(12) United States Patent
Ogumi et al.

(10) Patent No.: US 11,648,759 B2
(45) Date of Patent: May 16, 2023

(54) ELECTROCONDUCTIVE FILM, TOUCH PANEL, AND IMAGE DISPLAY DEVICE

(71) Applicant: DAI NIPPON PRINTING CO., LTD., Tokyo (JP)

(72) Inventors: Shoichiro Ogumi, Tokyo (JP); Yoshimasa Ogawa, Tokyo (JP); Eiji Ooishi, Tokyo (JP); Yukimitsu Iwata, Tokyo (JP); Yuji Shimizu, Tokyo (JP); Ryota Kitayama, Tokyo (JP); Hiroaki Mutou, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 17/685,028

(22) Filed: Mar. 2, 2022

(65) Prior Publication Data

US 2022/0184934 A1 Jun. 16, 2022

Related U.S. Application Data

(63) Continuation of application No. 16/922,239, filed on Jul. 7, 2020, now Pat. No. 11,298,925, which is a
(Continued)

(30) Foreign Application Priority Data

Sep. 30, 2016 (JP) .................................. 2016-195230
Sep. 30, 2016 (JP) .................................. 2016-195231
(Continued)

(51) Int. Cl.
*G09G 5/00* (2006.01)
*B32B 27/18* (2006.01)
(Continued)

(52) U.S. Cl.
CPC ................ *B32B 27/18* (2013.01); *B32B 7/02* (2013.01); *G06F 3/044* (2013.01); *G06F 3/0412* (2013.01);
(Continued)

(58) Field of Classification Search
CPC ......... B32B 27/18; B32B 7/02; G06F 3/0446; G06F 3/0412
(Continued)

(56) References Cited

U.S. PATENT DOCUMENTS

2007/0074316 A1 3/2007 Alden et al.
2009/0130433 A1 5/2009 Takada
(Continued)

FOREIGN PATENT DOCUMENTS

CN 102250506 11/2011
CN 104240958 12/2014
(Continued)

OTHER PUBLICATIONS

Japanese Office Action, issued in the corresponding Japanese patent application No. 2017-190650, dated Nov. 24, 2021, 18 pages.
(Continued)

*Primary Examiner* — Jonathan M Blancha
(74) *Attorney, Agent, or Firm* — Hamre, Schumann, Mueller & Larson, P.C.

(57) ABSTRACT

One aspect of the present invention provides a light-transmitting electroconductive film 10 comprising a light-transmitting base material 11 and an electroconductive part 13 provided on one surface of the light-transmitting base material 11, wherein the electroconductive part 13 includes a light-transmitting resin 15 and plural electroconductive fibers 16 incorporated in the light-transmitting resin 15, and the electroconductive part 13 can conduct electricity from the surface 13A of the electroconductive part 13, and the
(Continued)

electroconductive fibers 16 as a whole are unevenly distributed on the light-transmitting base material side than the position HL, which is located at half the film thickness of the electroconductive part 13 in the electroconductive part 13, and the electroconductive part 13 has a surface resistance value of 200 Ω/□ or less, and the electroconductive film 10 has a haze value of 5% or less.

16 Claims, 24 Drawing Sheets

Related U.S. Application Data continuation of application No. 16/337,242, filed as application No. PCT/JP2017/035578 on Sep. 29, 2017, now Pat. No. 10,831,327.

(30) Foreign Application Priority Data

Sep. 30, 2016 (JP) ................................ 2016-195233
Sep. 30, 2016 (JP) ................................ 2016-195234
Apr. 4, 2017 (JP) ................................ 2017-074413

(51) Int. Cl.
- *G06F 3/041* (2006.01)
- *H01L 27/32* (2006.01)
- *H01L 51/44* (2006.01)
- *G06F 3/044* (2006.01)
- *B32B 7/02* (2019.01)

(52) U.S. Cl.
CPC .......... *G06F 3/0446* (2019.05); *H01L 27/323* (2013.01); *H01L 51/442* (2013.01); *G06F 2203/04111* (2013.01); *G06F 2203/04112* (2013.01)

(58) Field of Classification Search
USPC .......................................................... 345/7
See application file for complete search history.

(56) References Cited

U.S. PATENT DOCUMENTS

| | | | |
|---|---|---|---|
| 2012/0258334 A1 | 10/2012 | Kaneko et al. | |
| 2012/0276394 A1* | 11/2012 | Yamamoto | B05D 7/02 427/515 |
| 2013/0040106 A1 | 2/2013 | Pschenitzka et al. | |
| 2014/0302326 A1 | 10/2014 | Shin et al. | |
| 2014/0360564 A1 | 12/2014 | Ng et al. | |
| 2015/0038033 A1* | 2/2015 | Gaynor | H01B 13/0013 442/52 |
| 2015/0284840 A1* | 10/2015 | Henn | C23C 14/0617 204/192.16 |
| 2015/0321220 A1 | 11/2015 | Mishima et al. | |
| 2016/0192483 A1* | 6/2016 | Shin | H05K 1/09 174/268 |
| 2016/0303838 A1 | 10/2016 | Chen et al. | |
| 2017/0010736 A1* | 1/2017 | Iwata | H01B 1/22 |
| 2017/0253707 A1* | 9/2017 | Lim | C08J 7/042 |
| 2017/0338003 A1 | 11/2017 | Haishi et al. | |

FOREIGN PATENT DOCUMENTS

| | | |
|---|---|---|
| JP | 2009-505358 | 2/2009 |
| JP | 2011/090879 | 5/2011 |
| JP | 2012-150944 | 8/2012 |
| JP | 2012-221075 | 11/2012 |
| JP | 2013-089334 | 5/2013 |
| JP | 2013-161404 | 8/2013 |
| JP | 2013-191520 | 9/2013 |
| JP | 2013-232291 | 11/2013 |
| JP | 2014/078461 | 5/2014 |
| JP | 2014-526956 | 10/2014 |
| JP | 2015-035381 | 2/2015 |
| JP | 2015-099748 | 5/2015 |
| JP | 2016-107229 | 6/2016 |
| JP | 2016-110831 | 6/2016 |
| JP | 2016-139600 | 8/2016 |
| JP | 2016-173983 | 9/2016 |
| JP | 2017-502399 | 1/2017 |
| TW | 201532076 | 8/2015 |
| WO | 2007/022226 | 2/2007 |
| WO | 2009/063744 | 5/2009 |
| WO | 2013/115310 | 8/2013 |
| WO | 2013/121556 | 8/2013 |
| WO | 2013/118643 | 5/2015 |
| WO | 2015/141473 | 9/2015 |

OTHER PUBLICATIONS

International Preliminary Report on Patentability, issued in the corresponding PCT application No. PCT/JP2017/035578, dated Apr. 2, 2019, 17 pages.

International Search Report, issued in the corresponding PCT Application No. PCT/JP2017/035578, dated Dec. 12, 2017, 5 pages.

Chinese Office Action, issued in the corresponding Chinese patent application No. 201780073145.6, dated Mar. 2, 2020, 16 pages.

* cited by examiner

ELECTROCONDUCTIVE FILM, TOUCH PANEL, AND IMAGE DISPLAY DEVICE

CROSS-REFERENCE TO RELATED APPLICATION

The present application enjoys the benefit of priority to the prior Japanese Patent Application Nos. 2016-195230 (filed on Sep. 30, 2016), 2016-195231 (filed on Sep. 30, 2016), 2016-195233 (filed on Sep. 30, 2016), 2016-195234 (filed on Sep. 30, 2016), and 2017-74413 (filed on Apr. 4, 2017), the entire disclosures of which are incorporated herein by reference.

TECHNICAL FIELD

The present invention relates to an electroconductive film, a touch panel, and an image display device.

BACKGROUND ART

Recent image display devices such as smartphone and tablet terminal may comprise a touch panel system that enables direct input of information by touching an image display screen with a finger or the like.

A touch panel typically comprises an electroconductive film that comprises an electroconductive part provided on a light-transmitting base material and indium tin oxide (ITO) is mainly used as an electroconductive material for such electroconductive parts of light-transmitting electroconductive films. However, ITO lacks flexibility, and an electroconductive part using ITO is thus prone to crack in cases where a flexible base material is used as the light-transmitting base material.

Accordingly, the use of metallic nanowire such as silver nanowire instead of ITO is currently studied as an electroconductive material to constitute the electroconductive part (see, for example, WO 2013/118643).

SUMMARY OF THE INVENTION (1) Currently, an electroconductive film using metallic nanowires as electroconductive materials is desired to achieve a lower haze value and a lower surface resistance value. In this respect, it is envisaged that the amount of metallic nanowires contained in an electroconductive part is increased to achieve a low surface resistance value because the surface resistance tends to decrease with increasing content of metallic nanowires, but an increased content of metallic nanowires results in a higher haze value. Because of this problem, an electroconductive film having a low haze value and a low surface resistance value has not yet been obtained.

Additionally, in cases where many metallic nanowires are exposed on the surface of an electroconductive part, the metallic nanowires are likely to react with, for example, sulfur, oxygen, and/or halogens in the air, so that the electrical conductivity is reduced.

(2) As described above, an electroconductive film using metallic nanowires as electroconductive materials is desired to achieve a lower haze value and a lower surface resistance value. However, when an electroconductive film is formed by using metallic nanowires, a difference in electrical resistance depending on the in-plain direction or area of an electroconductive part occurs. If the electrical resistance is different depending on the in-plain direction or area of the electroconductive part and the electroconductive film is used as an electrode for a touch panel sensor, the patterning of the electrode and/or the resulting IC chips may be limited, as well as the electroconductive film is limited in imposition and is thus prone to be wasted.

(3) As described above, an electroconductive film using metallic nanowires as electroconductive materials is desired to achieve a lower haze value and a lower surface resistance value. An underlayer is often provided on at least one surface of a light-transmitting resin base material for the purpose of, for example, improving adhesion to other layers, inhibiting the electroconductive film from sticking to itself when the electroconductive film is rolled, and/or inhibiting cissing of a coating liquid applied for forming another layer.

However, in cases where an electroconductive part is formed by using a metallic nanowire-containing composition containing metallic nanowires and a dispersion medium on the surface of an underlayer, permeation of the dispersion medium into the underlayer, the extent of which varies depending on the type of the dispersion medium, such as an aqueous dispersion medium or a solvent-based dispersion medium, used for dispersion of the metallic nanowires, may cause transfer of the metallic nanowires into the underlayer to increase the surface resistance value. A large amount of metallic nanowires is needed to achieve a low surface resistance value under this condition and is thus likely to result in a high haze value.

On the other hand, in cases where a layer impermeable to the dispersion medium is provided on the light-transmitting resin base material to prevent the transfer of the metallic nanowires into the underlayer, a layer having excellent hardness, specifically a hard coat layer, is generally provided. However, a hard coat layer provided on the light-transmitting resin base material causes a lack of flexibility, which may cause cracks in the resulting electroconductive film when the electroconductive film is folded.

(4) As described above, an electroconductive film using metallic nanowires as electroconductive materials is desired to achieve a lower haze value and a lower surface resistance value. In the electroconductive film, enough flexibility to fold may currently be required. However, the electroconductive film using metallic nanowires often comprises a hard coat layer provided between a light-transmitting base material and an electroconductive part for providing hardness, which may cause cracks in the electroconductive film (particularly, the hard coat layer) when the electroconductive film is folded and also cause an increased resistance value of the electroconductive part due to the crack formation in the electroconductive film.

Additionally, in cases where an electroconductive film is used in a touch panel, electric wirings that adhere to an electroconductive part of the electroconductive film are located behind a bezel of the touch panel. Although the electric wirings are generally formed by using an electroconductive paste (for example, a silver paste), electric wirings composed of a cured electroconductive paste may have poor adhesion to an electroconductive film depending on the type of the electroconductive paste. Thus, an electroconductive film is currently desired to have excellent adhesion to an electroconductive paste, regardless of the type of the electroconductive paste.

The present invention is designed to solve the above problems. That is, an object of the present invention is to provide (1) an electroconductive film that can achieve a low haze value and a low surface resistance value and prevent reduction in electrical conductivity due to the reaction of electroconductive fibers with substances in the atmosphere, (2) an electroconductive film that can achieve a low haze value and a low surface resistance value and has reduced the difference in electrical resistance value depending on the in-plain direction of an electroconductive part, (3) an electroconductive film that can achieve a low haze value and a low surface resistance value and has flexibility, or (4) an electroconductive film that can achieve a low haze value and a low surface resistance value and has flexibility and can increase choices of electroconductive pastes, and to provide a touch panel and an image display device comprising any of these electroconductive films.

The first aspect of the present invention provides a light-transmitting electroconductive film comprising a light-transmitting base material and an electroconductive part provided on one surface of the light-transmitting base material, wherein the electroconductive part comprises a light-transmitting resin and plural electroconductive fibers incorporated in the light-transmitting resin; the electroconductive part can conduct electricity from the surface of the electroconductive part; the electroconductive fibers as a whole are unevenly distributed on the light-transmitting base material side than the position located at half the film thickness of the electroconductive part in the electroconductive part; the electroconductive part has a surface resistance value of 200Ω/☐ or less; and the electroconductive film has a haze value of 5% or less.

The second aspect of the present invention provides a light-transmitting electroconductive film comprising a light-transmitting base material and an electroconductive part provided on one surface of the light-transmitting base material, wherein the electroconductive part comprises a light-transmitting resin and plural electroconductive fibers incorporated in the light-transmitting resin; the ratio of the electrical resistance in a first direction to that in a second direction is 1 or more and less than 2 when the electrical resistance values on the surface of the electroconductive part are measured in a predetermined size in six different directions including an arbitrary direction for each an angle of 30 degrees to the arbitrary direction in the surface of the electroconductive part, wherein a direction in which the electroconductive part shows the lowest electrical resistance value is designated as the first direction, and a direction which is perpendicular to the first direction is designated as the second direction; the electroconductive part has a surface resistance value of 200Ω/☐ or less; and the electroconductive film has a haze value of 5% or less.

The third aspect of the present invention provides a light-transmitting electroconductive film comprising a light-transmitting resin base material and an electroconductive part provided on at least one surface of the light-transmitting resin base material, wherein the electroconductive part comprises a light-transmitting resin and plural electroconductive fibers incorporated in the light-transmitting resin; the electroconductive part can conduct electricity from the surface of the electroconductive part; the electroconductive part is provided directly on at least one surface of the light-transmitting resin base material; the electroconductive part has a surface resistance value of 200Ω/☐ or less; and the electroconductive film has a haze value of 5% or less.

The fourth aspect of the present invention provides a light-transmitting electroconductive film comprising an underlayer and an electroconductive part in this order on at least one surface of a light-transmitting resin base material, wherein the electroconductive part comprises a light-transmitting resin and plural electroconductive fibers incorporated in the light-transmitting resin; the underlayer is provided directly on at least one surface of the light-transmitting resin base material; the electroconductive part is provided directly on the underlayer; the electroconductive part has a surface resistance value of 200Ω/☐ or less; and the electroconductive film has a haze value of 5% or less.

In the above second to fourth electroconductive films, the electroconductive part preferably contains no particles having a particle size larger than the film thickness of the light-transmitting resin.

In the above second to fourth electroconductive films, the electroconductive part preferably contains no particles.

In the above third and fourth electroconductive films, the ratio of the electrical resistance in a first direction to that in a second direction may be 1 or more and less than 2 when the electrical resistance values on the surface of the electroconductive part are measured in a predetermined size in six different directions including an arbitrary direction for each an angle of 30 degrees to the arbitrary direction in the surface of the electroconductive part, wherein a direction in which the electroconductive part shows the lowest electrical resistance value is designated as the first direction, and a direction which is perpendicular to the first direction is designated as the second direction.

In the above first, the third, and the fourth electroconductive films, the ratio of the electrical resistance in a first direction to that in a second direction may be 2 or more when the electrical resistance values on the surface of the electroconductive part are measured in a predetermined size in six different directions including an arbitrary direction for each an angle of 30 degrees to the arbitrary direction in the surface of the electroconductive part, wherein a direction in which the electroconductive part shows the lowest electrical resistance value is designated as the first direction, and a direction which is perpendicular to the first direction is designated as the second direction.

In the above first to fourth electroconductive films, the electroconductive film may have a total light transmittance of 80% or more.

In the above first to fourth electroconductive films, the electroconductive fibers may be one or more types of fibers selected from the group consisting of electroconductive carbon fibers, metallic fibers, and metal-coated synthetic fibers.

In the above first, the third, and the fourth electroconductive films, the electroconductive fibers may have a fiber diameter of 200 nm or less and a fiber length of 1 μm or more.

In the above fourth electroconductive film, the electroconductive fibers may have a fiber diameter of 200 nm or less and a fiber length of 10 μm or more and less than 30 μm.

In the above second to fourth electroconductive films, the electroconductive fibers as a whole may be unevenly distributed on the light-transmitting base material side than the position located at half the film thickness of the electroconductive part in the electroconductive part.

Another aspect of the present invention provides a touch panel comprising the above-described electroconductive film.

Another aspect of the present invention provides an image display device comprising the above-described touch panel.

Another aspect of the present invention provides a method of producing the above-described electroconductive film, wherein the method of producing a light-transmitting electroconductive film comprising a light-transmitting base material and an electroconductive part provided on at least one surface of the light-transmitting base material comprises the steps of: applying and drying an electroconductive fiber-containing composition containing electroconductive fibers and an organic dispersion medium on at least one surface of the light-transmitting base material to place the electroconductive fibers on the one surface; and covering the electroconductive fibers with a light-transmitting resin after placing the electroconductive fibers on the one surface.

Another aspect of the present invention provides a method of producing the above-described electroconductive film, comprising the steps of: applying an electroconductive fiber-containing composition containing electroconductive fibers and an organic dispersion medium directly on at least one surface of a light-transmitting resin base material and drying the electroconductive fiber-containing composition to place the electroconductive fibers directly on the one surface; and covering the electroconductive fibers with a light-transmitting resin after placing the electroconductive fibers directly on the one surface.

Another aspect of the present invention provides a method of producing the above-described electroconductive film, comprising the steps of: applying an electroconductive fiber-containing composition containing electroconductive fibers and a dispersion medium directly on a surface of an underlayer in a laminate, which comprises a light-transmitting resin base material and the underlayer provided directly on at least one surface of the light-transmitting resin base material, and drying the electroconductive fiber-containing composition to place the electroconductive fibers on the surface of the underlayer: and covering the electroconductive fibers with a light-transmitting resin after placing the electroconductive fibers directly on the surface of the underlayer.

ADVANTAGEOUS EFFECTS OF THE INVENTION

According to the first aspect of the present invention, an electroconductive film can achieve a low haze value and a low surface resistance value and prevent reduction in electrical conductivity due to the reaction of the electroconductive fibers with substances in the atmosphere, since the electroconductive part comprises a light-transmitting resin and plural electroconductive fibers incorporated in the light-transmitting resin; the electroconductive part can conduct electricity from the surface of the electroconductive part; the electroconductive fibers as a whole are unevenly distributed on the light-transmitting base material side than the position located at half the film thickness of the electroconductive part in the electroconductive part; the electroconductive part has a surface resistance value of 200Ω/□ or less; and the electroconductive film has a haze value of 5% or less. According to the second aspect of the present invention, an electroconductive film that can achieve a low haze value and low surface resistance value and has reduced the difference in electrical resistance depending on the in-plain direction of the electroconductive part can be provided, since the ratio of the electrical resistance in a first direction to that in a second direction is 1 or more and less than 2 when the electrical resistance values on the surface of the electroconductive part are measured in a predetermined size in six different directions including an arbitrary direction for each an angle of 30 degrees to the arbitrary direction in the surface of the electroconductive part, wherein a direction in which the electroconductive part shows the lowest electrical resistance value is designated as the first direction, and a direction which is perpendicular to the first direction is designated as the second direction; the electroconductive part has a surface resistance value of 200Ω/□ or less; and the electroconductive film has a haze value of 5% or less. According to the third aspect of the present invention, an electroconductive film that can achieve a low haze value and a low surface resistance value and has flexibility can be provided, since an electroconductive part is provided directly on at least one surface of a light-transmitting resin base material; the electroconductive part has a surface resistance value of 200Ω/□ or less; and the electroconductive film has a haze value of 5% or less. According to the fourth aspect of the present invention, an electroconductive film that can achieve a low haze value and a low surface resistance value and has flexibility and can increase choices of electroconductive pastes can be provided, since underlayer is provided directly on at least one surface of a light-transmitting resin base material; an electroconductive part is provided directly on the underlayer; the electroconductive part has a surface resistance value of 200Ω/□ or less; and the electroconductive film has a haze value of 5% or less. Additionally, according to a touch panel and an image display device of other aspects of the present invention, a touch panel and an image display device comprising such the electroconductive film can be provided.

DETAILED DESCRIPTION OF THE INVENTION

First Embodiment

Figure 1:
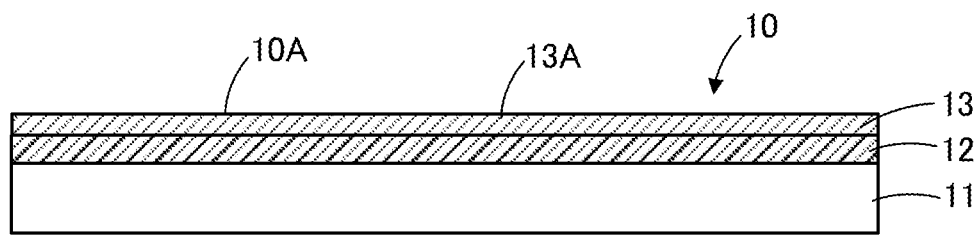
FIG. 1 depicts a schematic diagram of an electroconductive film according to the first embodiment.
Figure 2:
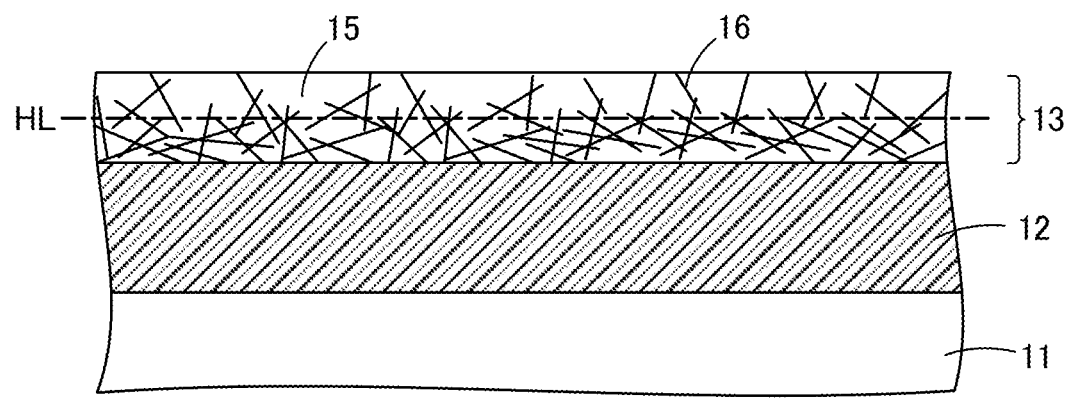
FIG. 2 depicts an enlarged view of a part of the electroconductive film shown in FIG. 1.
Figure 3:
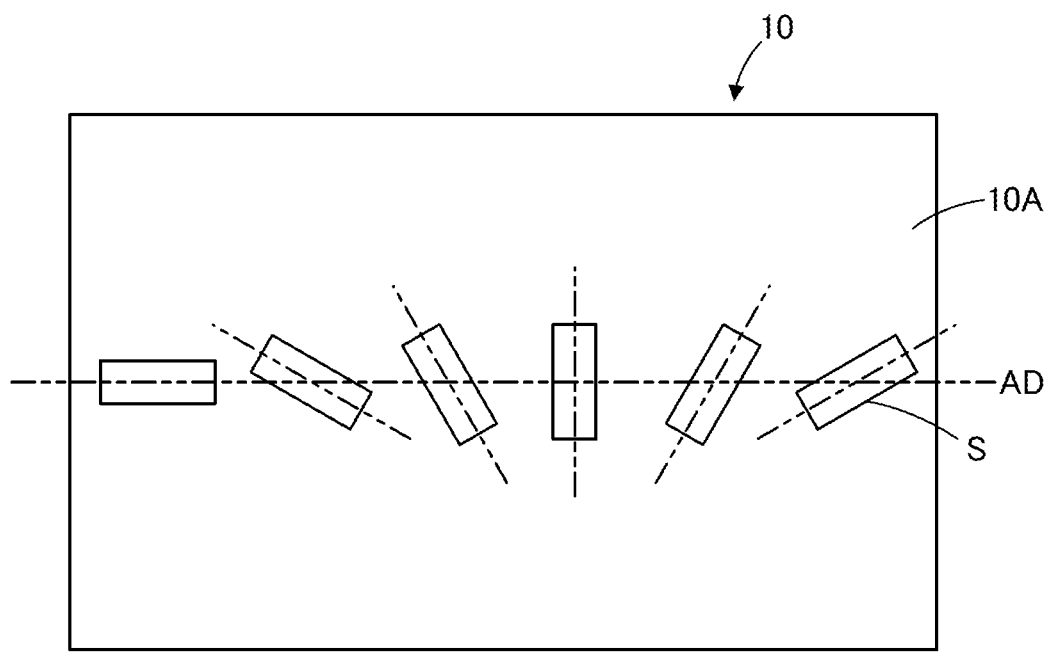
FIG. 3 depicts a layout drawing of samples excised from the electroconductive film according to the embodiment.
Figure 4:
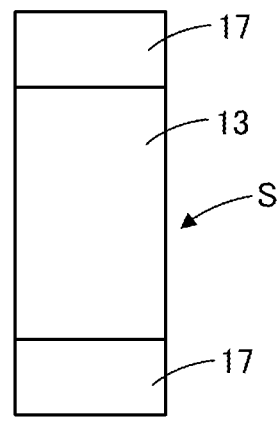
FIG. 4 depicts a plane view of a sample measured for electrical resistance.
Figure 5:
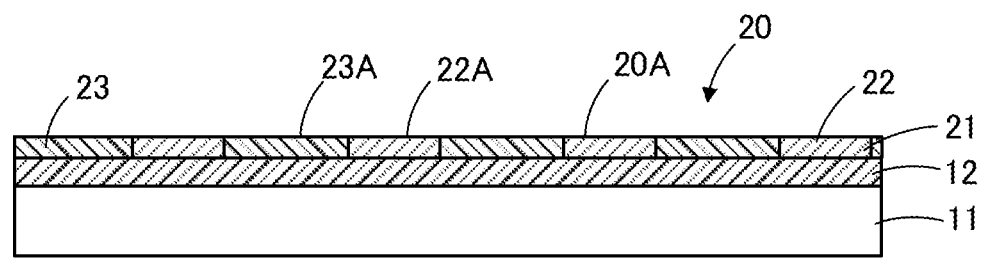
FIG. 5 depicts a schematic diagram of another electroconductive film according to the first embodiment.
Figure 6:
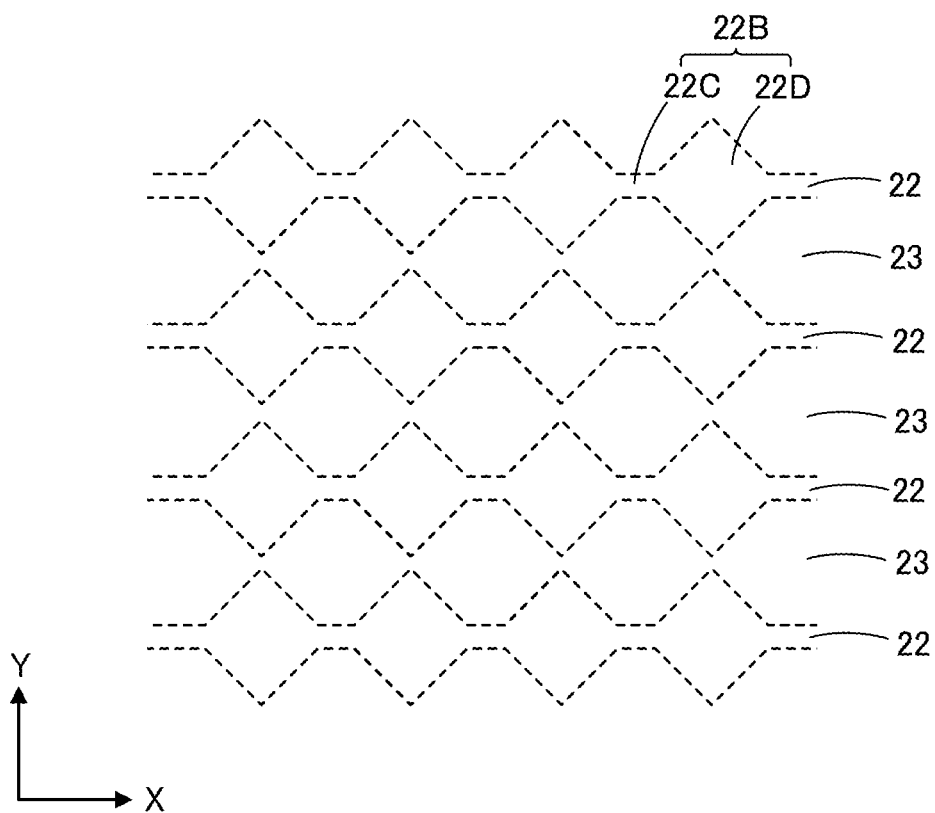
FIG. 6 depicts a schematic plane view of the electroconductive film shown in FIG. 5.
Figure 7:
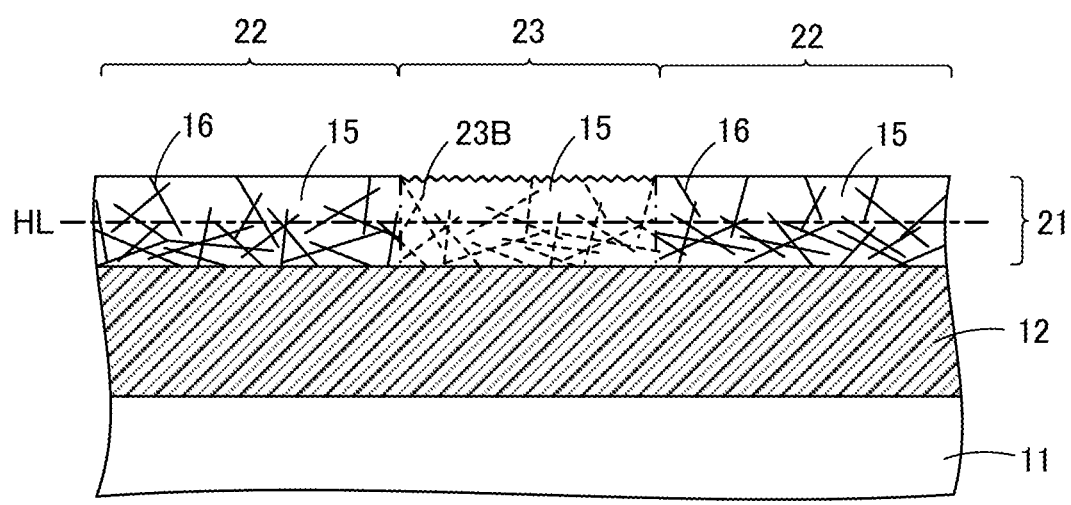
FIG. 7 depicts an enlarged view of a part of the electroconductive film shown in FIG. 5.
Figure 8:
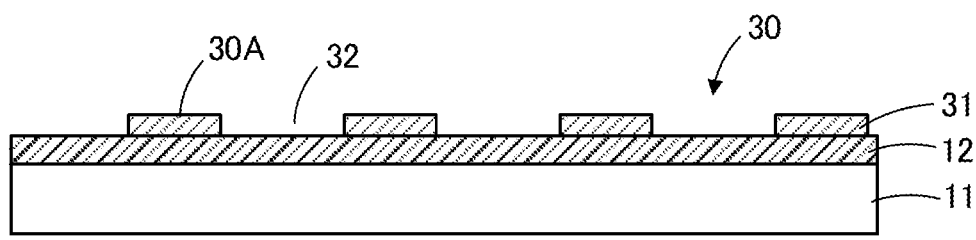
FIG. 8 depicts a schematic diagram of another electroconductive film according to the first embodiment.
Figure 9:
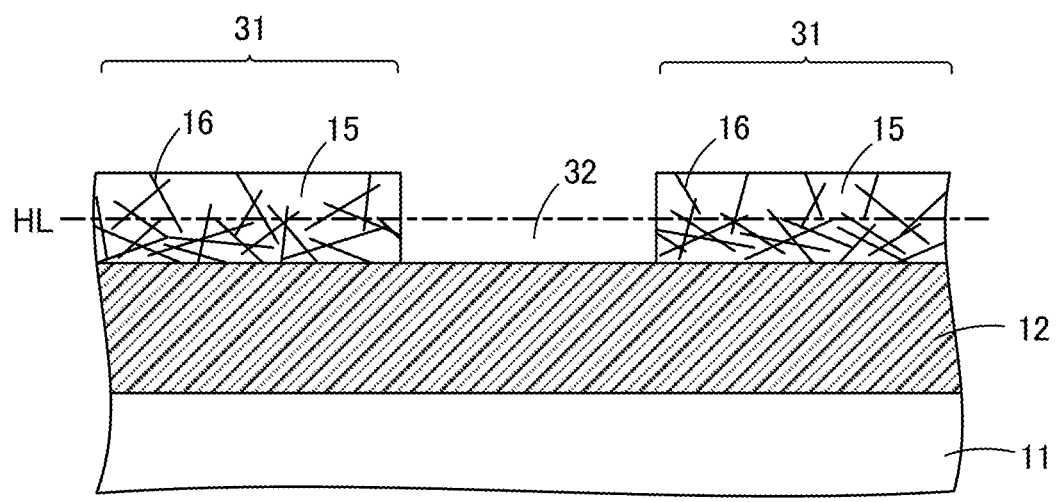
FIG. 9 depicts an enlarged view of a part of the electroconductive film shown in FIG. 8.
Figure 10A:
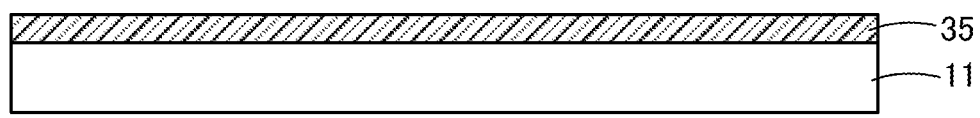
FIGS. 10(A) and 10(B) schematically illustrate the process for producing the electroconductive film according to the first embodiment.

Now, the electroconductive film, touch panel, and image display device according to the first embodiment of the present invention will be described below with reference to the drawings. The term "light-transmitting" as used herein refers to a property of transmitting light. Additionally, the term "light-transmitting" does not necessarily refer to transparency and may refer to translucency. FIG. 1 depicts a schematic diagram of an electroconductive film according to the present embodiment, while FIG. 2 depicts an enlarged view of a part of the electroconductive film shown in FIG. 1. FIG. 3 depicts a layout drawing of samples excised from the electroconductive film according to the present embodiment, while FIG. 4 depicts a plain view of a sample measured for electrical resistance. FIGS. 5 and 8 depict schematic diagrams of other electroconductive films according to the present embodiment; FIG. 6 depicts a schematic plain view of the electroconductive film shown in FIG. 5; FIG. 7 depicts an enlarged view of a part of the electroconductive film shown in FIG. 5; and FIG. 9 depicts an enlarged view of a part of the electroconductive film shown in FIG. 8. FIGS. 10 to 12 schematically illustrate the process for producing the electroconductive film according to the present embodiment.

<<<Electroconductive Film>>>

The electroconductive film 10 shown in FIG. 1 is light transmissive and comprises a light-transmitting base material 11, a light-transmitting functional layer 12 provided on at least one surface of the light-transmitting base material 11, and an electroconductive part 13 provided and patterned on a surface of the light-transmitting functional layer 12 opposite to the light-transmitting base material 11 side surface. However, the electroconductive film 10 should comprise the light-transmitting base material 11 and the electroconductive part 13, and may not comprise the light-transmitting functional layer 12. The absence of the light-transmitting functional layer 12 can improve the flexibility. The light-transmitting functional layer 12 is provided between the light-transmitting base material 11 and the electroconductive part 13; a light-transmitting functional layer may be provided not between the light-transmitting base material 11 and the electroconductive part 13 but on a surface of the light-transmitting base material 11 opposite to the electroconductive part 13 side surface, or may be provided both between the light-transmitting base material 11 and the electroconductive part 13 and on a surface of the light-transmitting base material 11 opposite to the electroconductive part 13 side surface. Additionally, in the electroconductive film 10 shown in FIG. 1, the electroconductive part 13 is provided on only one surface of the electroconductive film, but electroconductive parts may be provided on both surfaces of the electroconductive film.

The electroconductive part 13 shown in FIG. 1 is a film with no pattern, namely a so-called plain film. The surface 10A of the electroconductive film 10 is constituted by the surface 13A of the electroconductive part 13.

The electroconductive film 10 has a haze value (total haze value) of 5% or less. In cases where the electroconductive film 10 has a haze value of more than 5%, the electroconductive film may suffer from insufficient optical properties. The haze value can be measured using a haze meter (product name "HM-150"; manufactured by Murakami Color Research Laboratory Co., Ltd.) according to JIS K7136: 2000. The haze value is a value measured on the whole electroconductive film and is also determined as the arithmetic mean of three measurement values obtained from one electroconductive film, wherein a sample having a size of 50 mm×100 mm is cut from the electroconductive film and the sample without curl or wrinkle and without fingerprints or dust then placed in the haze meter in such a manner that the electroconductive part faces in the direction opposite to the light source (this shall not apply to an electroconductive film comprising electroconductive parts on the both sides). The term "three measurements" as used herein does not mean three measurements at the same location and shall mean measurements at three different locations. The surface 10A of the electroconductive film 10 is visually determined to be flat, and the laminated layers, such as the electroconductive part 13, likewise have a flat surface, and the deviation of film thickness is also within ±10%. Thus, the measurement of haze value at three different locations on the cut electroconductive film is considered to provide a rough average of the haze values measured on the whole electroconductive film. Additionally, if a sample having the above-described size cannot be cut from the electroconductive film, a sample having a size equal to or greater than a diameter of 21 mm is required because, for example, the HM-150 haze meter has an entrance port aperture having a diameter of 20 mm for use in the measurement. Thus, a sample having a size of 22 mm×22 mm or larger may be cut from the electroconductive film as appropriate. In cases where the electroconductive film is small in size, the electroconductive film is gradually shifted or turned in such an extent that the light source spot is within the electroconductive film, and three points of measurement are thereby obtained. The electroconductive film 10 has a haze value of 3% or less, 2% or less, 1.5% or less, 1.2% or less, or 1.1% or less in ascending order of preference (a lower value is more preferred). The deviation of the obtained haze value is within ±10% even though the measurement object has such a long size as a size of 1 m×3000 m or has almost the same size as that of a 5-inch smartphone; in cases where the deviation is within the above-described range, a low haze value and a low resistance value are more easily obtained. Additionally, although the electroconductive part of the electroconductive film 10 is not patterned, the total light transmittance is 5% or less, 3% or less, 2% or less, 1.5% or less, 1.2% or less, or 1.1% or less in ascending order of preference (a lower value is more preferred) even in an electroconductive film comprising a patterned electroconductive part. Additionally, also in a whole multi-layered laminate such as a touch panel sensor comprising an electroconductive film, the haze value is preferred to be the same as described above.

The electroconductive film 10 preferably has a total light transmittance of 80% or more. In cases where the electroconductive film has a total light transmittance of less than 80%, the electroconductive film may suffer from insufficient optical properties. The total light transmittance can be measured using a haze meter (product name "HM-150"; manufactured by Murakami Color Research Laboratory Co., Ltd.) according to JIS K7361-1: 1997. The total light transmittance is a value measured on the whole electroconductive film and is also determined as the arithmetic mean of three measurement values obtained from one electroconductive film, wherein a sample having a size of 50 mm×100 mm is cut from the electroconductive film and the sample without curl or wrinkle and without fingerprints or dust is then placed in the haze meter in such a manner that the electroconductive part faces in the direction opposite to the light source (this shall not apply to an electroconductive film comprising electroconductive parts on the both sides). The surface 10A of the electroconductive film 10 is visually determined to be flat, and the laminated layers, such as the electroconductive part 13, likewise have a flat surface, and the deviation of film thickness is also within ±10%. Thus, the measurement of total light transmittance at three different locations on the excised electroconductive film is considered to provide a rough average of the total light transmittance values measured on the whole electroconductive film. Additionally, if a sample having the above-described size cannot be cut from the electroconductive film, a sample having a size equal to or greater than a diameter of 21 mm is required because, for example, the HM-150 haze meter has an entrance port aperture having a diameter of 20 mm for use in the measurement. Thus, a sample having a size of 22 mm×22 mm or larger may be cut from the electroconductive film as appropriate. In cases where the electroconductive film is small in size, the electroconductive film is gradually shifted or turned in such an extent that the light source spot is within the electroconductive film, and three points of measurement are thereby obtained. The electroconductive film 10 has a total light transmittance of 85% or more, 88% or more, or 89% or more in ascending order of preference (a higher value is more preferred). Additionally, although the electroconductive part of the electroconductive film 10 is not patterned, the total light transmittance is 80% or more, 85% or more, 88% or more, or 89% or more in ascending order of preference (a higher value is more preferred) even in an electroconductive film comprising a patterned electroconductive part. The deviation of the obtained total light transmittance is within ±10% even though the measurement object has such a long size as a size of 1 m×3000 m or has almost the same size as that of a 5-inch smartphone; in cases where the deviation is within the above-described range, a low haze value and a low resistance value are more easily obtained. Additionally, also in a whole multi-layered laminate such as a touch panel sensor comprising an electroconductive film, the total light transmittance is preferred to be the same as described above.

The application of the electroconductive film according to the present invention, including the below-described electroconductive films 20, 30, 100, 110, 150, 160, 250, and 260 as well as the electroconductive film 10, is not limited to a particular application, and may be used in various applications, for example, in which a transparent electroconductive film is used. Additionally, the electroconductive film of the present invention may be used for electrical appliances and windows for use in houses and vehicles (including all types of vehicles such as trains and heavy-duty vehicles) as well as for products related to image display devices (including smartphone, tablet terminal, wearable terminal, personal computer, television, digital signage, public information display (PID), vehicle display, and the like). In particular, the electroconductive film of the present invention can suitably be used for products in which transparency is critical. Additionally, the electroconductive film of the present invention can suitably be used for electrical appliances in which not only technical features, such as transparency, but also designs are essential. Specific examples of the application of the electroconductive film according to the present invention include defrosters, antennas, solar cells, audio systems, loudspeakers, electric fans, interactive whiteboards, and carrier films for semiconductors and the like.

The electroconductive film of the present invention may be cut into a piece having a desired size or be rolled. In cases where the electroconductive film of the present invention has been cut into a piece having a desired size, the size of the electroconductive film piece is not limited to a particular size, and the size is appropriately determined depending on the display size of an image display device. Specifically, the electroconductive film piece may be, for example, 5 inches or more and 500 inches or less in size. The term "inch" as used herein shall mean the length of a diagonal when the electroconductive film is rectangular and to the length of a diameter when the electroconductive film is circular and to the average of major and minor axes when the electroconductive film is elliptical. In this respect, when the electroconductive film is rectangular, the aspect ratio of the electroconductive film which is measured to have the above-described inches is not limited to a particular aspect ratio as long as no problem is found with the electroconductive film to be used for the display screen of an image display device. Examples of the aspect ratio include height-to-width ratios of 1:1, 4:3, 16:10, 16:9, and 2:1. However, particularly in electroconductive films used for vehicle display and digital signage which are rich in designs, the aspect ratio is not limited to the above-described aspect ratios. Additionally, in cases where the electroconductive film 10 is large in size, the electroconductive film is appropriately trimmed starting at an arbitrary position to an easy-handling size such as A4 size (210 mm×297 mm) or A5 size (148 mm×210 mm) and then trimmed to fit size requirements of each measurement item.

<<Light-Transmitting Base Material>>

The light-transmitting base material 11 is not limited to a particular light-transmitting base material as long as it is light transmissive. Examples of the constituent material of the light-transmitting base material 11 include light-transmitting resins, such as polyolefin resins, polycarbonate resins, polyacrylate resins, polyester resins, aromatic polyetherketone resins, polyethersulfone resins, polyimide resins, polyamide resins, and polyamide-imide resins. Among those light-transmitting resins, polyester resins are preferred because a light-transmitting base material composed of a polyester resin is hardly damaged even upon contacting to a coating machine and is thus capable of inhibiting increase of haze value though the light-transmitting base material is contacted to a coating machine for coating of a light-transmitting functional layer or the like and thus likely to be damaged, as well as a light-transmitting base material composed of a polyester resin has superior heat resistance, barrier property, and water resistance to those of light-transmitting base materials composed of any light-transmitting resin other than polyester resins; additionally, polyimide resins and polyamide resins are preferred in terms of flexibility.

Examples of the polyolefin resin include resins composed of at least one of, for example, polyethylene, polypropylene, and cyclic polyolefin base materials. Examples of the cyclic polyolefin resin include resins having the norbornene backbone.

Examples of the polycarbonate resin include aromatic polycarbonate resins containing a bisphenol (such as bisphenol A) as a base material, and aliphatic polycarbonate resins such as diethylene glycol bis(allyl carbonate).

Examples of the polyacrylate resin include methyl poly (meth)acrylate base materials, ethyl poly(meth)acrylate base materials, and methyl (meth)acrylate-butyl (meth)acrylate copolymers.

Examples of the polyester resin include resins composed of at least one of polyethylene terephthalate (PET), polypropylene terephthalate, polybutylene terephthalate, and polyethylene naphthalate (PEN).

Examples of the aromatic polyetherketone resin include polyether ether ketone (PEEK).

A polyimide resin can be obtained from the reaction between a tetracarboxylic component and a diamine component. Preferably, a tetracarboxylic component and a diamine component are polymerized to form a polyamic acid, which is then imidized. The imidization may be heat imidization or chemical imidization. Additionally, a polyimide resin can also be produced by a combinational method of heat imidization and chemical imidization. The polyimide resin may be an aliphatic polyimide resin, and is preferably an aromatic polyimide resin containing aromatic rings. The aromatic polyimide resin is composed of a tetracarboxylic component and a diamine component, at least one of which is an aromatic ring-containing component. Tetracarboxylic dianhydride are suitably used as specific examples of the tetracarboxylic component, and may be used individually or in combination of two or more. Diamines produced by substitution of some or all hydrogen atoms in an aromatic ring of any of the diamines with a substituent(s) selected from fluoro, methyl, methoxy, trifluoromethyl, and trifluoromethoxy groups can also be used. These may be used individually or in combination of two or more.

For improving the light transmittance and the rigidity, the polyimide resin preferably contains an aromatic ring and at least one selected from the group consisting of: (i) a fluorine atom, (ii) an aliphatic ring, and (iii) a linking group that interrupts the electron conjugation between donor and acceptor aromatic rings; more preferably contains at least one of (i) and (iii). In a polyimide resin, the presence of an aromatic ring enhances the orientation of the polyimide resin itself and increases the rigidity but tends to decrease the transmittance depending on the absorption wavelength of the aromatic ring. In cases where the polyimide resin contains (i) a fluorine atom, the fluorine atom can give the polyimide backbone an electron configuration to inhibit electron transfer, and consequently improves the light transmittance. Also, in cases where the polyimide resin contains (ii) an aliphatic ring, the aliphatic ring can interrupt the pi-electron conjugation within the polyimide backbone to inhibit electron transfer within the backbone, and consequently improves the light transmittance. Furthermore, in cases where the polyimide resin contains (iii) a linking group that interrupts the electron conjugation between donor and acceptor aromatic rings, the linking group can interrupt the pi-electron conjugation within the polyimide backbone to inhibit electron transfer within the backbone, and consequently improves the light transmittance. Examples of such a linking group that interrupts the electron conjugation between donor and acceptor aromatic rings include ether linkage, thioether linkage, carbonyl linkage, thiocarbonyl linkage, amide linkage, sulfonyl linkage, and, sulfinyl linkage, as well as divalent linking groups such as alkylene groups optionally substituted by fluorine.

Among those polyimide resins, a polyimide resin containing an aromatic ring and a fluorine atom is preferably used in terms of improving the light transmittance and the rigidity. In the fluorine atom-containing polyimide resin, the ratio of fluorine atom number (F) to carbon atom number (C), F/C, is preferably 0.01 or more, further preferably 0.05 or more, when those atom numbers are determined by analyzing the surface of the polyimide resin by X-ray photoelectron spectroscopy. On the other hand, an excessively high content of fluorine atom is likely to result in reduction of, for example, the heat resistance inherent to the polyimide resin, and the ratio of fluorine atom number (F) to carbon atom number (C), F/C, is thus preferably 1 or less, further preferably 0.8 or less. In this respect, the above-described ratio obtained by X-ray photoelectron spectroscopy (XPS) can be calculated from the atom percentages of the respective atoms measured using an X-ray photoelectron spectrometer (for example, Theta Probe, Thermo Scientific Inc.).

Additionally, a polyimide resin in which 70% or more of the hydrogen atoms bound to the carbon atoms are directly bound to the aromatic rings is preferably used in terms of improving the light transmittance and the rigidity. In the polyimide resin, the ratio of the (number of) hydrogen atoms directly bound to the aromatic rings to the total (number of) hydrogen atoms bound to the carbon atoms is further preferably 80% or more, more preferably 85% or more. A polyimide in which 70% or more of the hydrogen atoms bound to the carbon atoms are directly bound to the aromatic rings is preferred because optical properties, particularly total light transmittance and yellow index (YI), vary less in the resulting optical film even after a heating process in the atmosphere, such as a stretching process at a temperature of 200° C. or higher. A polyimide resin in which 70% or more of the hydrogen atoms bound to the carbon atoms are directly bound to the aromatic rings has a low reactivity with oxygen, from which the chemical structure of the polyimide resin is predicted to hardly change. A base material composed of a polyimide resin is often used in devices that require taking advantage of the high heat resistance of the polyimide resin for a processing process involving a heating process in the production of the devices. A polyimide resin in which 70% or more of the hydrogen atoms bound to the carbon atoms are directly bound to the aromatic rings does not need the later stage processes performed in inert atmosphere to maintain the transparency of the resulting optical film, and can advantageously save costs for equipment and for maintenance of the atmosphere. In this respect, the ratio of the (number of) hydrogen atoms directly bound to the aromatic rings to the total (number of) hydrogen atoms bound to the carbon atoms in a polyimide resin can be determined by analyzing degradation products of the polyimide using high-performance liquid chromatography, a gas chromatograph mass spectrometer, and NMR. For example, a sample is degraded with an aqueous alkaline solution or supercritical methanol and the obtained degradation products are separated by high-performance liquid chromatography. Each separated peak is qualitatively analyzed using a gas chromatograph mass spectrometer, NMR, and the like, while quantitatively analyzed using high-performance liquid chromatography, whereby the ratio of the (number of) hydrogen atoms directly bound to the aromatic rings to the total (number of) hydrogen atoms bound to the carbon atoms in the polyimide can be determined.

Additionally, the polyimide resin preferably has at least one structure selected from the group consisting of the structures represented by the general formula (1) below and the general formula (3) below, among others, in terms of improving the light transmittance and the rigidity.

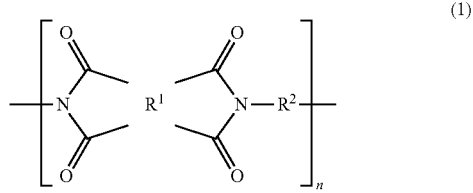
(1)

In the above-described general formula (1), $R^1$ represents a tetracarboxylic acid residue as a tetravalent group; $R^2$ represents at least one divalent group selected from the group consisting of trans-cyclohexanediamine residue, trans-1,4-bismethylene cyclohexanediamine residue, 4,4'-diaminodiphenyl sulfone residue, 3,4'-diaminodiphenyl sulfone residue, and divalent groups represented by the general formula (2) below; n represents the number of repeating units, which is 1 or more. In this specification, the "tetracarboxylic acid residue" refers to a residue remaining after subtracting four carboxylic groups from a tetracarboxylic acid, and represents the same structure as a residue remaining after subtracting the acid dianhydride structure from a tetracarboxylic dianhydride. Additionally, the "diamine residue" refers to a residue remaining after subtracting two amino groups from a diamine.

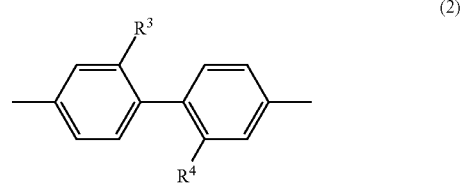
(2)

In the above-described general formula (2), $R^3$ and $R^4$ each independently represent a hydrogen atom, alkyl group, or perfluoroalkyl group.

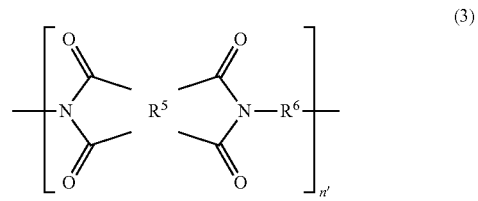
(3)

In the above-described general formula (3), $R^5$ represents at least one tetravalent group selected from the group consisting of cyclohexane tetracarboxylic acid residue, cyclopentane tetracarboxylic acid residue, a dicyclohexane-3,4,3',4'-tetracarboxylic acid residue, and a 4,4'-(hexafluoroisopropylidene)diphthalic acid residue; $R^6$ represents a diamine residue as a divalent group; n' represents the number of repeating units, which is 1 or more.

In the above-described general formula (1), $R^1$ refers to a tetracarboxylic acid residue and can represent, as indicated above, a residue remaining after subtracting the acid dianhydride structure from a tetracarboxylic dianhydride. As $R^1$ in the above-described general formula (1), at least one selected from the group consisting of 4,4'-(hexafluoroisopropylidene)diphthalic acid residue, 3,3',4,4'-biphenyl tetracarboxylic acid residue, pyromellitic residue, 2,3',3,4'-biphenyl tetracarboxylic acid residue, 3,3',4,4'-benzophenone tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue is preferably contained, among others, in terms of improving the light transmittance and the rigidity. At least one selected from the group consisting of 4,4'-(hexafluoroisopropylidene)diphthalic acid residue, 4,4'-oxydiphthalic acid residue, and 3,3',4,4'-diphenylsulfone tetracarboxylic acid residue is further preferably contained.

As $R^1$, those suitable residues are contained in total preferably at a content of 50% by mole or more, further preferably 70% by mole or more, and still further preferably 90% by mole or more.

Additionally, a combination of at least one selected from a group of tetracarboxylic acid residues suitable for improving the rigidity (group A), such as the group consisting of 3,3',4,4'-biphenyl tetracarboxylic acid residue, 3,3',4,4'-benzophenone tetracarboxylic acid residue, and pyromellitic residue, and at least one selected from a group of tetracarboxylic acid residues suitable for improving the transparency (group B), such as the group consisting of 4,4'-(hexafluoroisopropylidene)diphthalic acid residue, 2,3',3,4'-biphenyl tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue, is preferably used as $R^1$.

For the content ratio of the group of tetracarboxylic acid residues suitable for improving the rigidity (group A) to the group of tetracarboxylic acid residues suitable for improving the transparency (group B) in that case, preferably 0.05 moles or more and 9 moles or less, further preferably 0.1 moles or more and 5 moles or less, still further preferably 0.3 moles or more and 4 moles or less, of the group of tetracarboxylic acid residues suitable for improving the rigidity (group A) are combined with 1 mole of the group of tetracarboxylic acid residues suitable for improving the transparency (group B).

In the above-described general formula (1), $R^2$ preferably represents at least one divalent group selected from the group consisting of 4,4'-diaminodiphenyl sulfone residue, 3,4'-diaminodiphenyl sulfone residue, and divalent groups represented by the above-described general formula (2), further preferably at least one divalent group selected from the group consisting of 4,4'-diaminodiphenyl sulfone residue, 3,4'-diaminodiphenyl sulfone residue, and divalent groups represented by the above-described general formula (2) where $R^3$ and $R^4$ each represent a perfluoroalkyl group, among others, in terms of improving the light transmittance and the rigidity.

As $R^5$ in the above-described general formula (3), 4,4'-(hexafluoroisopropylidene)diphthalic acid residue, 3,3',4,4'-diphenylsulfone tetracarboxylic acid residue, and oxydiphthalic acid residue are preferably contained, among others, in terms of improving the light transmittance and the rigidity.

As $R^5$, those suitable residues are contained preferably at a content of 50% by mole or more, further preferably 70% by mole or more, and still further preferably 90% by mole or more.

In the above-described general formula (3), $R^6$ refers to a diamine residue and can represent, as indicated above, a residue remaining after subtracting two amino groups from a diamine. As $R^6$ in the above-described general formula (3), preferably at least one divalent group selected from the group consisting of 2,2'-bis(trifluoromethyl)benzidine residue, bis[4-(4-aminophenoxy)phenyl]sulfone residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl] hexafluoropropane residue, 4,4'-diamino-2-(trifluoromethyl)diphenyl ether residue, 4,4'-diaminobenzanilide residue, N,N'-bis(4-aminophenyl)terephthalamide residue, and 9,9-bis(4-aminophenyl)fluorene residue, further preferably at least one divalent group selected from the group consisting of 2,2'-bis(trifluoromethyl)benzidine residue, bis[4-(4-aminophenoxy)phenyl]sulfone residue, and 4,4'-diaminodiphenyl sulfone residue, is contained, among others, in terms of improving the light transmittance and the rigidity.

As $R^6$, those suitable residues are contained in total preferably at a content of 50% by mole or more, further preferably 70% by mole or more, and still further preferably 90% by mole or more.

Additionally, a combination of at least one selected from a group of diamine residues suitable for improving the rigidity (group C), such as the group consisting of bis[4-(4-aminophenoxy)phenyl]sulfone residue, 4,4'-diaminobenzanilide residue, N,N'-bis(4-aminophenyl)terephthalamide residue, paraphenylenediamine residue, methaphenylenediamine residue, and 4,4'-diaminodiphenylmethane residue, and at least one selected from a group of diamine residues suitable for improving the transparency (group D), such as the group consisting of 2,2'-bis(trifluoromethyl)benzidine residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl] hexafluoropropane residue, 4,4'-diamino-2-(trifluoromethyl)diphenyl ether residue, and 9,9-bis(4-aminophenyl)fluorene residue, is preferably used as $R^6$.

For the content ratio of the group of diamine residues suitable for improving the rigidity (group C) to the group of diamine residues suitable for improving the transparency (group D) in that case, preferably 0.05 moles or more and 9 moles or less, further preferably 0.1 moles or more and 5 moles or less, more preferably 0.3 moles or more and 4 moles or less, of the group of diamine residues suitable for improving the rigidity (group C) are combined with 1 mole of the group of diamine residues suitable for improving the transparency (group D).

For the structures represented by the above-described general formulae (1) and (3), n and n' each independently represent the number of repeating units, which is 1 or more. The number of repeating units, n, in the polyimide may be appropriately selected depending on the structure to allow the polyimide to have a preferred glass transition temperature as described below, and is not limited to a particular number. The average number of repeating units is typically 10 to 2,000, further preferably 15 to 1,000.

Additionally, the polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic acid residue such as terephthalic acid.

The polyimide resin preferably has a glass transition temperature of 250° C. or higher, further preferably 270° C. or higher, in terms of heat resistance, while the polyimide resin preferably has a glass transition temperature of 400° C. or lower, further preferably 380° C. or lower, in terms of ease of stretching and of reducing the baking temperature.

Specific examples of the polyimide resin include compounds having the structure represented by the formula below. In the formula below, n represents the number of repeating units, which is an integer of 2 or more.

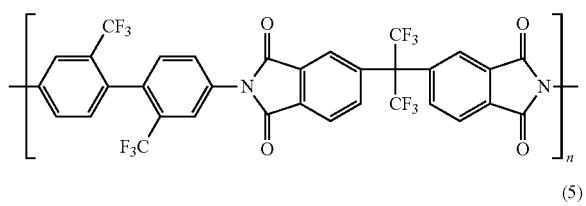

(4)

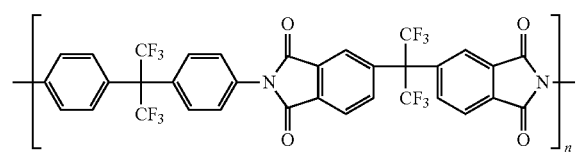

(5)

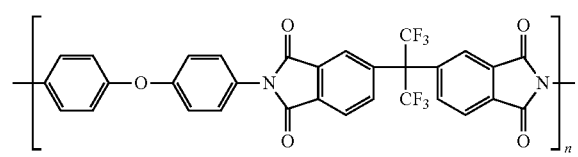

(6)

(7)
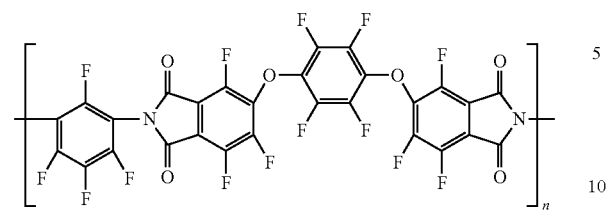

(8)
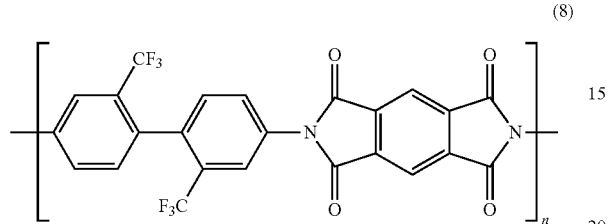

(9)
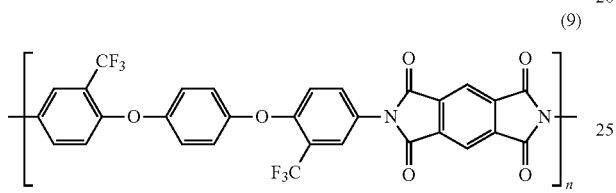

(10)
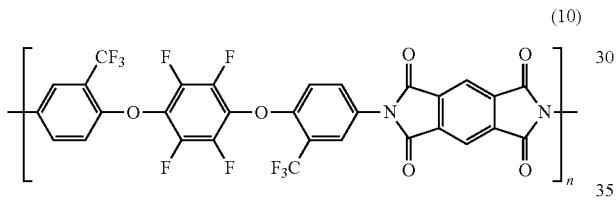

(11)
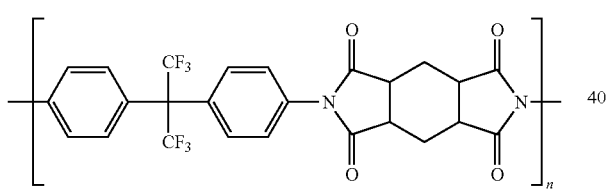

(12)
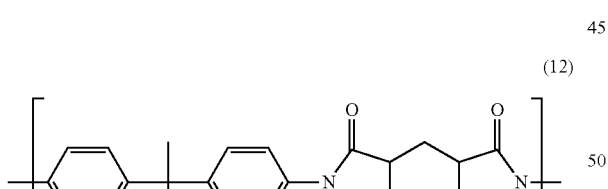

(13)
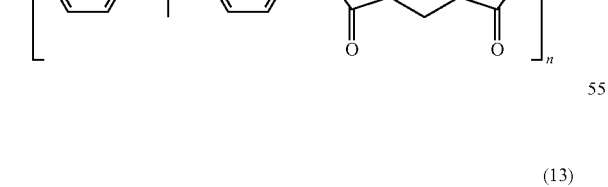

(14)
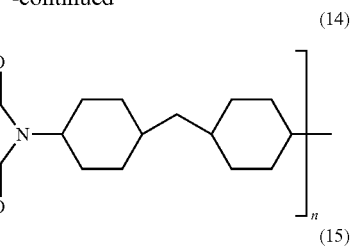

(15)
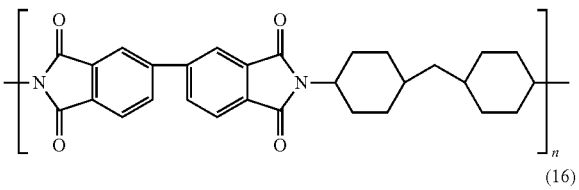

(16)
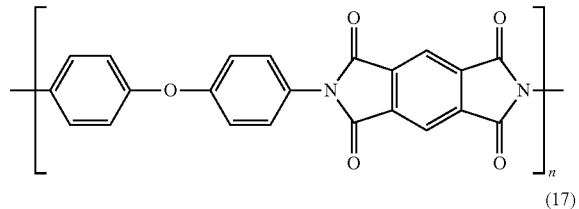

(17)
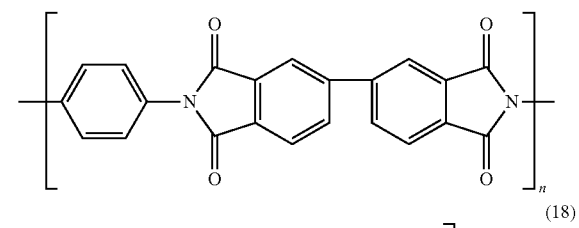

(18)
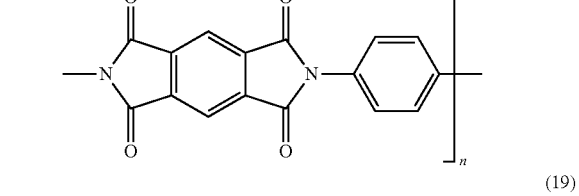

(19)
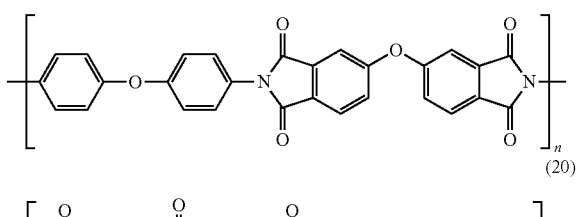

(20)
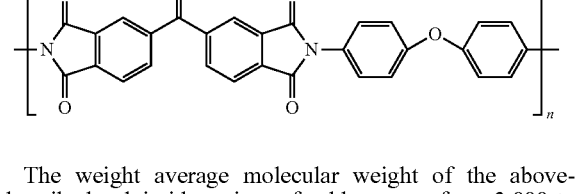

The weight average molecular weight of the above-described polyimide resin preferably ranges from 3,000 to 500,000 inclusive, more preferably from 5,000 to 300,000, and further preferably from 10,000 to 200,000 inclusive. In cases where the weight average molecular weight is 3,000 or more, the resin can have enough strength; in cases where the weight average molecular weight is 500,000 or less, the resin can prevent increase of viscosity and reduction of solubility, which in turn results in success to provide a film material with smooth surface and homogeneous film thickness. In this specification, the "weight average molecular weight" is measured by gel permeation chromatography (GPC) as a value in terms of polystyrene.

Among the above-described polyimide resins, the polyimide or polyamide resins having structures that inhibit intramolecular or intermolecular charge transfer are preferred due to the excellent transparency, specifically including the fluorinated polyimide resins represented by, for example, the above-described formulae (4) to (11), and the polyimide resins containing alicyclic structures represented by, for example, the above-described formulae (13) to (16).

Additionally, the fluorinated polyimide resins represented by, for example, the above-described formulae (4) to (11) each contain a fluorinated structure and thus have a high heat resistance, which protects a polyimide film composed of any of the polyimide resins from coloration by the heat generated during the synthesis and helps the polyimide film to maintain excellent transparency.

The concept of polyamide resin includes aromatic polyamides (aramids) as well as aliphatic polyamides. The polyamide resin generally refers to a resin having the backbone represented by the formula (21) or (22) below, and examples of the above-described polyamide resin include a compound represented by the formula (23) below. In the formula below, n represents the number of repeating units, which is an integer of 2 or more.

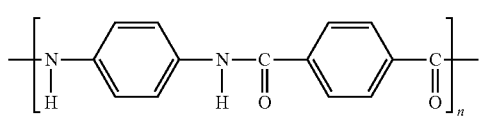
(21)

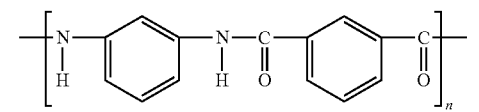
(22)

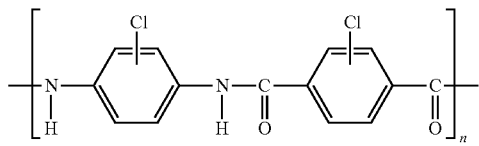
(23)

A commercially available base material may be used as a base material composed of the polyimide or polyamide resin represented by any of the above-described formulae (4) to (20) and (23). Examples of a commercially available base material composed of the above-described polyimide resin include Neopulim and the like manufactured by Mitsubishi Gas Chemical Company, Inc., while examples of a commercially available base material composed of the above-described polyamide resin include Mictron and the like manufactured by Toray Industries, Inc.

Additionally, a base material synthesized by a known method may be used as a base material composed of the polyimide or polyamide resin represented by any of the above-described formulae (4) to (20) and (23). For example, the polyimide resin represented by the above-described formula (4) is synthesized by a method described Japanese Patent Application Publication No. 2009-132091 and can be obtained, specifically, by a reaction of 4,4'-hexafluoropropylidenebisphthalic dianhydride (FPA) and 2,2'-bis(trifluoromethyl)-4,4'-diaminobiphenyl (TFDB), as represented by the formula (24) below.

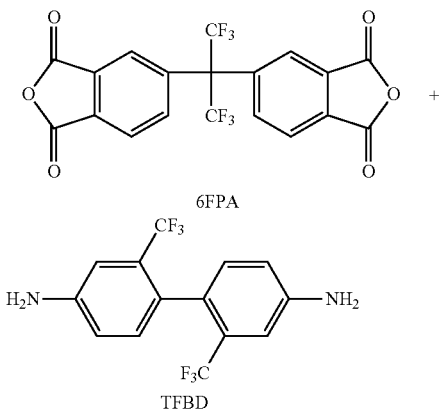
(24)

The weight average molecular weight of the above-described polyimide or polyamide resin preferably ranges from 3,000 to 500,000 inclusive, more preferably from 5,000 to 300,000, and further preferably from 10,000 to 200,000 inclusive. In cases where the weight average molecular weight is less than 3,000, the resin may not have enough strength; in cases where the weight average molecular weight is more than 500,000, the resin has an increased viscosity and a reduced solubility, which in turn may result in failure to provide a base material with smooth surface and homogeneous film thickness. In this specification, the "weight average molecular weight" is measured by gel permeation chromatography (GPC) as a value in terms of polystyrene.

Among the above-described polyimide and polyamide resins, the polyimide or polyamide resins having structures that inhibit intramolecular or intermolecular charge transfer are preferred due to the excellent transparency, specifically including the fluorinated polyimide resins represented by, for example, the above-described formulae (4) to (11), the polyimide resins containing alicyclic structures represented by, for example, the above-described formulae (13) to (16), and the halogenated polyamide resin represented by, for example, the above-described formula (23).

Additionally, the fluorinated polyimide resins represented by, for example, the above-described formulae (4) to (11) each contain a fluorinated structure and thus have a high heat resistance, which protects a base material composed of any of the polyimide resins from coloration by the heat generated during the synthesis of the polyimide resin and helps the polyimide resin to maintain excellent transparency.

For the light-transmitting base material 11, a base material composed of the fluorinated polyimide resin represented by, for example, any of the above-described formulae (4) to (11) or composed of halogenated polyamide resin represented by, for example, the above-described formula (23) is preferably used in terms of the ability to achieve excellent hardness. Among those base materials, a base material composed of the polyimide resin represented by the above-described formula (4) is more preferably used because use of the base material can provide very excellent hardness to the resulting optical film.

The thickness of the light-transmitting base material 11 is not limited to a particular thickness, and the thickness can be 3 μm or more and 500 μm or less; the minimum thickness of the light-transmitting base material 11 is 10 μm or more and 20 μm or more in ascending order of preference (a higher value is more preferred) from the viewpoint of, for example, handling properties. The maximum thickness of the light-transmitting base material 11 is 250 μm or less, 100 μm or less, 80 μm or less, 60 μm or less, or 40 μm or less in ascending order of preference (a lower value is more preferred) from the viewpoint of thinning the electroconductive film. The thickness of the light-transmitting base material can be measured by the same measurement method as for the film thickness of the below-described electroconductive part.

The light-transmitting base material 11 may have a surface treated by a physical treatment such as corona discharge treatment or oxidation treatment to improve the adhesiveness. Additionally, the light-transmitting base material 11 may have an underlayer on at least one surface for the purpose of improving adhesion to other layers, preventing the electroconductive film from sticking to itself when the electroconductive film is rolled, and/or inhibiting cissing of a coating liquid applied for forming another layer. In this specification, however, the underlayer provided on at least one surface of the light-transmitting base material and attached to the light-transmitting base material will be an integral part of the light-transmitting base material and will never be a part of the light-transmitting functional layer.

The underlayer contains, for example, an anchoring agent and/or a priming agent. As the anchoring agent and the priming agent, at least any of, for example, polyurethane resins, polyester resins, polyvinyl chloride resins, polyvinyl acetate resins, vinyl chloride-vinyl acetate copolymers, acrylic resins, polyvinyl alcohol resins, polyvinyl acetal resins, copolymers of ethylene and vinyl acetate or acrylic acid, copolymers of ethylene and styrene and/or butadiene, thermoplastic resins such as olefin resins and/or modified resins thereof, polymers of radiation-polymerizable compounds, polymers of thermopolymerizable compounds, and the like can be used.

The underlayer may contain particles of a lubricant or the like for the purpose of preventing the electroconductive film from sticking to itself when the electroconductive film is rolled, as described above. Examples of the particles include silica particles.

<<Light-Transmitting Functional Layer>>

The light-transmitting functional layer 12 is placed between the light-transmitting base material 11 and the electroconductive part 13. The term "light-transmitting functional layer" as used herein refers to a layer transmitting light and intended to achieve some functions in the electroconductive film. Specific examples of the light-transmitting functional layer include layers which exhibit functions, such as hard coat properties, refractive index modulation, and/or color modulation. The light-transmitting functional layer may have a monolayer structure or a multilayer structure composed of two or more laminated layers. In cases where the light-transmitting functional layer is a laminate composed of two or more layers, each layer may have the same or a different function. In this embodiment, the light-transmitting functional layer 12 is described as a layer having hard coat properties, namely a hard coat layer.

The light-transmitting functional layer 12 functions as a hard coat layer, as described above, and the light-transmitting functional layer 12 exhibits a hardness of "H" or harder in the pencil hardness test (at a load of 4.9 N) specified by JIS K5600-5-4: 1999. By limiting the pencil hardness to a hardness of "H" or harder, the resulting electroconductive film 10 can have sufficient hardness and increase durability. The maximum pencil hardness of the surface 13A of the electroconductive part 13 is preferably around 4 H in terms of the toughness of the light-transmitting functional layer and from the viewpoint of inhibiting curling.

The light-transmitting functional layer 12 preferably has a film thickness of 0.5 μm or more and 15 μm or less. By limiting the film thickness to a value within the above range, the light-transmitting functional layer 12 can achieve a desired hardness. The film thickness of the light-transmitting functional layer can be measured by the same measurement method as for the film thickness of the below-described electroconductive part. The minimum film thickness of the light-transmitting functional layer 12 is 1 μm or more, 1.5 μm or more, or 2 μm or more in ascending order of preference (a higher value is more preferred) from the viewpoint of inhibiting curling. Additionally, the maximum film thickness of the light-transmitting functional layer 12 is 12 μm or less, 10 μm or less, 7 μm or less, or 5 μm or less in ascending order of preference (a lower value is more preferred) from the viewpoint of inhibiting cracks from occurring in the light-transmitting functional layer.

The light-transmitting functional layer 12 can be composed of at least a light-transmitting resin. The light-transmitting functional layer 12 may additionally contain inorganic particles, organic particles, and a leveling agent, in addition to a light-transmitting resin.

<Light-Transmitting Resin>

The light-transmitting resin in the light-transmitting functional layer 12 includes resins containing a polymer (a cured or cross-linked product) of a polymerizable compound. The light-transmitting resin may contain a resin which cures by solvent evaporation, in addition to a polymer of a polymerizable compound. Examples of the polymerizable compound include radiation-polymerizable compounds and/or thermopolymerizable compounds.

The radiation-polymerizable compound refers to a compound having at least one radiation-polymerizable functional group in one molecule. The term "radiation-polymerizable functional group" as used herein refers to a functional group which can undergo radiation-induced polymerization. Examples of the radiation-polymerizable functional groups include ethylenic unsaturated groups such as (meth)acryloyl group, vinyl group, and allyl group. Both "acryloyl group" and "methacryloyl group" are meant by the word "(meth)acryloyl group." In addition, the types of ionizing radiation applied to induce polymerization of a radiation-polymerizable compound include visible light, ultraviolet light, X ray, electron beam, α ray, β ray, and γ ray.

Examples of the radiation-polymerizable compound include radiation-polymerizable monomers, radiation-polymerizable oligomers, and radiation-polymerizable prepolymers; these compounds can be used as appropriate. A combination of a radiation-polymerizable monomer and a radiation-polymerizable oligomer or prepolymer is preferred as the radiation-polymerizable compound.

Examples of the radiation-polymerizable monomer include monomers containing a hydroxyl group(s), such as 2-hydroxyethyl (meth)acrylate, 2-hydroxypropyl (meth)acrylate, and 2-ethylhexyl (meth)acrylate; and (meth)acrylate esters, such as ethylene glycol di(meth)acrylate, diethylene glycol di(meth)acrylate, triethylene glycol di(meth)acrylate, tetraethylene glycol di(meth)acrylate, tetramethylene glycol di(meth)acrylate, trimethylolpropane tri(meth)acrylate, trimethylolethane tri(meth)acrylate, pentaerythritol di(meth)acrylate, pentaerythritol tri(meth)acrylate, pentaerythritol tetra(meth)acrylate, dipentaerythritol tetra(meth)acrylate, dipentaerythritol hexa(meth)acrylate, and glycerol (meth)acrylate.

A polyfunctional oligomer having two or more functional groups, for example a polyfunctional oligomer having three or more radiation-polymerizable functional group (i.e., tri-functional or higher), is preferred as the radiation-polymerizable oligomer. Examples of the above-described polyfunctional oligomer include polyester (meth)acrylate, urethane (meth)acrylate, polyester-urethane (meth)acrylate, polyether (meth)acrylate, polyol (meth)acrylate, melamine (meth)acrylate, isocyanurate (meth)acrylate, and epoxy (meth)acrylate.

The radiation-polymerizable prepolymer has a weight average molecular weight of more than 10,000, preferably a weight average molecular weight of 10,000 or more and 80,000 or less, and more preferably a weight average molecular weight of 10,000 or more and 40,000 or less. In cases where the weight average molecular weight is more than 80,000, the radiation-polymerizable prepolymer has a high viscosity and thus reduces the suitability as a coating material, which may deteriorate the appearance of the resulting light-transmitting resin. Examples of the polyfunctional prepolymer include urethane (meth)acrylate, isocyanurate (meth)acrylate, polyester-urethane (meth)acrylate, and epoxy (meth)acrylate.

The thermopolymerizable compound refers to a compound having at least one thermopolymerizable functional group in one molecule. The term "thermopolymerizable functional group" as used herein refers to a functional group which can undergo heat-induced polymerization with the same type of functional group or with other types of functional groups. Examples of the thermopolymerizable functional group include hydroxyl group, carboxyl group, isocyanate group, amino group, cyclic ether group, and mercapto group.

The thermopolymerizable compound is not limited to a particular thermopolymerizable compound, and examples of the thermopolymerizable compound include epoxy compounds, polyol compounds, isocyanate compounds, melamine compounds, urea compounds, and phenol compounds.

The resin which cures by solvent evaporation refers to a resin, such as a thermoplastic resin, which forms a coat film when a solvent added to the resin for adjusting the content of solids for coating process is evaporated. In the preparation of the light-transmitting functional layer 12, addition of a resin which cures by solvent evaporation can effectively prevent failure in coating on a surface where a coating liquid is applied. The resin which cures by solvent evaporation is not limited to a particular resin, and a thermoplastic resin can generally be used as the resin which cures by solvent evaporation.

Examples of the thermoplastic resin can include styrene resins, (meth)acrylic resins, vinyl acetate resins, vinyl ether resins, halogen-containing resins, alicyclic olefin resins, polycarbonate resins, polyester resins, polyamide resins, cellulose derivatives, silicone resins, and rubber or elastomer materials.

The thermoplastic resin is preferably amorphous and soluble in an organic solvent (particularly, a solvent which can generally dissolve plural polymers or curable compounds). In particular, for example, styrene resins, (meth)acrylic resins, alicyclic olefin resins, polyester resins, and cellulose derivatives (such as cellulose esters) are preferred in terms of transparency and/or weather resistance.

<Inorganic Particles>

The inorganic particles are a component intended to increase the mechanical strength and pencil strength of the light-transmitting functional layer 12, and examples of the inorganic particles include inorganic oxide particles, such as silica ($SiO_2$) particles, alumina particles, titania particles, tin oxide particles, antimony-doped tin oxide (abbreviation: ATO) particles, and zinc oxide particles. Among those particles, silica particles are preferred from the viewpoint of further increasing the hardness. Examples of the silica particles include spherical silica particles and differently shaped silica particles; among those silica particles, differently shaped silica particles are preferred. In this specification, the "spherical particle" refers to, for example, a spherical or ellipsoidal particle, while "deformed particle" refers to a particle with a randomly rough surface as observed on potato tubers. The surface area of the above-described deformed shaped particle is larger than that of a spherical particle, and the presence of such deformed particles thus increases the contact area with, for example, the above-described polymerizable compound and successfully improves the pencil hardness of the light-transmitting functional layer 12 to a higher level. Observation of a cross-section of the light-transmitting functional layer 12 with a transmission electron microscope (TEM) or a scanning transmission electron microscope (STEM) can confirm whether the silica particles contained in the light-transmitting functional layer 12 are deformed silica particles or not. In cases where spherical silica particles are used, spherical silica particles with smaller particle diameters lead to higher hardness in the light-transmitting functional layer. On the other hand, deformed silica particles can achieve a hardness equivalent to that of commercially available spherical silica particles with the smallest particle diameter even if those deformed silica particles are not as small as those spherical silica particles.

The average primary particle diameter of the deformed silica particles is preferably 1 nm or more and 100 nm or less. Even if deformed silica particles have an average primary particle diameter within the above-described range, the deformed silica particles can achieve a hardness equivalent to that of spherical silica particles with an average primary particle diameter of 1 nm or more and 45 nm or less. The average primary particle diameter of deformed silica particles is determined as the arithmetic mean of the particle diameters of 20 particles, wherein each particle diameter is obtained as the average between the maximum (major axis) and the minimum (minor axis) values of the distance between two points on the circumference of each particle measured on a cross-sectional image of a light-transmitting functional layer acquired using a transmission electron microscope (TEM) or a scanning transmission electron microscope (STEM). Additionally, the average particle diameter of spherical silica particles is determined as the arithmetic mean of the particle diameters of 20 particles, wherein the particle diameters of 20 particles are measured on cross-sectional images of particles acquired using a transmission electron microscope (TEM) or a scanning transmission electron microscope (STEM) at a magnification of 10,000 to 100,000 times. When cross-sections are imaged using a scanning transmission electron microscope (STEM) (product name "S-4800 (Type 2)"; manufactured by Hitachi High-Technologies Corporation), the cross-sections are observed by setting the detector switch (signal selection) to "TE," the accelerating voltage to "30 kV," and the emission current to "10 µA." As other imaging conditions for acquiring images of cross-sections by STEM, the below-described conditions can be referenced. Additionally, the average primary particle diameter can be determined by binarizing and calculating the image data as described below.

The content of inorganic particles in the light-transmitting functional layer 12 is preferably 20% by mass or more and 70% by mass or less. In cases where the content of inorganic particles is less than 20% by mass, securing a sufficient hardness is challenging; additionally, in cases where the content of inorganic particles is more than 70% by mass, the filling ratio is increased excessively, which reduces the adhesion between the inorganic particles and the resin component and conversely results in reduced hardness of the light-transmitting functional layer.

As the inorganic particles, inorganic particles having photopolymerizable functional groups on the surface (reactive inorganic particles) are preferably used. Such inorganic particles having photopolymerizable functional groups on the surface can be produced by surface treatment of inorganic particles with, for example, a silane coupling agent. Examples of the method of treating the surface of inorganic particles with a silane coupling agent include a dry method in which the silane coupling agent is sprayed over the inorganic particles, and a wet method in which the inorganic particles are dispersed in a solvent and the silane coupling agent is then added to the solvent and allowed to react with the inorganic particles.

<Organic Particles>

The organic particles are also a component intended to increase the mechanical strength and pencil strength of the light-transmitting functional layer 12, and examples of the organic particles include plastic beads. Specific examples of the plastic beads include polystyrene beads, melamine resin beads, acrylic beads, acrylic-styrene beads, silicone beads, benzoguanamine beads, benzoguanamine-formaldehyde condensation beads, polycarbonate beads, and polyethylene beads.

<<Electroconductive Part>>

The electroconductive part 13 comprises a light-transmitting resin 15 and plural electroconductive fibers 16 incorporated in the light-transmitting resin 15, as shown in FIG. 2. The term "electroconductive part" as used herein refers to a layer containing electroconductive fibers, which are found by observing a cross-section of the electroconductive film with a scanning transmission electron microscope (STEM) or a transmission electron microscope (TEM). If the boundary surface of the electroconductive part is hard to be observed, the surface of the electroconductive part should undergo any pretreatment process commonly used for electron microscopy, such as formation of a metal layer of Pt—Pd, Au, or the like by sputtering. Additionally, the whole electroconductive film may be embedded in a resin and then stained with osmium tetraoxide, ruthenium tetraoxide, phosphotungstic acid, or the like because such staining enables easier observation of the interface between organic layers. Additionally, the term "electroconductive fiber" as used herein refers to a fiber having electrical conductivity and a length much longer than the thickness (for example, the diameter); for example, the electroconductive fiber will include a fiber having electrical conductivity and a length that is approximately equal to or more than five times as long as the thickness. Additionally, the term "electroconductive part" refers a part comprising a light-transmitting resin and plural electroconductive fibers incorporated in the light-transmitting resin and being capable of conducting electricity from the surface, and the concept includes both layered and non-layered structures. Additionally, as shown in FIG. 3, the light-transmitting resin 15 in the electroconductive part 13 may be communicated with the light-transmitting resin 15 in the nonconductive part 15. The electroconductive part 13 preferably further comprises a reaction inhibitor which is contained in the light-transmitting resin 15.

The electroconductive part 13 can conduct electricity from the surface 13A of the electroconductive part 13. Measurement of the surface resistance value of an electroconductive part can determine whether or not the electroconductive part can conduct electricity from the surface of the electroconductive part. The method of measuring the surface resistance value of an electroconductive part will be described hereinafter and the description of the method is omitted here. In cases where the arithmetic mean of the surface resistance values of an electroconductive part is less than $1 \times 10^6 \Omega/\square$, the electroconductive part can be determined to conduct electricity from the surface. Although a majority of the electroconductive fibers 16 are distributed from the position HL, which is located at half the film thickness of the electroconductive part 13, to the light-transmitting base material 11, as described below, the remaining electroconductive fibers 16 are stacked on the electroconductive fibers 16 which are distributed on the light-transmitting base material 11 side, and consequently distributed from the position HL, which is located at half the film thickness of the electroconductive part 13, to the surface 13A, and also exposed on the surface 13A of the electroconductive part 13. Thus, the electroconductive part 13 can conduct electricity from the surface 13A.

In the electroconductive part 13, the electroconductive fibers 16 are unevenly distributed on the light-transmitting base material 11 side than the position HL, which is located at half the film thickness of the electroconductive part 13 (the light-transmitting resin 15), as shown in FIG. 2. The determination of whether or not the electroconductive fibers 16 are unevenly distributed on the light-transmitting base material 11 side than the position HL, which is located at half the film thickness of the electroconductive part 13, can be achieved as follows. First, samples for observing a cross-section are prepared from an electroconductive film. More specifically, a cut piece of electroconductive film having a size of 2 mm×5 mm is placed in an embedding plate made of silicone, into which an epoxy resin is later poured to embed the whole electroconductive film in the resin. Then, the embedding resin is left to stand at 65° C. for 12 hours or longer and cured. Subsequently, ultra-thin sections are prepared using an ultramicrotome (product name "Ultra-microtome EM UC7"; manufactured by Leica Microsystems GmbH) at a feeding rate of 100 nm. The prepared ultra-thin sections are collected on collodion-coated meshes (150 meshes) to obtain STEM samples. If these samples conduct no electricity, images observed by STEM will appear blurry. Thus, the samples are preferably sputtered with Pt—Pd for about 20 seconds. The sputtering time can be appropriately adjusted but needs careful attention; a period of 10 seconds is too short, and a period of 100 seconds is so long that the metal used for sputtering is observed as particulate foreign bodies. Then, a cross-sectional image of the electroconductive part in a STEM sample is photographed using a scanning transmission electron microscope (STEM) (product name "S-4800 (Type 2)"; manufactured by Hitachi High-Technologies Corporation). The cross-section is observed and imaged under STEM at a magnification of 5,000 to 200,000 times by setting the detector switch (signal selection) to "TE," the accelerating voltage to "30 kV," and the emission current to "10 μA," and appropriately adjusting the focus, contrast, and brightness so that each layer can be identified. The magnification is preferably in the range from 10,000 to 100,000 times, more preferably in the range from 10,000 to 50,000 times, and most preferably in the range from 25,000 to 50,000 times. The cross-section may be imaged by additionally setting the beam monitor aperture to 3 and the objective lens aperture to 3, and also setting the WD to 8 mm. Then, the cross-sectional images at 10 locations photographed as described above are prepared. Upon completion of photographing the cross-sectional images of the electroconductive part, the position located at half the film thickness of the electroconductive part is determined on each cross-sectional image. Then, it is determined whether or not electroconductive fibers appearing on each cross-sectional image are distributed on the light-transmitting base material side than the half-length position. Specifically, first of all, electroconductive fibers in the above-described electron microscopic cross-sectional images of the electroconductive part are visualized as darker areas (for example, in black) compared to the light-transmitting resin, so that electroconductive fibers can be identified in the cross-sectional images of the electroconductive part. Meanwhile, by enlarging each cross-sectional image, pixels that make up the image become visible. All pixels are the same size and are arranged into a grid (lattice). The numbers of pixels covering the electroconductive fibers distributed on the the light-transmitting base material side than the above-described half-length position and covering the electroconductive fibers distributed on the surface side of the electroconductive part than the above-described half-length position are counted in each cross-sectional image to determine the ratio of the number of pixels covering the electroconductive fibers distributed on the the light-transmitting base material side than the above-described half-length position relative to the total number of pixels covering the electroconductive fibers. In this respect, for the pixels covering an electroconductive fiber, each pixel on the line running through the above-described half-length position will be divided into a portion located on the light-transmitting base material side than the above-described half-length position and the remaining portion located on the surface side of the electroconductive part than the above-described position, to divide one pixel based on the area ratio between the divided portions. Then, the above-described ratio determined from the cross-sectional images is determined as the existence ratio of electroconductive fibers distributed on the light-transmitting base material side than the position located at half the film thickness of the electroconductive part. In cases where the existence ratio is 55% or more, the electroconductive fibers are determined to be unevenly distributed on the light-transmitting base material side than the position located at half the film thickness of the electroconductive part. The existence ratio should be the arithmetic mean of the existence ratio values determined from the cross-sectional images. Incidentally, a low surface resistance value represents even distribution of electroconductive fibers in an electroconductive part. Therefore, the existence ratio of electroconductive fibers determined using cross-sectional images of a portion of the electroconductive part is considered as the existence ratio of electroconductive fibers in the whole electroconductive part. The existence ratio of electroconductive fibers distributed on the light-transmitting base material side than the position located at half the film thickness of the electroconductive part, which is determined from the above-described cross-sectional images, is preferably 70% or more, more preferably 80% or more.

The determination of whether or not the electroconductive fibers 16 are unevenly distributed on the light-transmitting base material 11 side than the position HL, which is located at half the film thickness of the electroconductive part 13, can also be achieved as follows. First, a first sample of the electroconductive film in which a metal layer of Pt—Pd, Pt, Au, or the like has been formed by sputtering on the surface of the electroconductive part and a second sample of the same electroconductive film in which a metal layer is not formed on the surface are prepared. Then, the film thickness of the electroconductive part 13 is determined using the first sample by the below-described measurement method. Additionally, the second sample is used to photograph cross-sectional images of the electroconductive part by the above-described method, and the photographed cross-sectional image data is loaded to and binarized by image analysis and measurement software (product name "WinROOF Version 7.4"; manufactured by Mitani Corporation). In STEM observations, the difference in intensity of the transmitted electron beam produces image contrast. Metals having high density are hard to transmit a beam of electrons and thus are visualized in black, and organic materials, which have a lower density than metals, are visualized in white. Thus, the portions visualized in black are determined as electroconductive fibers and the remaining portions visualized in gray to white in the image data are determined as a light-transmitting resin. Accordingly, in cases where the ratio of a black-colored area in the area located on the light-transmitting base material side than the position located at half the film thickness of the electroconductive part is larger than the ratio of a black-colored area in the area located on the surface side of the electroconductive part than the above-described half-length position, the electroconductive fibers 16 can be determined to be unevenly distributed on the light-transmitting base material side than the position HL, which is located at half the film thickness of the electroconductive part 13. The portions visualized in black can be extracted based on the luminance. Additionally, the difference in contrast between images of metals and organic materials is so clear that the area of each portion can be determined by an automated area measurement system alone.

The above-described binarization-mediated area measurement is performed as follows. First, a cross-sectional image is loaded to the above-described software and displayed on the image window of the software program. Then, either below or above the position located at half the film thickness in ROI (processing area) as subjects of image processing are selected in the image window and then binarized to calculate the total areas covered by electroconductive fibers. The selection of a processing area is carried out by clicking the rectangular ROI selection button in the image tool bar and setting a rectangular ROI in the image window. The above-described software outputs each measured value in pixel unit, which can be converted and outputted as a real length after calibration. When an area ratio is calculated, the measured value in pixel unit is not needed to be converted to a real length for the purpose of determining whether or not electroconductive fibers are unevenly distributed on the light-transmitting base material side, but calibration is required for measuring the surface resistance value and the haze value and for imaging the presence of fibers in the electroconductive film. Each STEM image displays a scale, which can be used to perform the ROI calibration. Specifically, the line ROI selection button in the image tool bar is clicked to draw a line having a length equal to the scale displayed in each STEM image, and the calibration dialog box is then displayed to choose the drawn line and to input the length value of the scale displayed in the STEM image and the unit for the length value. In binarization, the areas covering electroconductive fibers are separated from other areas. Specifically, binarization with two thresholds is selected from the menu of binarization. Because each electroconductive fiber has a high density and is visualized in black and the remaining region is visualized in white to gray, appropriately selected two density (brightness) thresholds (for example, 0 and 80) are inputted to perform binarization with two thresholds. If the area covered by electroconductive fibers in an actual STEM image does not exactly match with the area covered by the same electroconductive fibers (colored in, for example, green) in a binarized image produced by applying the thresholds to convert the image into two colors, the binarized image is corrected by appropriately changing the values of the thresholds until a binarized image most closely resembling the STEM image is obtained. For example, the difference between the STEM image and the binarized image can be appropriately corrected by the fill function and/or the delete function selected from the binarization menu. Any uncolored area inside or any excess colored area outside a binarized electroconductive fiber identified by the comparison with the same actual electroconductive fiber will be filled with a color or deleted. For the addition or deletion of a colored area, an area of interest can be filled with a color or be deleted by adjusting the threshold value for the area. Clicking an area to be deleted gives a threshold value suitable for deleting the area. The binarized image would be corrected as much as possible by other functions in the binarization menu as necessary, so that the resulting binarized image is matched with the STEM image. Additionally, an excess colored area in the binarized image can also be manually selected and deleted using the eraser tool button. In addition, an area can also be filled with a color for correction using the pen tool button through manual painting in the window. Upon completion of this task, one of the shape features in the analysis menu is selected to choose areas to be measured. The summed areas of electroconductive fibers can be determined, as well as the area of each of the electroconductive fibers is measured. By the above-described operation, the total areas below and above the position located at half the film thickness of the electroconductive layer are determined, and the areas of the ROIs located below and above the position at half the film thickness are further determined by manual measurement, and the above-described ratio is thereby calculated. The manual measurement can be performed by selecting the line length measurement function from the manual measurement functions in the analysis menu and choosing all the line length measurement items. Tools in the line length tool palette can be appropriately used to measure the length of a line and the area of a ROI selected by dragging the cursor from a start point to an end point with a mouse button. The details of the task will be according to the WinROOF Version 7.4 Users Manual.

The electroconductive part 13 has a surface resistance value of 200Ω/□ or less. In cases where the electroconductive part 13 has a surface resistance value of more than 200Ω/□, particularly problems such as slow response speed may occur in touch panel applications. The surface resistance value of the electroconductive part 13 is a surface resistance value measured on the surface 13A of the electroconductive part 13. The surface resistance can be measured using either a contact-type resistivity meter (product name "Loresta-AX MCP-T370"; Manufactured by Mitsubishi Chemical Analytech Co., Ltd., Type of sensor: ASP-probe) according to JIS K7194: 1994 (Testing method for resistivity of conductive plastics with a four-point probe array) or a non-destructive (based on the eddy current method) resistivity meter (product name "EC-80P"; manufactured by Napson Corporation; https://www.napson.co.jp/wp/wp-content/uploads/2016/08/Napson_EC80P_leaflet_160614.pdf), and preferably measured using a non-destructive resistivity meter, which can accurately measure the surface resistance independently of the film thickness of an electroconductive part. The non-destructive resistivity meter can start measurement at an arbitrary position on a sample by simple contact of a probe with the sample and without damaging the sample. From this point, it may be referred to as non-contact-type resistivity meter. The surface resistance value of an electroconductive part should be measured with a non-destructive resistivity meter by placing a cut piece of the electroconductive film having a size of 80 mm×50 mm on a flat glass plate with the electroconductive part facing upward and bring a probe into contact with the electroconductive part. For the measurement of surface resistance value with the EC-80P, the type SW2 is selected and the mode M-H sheet resistance (Ω/□) measurement is selected. Additionally, a probe can be easily switched with another type of probe depending on the range of measurement, and probes for the measurement ranges from 10 to 1000Ω/□ and from 0.5 to 10Ω/□ are used in the present embodiment. A resistivity meter EC-80P-PN (manufactured by Napson Corporation) can be used instead of a resistivity meter EC-80P to perform the measurement in the same manner, and P-type conduction may be selected from P-type and N-type conductions for the measurement using this instrument. Additionally, the surface resistance value of an electroconductive part should be measured with a contact-type resistivity meter by placing a cut piece of the electroconductive film having a size of 80 mm×50 mm on a flat glass plate with the electroconductive part facing upward and then placing an ASP-probe on the center of the electroconductive part and evenly pressing all the electrode pins on the electroconductive part. For the measurement of surface resistance value with the contact-type resistivity meter, the mode "Ω/□" as a sheet resistance measurement mode is selected. Once the start button is pushed and the instrument is held, the result of the measurement will be displayed. The measurement of surface resistance value should be performed in an environment at a temperature of 23° C. and a relative humidity of 55% independently of the type of a resistivity meter. Additionally, although an electroconductive film to be measured for surface resistance value is placed on a horizontal benchtop, independently of the type of a resistivity meter, to perform the measurement on a flat and even surface, a curled electroconductive film that is unable to keep the surface evenly flat should be fixed with tape or the like on a glass plate to perform the measurement. Three measurement locations are in the central part of the electroconductive film and the arithmetic mean of the surface resistance values at the three locations is determined as the surface resistance value. In this respect, the number of measurement location is 1, 5, or 9 in cases of totally following JIS K7194: 1994. However, once the electroconductive film is actually cut into a size of 80 mm×50 mm and measured as shown in FIG. 5 in JIS K7194: 1994, the electroconductive film may give variable measurement values. Thus, the measurement should be performed on three locations in the central part of the electroconductive part, differing from JIS K7194: 1994. For example, the surface resistance value is measured at the position 1, at a position located between the positions 1 and 7 (preferably, a position close to the position 1), and at a position located between the positions 1 and 9 (preferably, a position close to the position 1) shown in FIG. 5 in JIS K7194: 1994. The preference of a position near the central a sample for the measurement of surface resistance value is also reported in Daichi Isaka and a coworker, "Resistivity measurements for conducting thin films by four-point probe method electroconductive," The Tokyo branch Students' Conference, the Institute of Electronics, Information, and Communication Engineers, 2009 (https://www.ieice.org/tokyo/gakusei/kenkyuu/14/pdf/120.pdf). The minimum surface resistance value of the electroconductive film 10 is 1Ω/□ or more, 5Ω/□ or more, or 10Ω/□ or more in ascending order of preference (a higher value is more preferred), while the maximum surface resistance value of the electroconductive film 10 is 100Ω/□ or less, 70Ω/□ or less, 60Ω/□ or less, or 50Ω/□ or less in ascending order of preference (a lower value is more preferred).

The electroconductive part 13 preferably has a film thickness of less than 300 nm. In cases where the electroconductive part 13 has a film thickness of 300 nm or more, the film thickness of the light-transmitting resin 15 is accordingly too thick and all the electroconductive fibers are covered with the light-transmitting resin, so that it is likely that none of the electroconductive fibers are exposed on the surface of the electroconductive part and no electricity is conducted from the surface of the electroconductive part. The thicker the film thickness of the electroconductive part is, the more frequently the electroconductive fibers overlap with each other and a low surface resistance value of 1Ω/□ or more and 10Ω/□ or less can be achieved. However, excessive overlap of the electroconductive fibers may result in difficulty in maintenance of a low haze value. Thus, the film thickness is preferably 300 nm or less. The electroconductive part is preferably a thin film in terms of optical properties and from the viewpoint of thinning the electroconductive film, as long as it can maintain a low surface resistance value. The maximum film thickness of the electroconductive part 13 is 145 nm or less, 140 nm or less, 120 nm or less, 110 nm or less, 80 nm or less, or 50 nm or less in ascending order of preference (a lower value is more preferred) from the viewpoint of thinning the electroconductive film and obtaining excellent optical properties such as a low haze value. Additionally, the minimum film thickness of the electroconductive part 13 is preferably 10 nm or more. In cases where the electroconductive part has a film thickness of less than 10 nm, the film thickness of the light-transmitting resin 15 is accordingly too thin, so that it is likely that some electroconductive fibers are removed from the electroconductive part, or the durability of the electroconductive part is reduced, or the abrasion resistance is reduced. Additionally, each electroconductive fiber preferably has a relatively large fiber diameter to control the instabilities, such as higher tendency for breakage. The fiber diameter that allows each electroconductive fiber to keep stably its form is considered to be 10 nm or more or 15 nm or more. On the other hand, the minimum film thickness of the electroconductive part 13 is more preferably 20 nm or more or 30 nm or more because two or more electroconductive fibers are desired to overlap with and contact with each other to obtain stable electrical conductivity.

The film thickness of the electroconductive part 13 is determined as the arithmetic mean of the thickness values measured at randomly selected 10 locations, wherein the thickness values are determined at the 10 locations in cross-sectional images of the electroconductive part photographed using a scanning transmission electron microscope (STEM) or a transmission electron microscope (TEM). A specific method of photographing cross-sectional images will be described below. First, samples for observing a cross-section are prepared from an electroconductive film by the same method as described above. If these samples conduct no electricity, images observed by STEM will appear blurry. Thus, the samples are preferably sputtered with Pt—Pd for about 20 seconds. The sputtering time can be appropriately adjusted but needs careful attention; a period of 10 seconds is too short, and a period of 100 seconds is so long that the metal used for sputtering is observed as particulate foreign bodies. Then, a cross-sectional image of a STEM sample is photographed using a scanning transmission electron microscope (STEM) (product name "S-4800 (Type 2)"; manufactured by Hitachi High-Technologies Corporation). The cross-section is observed and imaged under STEM by setting the detector switch (signal selection) to "TE," the accelerating voltage to "30 kV," and the emission current to "10 μA." The focus, contrast, and brightness are appropriately adjusted at a magnification of 5,000 to 200,000 times so that each layer can be identified. The magnification is preferably in the range from 10,000 to 100,000 times, more preferably in the range from 10,000 to 50,000 times, and most preferably in the range from 25,000 to 50,000 times. The cross-section may be imaged by additionally setting the beam monitor aperture to 3 and the objective lens aperture to 3, and also setting the WD to 8 mm. For the measurement of the film thickness of the electroconductive part, it is important that the contrast at the interface between the electroconductive part and another layer (such as the light-transmitting functional layer or the embedding resin) can be observed as clearly as possible upon observation of a cross-section. If the interface is hard to be observed due to a lack of contrast, the surface of the electroconductive part may undergo any pretreatment process commonly used for electron microscopy, such as formation of a metal layer of Pt—Pd, Pt, Au, or the like by sputtering. In addition, the sample may be stained with osmium tetraoxide, ruthenium tetraoxide, phosphotungstic acid, or the like because such staining enables easier observation of the interface between organic layers. Additionally, the contrast of the interface may be hard to be observed at a higher magnification. In that case, the sample is also observed at a lower magnification at the same time. For example, a pair of magnifications consisting of a higher magnification and a lower magnification, such as 25,000 and 50,000 times or 50,000 and 100,000 times, is used for observation to obtain the above-described arithmetic means at both the magnifications, and the further averaged value is determined as the film thickness of the electroconductive part.

As described below, the electroconductive part 13 is prepared by applying, drying, and curing a light-transmitting resin composition containing a polymerizable compound to form the light-transmitting resin 16 on a cured coating film of an electroconductive fiber-containing composition containing the electroconductive fibers 16; in cases, for example, where an electroconductive part is prepared only by applying and drying an electroconductive fiber-containing composition containing electroconductive fibers, the film thickness of the electroconductive part can be simply obtained from the amount of the applied electroconductive fiber-containing composition by using the following theoretical formula (see, for example, https://www.nipponpaint.co.jp/biz1/large/pdf/tech04.pdf):

$$T = \frac{X}{dp} - \frac{X(1-NV)}{ds}$$

In the above-described formula, T represents the dry film thickness (μm) of an electroconductive part; X represents the theoretical amount (g/m$^2$) of an applied electroconductive fiber-containing composition to obtain a dry film thickness of T (μm); dp represents the specific gravity of the electroconductive fiber-containing composition; ds represents the specific gravity of the volatile component in the electroconductive fiber-containing composition; and NV represents the ratio of the non-volatile component in the electroconductive fiber-containing composition (a ratio by weight).

The electroconductive part 13 preferably contains no particles, such as inorganic particles, having a particle size larger than the film thickness of the light-transmitting resin 15. If the electroconductive part contains such particles, some of the particles are protruded from the surface of the light-transmitting resin and cause to increase the film thickness of the electroconductive part. In this respect, if a particle is protruded from the surface of the light-transmitting resin, the film thickness of the electroconductive part is determined as the distance from the surface of the electroconductive part on the side of the light-transmitting base material to the top of the particle. Additionally, the electroconductive part 13 more preferably contains no particles, such as inorganic particles, regardless of the size of the particles. However, for example, metallic core particle residues obtained during an intermediate process to prepare electroconductive fibers 16 or any modifying materials for the electroconductive fibers are considered as an integral part of the electroconductive fibers and, thus, should not be included in the above-described particles.

The electroconductive part 13 preferably has a Martens hardness of 970 N/mm$^2$ or more and 1050 N/mm$^2$ or less at an indentation amount of 10 nm from the surface 13A. Additionally, the electroconductive part 13 preferably has a Martens hardness of 130 N/mm$^2$ or more and 300 N/mm$^2$ or less at an indentation amount of 100 nm from the surface 13A. In general, the indentation amount is preferably within 10% of the film thickness of a measurement subject for the measurement with a microhardness tester. That is, the Martens hardness at a position of 10 nm in the present embodiment means the exact hardness of the electroconductive part, wherein the value of the hardness is hardly influenced by the layer beneath the electroconductive part. Additionally, the Martens hardness at a position of 100 nm means the hardness of the electroconductive part required in a film product since the electroconductive part is typically not provided alone but provided as a film comprising the electroconductive part and various layers, such as a base material, laminated on the lower side, depending on the type of a product. The resulting electroconductive film will be hardly broken or cracked, as long as the electroconductive part satisfies the above-described Martens hardness requirement even if any layer is deposited below the electroconductive part.

In cases where the Martens hardness of the electroconductive part 13 at the above-described indentation amount of 10 nm is less than 970 N/mm$^2$, the electroconductive part may be easily damaged during the production process for an electroconductive film; additionally in cases where the above-described Martens hardness is more than 1050 N/mm$^2$, etching rate for forming a pattern on the electroconductive part may be slowed down or the electroconductive film may be cracked when folded. In the electroconductive part 13, the minimum Martens hardness at the above-described indentation amount of 10 nm is 980 N/mm$^2$ or more, 1000 N/mm$^2$ or more, or 1015 N/mm$^2$ or more in ascending order of preference (a higher value is more preferred); the maximum Martens hardness at the above-described indentation amount of 10 nm is 1040 N/mm$^2$ or less, 1030 N/mm$^2$ or less, or 1020 N/mm$^2$ or less in ascending order of preference (a lower value is more preferred). Additionally, in cases where the Martens hardness at the above-described indentation amount of 100 nm is less than 130 N/mm$^2$, the electroconductive film may be easily fractured; additionally, in cases where the Martens hardness is more than 150 N/mm$^2$, the electroconductive film may be broken when folded. In the electroconductive part 13, the minimum Martens hardness at the above-described indentation amount of 100 nm is 140 N/mm$^2$ or more, 150 N/mm$^2$ or more, or 170 N/mm$^2$ or more in ascending order of preference (a higher value is more preferred); the maximum Martens hardness at the above-described indentation amount of 100 nm is 280 N/mm$^2$ or less, 250 N/mm$^2$ or less, or 200 N/mm$^2$ or less in ascending order of preference (a lower value is more preferred).

In the present invention, at least one of the Martens hardness requirements at the above-described indentations amount of 10 nm or 100 nm is preferably satisfied. By satisfying both the Martens hardness requirements, physical properties which are so suitable as to prevent any breakage, crack, or the like are achieved, as described above. Additionally, it is important that the Martens hardness is not excessively low or excessively high. For example, at least a certain level of hardness is required to avoid the electroconductive part easily damaged during the production process for an electroconductive film. In addition, the electroconductive part is etched for pattern geometry. The etching process includes dry etching processes, such as laser dry etching, and wet etching processes, such as a process comprising immersion in an etching liquid and based on a broadly used photolithography technique. In either etching process, an excessively high hardness of the electroconductive part results in a problem of a slow etching rate, which in turn requires a longer period for processing. Thus, the upper limit of the above-described Martens hardness should be specified.

The Martens hardness at an indentation amount of 10 nm or 100 nm from the surface of the electroconductive part will be measured by the following method. First, a cut piece of an electroconductive film having a size of 20 mm×20 mm is fixed with an adhesive resin (product name "Aron Alpha® General type"; manufactured by Toagosei Co., Ltd.) on a commercially available slide glass with the electroconductive part facing upward. Specifically, a drop of the above-described adhesive resin is placed at the center of a slide glass 1 (product name "Slide glass (Strainer), 1-9645-11"; manufactured by AS One Corporation). In this step, the adhesive resin is not spread over the slide glass, and a drop of the adhesive resin is applied so that the adhesive resin does not extend beyond the electroconductive film when pressed as described below. Subsequently, the slide glass is contacted with the cut piece of the electroconductive film having the above-described size with the electroconductive part facing upward and with the center of the electroconductive film located on the adhesive resin, and the adhesive resin is spread between the slide glass 1 and the electroconductive film for temporary adhesion. Then, another new slide glass 2 is placed on the electroconductive film to obtain a laminate composed of the slide glass 1, the adhesive resin, the electroconductive film, and the slide glass 2. Subsequently, a weight of 30 g to 50 g is left to stand on the slide glass 2 for 12 hours at room temperature. Then, the weight and the slide glass 2 are removed from the laminate to prepare a measurement sample. The four corners electroconductive film fixed with the adhesive resin may further be fixed with tape (product name "Cello Tape®"; manufactured by Nichiban Co., Ltd.). The measurement sample is fixed on the measurement stage of a microhardness tester (product name "PICODENTOR HM500", manufactured by Fischer Instruments K.K.; following 15014577-1 and ASTM E2546) placed horizontally on a vibration isolation table. Any method, such as putting tape (product name "Cello Tape®"; manufactured by Nichiban Co., Ltd.) on the four edges, is available to fix the slide glass 1, as long as the measurement sample does not move. Additionally, in cases where the microhardness tester is equipped with an air suction system, the measurement sample may be fixed with the air suction system. After the measurement sample is fixed on the measurement stage of the microhardness tester, the Martens hardness is measured under the following measurement conditions at indentation amounts of 10 nm and 100 nm on the surface of the electroconductive part. The Martens hardness is measured at five arbitrary locations near the center on the surface of the electroconductive part in the measurement sample to determine the arithmetic mean of the obtained five hardness values as the Martens hardness. However, the measured five arbitrary locations should be selected on the area having a surface as flat as possible in the electroconductive part by observing the electroconductive part at a magnification of 50 to 500 times using a microscope accessory to the PICODENTOR HM500, avoiding areas with extreme projections due to overlapped electroconductive fibers and, on the contrary, areas with extreme depressions. Even in a patterned electroconductive part of an electroconductive film, five arbitrary measurement locations are selected in the same manner as described above. Additionally, when the Martens hardness is calculated, "HM" (Martens hardness) is selected as a type of hardness to be measured on the PICODENTOR HM500 to start automatic calculation.

(Measurement Conditions)

Type of an indenter: Vickers (quadrangular pyramid diamond indenter, having an apex part with an angle of 136 degrees between opposite faces);

Load control mode: up to 40 mN;

Loading time: 20 seconds;

Creep time: 5 seconds;

Unloading time: 20 seconds;

Indentation: 10 nm (for measuring the Martens hardness at an indentation amount of 10 nm) and 100 nm (for measuring the Martens hardness at an indentation amount of 100 nm);

Measurement temperature: 25° C.;

Measurement humidity: 50%.

In the measurement profile, the applied load will increase from 0 mN to 40 mN over 20 seconds, keep at 40 mN for 5 seconds, and then decrease from 40 mN to 0 mN over 20 seconds.

In cases where the electroconductive film 10 is used as an electrode for a touch panel sensor, the ratio of the electrical resistance value in a second direction to that in a first direction (the ratio is hereinafter referred to as "electrical resistance value ratio") is preferably 1 or more and less than 2 when the electrical resistance values on the surface 13A of the electroconductive part 13 are measured in a predetermined size in six different directions including an arbitrary direction for each an angle of 30 degrees in the surface of the electroconductive part, wherein a direction in which the electroconductive part shows the lowest electrical resistance value is designated as the first direction, and a direction which is orthogonal to the first direction is designated as the second direction. The electrical resistance value ratio can be obtained, for example, as follows. First, as shown in FIG. 2, an arbitrary direction AD is determined in the surface of the electroconductive part 13 and samples S having a predetermined size (for example, in a rectangular shape having a size of 110 mm length×5 mm width; a sample S excluding the below-described silver paste 17 has a size of 100 mm length×5 mm width) and extending in six different directions including the arbitrary direction AD, which are each an angle of 30 degrees to the arbitrary direction AD, are cut from the electroconductive film 10. In consideration of providing a silver paste, each sample S is cut with a margin of about 10 mm in the length direction. After the samples S are cut from the electroconductive film 10, a silver paste (product name "DW-520H-14"; manufactured by Toyobo Co., Ltd.) is applied, as shown in FIG. 3, on both longitudinal ends of each sample S (for example, each end having a size of 5 mm length×5 mm width) to prevent any change in distance between points for measuring the electrical resistance value and in a manner that enables a post-curing film thickness of 5 µm or more and 10 µm or less, and heated at 130° C. for 30 minutes to obtain the sample S retaining the cured silver pastes 17 on both the terminal regions. The distance between the points where the silver paste 17 has been applied (the length of the portion carrying no silver paste 17) is the distance between points for measuring the electrical resistance in each sample S (for example, 100 mm), which should be constant among the samples S. Although a recommendable aspect ratio of the sample S without the silver paste 17 is 20:1, a sample having a size of 60 mm length×5 mm width (the sample without the silver paste 17 has a size of 50 mm length×5 mm width) may be used in cases where only a small sample can be prepared, because the recommendable aspect ratio of a sample without the silver paste 17 can be reduced to 10:1. Additionally, although the samples S in the present embodiment are withdrawn in six different directions for each an angle of 30 degrees to the arbitrary direction AD, samples may be cut from any portions in the electroconductive film as long as a long side of each sample extends at an angle differently from any line parallel to the arbitrary direction AD. Then, the electrical resistance value of each sample S retaining the cured silver pastes 17 on both the terminal regions is measured using a tester (product name "Digital MΩ Hitester 3454-11"; manufactured by Hioki E.E. Corporation). Specifically, first of all, since the Digital MΩ Hitester 3454-11 comprises a black probe terminal and a red probe terminal (both are pin-type terminals), the black probe terminal is connected to the EARTH terminal and the red probe terminal is connected to the LINE terminal. After selecting the function selector to "Ω," the MEASURE LOCK/STOP key is pressed for 2 seconds. This allows the measurement of electrical resistance value to start automatically every time the probe terminals are connected to a sample. Under this condition, the red probe terminal is contacted with the cured silver paste 17 provided on one of the ends and the black probe terminal is contacted with the cured silver paste 17 provided on the other end to measure the electrical resistance value. The measurement of electrical resistance should be performed in an environment at a temperature of 23° C. and a relative humidity of 55%. The electrical resistance value is preferably measured in a sample provided with an amount of a silver paste enough to achieve a post-curing film thickness of 10 µm because poor coating of a silver paste may cause unstable results in electrical resistance value measurement and also display abnormal values clearly different from expected resistance values. Then, a sample S showing the lowest electrical resistance value is identified among the samples S cut from the electroconductive film 10. The direction of cutting the sample S showing the lowest electrical resistance value from the electroconductive film is designated as a first direction, and a sample S cut in a second direction orthogonal to the first direction is identified, and the ratio of the electrical resistance of the sample S in the second direction to that of the sample S in the first direction is calculated. The arithmetic mean of three measurements is determined as the electrical resistance value ratio. The maximum electrical resistance value ratio is 1.8 or less, 1.5 or less, or 1.3 or less in ascending order of preference (a lower value is more preferred). By limiting the maximum electrical resistance value ratio to be within the above-described range, a uniform resistance value can be obtained over the surface. Products manufactured using an electroconductive film (for example, smartphone) use a small area of the electroconductive film. However, any deviation of electrical resistance in the surface of the electroconductive film in one article may cause problems to occur in actions as an image display screen or a touch panel. Thus, the limited maximum electrical resistance value ratio can prevent such problems.

In cases where an electroconductive part is patterned to form several electric wirings as in the cases of the below-described electroconductive parts 22 and 31, the electrical resistance value ratio can be obtained, for example, as follows. First, six arbitrary areas are selected as measurement areas on the surface of the electroconductive film. The six measurement areas should have the same size (the same length) and be separated from one another. Additionally, the above-described six measurement areas are determined such that, for example, three areas are located on the first edge positioned in the extending direction of each electric wiring in the electroconductive film and three areas are located on the second edge positioned in the extending direction of each electric wiring and opposite to the first edge. Specifically, the above-described measurement areas are provided such that two out of the three areas on the first edge and two out of the three areas on the second edge are located in close proximity to the four corners of the electroconductive film, and the remaining one out of the three areas on the first edge and the remaining one out of the three areas on the second edge are respectively located at the middle of the first and second edges. Then, a silver paste (product name "DW-520H-14"; manufactured by Toyobo Co., Ltd.) is applied on the outside of both ends of each area located in the above-described extending direction of each electric wiring in a manner that enables a post-curing film thickness of 5 μm or more and 10 μm or less and prevents any contact with an adjacent electric wiring, and heated at 130° C. for 30 minutes to cure the silver paste. The distance between the cured silver pastes located on the outside of both ends of each area (measurement length) should be identical among the areas, while the width of the silver pastes on both ends should be in total within 10 mm. Then, the cured silver pastes located on the outside of both ends of each area are contacted with probe terminals of a tester (product name "Digital MΩ Hitester 3454-11"; manufactured by Hioki E.E. Corporation) to measure the line resistance value. For example, in cases where the Digital MΩ Hitester 3454-11 is used as a tester, the Digital MΩ Hitester 3454-11 comprises two probe terminals (a red probe terminal and a black probe terminal; both are pin-type terminals) and, therefore, the red probe terminal is contacted with the silver paste located on the outside of one end of a measurement area and the black probe terminal is contacted with the cured silver paste located on the outside of the other end of the measurement area to measure the line resistance value. Then, among those line resistant values of the six measurement areas, the highest line resistance value will be divided by the lowest line resistance value to obtain the electrical resistance value ratio. Although line widths of an electroconductive part in, for example, 5-inch smartphones are very narrows, silver pastes provided on an electroconductive part (electric wirings) enable measurement of line resistance value in the electroconductive part even if the line widths are very narrow.

For the measurement of the above-described line resistance value, the line width is in the order of micrometers at the narrowest portion in small-sized products such as 5-inch smartphones. In that case, each measurement area will be selected to have a measurement length as long as possible independently of the aspect ratio. In cases where an electroconductive film is in a shape of long rectangle, a measurement area is preferably selected to have a measurement length equal to about half the length of the long side of the electroconductive film. On the other hand, in cases of products having a size of 20 inches or more, the line width is in the order of millimeters and a measurement area is preferably selected to have an aspect ratio of 1:20.

In cases where the electrical resistance value or surface resistance value of a manufactured product is measured, the following pretreatment should be appropriately performed. The pretreatment method is not limited to the following method as long as the pretreated product becomes available for the measurement, and it is critical to avoid any influence on electroconductive fibers. That is, in cases where an electroconductive part is already clearly visible and the thickness of an adhesive layer can be presumed to be very thin, measurement can be performed without any further treatment and there is no need to peel off the electroconductive part entirely by force. However, the manufactured product is preferably pretreated to reduce the thickness as thin as possible. For example, in cases where an electroconductive film is used as a touch panel sensor, a cover film or glass is layered on the electroconductive film through an adhesive layer. Thus, a cutter blade is first inserted into the adhesive layer from the edge to remove the cover film or glass. When the cover film or glass is not easily removed, the electroconductive film proceeds to the next step without removing the cover film or glass by force. Next, the electroconductive film is immersed in and withdrawn from warm water at 40° C. for 10 seconds three times. Then, detachment of the adhesive layer is checked with a cutter or the like, and in some cases the electroconductive film is immersed in and withdrawn from warm water at 40° C. for 10 seconds further three times. Subsequently, the adhesive layer is slowly peeled off with a tool which will never damage the electroconductive part (a thin and flat tool without a blade). The adhesive layer need not be removed entirely as long as the adhesive layer at measurement locations is removed. The present pretreatment can also be used for measuring anything other than electrical resistance value and surface resistance value.

On the other hand, in cases of obtaining an electroconductive film which provides a much lower electrical resistance value in a particular direction, the above-described electrical resistance value ratio is preferably 2 or more when the electrical resistance value on the surface 31A of the electroconductive part 31 is measured in a predetermined size in six different directions including an arbitrary direction for each an angle of 30 degrees to the arbitrary direction in the surface 31A of electroconductive part 31. The arithmetic mean of three measurements is determined as the electrical resistance value ratio. The minimum electrical resistance value ratio is more preferably 3 or more. The maximum electrical resistance value ratio is 10 or less, or 8 or less in ascending order of preference (a lower value is more preferred) from the viewpoint of obtaining a uniform resistance value on the surface.

Such an electroconductive part having an electrical resistance value ratio of 1 or more and less than 2 or an electrical resistance value ratio of 2 or more can be obtained, for example, by appropriately modifying the fiber length of electroconductive fibers, the type or film thickness of a resin that constitutes the below-described organic protective layer, and/or the temperature for drying the electroconductive fiber-containing composition.

<Light-Transmitting Resin>

The light-transmitting resin 15 covers electroconductive fibers 16 to prevent removal of the electroconductive fibers 16 from the electroconductive part 13 and to improve the durability or scratch resistance of the electroconductive part 13, and covers electroconductive fibers 16 to such an extent that the electroconductive part 13 can conduct electricity from the surface 13A. Specifically, the light-transmitting resin 15 preferably covers electroconductive fibers 16 in a manner that will leave some of the electroconductive fibers 16 exposed on the surface 13A of the electroconductive part 13, because it is likely that the electroconductive part can conduct no electricity from the surface, as described above, when some electroconductive fibers are not exposed on the surface of the electroconductive part. For example, the film thickness of the light-transmitting resin 15 should be adjusted to cover electroconductive fibers 16 with the light-transmitting resin 15 in a manner that will leave some of the electroconductive fibers 16 exposed on the surface 13A of the electroconductive part 13.

The light-transmitting resin 15 preferably has a film thickness of less than 300 nm from the viewpoint of thinning the electroconductive film. The film thickness of the light-transmitting resin 15 can be measured by the same measurement method as for the film thickness of the electroconductive part 13. The maximum film thickness of the light-transmitting resin 15 is 145 nm or less, 140 nm or less, 120 nm nm, 110 nm or less, 80 nm or less, or 50 nm or less in ascending order of preference (a lower value is more preferred). Additionally, the minimum film thickness of the light-transmitting resin 15 is preferably 10 nm or more.

The light-transmitting resin 15 is not limited to a particular light-transmitting resin as long as it is a light-transmissive resin, and examples of the light-transmitting resin include polymers of polymerizable compounds and thermoplastic resins. Polymerizable compounds similar to those described for the light-transmitting functional layer 12 are included as examples of the polymerizable compound, and further description is thus omitted here.

<Reaction Inhibitor>

A reaction inhibitor is a substance that prevents reduction in electrical conductivity after application of the light-transmitting resin composition due to the reaction of the electroconductive fibers 16 with substances in the atmosphere. Examples of the reaction inhibitor include nitrogen-containing compounds, such as benzoazole compounds, triazole compounds, tetrazole compounds, isocyanurate compounds, and aniline compounds. Examples of the nitrogen-containing compound used as a reaction inhibitor include 1-amino-benzoazole, 5-methylbenzotriazole, 1,2,3-benzotriazole, 1-methyl-1H-tetrazole-5-amine, DL-α-tocopherol, 1-octadecanethiol, 2-mercapto-5-(trifluoromethyl) pyridine, diallyl isocyanurate, diallyl propyl isocyanurate, 6-anilino-1,3,5-triazine-2,4-dithiol, thiocyanuric acid, 3,5-dimethyl-1H-1,2,4-triazole, 4-(1,2,4-triazol-1-ylmethyl)aniline, 6-(dibutylamino)-1,3,5-triazine-2,4-dithiol, 4-(1,2,4-triazol-1-yl)aniline, 2-methylthio-benzothiazole, 1-phenyl-5-mercapto-1H-tetrazole, 5-mercapto-1-methyltetrazole, 5-(methylthio)-1H-tetrazole, 5-amino-1H-tetrazole, 1-(2-dimethylaminoethyl)-5-mercaptotetrazole, 1-(2-dimethylaminoethyl)-5-mercaptotetrazole, 1-(4-hydroxyphenyl)-5-mercapto-1H-tetrazole, 3-amino-5-mercapto-1,2,4-triazole, and 3,5-diamino-1,2,4-triazole.

The content of a reaction inhibitor in the electroconductive part 13 is preferably 0.01% by mass or more and 10% by mass or less. In cases where the content of the reaction inhibitor is less than 0.01% by mass, the electroconductive fibers may react with substances in the atmosphere, which in turn results in reduced electrical conductivity. Additionally, although the reaction inhibitor reacts with the surface of electroconductive fibers and thus inactivates the surface of electroconductive fibers, and renders the resulting electroconductive fibers less prone to react with substances in the atmosphere, the reaction inhibitor may react not only with the surface of electroconductive fibers but also with the inside of the electroconductive fibers, which in turn results in reduced electrical conductivity in cases where the content of the reaction inhibitor is more than 10% by mass.

<Electroconductive Fibers>

Although the electroconductive fibers 16 are unevenly distributed on the light-transmitting base material 11 side than the position HL, which is located at half the film thickness of the electroconductive part 13, the electroconductive fibers 16 contact with each other in the thickness direction of the electroconductive part 13, as indicated by the ability of the electroconductive part 13 to conduct electricity from the surface 13A.

The electroconductive fibers 16 preferably contact with each other to form a network structure (meshwork) to the surface direction (two-dimensional direction) of the electroconductive part 13 in the light-transmitting base material 11 side than the position HL, which is located at half the film thickness of the electroconductive part 13. Formation of a network structure by the electroconductive fibers 16 enables efficient creation of a conductive path with the electroconductive fibers 16 even in a small amount.

Some of the electroconductive fibers 16 are preferably exposed on the surface 13A of the electroconductive part 13. The phrase "some of the electroconductive fibers are exposed on the surface of the electroconductive part" as used herein should refer to exposure of some electroconductive fibers on the surface of the electroconductive part in such an extent that the electroconductive fibers are anchored to the electroconductive part, including electroconductive fibers protruded from the surface of the electroconductive part. In cases where some electroconductive fibers are not exposed on the surface of the electroconductive part, the electroconductive part may conduct no electricity from the surface. Once electrical conduction from the surface 13A of the electroconductive part 13 is identified by the above-described measurement method, some of the electroconductive fibers 16 can thus be determined to be exposed on the surface 13A of the electroconductive part 13.

The electroconductive fibers 16 preferably have a fiber diameter of 200 nm or less. In cases where the electroconductive fibers have a fiber diameter of more than 200 nm, the resulting electroconductive film may have a higher haze value or a poor light transmittance. The minimum fiber diameter of the electroconductive fibers 16 is more preferably 10 nm or more from the viewpoint of the electrical conductivity of the electroconductive part 13, and a more preferred range of fiber diameter in the electroconductive fibers 16 is 15 nm or more and 50 nm or less. The electroconductive fibers 16 most preferably have a fiber diameter of 30 nm or less.

The fiber diameter of the electroconductive fibers 16 will be obtained as the arithmetic mean of the fiber diameters of 100 electroconductive fibers in 50 images photographed at a magnification of 100,000 to 200,000 times, for example, using a transmission electron microscope (TEM) (product name "H-7650"; manufactured by Hitachi High-Technologies Corporation), which are measured on the photographed images by a software program accessory to the TEM. The fiber diameters are measured using the above-described H-7650 by setting the accelerating voltage to "100 kV," the emission current to "10 µA," the condenser lens aperture to "1," the objective lens aperture to "0," the observation mode to "HC," and the Spot to "2." Additionally, the fiber diameters of the electroconductive fibers can also be measured by a scanning transmission electron microscope (STEM) (product name "S-4800 (Type 2)"; manufactured by Hitachi High-Technologies Corporation). In that case, the fiber diameter of the electroconductive fibers will be obtained as the arithmetic mean of the fiber diameters of 100 electroconductive fibers in 50 images photographed at a magnification of 100,000 to 200,000 times using the STEM, which are measured on the acquired images by a software program accessory to the STEM. The fiber diameters are measured using the above-described S-4800 (Type 2) by setting the signal selection to "TE," the accelerating voltage to "30 kV," the emission current to "10 µA," the probe current to "Norm," the focus mode to "UHR," the condenser lens 1 to "5.0," the WD to "8 mm," and the Tilt to "0°."

When the fiber diameter of the electroconductive fibers 16 is determined, a measurement sample prepared by the following method is used. In this respect, TEM measurement is performed at high magnifications and it is consequently critical to reduce the concentration of the electroconductive fiber-containing composition as much as possible for the purpose of inhibiting overlap of the electroconductive fibers as much as possible. Specifically, the electroconductive fiber-containing composition is preferably diluted with water or alcohol depending on the dispersion medium used in the composition to reduce the concentration of electroconductive fibers to 0.05% by mass or less or to reduce the content of solids to 0.2% by mass or less. Furthermore, a drop of the diluted electroconductive fiber-containing composition is applied on a grid mesh with a carbon supporting film for TEM or STEM observation, dried at room temperature, and then observed under the above-described conditions, and the resulting observation image data is used to calculate the arithmetic mean. As the grid mesh with a carbon supporting film, a Cu grid with the model "#10-1012, Elastic Carbon Film ELS-C10 in the STEM Cu100P grid specification" is preferred, and any grid having better resistance against electron beam exposure and a higher electron beam transmittance than a plastic supporting film, and thus being suitable for observation at a high magnification, and having better resistance against organic solvents is also preferred. Additionally, a drop of the diluted electroconductive fiber-containing composition could be applied on a grid mesh placed on a slide glass because the grid mesh is so small that it is difficult to apply the drop of the diluted electroconductive fiber-containing composition on a plain grid mesh.

The above-described fiber diameter can be obtained by image-based measurement or may be calculated from the binarized image data. In the case of actual measurement, images may be printed or enlarged as appropriate. In that case, each electroconductive fiber is visualized in darker black than other components. Measurement points are selected on the outer counter of each fiber as a starting point and an end point. The concentration of electroconductive fibers will be obtained based on the ratio of the mass of the electroconductive fibers to the total mass of the electroconductive fiber-containing composition, while the content of solids will be obtained based on the ratio of the mass of all components except for the dispersion medium (including the electroconductive fibers, the resin component, and other additives) to the total mass of the electroconductive fiber-containing composition.

The electroconductive fibers 16 preferably have a fiber length of 1 µm or more. In cases where the electroconductive fibers 16 have a fiber length of less than 1 µm, an electroconductive layer having a sufficient electrical conductivity may not be formed and aggregation may occur, which may in turn result in a higher haze value and a low light transmittance. The maximum fiber length of the electroconductive fibers 16 may be 500 µm or less, 300 µm or less, or 30 µm or less, while the minimum fiber length of the electroconductive fibers 16 may be 3 µm or more, or 10 µm or more.

In cases where the electroconductive fibers 16 have a fiber length of 30 µm or more, electroconductive fibers are easily aligned along the below-described MD direction, which causes a tendency to increase the difference in electrical resistance value depending on the direction on a surface. Thus, the electroconductive fibers 16 preferably have a fiber length of, for example, 1 µm or more and less than 30 µm in cases of obtaining an electroconductive part having an electrical resistance value ratio of 1 or more and less than 2, while the electroconductive fibers 16 preferably have a fiber length of, for example, 30 µm or more in cases of obtaining an electroconductive part having an electrical resistance value ratio of 2 or more. In cases of obtaining an electroconductive part having an electrical resistance value ratio of 1 or more and less than 2, the electroconductive fibers 16 preferably have a minimum fiber length of 10 µm or more and a maximum fiber length of 20 µm or less from the viewpoint of obtaining a low surface resistance value.

The fiber length of the electroconductive fibers 16 will be obtained as the arithmetic mean of the fiber lengths of 100 electroconductive fibers in 10 images photographed at a magnification of 500 to 20,000,000 times, for example, using a scanning electron microscope (SEM) (product name "S-4800 (Type 2)"; manufactured by Hitachi High-Technologies Corporation) on the SEM mode, which are measured on the acquired images by an accessory software program. The fiber lengths are measured using the above-described S-4800 (Type 2) together with a 45° pre-tilted sample stub by setting the signal selection to "SE," the accelerating voltage to "3 kV," the emission current to "10 µA to 20 µA," the SE detector to "Mixed," the probe current to "Norm," the focus mode to "UHR," the condenser lens 1 to "5.0," the WD to "8 mm," and the Tilt to "30°." Because no TE detector is used for SEM observation, it is essential to remove the TE detector before SEM observation. Although either the STEM mode or the SEM mode can be selected as an operation mode of the above-described S-4800, the SEM mode will be used for the measurement of the above-described fiber length.

When the fiber length of the electroconductive fibers 16 is determined, a measurement sample prepared by the following method is used. First, the electroconductive fiber-containing composition is applied on an untreated surface of a polyethylene terephthalate (PET) film in B5 size having a thickness of 50 μm at an application dose of 10 mg/m², and dried to evaporate the dispersion medium and to place electroconductive fibers on the surface of the PET film, and an electroconductive film is thereby prepared. A piece having a size of 10 mm×10 mm is cut from the central part of the electroconductive film. Then, the cut electroconductive film is attached flat against the tilted surface of a 45° pre-tilted SEM sample stub (model number "728-45"; manufactured by Nissin EM Co., Ltd.; 45° pre-tilted sample stub; 15 mm diameter×10 mm height; made of M4 aluminum) using a silver paste. Furthermore, the cut electroconductive film is sputtered with Pt—Pd for 20 to 30 seconds to obtain electrical conductivity. Because an image of the sample without a suitable sputtered film may not be clearly visible, the sputtering process is appropriately modified in that case.

The above-described fiber length can be obtained by image-based measurement or may be calculated from the binarized image data. In the case of image-based measurement, the measurement will be performed by the same method as described above.

The electroconductive fibers 16 are preferably at least one type of fibers selected from the group consisting of electroconductive carbon fibers, metallic fibers such as metallic nanowires, metal-coated organic fibers, metal-coated inorganic fibers, and carbon nanotubes.

Examples of the above-described electroconductive carbon fiber include vapor grown carbon fiber (VGCF), carbon nanotube, wire cup, and wire wall. These electroconductive carbon fibers may be used individually or in combination of two or more.

As the above-described metallic fibers, fibers produced by, for example, a wire drawing process or coil shaving process that prepares a thin and long wire of a metal, such as stainless steel, iron, gold, silver, aluminium, nickel, or titanium, can be used. Such metallic fibers may be used individually or in combination of two or more. The metallic fibers are preferably metallic nanowires having a fiber diameter of 200 nm or less, preferably 50 nm or less, more preferably 30 nm or less, and a fiber length of 1 μm or more, preferably 15 μm or more, more preferably 20 μm or more.

Examples of the above-described metal-coated synthetic fibers include acrylic fibers coated with a metal such as gold, silver, aluminium, nickel, or titanium. Such metal-coated synthetic fibers may be used individually or in combination of two or more.

<<Other Electroconductive Films>>

For the electroconductive film 10 shown in FIG. 1, the electroconductive part 13 is a film with no pattern, namely a so-called plain film, but the electroconductive part may be patterned depending on applications. Specifically, the electroconductive film may be an electroconductive film 20, as shown in FIGS. 5 to 7, comprising an electroconductive layer 21 which is composed of plural electroconductive parts 22 and plural nonconductive parts 23 located between the electroconductive parts 22, or an electroconductive film 30 comprising plural electroconductive parts 31 and plural gaps 32 existing between the electroconductive parts 31. The surface 20A of the electroconductive film 20 comprises the surfaces 22A of the electroconductive parts 22 and the surfaces 23A of the nonconductive parts 23, while the surface 30A of the electroconductive film 30 comprises the surfaces of the electroconductive parts 31 and one surface of the light-transmitting functional layer. For example, the physical property values of the electroconductive films 20 and 30 are similar to those of the electroconductive film 10. In FIGS. 5 to 9, the elements indicated by the same reference numbers as in FIGS. 1 and 2 are the same as those indicated in FIGS. 1 and 2, and further description is thus omitted.

<Electroconductive Part>

The electroconductive parts 22 and 31 are the same as the electroconductive part 13, except that the former electroconductive parts are patterned. That is, the electroconductive parts 22 and 31 each comprise a light-transmitting resin 15 and plural electroconductive fibers 16 incorporated in the light-transmitting resin 15, as shown respectively in FIGS. 7 and 9. The electroconductive parts 22 and 31 can conduct electricity from the surfaces. In the electroconductive parts 22 and 31, the electroconductive fibers 16 are preferably unevenly distributed on the light-transmitting base material 11 side than the position HL, which is located at half the film thickness of the electroconductive parts 22 and the parts 23, as shown respectively in FIGS. 7 and 9. Other configurations, materials, physical properties values, and the like of the electroconductive parts 22 and 31 are also the same as those of the electroconductive part 13.

The electroconductive parts 22 function, for example, as electrode lines in the X direction in a projected capacitive touch panel and comprise plural sensing portions 22B aligned in the X direction and plural connectors (not shown) that are connected to the sensing portions 22B, as shown in FIG. 6. Each sensing portion 22B is located at a rectangular active area for sensing a touch position, while each connector is located at a non-active area adjacent to and surrounding the active area.

Each sensing portion 22B comprise a straight extending linear portion 22C and an expanded portion 22D extending from the linear portion 22C. In FIG. 6, linear portions 22C extend straight along a direction intersecting with the arrangement direction of sensing portions 22B. The expanded portion 22D is an outwardly expanded portion extending from a linear portion 22C on the surface of the light-transmitting functional layer 12. Thus, the width of each sensing portion 22B is broadened at an area where an expanded portion 22D is provided. In the present embodiment, each expanded portion 22D has an outer contour in a substantially square shape. The shape of each expanded portion 22D is not limited to a substantially square shape and it may take a diamond shape or a stripe shape.

The surface resistance values ($\Omega/\square$) of the electroconductive parts 22 and 31 can be measured in pieces of the electroconductive parts 22 and 31 each having a large area (for example, a bezel in a manufactured product). The surface resistance values of the electroconductive parts 22 and 31 are preferably measured using a contact-type resistivity meter (product name "Loresta-AX MCP-T370"; Mitsubishi Chemical Analytech Co., Ltd.) in accordance with JIS K7194: 1994 (Testing method for resistivity of conductive plastics with a four-point probe array), though it depends on the shape and/or size of the patterned electroconductive part 22 or 31. However, a non-destructive type (eddy current) resistivity meter (product name "EC-80P"; manufactured by Napson Corporation) may be used to measure the surface resistance value in cases where the electroconductive part 22 or 31 has a shape and/or a size that allows the measurement of surface resistance value using the non-destructive resistivity meter. The methods of measuring the surface resistance values of the electroconductive parts 22 and 31 with a contact-type resistivity meter and a non-destructive resistivity meter are the same as those of measuring the surface resistance value of the electroconductive part 13 with a contact-type resistivity meter and a non-destructive resistivity meter, and the description of the methods is omitted here. Although the type of a probe terminal for a Loresta-AX MCP-T370 resistivity meter is typically the ASP-probe type (4-pin probe, inter-pin distance=5 mm, pin-head radius=0.37 mm), a probe terminal of the PSP probe type (4-pin probe, inter-pin distance=1.5 mm, pin-head radius=0.26 mm) or the TFP probe type (4-pin probe, inter-pin distance=1 mm, pin-head radius=0.04 mm) is preferably used in cases where samples obtained from the electroconductive parts 22 and 31 are small in size.

<Nonconductive Part>

The nonconductive parts 23 are parts located between electroconductive parts 22 and having no electrical conductivity. As shown in FIG. 7, the nonconductive parts 23 contain substantially no electroconductive fibers 16. The phrase "a nonconductive part contains substantially no electroconductive fibers" as used herein means that the nonconductive part may contain a small amount of electroconductive fibers under a condition where an electrical short circuit between electroconductive parts is not formed even if metal ions from the electroconductive parts migrate to and permeated into the nonconductive part. The nonconductive parts 23 preferably contain none of the electroconductive fibers 16. When electroconductive fibers 16 are removed from the nonconductive parts 23 by sublimating the electroconductive fibers 16 through exposure to laser light as described below or by wet etching based on photolithography, a certain amount of an electroconductive material as a component of the electroconductive fibers 16 may be left as a residue. However, the residual electroconductive materials are not considered as electroconductive fibers because those residual materials are not in fiber form.

Because the nonconductive parts 23 are formed together with the electroconductive parts 21 as an integrated body, the film thickness of the nonconductive parts is preferably less than 300 nm, regardless of whether or not an underlayer or a light-transmitting functional layer is provided on a light-transmitting base material. The phrase "the film thickness of nonconductive part" as used herein means the film thickness of a part laminated directly to a basement (such as a light-transmitting base material, underlayer, or light-transmitting functional layer) to which an electroconductive part containing electroconductive fibers identified by observation of a cross-section is also laminated. The maximum film thickness of the nonconductive parts 23 is 145 nm or less, 140 nm or less, 120 nm or less, 110 nm or less, 80 nm or less, 50 nm or less, 30 nm or less, or 10 nm or less in ascending order of preference (a lower value is more preferred). Additionally, the minimum film thickness of the nonconductive parts 23 is preferably 10 nm or more. The film thickness of the nonconductive parts 23 will be measured by the same method as for the film thickness of the electroconductive parts 22.

As shown in FIG. 7, the nonconductive parts 23 comprise the light-transmitting resin 15. The nonconductive parts 23 may be formed by removing electroconductive fibers 16 through sublimation and may have the resulting voids 23B which are not filled with electroconductive fibers. In that case, the sublimated electroconductive fibers 16 burst out through areas to be the nonconductive parts 23 during the formation of the nonconductive parts 23 and the resulting nonconductive parts 23 have rough surfaces. The light-transmitting resin 15 in the nonconductive parts 23 is the same as the light-transmitting resin 15 in the electroconductive part 13, and the description of the light-transmitting resin is omitted here.

<<Production Methods of Electroconductive Films>>

The electroconductive film 10 can be produced, for example, as follows. First, a light-transmitting functional layer composition is applied on one surface of the light-transmitting base material 11 and dried to form a coating film 35 of the light-transmitting functional layer composition, as shown in FIG. 10(A).

The light-transmitting functional layer composition contains a polymerizable compound, and may contain the above-described inorganic particles, the above-described leveling agent, a solvent, and a polymerization initiator as necessary. Furthermore, the light-transmitting functional layer composition may be supplemented with, for example, a conventionally known dispersing agent, surfactant, silane coupling agent, thickener, coloring inhibitor, coloring agent (pigment and dye), antifoam agent, flame retardant, ultraviolet absorber, adhesion promoter, polymerization inhibitor, antioxidant, surface modifier, and/or lubricant in accordance with various purposes of, for example, increasing hardness, reducing cure shrinkage, and/or controlling refractive index in the light-transmitting functional layer.

<Solvent>

Examples of the solvent include alcohols (such as methanol, ethanol, propanol, isopropanol, n-butanol, s-butanol, t-butanol, benzyl alcohol, PGME, and ethylene glycol), ketones (such as acetone, methyl ethyl ketone (MEK), cyclohexanone, methyl isobutyl ketone, diacetone alcohol, cycloheptanone, and diethyl ketone), ethers (such as 1,4-dioxane, dioxolane, diisopropyl ether dioxane, and tetrahydrofuran), aliphatic hydrocarbons (such as hexane), alicyclic hydrocarbons (such as cyclohexane), aromatic hydrocarbons (such as toluene and xylene), halocarbons (such as dichloromethane and dichloroethane), esters (such as methyl formate, methyl acetate, ethyl acetate, propyl acetate, butyl acetate, and ethyl lactate), cellosolves (such as methyl cellosolve, ethyl cellosolve, and butyl cellosolve), cellosolve acetates, sulfoxides (such as dimethyl sulfoxide), amides (such as dimethylformamide and dimethylacetamide), and combinations thereof.

<Polymerization Initiator>

The polymerization initiator is a component that generates radicals upon degradation induced by exposure to light or heat and initiates or promotes the polymerization (cross-linking) of a polymerizable compound. Examples of a polymerization initiator used in the light-transmitting functional layer composition include photopolymerization initiators (for example, photo-radical polymerization initiators, photo-cationic polymerization initiators, photo-anionic polymerization initiators), thermal polymerization initiators (for example, thermal radical polymerization initiators, thermal cationic polymerization initiators, thermal anionic polymerization initiators), and combinations thereof.

Examples of the above-described photo-radical polymerization initiator include benzophenone-based compounds, acetophenone-based compounds, acylphosphine oxide-based compounds, titanocene-based compounds, oxime ester-based compounds, benzoin ether-based compounds, and thioxantone.

Among the above-described photo-radical polymerization initiators, commercially available photo-radical polymerization initiators include, for example, Irgacure 184, Irgacure 369, Irgacure 379, Irgacure 651, Irgacure 819, Irgacure 907, Irgacure 2959, Irgacure OXE01, and Lucirin TPO (all are manufactured by BASF Japan Ltd.); NCI-930 (manufactured by ADEKA Corporation); SpeedCure EMK (manufactured by Nihon SiberHegner K.K.); and benzoin methyl ether, benzoin ethyl ether, and benzoin isopropyl ether (all are manufactured by Tokyo Chemical Industry Co., Ltd.).

Examples of the above-described photo-cationic polymerization initiator include aromatic diazonium salts, aromatic iodonium salts, and aromatic sulfonium salts. Among the above-described photo-cationic polymerization initiators, commercially available photo-cationic polymerization initiators include, for example, Adeka Optomer SP-150 and Adeka Optomer SP-170 (both are manufactured by ADEKA Corporation).

Examples of the above-described thermal radical polymerization initiator include peroxides and azo compounds. Among those, high-molecular-weight azo initiators consisting of high-molecular-weight azo compounds are preferred. Examples of the high-molecular-weight azo initiator include high-molecular-weight azo initiator having a structure composed plural units of, for example, a polyalkylene oxide or a polydimethyl siloxane linked to each other via an azo group.

Examples of the above-described high-molecular-weight azo initiator having a structure composed of plural units of, for example, a polyalkylene oxide linked to each other via an azo group include a polycondensate of 4,4'-azobis(4-cyanopentanoic acid) and a polyalkylene glycol, and a polycondensate of 4,4'-azobis(4-cyanopentanoic acid) and a polydimethyl siloxane having a terminal amino group.

Examples of the above-described peroxide include ketone peroxide, peroxy ketal, hydroperoxide, dialkyl peroxide, peroxy esters, diacyl peroxide, and peroxy dicarbonate.

Among the above-described thermal radical polymerization initiators, examples of commercially available thermal radical polymerization initiators include Perbutyl O, Perhexyl O, and Perbutyl PV (manufactured by NOF Corporation); V-30, V-501, V-601, VPE-0201, VPE-0401, and VPE-0601 (manufactured by Wako Pure Chemical Industries, Ltd.).

Examples of the above-described thermal cationic polymerization initiator include various onium salts, such as quaternary ammonium salts, phosphonium salts, and sulfonium salts. Among the above-described thermal cationic polymerization initiators, examples of commercially available thermal cationic polymerization initiators include ADEKA Opton CP-66, and ADEKA Opton CP-77 (manufactured by ADEKA Corporation); SAN AID SI-60L, SAN AID SI-80L, SAN AID SI-100L (manufactured by Sanshin Chemical Industry Co., Ltd.); and CI series (manufactured by Nippon Soda Co., Ltd.).

The content of a polymerization initiator in the light-transmitting functional layer composition is preferably 0.5 parts by mass or more and 10.0 parts by mass or less relative to 100 parts by mass of the polymerizable compound. By limiting the content of the polymerization initiator to a value within the above range, hard coat properties can be well maintained and cure inhibition can be inhibited.

The method of applying the light-transmitting functional layer composition include known coating methods, such as spin coating, dipping, spraying, slide coating, bar coating, roll coating, gravure coating, and die coating methods.

Figure 10B:
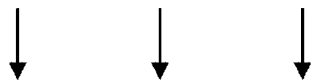
Figure 10B:
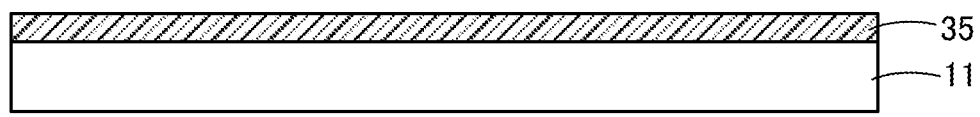

Next, the coating film 35 is exposed to light such as ultraviolet light or heated, as shown in FIG. 10(B), to polymerize (cross-link) the polymerizable compound and to cure the coating film 35, whereby the light-transmitting functional layer 12 is formed.

In cases where ultraviolet light is used as the light to cure the light-transmitting functional layer composition, the ultraviolet light or the like emitted from, for example, a super high pressure mercury lamp, high pressure mercury lamp, low pressure mercury lamp, carbon arc lamp, xenon arc lamp, or metal halide lamp can be used. Additionally, the wavelength range from 190 to 380 nm can be used as the wavelength of ultraviolet light. Specific examples of the source of electron beam include various types of electron beam accelerators, such as Cockcroft-Walton type, Van de Graft type, resonant transformer type, insulating core transformer type, linear type, Dynamitron type, and high frequency type accelerators.

Figure 11A:
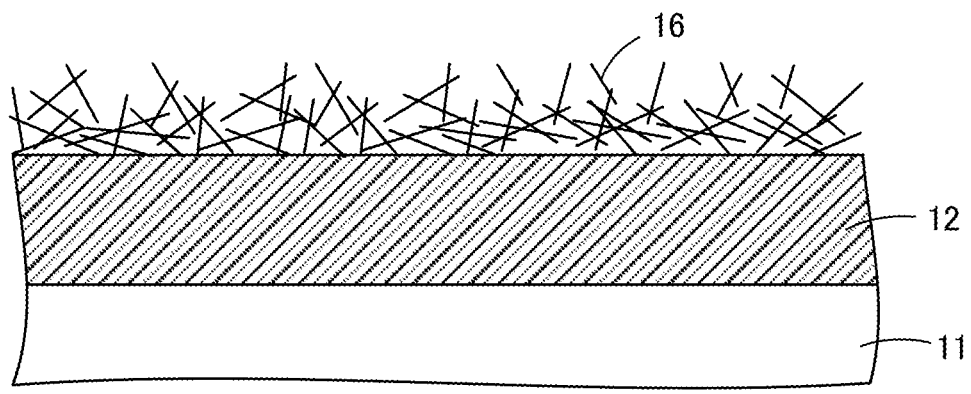
FIGS. 11(A) and 11(B) schematically illustrate the process for producing the electroconductive film according to the first embodiment.

After the light-transmitting functional layer 12 is formed on the light-transmitting base material 11, an electroconductive fiber-containing composition containing electroconductive fibers 16 and an organic dispersion medium is applied on a surface of the light-transmitting functional layer 12 opposite to the light-transmitting base material 11 side surface, and dried to place a plurality of the electroconductive fibers 16 on the light-transmitting functional layer 12, as shown in FIG. 11(A). The organic dispersion medium may contain water of less than 10% by mass. The electroconductive fiber-containing composition may contain a resin material consisting of a thermoplastic resin or a polymerizable compound, in addition to the electroconductive fibers 16 and the organic dispersion medium. However, in cases where the content of the resin material in the electroconductive fiber-containing composition is excessively high, the resin material permeates into the space between the electroconductive fibers and the electrical conductivity of the electroconductive part is consequently deteriorated. Thus, the content of the resin material is needed to be appropriately adjusted. The term "resin material" as used herein inclusively refers to a component such as polymerizable compound that can be polymerized to a resin, in addition to a resin (however, excluding a resin (for example, polyvinylpyrrolidone) as a component of an organic protective layer that is formed surrounding electroconductive fibers in the preparation of the electroconductive fibers, for the purpose of, for example, preventing the electroconductive fibers from weld anchoring to each other or from reacting with substances in the atmosphere). Additionally, the resin material in the electroconductive fiber-containing composition becomes an integral part of the light-transmitting resin 15 after the formation of the electroconductive part 13.

The organic dispersion medium is not limited to a particular organic dispersion medium, and is preferably a hydrophilic organic dispersion medium. Examples of the organic dispersion medium include saturated hydrocarbons, such as hexane; aromatic hydrocarbons, such as toluene and xylene; alcohols, such as methanol, ethanol, propanol, and butanol; ketones, such as acetone, methyl ethyl ketone (MEK), methyl isobutyl ketone, and diisobutyl ketone; esters, such as ethyl acetate and butyl acetate; ethers such as tetrahydrofuran, dioxane, and diethyl ether; amides, such as N,N-dimethylformamide, N-methylpyrrolidone (NMP), and N,N-dimethylacetamide; and halogenated hydrocarbons, such as ethylene chloride and chlorobenzene. Among those organic dispersion media, alcohols are preferred in terms of the stability of the electroconductive fiber-containing composition.

Examples of a thermoplastic resin that may be contained in the electroconductive fiber-containing composition include acrylic resins; polyester resins, such as polyethylene terephthalate; aromatic resins, such as polystyrene, polyvinyl toluene, polyvinyl xylene, polyimide, polyamide, and polyamide-imide; polyurethane resins; epoxy resins; polyolefin resins; acrylonitrile-butadiene-styrene copolymer (ABS); cellulose-based resins; polyvinyl chloride resins; polyacetate resins; polynorbornene resins; synthetic rubber; and fluorine-based resins.

Examples of a polymerizable compound that may be contained in the electroconductive fiber-containing composition include polymerizable compounds similar to that described for the light-transmitting functional layer 12, and the description of the polymerizable compound is omitted here.

Figure 11B:
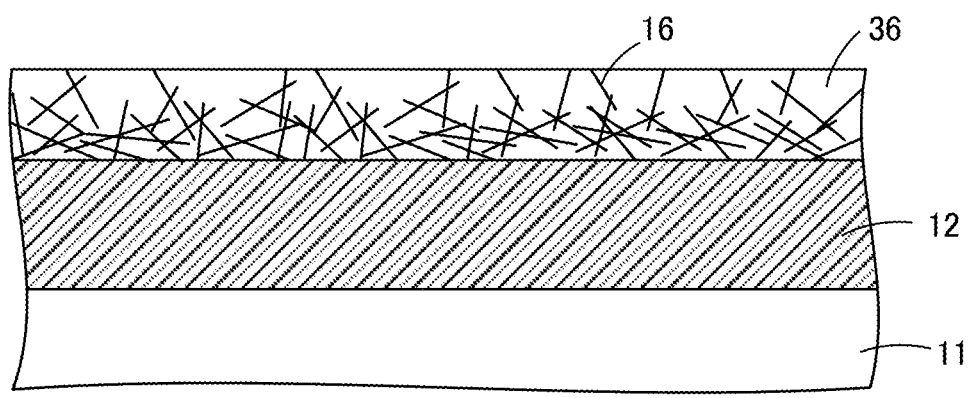

After a plurality of the electroconductive fibers 16 are placed on the light-transmitting functional layer 12, a light-transmitting resin composition containing a polymerizable compound and a solvent is applied on it and dried to form a coating film 36 of the light-transmitting resin composition, as shown in FIG. 11(B). The light-transmitting resin composition containing the polymerizable compound and the solvent may additionally contain a polymerization initiator and the above-described reaction inhibitor as necessary. In this respect, although a reaction inhibitor can be added to an electroconductive fiber-containing composition, the addition of the reaction inhibitor to the electroconductive fiber-containing composition may cause coating of the surface of electroconductive fibers with the reaction inhibitor before the electroconductive fibers form a network structure, which in turn deteriorates the electrical conductivity. Thus, a reaction inhibitor is preferably added to the light-transmitting resin composition.

Figure 12A:
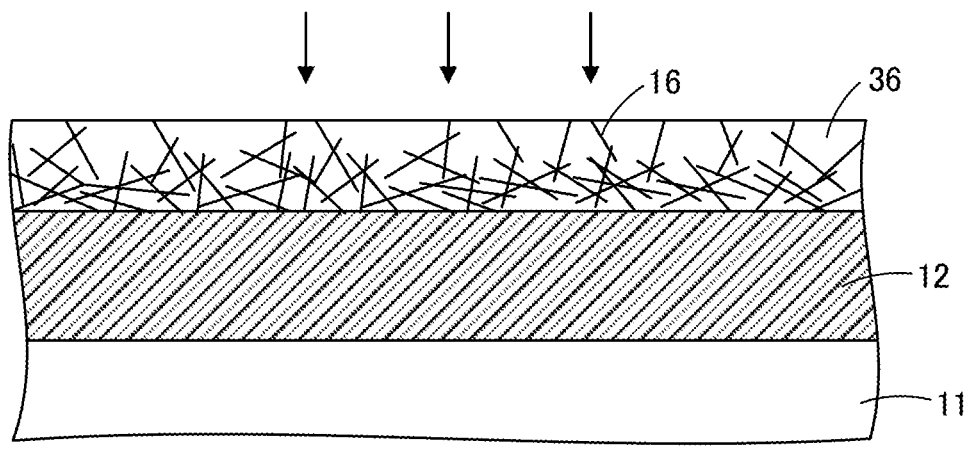
FIGS. 12(A) and 12(B) schematically illustrate the process for producing the electroconductive film according to the first embodiment.

Next, the coating film 36 is exposed to ionizing radiation such as ultraviolet light, as shown in FIG. 12(A), to polymerize (cross-link) the polymerizable compound and to cure the coating film 36, whereby the light-transmitting resin 15 is formed.

Because the electroconductive part 13 of the electroconductive film 10 shown in FIG. 1 is a plain film, the electroconductive film 10 is obtained in the above-described process. On the other hand, because the electroconductive film 20 shown in FIG. 5 is patterned, the patterning step will be described below.

Figure 12B:
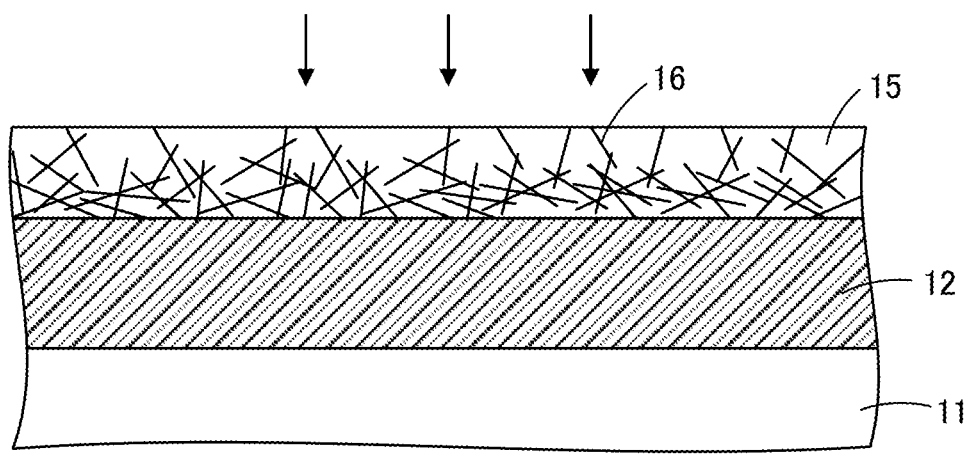

After the light-transmitting resin 15 is formed, areas to be the nonconductive parts 23 are exposed to laser light (for example, infrared laser) to form a pattern on the electroconductive part 13, as shown in FIG. 12(B). Upon irradiation of laser light to the regions of the prospective nonconductive parts 23, electroconductive fibers 16 included in the regions are sublimated by the heat of the laser light. The sublimated electroconductive fibers 16 burst out through the light-transmitting resin 15. Thus, an electroconductive film 10 comprising the electroconductive part 13 shown in FIG. 1 and further comprising the nonconductive parts 23 can be obtained. The patterning of the electroconductive part 13 described above is performed by exposure to laser light, while the patterning of the electroconductive part 13 may be performed by photolithography because electroconductive fibers 16 can also be removed by photolithography from areas to be the nonconductive parts 23.

According to the present embodiment, since the electroconductive fibers 16 as a whole in the electroconductive part 13 or parts 22 or 31 are unevenly distributed on the light-transmitting base material 11 side than the position HL, which is located at half the film thickness of the electroconductive part 13 or parts 22 or 31, the contact points between the electroconductive fibers 16 can be increased. This allows ensuring electrical conduction from the surface 13A of the electroconductive part 13 or the surfaces of the electroconductive parts 22 and 31 and thus for achieving a low surface resistance value of 200Ω/□ or less, even if the content of electroconductive fibers 16 is low. Additionally, a low haze value of 5% or less can be achieved because the content of electroconductive fibers 16 can be reduced.

In a thin electroconductive part, since the amount of electroconductive fibers is accordingly reduced, the electroconductive part is prone to increase the surface resistance value. According to the present embodiment, the electroconductive fibers 16 as a whole in the electroconductive part 13 or parts 22 or 31 are unevenly distributed on the light-transmitting base material 11 side than the position HL, which is located at half the film thickness of the electroconductive part 13 or parts 22 or 31, to increase the contact points between the electroconductive fibers 16, whereby a low haze value of 5% or less and a low surface resistance value of 200Ω/□ or less can be achieved even if the electroconductive part 13 or parts 22 or 31 have a thin film thickness of less than 300 nm or a very thin film thickness of 145 nm or less.

According to the present embodiment, since the electroconductive fibers 16 in the electroconductive part 13 or parts 22 or 31 are unevenly distributed on the light-transmitting base material 11 side than the position HL, which is located at half the film thickness of the electroconductive part 13 or parts 22 or 31, a majority of the electroconductive fibers 16 are covered with the light-transmitting resin 15. This allows inhibiting the electroconductive fibers 16 from reducing the electrical conductivity due to the reaction with sulfur, oxygen, and/or halogens in the air.

According to the present embodiment, since the electroconductive fibers 16 in the electroconductive part 13 or parts 22 or 31 are unevenly distributed on the light-transmitting base material 11 side than the position HL, which is located at half the film thickness of the electroconductive part 13 or parts 22 or 31, a maximally excellent surface resistance value can be obtained with a minimum amount of electroconductive fibers. Additionally, the uneven distribution of the electroconductive fibers 16 as described above enables optical properties with a lower haze value. Furthermore, uneven distribution, rather than homogeneous dispersion, of electroconductive fibers 16 enables easier adjustment of the Martens hardness. Additionally, the dense presence of electroconductive fibers 16 in the light-transmitting resin 15 enables increasing the hardness of the light-transmitting resin and also enables obtaining a light-transmitting resin which is neither too hard nor too soft by devising the composition of the light-transmitting resin 15. In addition, the light-transmitting resin having an appropriate Martens hardness could achieve excellent flexibility for folding or rolling. That is, by combining features of the present invention, physical properties suitable for the requirements of various applications can be imparted.

Even in conventional electroconductive films, some electroconductive films have an electroconductive part comprising a light-transmitting resin and electroconductive fibers incorporated in the light-transmitting resin, and the electroconductive parts of those electroconductive films are formed using an electroconductive fiber-containing composition containing electroconductive fibers and a resin material. In this respect, an aqueous dispersion medium is mainly used as a dispersion medium in an electroconductive fiber-containing composition used for a conventional electroconductive part. The term "aqueous dispersion medium" as used herein shall mean a dispersion medium having a water concentration of 10% by mass or more. For using an aqueous dispersion medium, an electroconductive fiber-containing composition contains a large content of a resin material in view of storage stability and ability to provide a homogeneous coating film upon application. Because of this, even if an electroconductive part is formed using an electroconductive fiber-containing composition, electroconductive fibers as a whole are currently not enabled to distribute unevenly on the light-transmitting base material side than the position located at half the film thickness of the electroconductive part. On the other hand, in cases where an organic dispersion medium is used as the dispersion medium, the ability to provide a homogeneous coating film upon application is superior, which enables to reduce the content of the resin material. In the present embodiment, an organic dispersion medium is used as a dispersion medium for an electroconductive fiber-containing composition, and the electroconductive fiber-containing composition contains no resin material or, alternatively, a smaller amount of a resin material than the conventional amount of the resin material. Accordingly, in the electroconductive part 13 or parts 22 or 31, the electroconductive fibers 16 can be unevenly distributed on the light-transmitting base material 11 side than the position HL, which is located at half the film thickness of the electroconductive part 13 or parts 22 or 31, as well as the electroconductive part 13 or parts 22 or 31 can have a film thickness of less than 300 nm or a very thin film thickness of 145 nm or less.

In cases where an electroconductive film is formed using electroconductive fibers, the electrical resistance value is likely to be different depending on the in-plain direction of an electroconductive part. If the electrical resistance value is different depending on the in-plain direction of the electroconductive part and the electroconductive film is used as an electrode for a touch panel sensor, the patterning of the electrode may have to be changed, as well as the electroconductive film is limited in partitioning and is thus prone to be wasted. The inventors found that, in an electroconductive part containing electroconductive fibers formed on a light-transmitting base material by coating process (particularly, by roll-to-roll process), the electroconductive fibers tend to align along the flow direction of the light-transmitting base material (MD direction) and the electrical resistance value in the MD direction is accordingly reduced; on the other hand, the electrical resistance value observed in a direction (TD direction) orthogonal to the MD direction on the surface of the electroconductive part tends to be higher than that observed in the MD direction, which causes a difference in electrical resistance value depending on the in-plain direction. Depending on the way of defining an arbitrary direction AD, a first direction in which the lowest electrical resistance value is provided is highly likely to be the MD direction or a direction which is inclined at an angle of less than 30 degrees from the MD direction. Accordingly, in cases where the first direction is the MD direction, a second direction perpendicular to the first direction is the TD direction. According to the present embodiment, the electroconductive part 13 is provided directly on the light-transmitting base material 11 by coating process; the difference in electrical resistance value depending on the in-plain direction of the electroconductive part 13 can be reduced if the above-described electrical resistance value ratio is 1 or more and less than 2 in the electroconductive part 13. In cases where the electroconductive film is used for an electrode for a touch panel sensor, limitations on the pattern of the electrode, IC chips, and partitioning are reduced with the reduced difference in electrical resistance.

Meanwhile, image display devices are increasing application examples and image display devices with various shapes (for example, an elongate shape) are under development. An image display device may not conduct electricity equally in all two-dimensional directions but conduct more electricity in a particular direction although it depends on the shape of the image display device. Thus, an electroconductive film incorporated into an image display device may also have a low electrical resistance value in a particular direction on the surface and higher electrical resistance values in other directions. According to the present embodiment, the electroconductive part 13 has a high electrical resistance value in the second direction and a low electrical resistance value in the first direction in cases where the above-described electrical resistance value ratio is 2 or more. Thus, the electroconductive film 30 showing a further lower electrical resistance value in a particular direction (first direction) can be provided.

According to the present embodiment, the light-transmitting resin 15 in the electroconductive part 13 or parts 22 or 31 contains a reaction inhibitor, and can consequently prevent the electroconductive fibers 16 from reducing the electrical conductivity due to the reaction with sulfur, oxygen, and/or halogens in the atmospheric air.

An electroconductive part will be contacted with a light-transmitting adhesive layer when an electroconductive film is incorporated into an image display device. When the electroconductive part in contact with the light-transmitting adhesive layer is tested in a humidity/heat resistance test by leaving them for 240 hours, for example, in an environment at a temperature of 60° C. and a relative humidity of 90%, an environment at a temperature of 85° C. and a relative humidity of 85%, or an environment at a higher temperature and a higher relative humidity, electroconductive fibers may react with components of the light-transmitting adhesive layer (for example, an acidic component that constitutes the adhesive layer itself, and/or an additive that has been added to the adhesive layer) depending on the type of the light-transmitting adhesive layer, which in turn increases the surface resistance value of the electroconductive part. In this respect, according to the present embodiment, a reaction inhibitor contained in the electroconductive part 13 or parts 22 or 31 can control the reaction of the electroconductive fibers 16 with components of a light-transmitting adhesive layer, even if the electroconductive part 13 or parts 22 or 31 in contact with the light-transmitting adhesive layer are tested by the humidity/heat resistance test. Accordingly, the number of light-transmitting adhesive layer choices can be increased.

Figure 13:
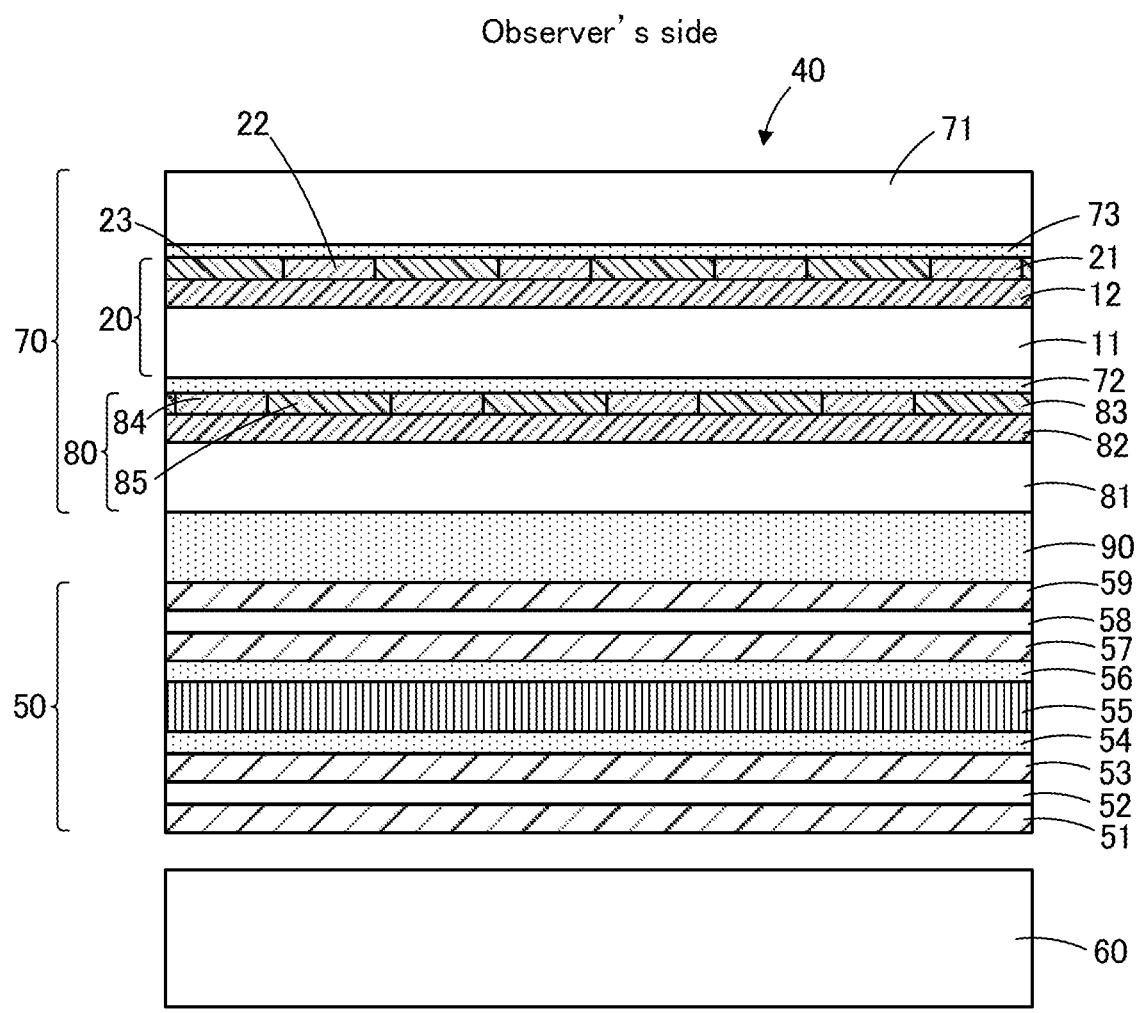
FIG. 13 depicts a schematic diagram of an image display device according to the first embodiment.
Figure 14:
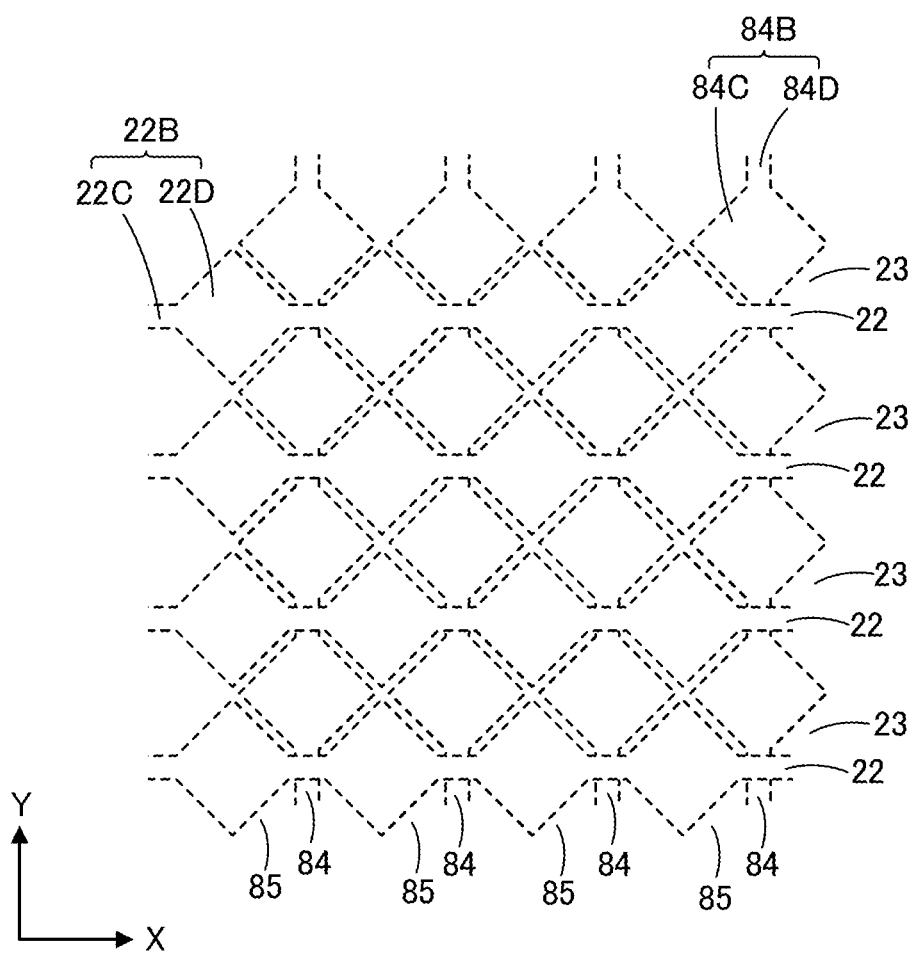
FIG. 14 depicts a schematic plane view of a touch panel according to the first embodiment.
Figure 15:
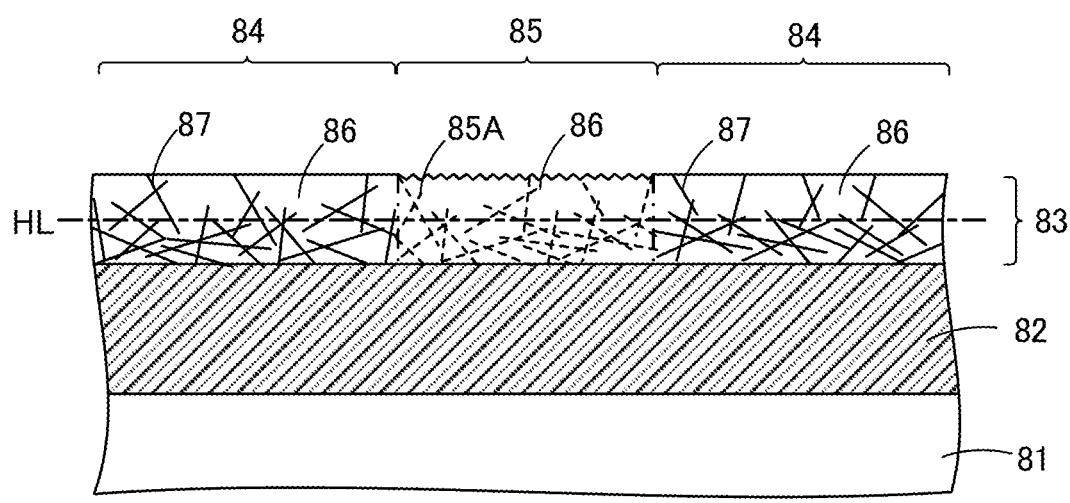
FIG. 15 depicts an enlarged view of a part of the electroconductive film on the side of the display panel shown in FIG. 13.

The application of an electroconductive film according to the present embodiment is not limited to a particular application and can be incorporated into an image display device comprising a touch panel and be used. Additionally, the electroconductive film can be used, for example, as an electro-magnetic interference shield. FIG. 13 depicts a schematic diagram of an image display device according to the present embodiment; FIG. 14 depicts a schematic plain view of a touch panel according to the present embodiment; and FIG. 15 depicts an enlarged view of a part of the electroconductive film on the side of the display panel shown in FIG. 13.

<<<Image Display Device>>>

As shown in FIG. 13, an image display device 40 mainly comprises a display panel 50 for displaying images, a backlight unit 60 placed on the back surface of the display panel 50, a touch panel 70 placed on the observer's side of the display panel 50, and a light-transmitting adhesion layer 90 intervening between the display panel 50 and the touch panel 70. In the present embodiment, the display panel 50 is a liquid-crystal display panel and the image display device 40 thus comprises the backlight unit 60 but may not comprise the backlight unit 60 depending on the type of the display panel (display element).

<<Display Panel>>

The display panel 50 has a laminate structure, as shown in FIG. 13, composed of a protective film 51 made of, for example, a triacetyl cellulose film (TAC film) or a cycloolefin polymer film, a polarizer 52, a protective film 53, a light-transmitting adhesive layer 54, a display element 55, a light-transmitting adhesive layer 56, a protective film 57, a polarizer 58, and a protective film 59 in this order from the backlight unit 60 to the observer's side. The display panel 50 should comprise the display element 55 and may not comprise the protective film 51 or the like.

The display element 55 is a liquid-crystal display element. However, the display element 55 is not limited to a liquid-crystal display element, and may be a display element using, for example, an organic light-emitting diode (OLED), an inorganic light-emitting diode, and/or a quantum dot light-emitting diode (QLED). The liquid-crystal display element comprises, for example, a liquid-crystal layer, an alignment film, an electrode layer, and a color filter located between two glass base materials.

<<Backlight Unit>>

The backlight unit 60 illuminates the display panel 50 from the back surface of the display panel 50. Any known backlight unit can be used as the backlight unit 60, and, moreover, the backlight unit 60 may be either an edge light-type or a direct light-type backlight unit.

<<Touch Panel>>

The touch panel 70 comprises an electroconductive film 80, an electroconductive film 20 placed on the observer's side of the electroconductive film 80, a light-transmitting cover member 71, such as a cover glass, placed on the observer's side of the electroconductive film 20, a light-transmitting adhesive layer 72 intervening between the electroconductive film 80 and the electroconductive film 10, and a light-transmitting adhesive layer 73 intervening between the electroconductive film 20 and the light-transmitting cover member 71.

<Electroconductive Film>

The electroconductive film 80 has almost the same structure as that of the electroconductive film 20. That is, the electroconductive film 80 comprises a light-transmitting base material 81, a light-transmitting functional layer 82 provided on one surface of the light-transmitting base material 81, and electroconductive parts 84 provided and patterned on a surface of the light-transmitting functional layer 82 opposite to the light-transmitting base material 81 side surface, as shown in FIG. 13. The electroconductive parts 84 are an integral part of an electroconductive layer 83. The electroconductive layer 83 is composed of plural electroconductive parts 84 and nonconductive parts 85 located between the electroconductive parts 84. The light-transmitting base material 81 is similar to the light-transmitting base material 11 and the light-transmitting functional layer 82 is likewise similar to the light-transmitting functional layer 82, and further descriptions is thus omitted here.

(Electroconductive Part and Nonconductive Part)

The electroconductive parts 84 have the same structure as that of the electroconductive parts 22. That is, the electroconductive parts 84 comprise a light-transmitting resin 86 and electroconductive fibers 87, as shown in FIG. 15. The nonconductive parts 85 comprise the light-transmitting resin 86 and contain substantially no electroconductive fibers 87. The nonconductive parts 85 shown in FIG. 15 comprise voids 85A in the light-transmitting resin 86, similarly to the nonconductive parts 23. Additionally, the electroconductive fibers 87 are unevenly distributed on the light-transmitting base material 81 side than the position HL, which is located at half the film thickness of the electroconductive parts 84, and the electroconductive parts 84 can conduct electricity from the surfaces 84A.

The electroconductive parts 84 function as electrode lines in the Y direction in a projected capacitive touch panel and comprise plural sensing electrodes 84B and plural connectors (not shown) that are connected to the sensing electrodes 84B, as shown in FIG. 14. The sensing electrodes 84B have the same structure as that of the sensing electrodes 84B but extend in the Y direction. The electroconductive parts 84 have the same structure as that of the electroconductive part 13 but the electroconductive parts 84 may not need to have the same structure as that of the electroconductive parts 22.

<Light-Transmitting Adhesive Layer>

Examples of the light-transmitting adhesive layers 72 and 73 include adhesive sheets, such as OCA (optical clear adhesive) sheets. Light-transmitting adhesion layers may be used instead of the light-transmitting adhesive layers 72 and 73.

<<Light-Transmitting Adhesion Layer>>

The light-transmitting adhesion layer 90 intervenes between the display panel 50 and the touch panel 70, and is attached to both the display panel 50 and the touch panel 70. Thus, the display panel 50 and the touch panel 70 are bonded together. The light-transmitting adhesion layer 90 comprises a cured product of, for example, a liquid curable adhesion layer composition comprising a polymerizable compound such as an OCR (optically clear resin).

The light-transmitting adhesion layer 90 preferably has a film thickness of 10 µm or more and 150 µm or less. In cases where the light-transmitting adhesion layer has a film thickness of less than 10 µm, the light-transmitting adhesion layer is so thin that troubles such as jamming of foreign bodies or poor gap filling performance may easily occur; additionally, in cases where the light-transmitting adhesion layer has a film thickness of more than 150 µm, the production cost is too high. The film thickness of the light-transmitting adhesion layer is determined as the arithmetic mean of the film thickness values measured at randomly selected 10 locations, wherein the film thickness values are determined at the 10 locations in cross-sectional images of the light-transmitting adhesion layer acquired using an optical microscope. A light-transmitting adhesive layer may be used instead of the light-transmitting adhesion layer 90.

Second Embodiment

Figure 16:
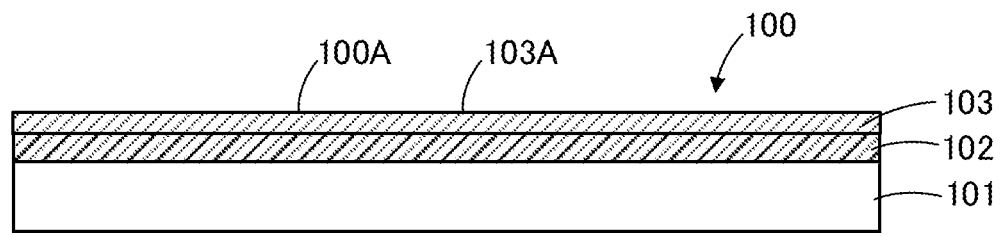
FIG. 16 depicts a schematic diagram of an electroconductive film according to the second embodiment.
Figure 17:
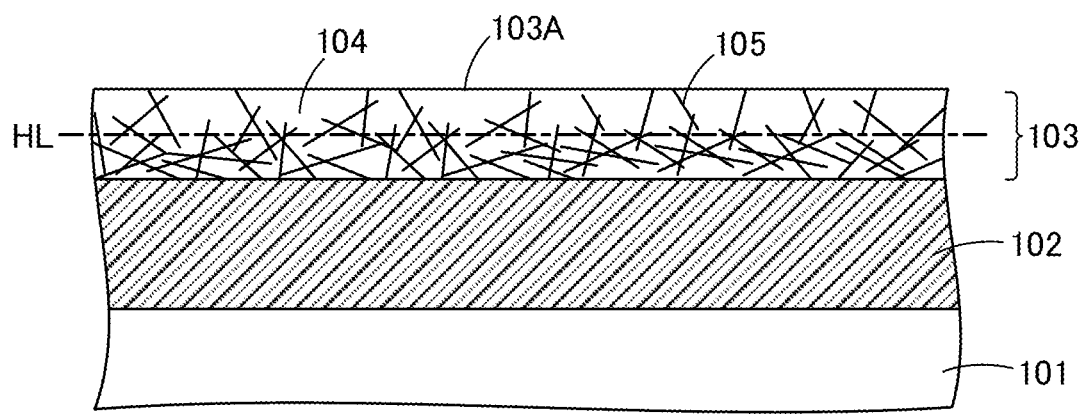
FIG. 17 depicts an enlarged view of a part of the electroconductive film shown in FIG. 16.
Figure 18:
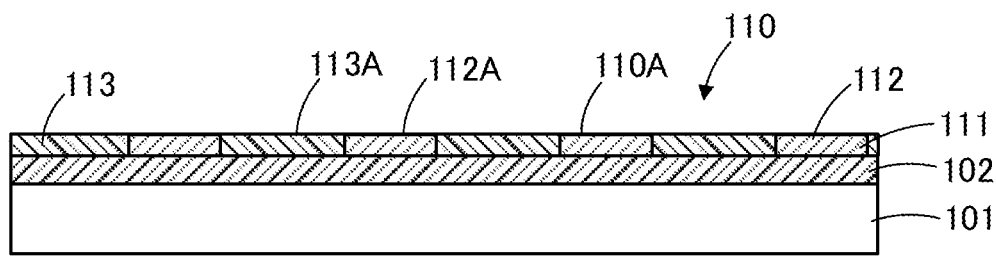
FIG. 18 depicts a schematic diagram of another electroconductive film according to the second embodiment.
Figure 19:
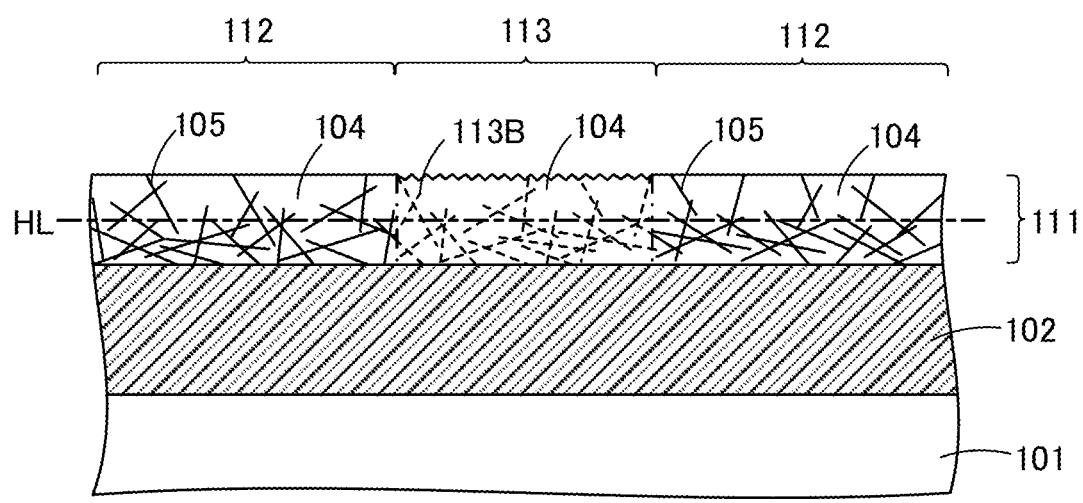
FIG. 19 depicts an enlarged view of a part of the electroconductive film shown in FIG. 18.

Now, the electroconductive film, touch panel, and image display device according to the second embodiment of the present invention will be described below with reference to the drawings. FIG. 16 depicts a schematic diagram of an electroconductive film according to the present embodiment; FIG. 17 depicts an enlarged view of a part of the electroconductive film shown in FIG. 16; FIG. 18 depicts a schematic diagram of another electroconductive film according to the present embodiment; and FIG. 19 depicts an enlarged view of a part of the electroconductive film shown in FIG. 18.

<<<Electroconductive Film>>>

The electroconductive film 100 shown in FIG. 16 is light transmissive and comprises a light-transmitting base material 101, a light-transmitting functional layer 102 provided on one surface of the light-transmitting base material 101, and an electroconductive part 103 provided on a surface of the light-transmitting functional layer 102 opposite to the light-transmitting base material 101 side surface. However, the electroconductive film 100 should comprise the light-transmitting base material 101 and the electroconductive part 103, and may not comprise the light-transmitting functional layer 102. The light-transmitting functional layer 102 shown in FIG. 16 is provided between the light-transmitting base material 101 and the electroconductive part 103; a light-transmitting functional layer may be provided not between the light-transmitting base material 101 and the electroconductive part 103 but on a surface of the light-transmitting base material 101 opposite to the electroconductive part 103 side surface, or may be provided both between the light-transmitting base material 101 and the electroconductive part 103 and on a surface of the light-transmitting base material 101 opposite to the electroconductive part 103 side surface. Additionally, in the electroconductive film 100 shown in FIG. 16, the electroconductive part 103 is provided on only one surface of the electroconductive film, but electroconductive parts may be provided on both surfaces of the electroconductive film.

The electroconductive film 100 has a haze value (total haze value) of 5% or less for the same reason as described for the electroconductive film 10. The haze value of the electroconductive film 100 can be measured by the same method as for the haze value of the electroconductive film 10. The electroconductive film 100 has a haze value of 3% or less, 2% or less, 1.5% or less, 1.2% or less, or 1.1% or less in ascending order of preference (a lower value is more preferred).

The electroconductive film 100 preferably has a total light transmittance of 80% or more for the same reason as described for the electroconductive film 10. The total light transmittance of the electroconductive film 100 can be measured by the same method as for the total light transmittance of the electroconductive film 10. The electroconductive film 10 has a total light transmittance of 85% or more, 88% or more, or 89% or more in ascending order of preference (a higher value is more preferred).

<<Light-Transmitting Resin Base Material>>

The light-transmitting base material 101 is not limited to a particular light-transmitting base material as long as it is a base material composed of a light-transmissive resin. The light-transmitting base material 101 is the same as the light-transmitting base material 11. Thus, the constituent materials and thickness of the light-transmitting base material 101 are also the same as those of the light-transmitting base material 11. The light-transmitting base material 101 is similar to the light-transmitting base material 11, and the description is thus omitted here.

<<Light-Transmitting Functional Layer>>

The light-transmitting functional layer 102 is placed between the light-transmitting base material 101 and the electroconductive part 103. The light-transmitting functional layer 102 is the same as the light-transmitting functional layer 12. For example, specific examples, the pencil hardness, the film thickness, the constituent materials, and the additives of the light-transmitting functional layer 102 are also the same as those of the light-transmitting base material 11. The light-transmitting functional layer 102 is similar to the light-transmitting functional layer 12, and the description is thus omitted here.

<<Electroconductive Part>>

The surface 100A of the electroconductive film 100 is constituted by the surface 103A of the electroconductive part 103. The electroconductive part 103 comprises a light-transmitting resin 104 and plural electroconductive fibers 105 incorporated in the light-transmitting resin 104, as shown in FIG. 17. The electroconductive part 103 preferably further comprises a reaction inhibitor which is contained in the light-transmitting resin 104.

The ratio of the electrical resistance value in a second direction to that in a first direction (the ratio is hereinafter referred to as "electrical resistance value ratio") is 1 or more and less than 2 when the electrical resistance values are measured in samples having a predetermined size in six different directions including an arbitrary direction for each an angle of 30 degrees to the arbitrary direction in the surface 103A of the electroconductive part 103, wherein a direction in which the electroconductive part shows the lowest electrical resistance value is designated as the first direction, and a direction which is perpendicular to the first direction is designated as the second direction. The electrical resistance value ratio can be determined by a method similar to the electric resistance measurement method described for the electroconductive part 13. The maximum electrical resistance value ratio is 1.8 or less, 1.5 or less, 1.3 or less, or 1.2 or less in ascending order of preference (a lower value is more preferred).

Such an electroconductive part 103 having an electrical resistance value ratio of 1 or more and less than 2 can be obtained, for example, by modifying the fiber length of the below-described electroconductive fibers 105, the type or film thickness of a resin that constitutes the below-described organic protective layer, and/or the temperature for drying the electroconductive fiber-containing composition.

The electroconductive part 103 can conduct electricity from the surface 103A of the electroconductive part 103. Measurement of the surface resistance value of the electroconductive part 103 can determine, as in the case of the electroconductive part 13, whether or not the electroconductive part can conduct electricity from the surface of the electroconductive part. The method of measuring the surface resistance of the electroconductive part 103 and the criteria to evaluate whether or not the electroconductive part 103 can conduct electricity from the surface 103A of the electroconductive part 103 are the same as those described for the electroconductive part 13, and the description of the measurement method and the evaluation criteria is thus omitted here. Although a majority of the electroconductive fibers 105 are distributed from the position HL, which is located at half the film thickness of the electroconductive part 103, to the light-transmitting base material 101, as described below, the remaining electroconductive fibers 105 are stacked on the electroconductive fibers 105 which are distributed on the light-transmitting base material 101 side, and consequently distributed from the position HL, which is located at half the film thickness of the electroconductive part 103, to the surface 103A, and also exposed on the surface 103A of the electroconductive part 103. Thus, the electroconductive part 103 can conduct electricity from the surface 103A.

In the electroconductive part 103, the electroconductive fibers 105 are preferably unevenly distributed on the light-transmitting base material 101 side than the position HL, which is located at half the film thickness of the electroconductive part 103, as shown in FIG. 17. The determination of whether or not the electroconductive fibers 105 are unevenly distributed on the light-transmitting base material 101 side than the position HL, which is located at half the film thickness of the electroconductive part 103, is achieved by the evaluation method described for the electroconductive part 13, and the description of the method is omitted here. The existence ratio of electroconductive fibers distributed on the light-transmitting base material 101 side than the position located at half the film thickness of the electroconductive part, which is determined from cross-sectional images photographed using a scanning transmission electron microscope (STEM) or a transmission electron microscope (TEM), is 70% or more or 80% or more in ascending order of preference (a higher value is more preferred).

The surface resistance of the electroconductive part 103 is 200Ω/□ or less for the same reason as described for the electroconductive part 13. The surface resistance of the electroconductive part 103 is a surface resistance value measured on the surface 103A of the electroconductive part 103. The surface resistance of the electroconductive part 103 can be measured by the same method as for the surface resistance of the electroconductive part 13. The minimum surface resistance value of the electroconductive part 103 is 1Ω/□ or more, 5Ω/□ or more, or 10Ω/□ or more in ascending order of preference (a higher value is more preferred), while the maximum surface resistance value of the electroconductive part 103 is 100Ω/□ or less, 70Ω/□ or less, 60Ω/□ or less, or 50Ω/□ or less in ascending order of preference (a lower value is more preferred).

The electroconductive part 103 preferably has a film thickness of less than 300 nm from the viewpoint of thinning the electroconductive film. The film thickness of the electroconductive part 103 can be measured by the same method as for the film thickness of the electroconductive part 13. The maximum film thickness of the electroconductive part 103 is 145 nm or less, 140 nm or less, 120 nm or less, 110 nm or less, 80 nm or less, or 50 nm or less in ascending order of preference (a lower value is more preferred). Additionally, the minimum film thickness of the electroconductive part 103 is preferably 10 nm or more for the same reason as described for the electroconductive part 13.

The electroconductive part 103 preferably has a Martens hardness of 970 N/mm$^2$ or more and 1050 N/mm$^2$ or less at an indentation amount of 10 nm from the surface 103A for the same reason as described for the electroconductive part 13. In the electroconductive part 103, the minimum Martens hardness at the above-described indentation amount of 10 nm is 980 N/mm$^2$ or more, 1000 N/mm$^2$ or more, or 1015 N/mm$^2$ or more in ascending order of preference (a higher value is more preferred); the maximum Martens hardness at the above-described indentation amount of 10 nm is 1040 N/mm$^2$ or less, 1030 N/mm$^2$ or less, or 1020 N/mm$^2$ or less in ascending order of preference (a lower value is more preferred).

The electroconductive part 103 preferably has a Martens hardness of 130 N/mm$^2$ or more and 300 N/mm$^2$ or less at an indentation amount of 100 nm from the surface 103A for the same reason as described for the electroconductive part 13. In the electroconductive part 103, the minimum Martens hardness at the above-described indentation amount of 100 nm is 140 N/mm$^2$ or more, 150 N/mm$^2$ or more, or 170 N/mm$^2$ or more in ascending order of preference (a higher value is more preferred); the maximum Martens hardness at the above-described indentation amount of 100 nm is 280 N/mm$^2$ or less, 250 N/mm$^2$ or less, or 200 N/mm$^2$ or less in ascending order of preference (a lower value is more preferred).

<Light-Transmitting Resin>

The light-transmitting resin 104 covers electroconductive fibers 105, similarly to the light-transmitting resin 15, to prevent removal of the electroconductive fibers 105 from the electroconductive part 103 and to improve the durability or abrasion resistance of the electroconductive part 103, and, also in the present embodiment, covers electroconductive fibers 105 to such an extent that the electroconductive part 103 can conduct electricity from the surface 103A. The light-transmitting resin 104 is the same as the light-transmitting resin 15. Thus, the film thickness and constituent materials of the light-transmitting resin 104 are also the same as those of the light-transmitting resin 15. The light-transmitting resin 104 is similar to the light-transmitting resin 15, and the description is thus omitted here.

<Reaction Inhibitor>

A reaction inhibitor is a substance that prevents reduction in electrical conductivity after application of the light-transmitting resin composition due to the reaction of the electroconductive fibers 105 with substances in the atmosphere. The reaction inhibitor and the content of the reaction inhibitor are the same as those described in the first embodiment, and the description of the reaction inhibitor and the content is thus omitted here.

<Electroconductive Fibers>

In cases where the electroconductive fibers 105 are unevenly distributed on the light-transmitting base material 101 side than the position HL, which is located at half the film thickness of the electroconductive part 103, the electroconductive fibers 105 contact with each other in the thickness direction of the electroconductive part 103, as indicated by the ability of the electroconductive part 103 to conduct electricity from the surface 103A.

The electroconductive fibers 105 preferably contact with each other to form a network structure (meshwork) to the surface direction (two-dimensional direction) of the electroconductive part 103 in the light-transmitting base material 101 side than the position HL, which is located at half the film thickness of the electroconductive part 103. Formation of a network structure by the electroconductive fibers 105 enables efficient creation of a conductive path with the electroconductive fibers 105 even in a small amount.

Some of the electroconductive fibers 105 are preferably exposed on the surface 103A of the electroconductive part 103. Once electrical conduction from the surface 103A of the electroconductive part 103 is identified by the above-described measurement method, some of the electroconductive fibers 105 can thus be determined to be exposed on the surface 103A of the electroconductive part 103.

The electroconductive fibers 105 preferably have a fiber diameter of 200 nm or less for the same reason as described for the electroconductive fibers 16. The minimum fiber diameter of the electroconductive fibers 105 is more preferably 10 nm or more from the viewpoint of the electroconductive of the electroconductive part 103, and a more preferred range of fiber diameter in the electroconductive fibers 105 is from 15 nm to 180 nm inclusive. The fiber diameter of the electroconductive fibers 105 can be obtained by the same method as for the fiber diameter of the electroconductive fibers 16.

The electroconductive fibers 105 preferably have a fiber length of 1 μm or more and less than 30 μm. In cases where the electroconductive fibers 105 have a fiber length of less than 1 μm, the surface resistance value is increased, which may result in failure to form an electroconductive part having a sufficient electrical conductivity. The amount of added electroconductive fibers having a fiber length of less than 1 μm may be increased to reduce the surface resistance. However, an increase of the added amount of such electroconductive fibers leads to reduction in surface resistance value but may result in a higher haze value and a low light transmittance. Additionally, in cases where the electroconductive fibers 105 have a fiber length of 30 μm or more, electroconductive fibers are easily aligned along the below-described MD direction, which causes a tendency to increase the difference in electrical resistance value depending on the direction on a surface, or leads to a difficulty in coating during the preparation of an electroconductive part by coating process. The electroconductive fibers 105 preferably have a minimum fiber length of 10 μm or more and a maximum fiber length of 20 μm or more. The fiber length of the electroconductive fibers 105 can be obtained by the same method as for the fiber length of the electroconductive fibers 16.

The constituent fibers of the electroconductive fibers 105 are the same as those of the electroconductive fibers 16, and the description of the constituent fibers is thus omitted here.

<<Other Electroconductive Films>>

For the electroconductive film 100 shown in FIG. 16, the electroconductive part 103 is a film with no pattern, namely a so-called plain film, but the electroconductive part may be patterned depending on applications. Specifically, the electroconductive film may be an electroconductive film 110, as shown in FIG. 18, comprising an electroconductive layer 111 which is composed of plural electroconductive parts 112 and plural nonconductive parts 113 located between the electroconductive parts 112, or an electroconductive film comprising, as shown in FIG. 4, plural electroconductive parts and plural gaps existing between the electroconductive parts. The surface 110A of the electroconductive film 110 comprises the surfaces 112A of the electroconductive parts 112 and the surfaces 113A of the nonconductive parts 113, while the surface of the electroconductive film comprising gaps existing between electroconductive parts comprises the surfaces of the electroconductive parts and one surface of the light-transmitting functional layer. For example, the physical property values of the electroconductive film 110 and the electroconductive film comprising gaps existing between electroconductive parts are similar to those of the electroconductive film 100. In FIG. 18, the elements indicated by the same reference numbers as in FIG. 16 are the same as those indicated in FIG. 16, and further description is thus omitted.

<Electroconductive Part>

The electroconductive parts 112 are the same as the electroconductive part 103, except that the former electroconductive parts are patterned. That is, the electroconductive parts 112 comprise a light-transmitting resin 104 and plural electroconductive fibers 105 incorporated in the light-transmitting resin 104, as shown in FIG. 19. The electroconductive parts 112 can conduct electricity from the surfaces 112A. In the electroconductive parts 112, the electroconductive fibers 105 are preferably unevenly distributed on the light-transmitting base material 101 side than from the position HL, which is located at half the film thickness of the electroconductive parts 112, as shown in FIG. 19. Other configurations, materials, physical properties values, and the like of the electroconductive parts 112 are also the same as those of the electroconductive part 10, and further description is thus omitted here.

<Nonconductive Part>

The nonconductive parts 113 are parts located between electroconductive parts 112 and having no electrical conductivity. As shown in FIG. 19, the nonconductive parts 113 contain substantially no electroconductive fibers 105.

Because the nonconductive parts 113 are formed together with the electroconductive parts 112 as an integrated body, the film thickness of the nonconductive parts is less than 300 nm. The maximum film thickness of the nonconductive parts 23 is 145 nm or less, 140 nm or less, 120 nm or less, 110 nm or less, 80 nm or less, or 50 nm or less in ascending order of preference (a lower value is more preferred). Additionally, the minimum film thickness of the nonconductive parts 23 is preferably 10 nm or more. The film thickness of the nonconductive parts 113 will be measured by the same method as for the film thickness of the electroconductive part 103.

As shown in FIG. 19, the nonconductive parts 113 comprise the light-transmitting resin 104. The nonconductive parts 113 may be formed by removing electroconductive fibers 105 through sublimation and may have the resulting voids 113B which are not filled with electroconductive fibers. In that case, the sublimated electroconductive fibers 105 burst out through areas to be the nonconductive parts 113 during the formation of the nonconductive parts 113 and the resulting nonconductive parts 113 have rough surfaces 113A. The light-transmitting resin 104 in the nonconductive parts 113 is the same as the light-transmitting resin 104 in the electroconductive part 103, and the description is thus omitted here.

<<Production Methods of Electroconductive Films>>

The electroconductive film 100 can be produced, for example, as follows. First, a light-transmitting functional layer composition is applied on one surface of the light-transmitting base material 11 and dried to form a coating film of the light-transmitting functional layer composition. The light-transmitting functional layer composition is the same as that used in the first embodiment, and the description of the light-transmitting functional layer composition is thus omitted here.

Next, the coating film is exposed to ionizing radiation such as ultraviolet light or heated to polymerize (cross-link) a polymerizable compound and to cure the coating film, whereby the light-transmitting functional layer 102 is formed.

After the light-transmitting functional layer 102 is formed on the light-transmitting base material 101, an electroconductive fiber-containing composition containing electroconductive fibers 105 and an organic dispersion medium is applied on a surface of the light-transmitting functional layer 102 opposite to the light-transmitting base material 101 side surface, and dried to place a plurality of the electroconductive fibers 105 on the light-transmitting functional layer 102. The electroconductive fiber-containing composition is the same as that used in the first embodiment, and the description of the electroconductive fiber-containing composition is thus omitted here.

After a plurality of the electroconductive fibers 105 are placed on the light-transmitting functional layer 102, a light-transmitting resin composition containing a polymerizable compound and a solvent is applied on the electroconductive fibers 105 and dried to form a coating film of the light-transmitting resin composition. The light-transmitting resin composition is the same as that used in the first embodiment, and the description of the light-transmitting resin composition is thus omitted here.

Next, the coating film is exposed to ionizing radiation such as ultraviolet light to polymerize (cross-link) the polymerizable compound and to cure the coating film, whereby the light-transmitting resin 104 is formed. Thus, an electroconductive film 10 as shown in FIG. 16 can be obtained. The electroconductive film 110 shown in FIG. 18 is patterned and can be obtained similarly to the first embodiment, for example, by irradiating laser light (for example, infrared laser) to areas to be the nonconductive parts 113 for the generation of patterns of the electroconductive parts 112.

According to the present embodiment, the electroconductive part 103 or 112 is provided directly on the light-transmitting base material 101 by coating process; the difference in electrical resistance value depending on the in-plain direction of the electroconductive part 103 or 112 can be reduced due to the same reason as described in the first embodiment, because the above-described electrical resistance value ratio is 1 or more and less than 2 in the electroconductive part 103 or 112. In cases where the electroconductive film is used for an electrode for a touch panel sensor, limitations on the pattern of the electrode and on IC chips are reduced, and the patterning of the electrode for a touch panel sensor needs not be changed, and limitations on partitioning is also reduced.

In the present embodiment, the contact points between the electroconductive fibers 105 can be increased in cases where the electroconductive fibers 105 as a whole in the electroconductive part 103 or parts 112 are unevenly distributed on the light-transmitting base material 101 side than the position HL, which is located at half the film thickness of the electroconductive part 103 or parts 112. This allows ensuring electrical conduction from the surface 103A of the electroconductive part 103 or the surfaces 112A of the electroconductive parts 112 through the electroconductive fibers 105 exposed on the surface 103A or the surfaces 112A and thus for achieving a lower surface resistance value, even if the content of electroconductive fibers 105 is low. Additionally, a low haze value of 5% or less can be achieved because the content of electroconductive fibers 105 can be reduced.

In a thin electroconductive part, the amount of electroconductive fibers is accordingly reduced and the electroconductive part is thus prone to increase the surface resistance. A according to the present embodiment, the contact points between the electroconductive fibers 105 are increased in cases where the electroconductive fibers 105 as a whole in the electroconductive part 103 or parts 112 are unevenly distributed on the light-transmitting base material 101 side than the position HL, which is located at half the film thickness of the electroconductive part 103 or parts 112, and a low haze value of 5% or less and a low surface resistance value of 200Ω/□ or less can consequently be achieved even if the electroconductive part 103 or parts 112 have a thin film thickness of less than 300 nm or a very thin film thickness of 145 nm or less.

According to the present embodiment, a majority of the electroconductive fibers 105 in the electroconductive part 103 are covered with the light-transmitting resin 104 in cases where the electroconductive fibers 105 are unevenly distributed on the light-transmitting base material 101 side than the position HL, which is located at half the film thickness of the electroconductive part 103. This enables reducing the corrosion of the electroconductive fibers 105 by sulfur and/or oxygen in the air.

In the present embodiment, a maximally excellent surface resistance value can be obtained with a minimum amount of electroconductive fibers in cases where the electroconductive fibers 105 as a whole in electroconductive part 103 or parts 112 are unevenly distributed on the light-transmitting base material 101 side than the position HL, which is located at half the film thickness of the electroconductive part 103 or parts 112. Additionally, the uneven distribution of the electroconductive fibers 105 as described above enables optical properties with a lower haze value. Furthermore, uneven distribution, rather than homogeneous dispersion, of electroconductive fibers 105 enables easier adjustment of the Martens hardness. Additionally, the dense presence of electroconductive fibers 105 in the light-transmitting resin 104 enables increasing the hardness of the light-transmitting resin and also enables obtaining a light-transmitting resin which is neither too hard nor too soft by devising the composition of the light-transmitting resin 104. In addition, the light-transmitting resin having an appropriate Martens hardness could achieve excellent flexibility for folding or rolling.

In the present embodiment, an organic dispersion medium is used as a dispersion medium for an electroconductive fiber-containing composition, and the electroconductive fiber-containing composition contains no resin material or, alternatively, a smaller amount of a resin material than the conventional amount of the resin material. Accordingly, in the electroconductive part 103 or parts 112, the electroconductive fibers 105 can be unevenly distributed on the light-transmitting base material 10 side than the position HL, which is located at half the film thickness of the electroconductive part 103 or parts 112, due to the same reason as described in the first embodiment.

According to the present embodiment, the light-transmitting resin 104 in the electroconductive part 103 or parts 112 contains a reaction inhibitor, and can consequently prevent the electroconductive fibers 105 from reducing the electrical conductivity due to the reaction with sulfur, oxygen, and/or halogens in the atmospheric air.

According to the present embodiment, a reaction inhibitor contained in the electroconductive part 103 or parts 112 can control the reaction of the electroconductive fibers 105 with components of a light-transmitting adhesive layer due to the same reason as described in the first embodiment, even if the electroconductive part 103 or parts 112 in contact with the light-transmitting adhesive layer are tested by the humidity/heat resistance test. Accordingly, the number of light-transmitting adhesive layer choices can be increased.

According to the present embodiment, the use of electroconductive fibers 105, differing from ITO, enables providing an electroconductive film 10 which is hardly broken when folded. Thus, the electroconductive films 100 and 110 can be incorporated into a foldable image display device and then used.

The electroconductive films 100 and 110 have been described above; the above-described electroconductive film comprising gaps existing between electroconductive parts can likewise obtain the same effects as those of the electroconductive films 100 and 110.

Figure 20:
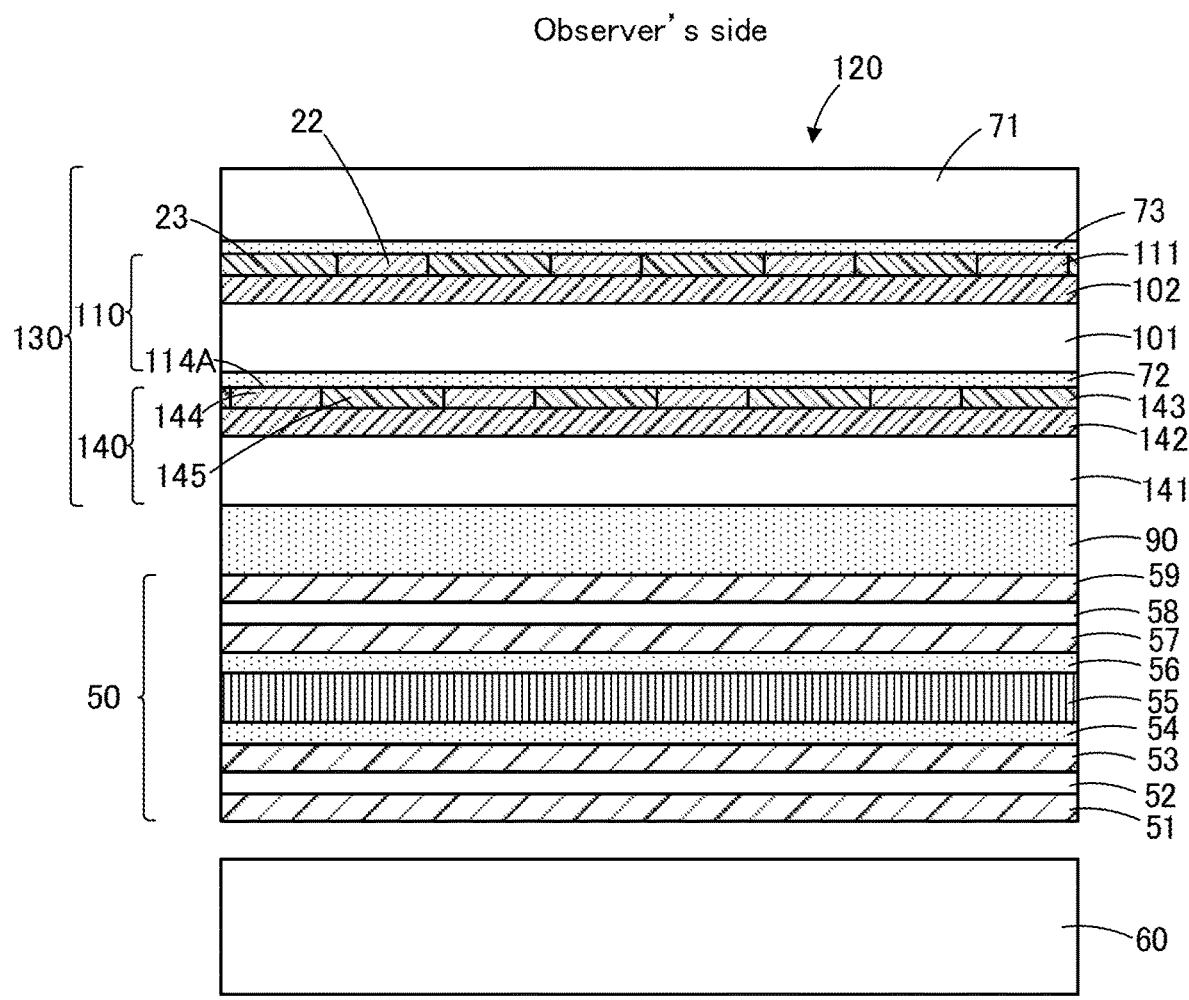
FIG. 20 depicts a schematic diagram of an image display device according to the second embodiment.

The electroconductive film 100 according to the present embodiment can be incorporated into, for example, an image display device and then used. FIG. 20 depicts a schematic diagram of an image display device according to the present embodiment. In FIG. 20, the elements indicated by the same reference numbers as in FIG. 13 are the same as those indicated in FIG. 13, and further description is thus omitted.

<<<Image Display Device>>>

As shown in FIG. 20, an image display device 120 mainly comprises a display panel 50 for displaying images, a backlight unit 60 placed on the back surface of the display panel 50, a touch panel 130 placed on the observer's side of the display panel 50, and a light-transmitting adhesion layer 90 intervening between the display panel 50 and the touch panel 130. In the present embodiment, the display panel 50 is a liquid-crystal display panel and the image display device 40 thus comprises the backlight unit 60 but may not comprise the backlight unit 60 depending on the type of the display panel (display element).

<<Touch Panel>>

The touch panel 130 comprises an electroconductive film 140, an electroconductive film 110 placed on the observer's side of the electroconductive film 140, a light-transmitting cover member 71, such as a cover glass, placed on the observer's side of the electroconductive film 110, a light-transmitting adhesive layer 72 intervening between the electroconductive film 140 and the electroconductive film 110, and a light-transmitting adhesive layer 73 intervening between the electroconductive film 110 and the light-transmitting cover member 71.

<Electroconductive Film>

The electroconductive film 140 has almost the same structure as that of the electroconductive film 110. That is, the electroconductive film 14l comprises a light-transmitting base material 141, a light-transmitting functional layer 142 provided on one surface of the light-transmitting base material 141, and electroconductive parts 134 provided and patterned on a surface of the light-transmitting functional layer 142 opposite to the light-transmitting base material 141 side surface, as shown in FIG. 20. The electroconductive parts 134 are an integral part of an electroconductive layer 143. The electroconductive layer 143 is composed of plural electroconductive parts 134 and nonconductive parts 135 located between the electroconductive parts 134. The light-transmitting base material 141 is similar to the light-transmitting base material 101 and the light-transmitting functional layer 142 is likewise similar to the light-transmitting functional layer 102, and further descriptions is thus omitted here.

(Electroconductive Part and Nonconductive Part)

The electroconductive parts 134 have the same structure as that of the electroconductive parts 112. That is, the electroconductive parts 134 comprise a light-transmitting resin and electroconductive fibers, as shown in FIG. 20. The nonconductive parts 135 comprise a light-transmitting resin and contain substantially no electroconductive fibers. Additionally, the electroconductive fibers in the electroconductive parts 134 are unevenly distributed on the light-transmitting base material 141 side than the position HL, which is located at half the film thickness of the electroconductive parts 134, and the electroconductive parts 134 can conduct electricity from the surfaces 144A. The electroconductive parts 134 have the same structure as that of the electroconductive parts 112 but the electroconductive parts 134 may not need to have the same structure as that of the electroconductive parts 112.

The electroconductive parts 112 of the electroconductive film 110 function as electrode lines in the X direction in a projected capacitive touch panel, while the electroconductive parts 134 of the electroconductive film 140 function as electrode lines in the Y direction in a projected capacitive touch panel and have the same top view as shown in FIG. 14.

The electroconductive films used in touch panel applications have been described in the above embodiment, but the electroconductive films are not limited to particular applications. For example, the electroconductive film 100 and 110 can also be used for connection with IC chips or as electric wirings.

Third Embodiment

Figure 21:
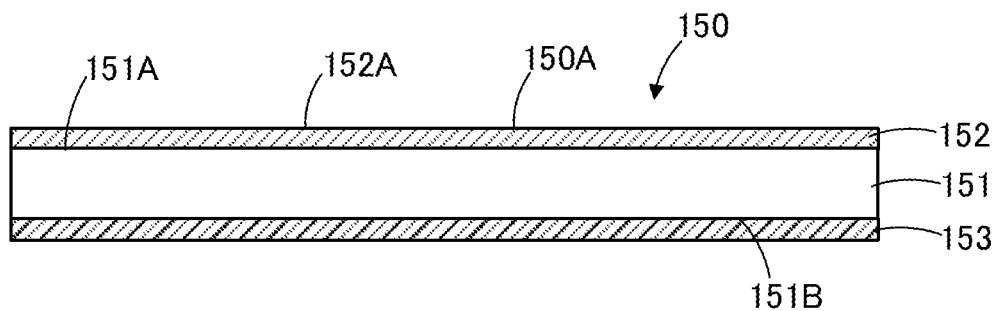
FIG. 21 depicts a schematic diagram of an electroconductive film according to the third embodiment.
Figure 22:
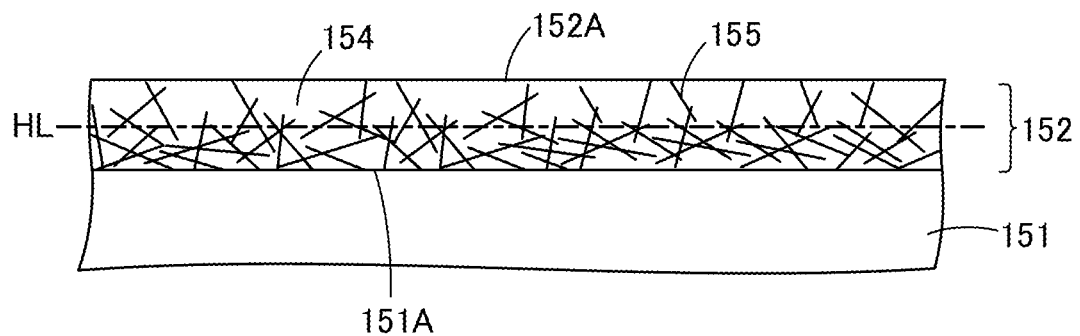
FIG. 22 depicts an enlarged view of a part of the electroconductive film shown in FIG. 21.
Figure 23A:
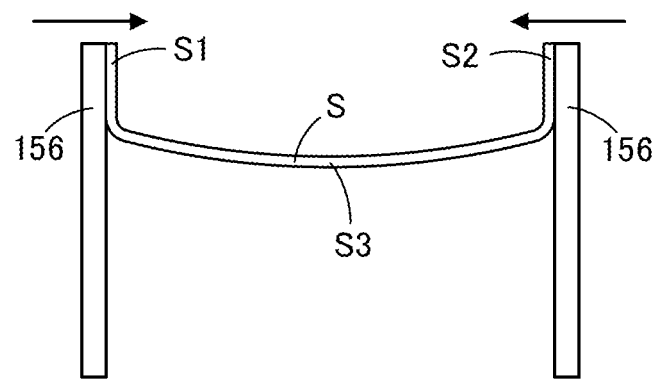
FIGS. 23(A), 23(B) and 23(C) schematically illustrate each step of the foldability test.
Figure 24:
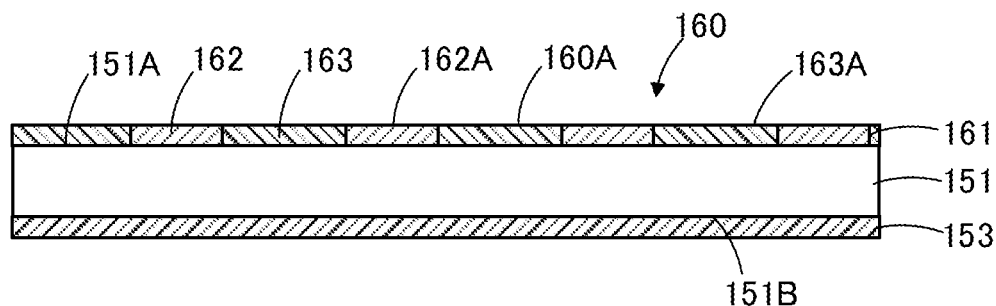
FIG. 24 depicts a schematic diagram of another electroconductive film according to the third embodiment.
Figure 25:
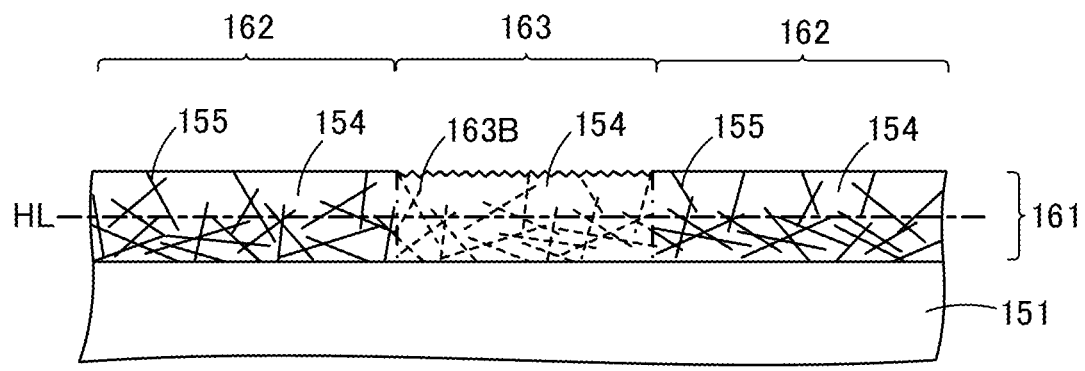
FIG. 25 depicts an enlarged view of a part of the electroconductive film shown in FIG. 24.

Now, the electroconductive film, touch panel, and image display device according to the third embodiment of the present invention will be described below with reference to the drawings. FIG. 21 depicts a schematic diagram of an electroconductive film according to the present embodiment; FIG. 22 depicts an enlarged view of a part of the electroconductive film shown in FIG. 21; and FIG. 23 schematically illustrates each step of the foldability test. FIG. 24 depicts a schematic diagram of another electroconductive films according to the present embodiment, while FIG. 25 depicts an enlarged view of a part of the electroconductive film shown in FIG. 24. FIGS. 26 and 27 schematically illustrate the process for producing the electroconductive film according to the present embodiment.

<<<Electroconductive Film>>>

The electroconductive film 150 shown in FIG. 21 is light transmissive and comprises a light-transmitting base material 151, and an electroconductive part 152 provided directly on one surface of the light-transmitting base material 151. The surface 150A of the electroconductive film 150 is constituted by the surface 152A of the electroconductive part 152.

The electroconductive film 150 further comprises an underlayer 153 provided directly on the other surface 151B of the light-transmitting resin base material 151 opposite to the one surface 151A. In addition, although the electroconductive part 152 shown in FIG. 21 is provided only on the one surface 151A of the light-transmitting resin base material 151, an electroconductive part may additionally be provided on the other surface 151B of the light-transmitting resin base material 151. In that case, it is preferred not to provide the underlayer 153 and to provide an electroconductive part directly on the other surface 151B of the light-transmitting resin base material 151. However, in cases where electroconductive parts are provided on both surfaces of the light-transmitting resin base material, an electroconductive part should be provided directly on one surface of the light-transmitting resin base material and another electroconductive part may not need to be provided directly on the other surface of the light-transmitting resin base material.

The electroconductive film 150 has a haze value (total haze value) of 5% or less for the same reason as described for the electroconductive film 10. The haze value of the electroconductive film 150 can be measured by the same method as for the haze value of the electroconductive film 10. The electroconductive film 150 has a haze value of 3% or less, 2% or less, 1.5% or less, 1.2% or less, or 1.1% or less in ascending order of preference (a lower value is more preferred).

The electroconductive film 150 preferably has a total light transmittance of 80% or more for the same reason as described for the electroconductive film 10. The total light transmittance of the electroconductive film 150 can be measured by the same method as for the total light transmittance of the electroconductive film 10. The electroconductive film 150 has a total light transmittance of 85% or more, 88% or more, or 89% or more in ascending order of preference (a higher value is more preferred).

The electroconductive film 150 has flexibility. Preferably, even if the electroconductive film 150 is folded at 180 degrees in a manner that leaves a gap of 3 mm between the opposite edges of the electroconductive film 150 and the process (foldability test) is repeated one hundred thousand times, the below-described ratio between the electrical resistance values measured before and after the foldability test on the surface 152A of the electroconductive part 152 of the electroconductive film 150 is 3 or less; more preferably, the ratio between the electrical resistance values measured before and after the foldability test on the surface 152A of the electroconductive part 152 of the electroconductive film 150 is 3 or less even if the foldability test is repeated two hundred thousand times; further preferably, the ratio between the electrical resistance values measured before and after the foldability test on the surface 152A of the electroconductive part 152 of the electroconductive film 150 is 3 or less even if the foldability test is repeated one million times. In cases where the ratio between the electrical resistance values measured before and after the foldability test on the surface of an electroconductive part of an electroconductive film is more than 3 after repeating the foldability test on the electroconductive film one hundred thousand times, the value of the ratio indicates the possibility that the electroconductive film is cracked or otherwise damaged, which in turn means that the electroconductive film has poor flexibility. In this respect, any crack or other damage to the electroconductive film by the foldability test reduces the electrical conductivity, which causes the electrical resistance value measured after the foldability test on the surface of the electroconductive part of the electroconductive film to be higher than that measured before the foldability test on the surface of the electroconductive part of the electroconductive film. Because of this respect, the determination of whether or not an electroconductive film is cracked or otherwise damaged can be achieved by determining the ratio between the electrical resistance values measured before and after the foldability test on the surface of the electroconductive part of the electroconductive film. If a hard coat layer is provided between a light-transmitting resin base material and an electroconductive part, it is highly likely that the hard coat layer is cracked by the foldability test after repeating the foldability test the number of times as specified above and the ratio of the electrical resistance value measured after the foldability test on the surface of the electroconductive part of the electroconductive film exceeds 3. In cases where the foldability test is repeated the number of times as specified above, the ratio between the electrical resistance values measured before and after the foldability test on the surface 152A of the electroconductive part 152 of the electroconductive film 150 is more preferably 1.5 or less, regardless of whether a hard coat layer is provided or not. The foldability test may be carried out by folding the electroconductive film 150 with the electroconductive part 152 facing either inward or outward. In either case, the ratio between the electrical resistance values measured before and after the foldability test on the surface 152A of the electroconductive part 152 of the electroconductive film 150 is preferred to be 3 or less.

Specifically, first of all, samples similar to those prepared for the measurement of the electrical resistance as described in the first embodiment are prepared. Specifically, as in the case of the electroconductive film 30 shown in FIG. 8, an arbitrary direction AD is determined in the surface of the electroconductive part 152 and samples S having a predetermined size (for example, in a rectangular shape having a size of 125 mm length×50 mm width) and extending in six different directions including the arbitrary direction AD, which are each an angle of 30 degrees to the arbitrary direction, are cut from the electroconductive film 150 before the foldability test. If samples having a size of 125 mm length×50 mm width cannot be cut, samples having a size of, for example, 110 mm length×50 mm width may be cut from the electroconductive film. After six samples S are cut from the electroconductive film before the foldability test, each of the samples S before the foldability test is measured for electrical resistance on the surface of the electroconductive part. Specifically, as in the case of FIG. 9, a silver paste (product name "DW-520H-14"; manufactured by Toyobo Co., Ltd.) is applied on both longitudinal ends of each sample S (for example, each end having a size of 10 mm length×50 mm width) to prevent any change in distance between points for measuring the electrical resistance, and heated at 130° C. for 30 minutes to provide a cured silver paste to each end of the sample, and the electrical resistance of the sample is then measured using a tester (product name "Digital MΩ Hitester 3454-11"; manufactured by Hioki E.E. Corporation). When the electrical resistance is measured, probe terminals of the tester are individually contacted with either of the cured silver pastes provided on both ends. After the electrical resistance on the surface 152A of the electroconductive part 152 is measured in each sample before the foldability test, a sample S exhibiting the lowest electrical resistance value is selected among the samples S. Subsequently, the foldability test is performed on the selected sample S.

The foldability test is carried out as follows. The foldability test starts with fixing the edge S1 and opposite edge S2 of the selected sample S to fixing members 156 arranged in parallel to each other, as shown in FIG. 23(A). In addition, the fixing members 156 can slide in the horizontal direction, as shown in FIG. 23(A).

Figure 23B:
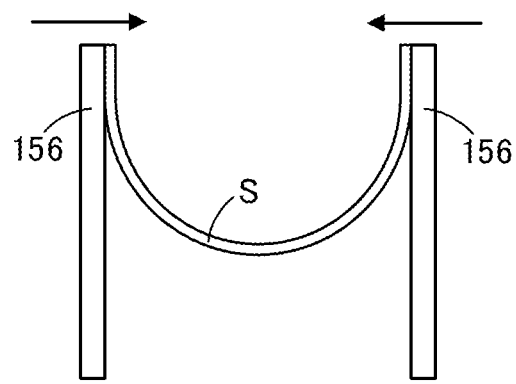
Figure 23C:
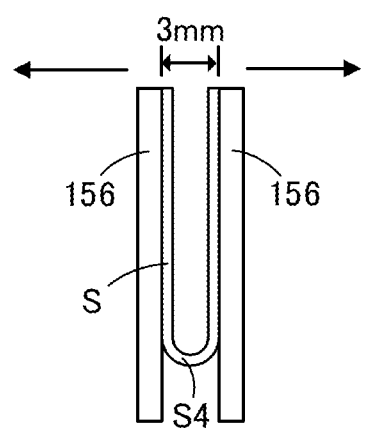

Next, the fixing members 156 are moved close to each other to fold and deform the sample S at the center part S3, as shown in FIG. 23(B); the fixing members 156 are further moved until a gap between the two opposing edges S1 and S2 of the sample S fixed to the fixing members 156 reaches 3 mm, as shown in FIG. 23(C); subsequently, the fixing members 156 are moved in opposite directions to resolve the deformation of the sample S.

As shown FIG. 23(A) to (C), the fixing members 156 can be moved to fold the sample S at the center part S3 at 180 degrees. In addition, a gap of 3 mm can be maintained between the two opposing edges S1 and S2 of the sample S by carrying out the foldability test in a manner that prevents the bent part S4 of the sample S from being forced out beyond the lower edges of the fixing members 156 and controls the fixing members 156 to keep a distance of 3 mm when they approach closest each other. In this case, the outer width of the bent part S4 is considered as 3 mm. The thickness of the sample S is small enough as compared with the gap between the fixing members 156 (3 mm). Thus, it seems unlikely that a difference in the thickness of the sample S affects the result of the foldability test on the sample S.

After the foldability test is performed, the sample S after the foldability test is measured for electrical resistance on the surface of the electroconductive part, similarly to the sample S before the foldability test. Then, the ratio of the electrical resistance value measured after the foldability test on the selected sample S to that measured before the foldability test on the same sample S (the electrical resistance of the selected sample before the foldability test/the electrical resistance of the same sample after the foldability test) is calculated. The arithmetic mean of three measurements is determined as the electrical resistance value ratio.

<<Light-Transmitting Resin Base Material>>

The light-transmitting resin base material 151 is not limited to a particular light-transmitting resin base material as long as it is a base material composed of a light-transmissive resin. Examples of the light-transmitting resin as a component of the light-transmitting resin base material 151 include the same light-transmitting resins as those described for the light-transmitting base material 11. The thickness of the light-transmitting base material 151 is the same as that of the light-transmitting base material 11. However, although some light-transmitting resin base materials have an underlayer for the purpose of improving adhesion to other layers, preventing the electroconductive film from sticking to itself when the electroconductive film is rolled, and/or inhibiting cissing of a coating liquid applied for forming another layer, the term "light-transmitting resin base material" in the present embodiment will be used to refer to a light-transmitting resin base material without an underlayer. The light-transmitting resin base material 151 may have a surface treated by a physical treatment such as corona discharge treatment or oxidation treatment to improve the adhesiveness.

<<Electroconductive Part>>

The electroconductive part 152 is provided directly on one surface 151A of the light-transmitting resin base material 151. The phrase "provided directly on" in this context means that the electroconductive part is in direct contact with one surface of the light-transmitting resin base material. That is, no underlayer is provided between the light-transmitting resin base material 151 and the electroconductive part 152. The determination of whether or not an electroconductive part is provided directly on one surface of a light-transmitting resin base material, or whether or not an underlayer is provided between a light-transmitting resin base material and an electroconductive part can be achieved by observing a cross-section near the interface between the light-transmitting resin base material and the electroconductive part using a scanning electron microscope (SEM), a scanning transmission electron microscope (STEM), or a transmission electron microscope (TEM) at a magnification of 1,000 to 500,000 times. The underlayer may contain particles as, for example, lubricant additives for the purpose of preventing an electroconductive film from sticking to itself when the electroconductive film is rolled; accordingly, the layer between the light-transmitting resin base material and the electroconductive part can be identified as an underlayer by the presence of the particles in the layer. As the electron microscopy conditions for the measurement in this case, the conditions for measuring the film thickness of, for example, the electroconductive part 13 can be used.

The electroconductive part 152 comprises a light-transmitting resin 154 and plural electroconductive fibers 155 incorporated in the light-transmitting resin 154, as shown in FIG. 22. The electroconductive part 152 preferably further comprises a reaction inhibitor which is contained in the light-transmitting resin 154.

The electroconductive part 152 can conduct electricity from the surface 152A. The determination of whether or not the electroconductive part 152 can conduct electricity from the surface 152A of the electroconductive part 152 can be achieved by measuring the surface resistance value of the electroconductive part 152, as in the case of the electroconductive part 13. The method of measuring the surface resistance value of the electroconductive part 152 and the criteria to evaluate whether or not the electroconductive part 152 can conduct electricity from the surface 152A of the electroconductive part 152 are the same as those described for the electroconductive part 13, and the description of the measurement method and the evaluation criteria is thus omitted here. Although a majority of the electroconductive fibers 155 are distributed on the light-transmitting resin base material 151 side than the position HL, which is located at half the film thickness of the electroconductive part 152, as described below, the remaining electroconductive fibers 155 are stacked on the electroconductive fibers 155 which are distributed on the light-transmitting resin base material 151 side, and consequently distributed on the surface 152A side than the position HL, which is located at half the film thickness of the electroconductive part 152, and also located on the surface 152A of the electroconductive part 152. Thus, the electroconductive part 152 can conduct electricity from the surface 152A.

In the electroconductive part 152, the electroconductive fibers 155 are preferably unevenly distributed on the light-transmitting base material 151 side than the position HL, which is located at half the film thickness of the electroconductive part 152, as shown in FIG. 22. The determination of whether or not the electroconductive fibers 155 are unevenly distributed on the light-transmitting base material 151 side than the position HL, which is located at half the film thickness of the electroconductive part 152, is achieved by the evaluation method described for the electroconductive part 13, and the description of the method is omitted here. The existence ratio of electroconductive fibers distributed on the the light-transmitting base material side than the position located at half the film thickness of the electroconductive part, which is determined from cross-sectional images photographed using a scanning transmission electron microscope (STEM) or a transmission electron microscope (TEM), is preferably 70% or more, more preferably 80% or more.

The surface resistance value of the electroconductive part 152 is 200Ω/□ or less for the same reason as described for the electroconductive part 13. The surface resistance value of the electroconductive part 152 is a surface resistance value measured on the surface 152A of the electroconductive part 152. The surface resistance of the electroconductive part 152 can be measured by the same method as for the surface resistance of the electroconductive part 13. The minimum surface resistance value of the electroconductive part 152 is 1Ω/□ or more, 5Ω/□ or more, or 10Ω/□ or more in ascending order of preference (a higher value is more preferred), while the maximum surface resistance value of the electroconductive part 152 is 100Ω/□ or less, 70Ω/□ or less, 60Ω/□ or less, or 50Ω/□ or less in ascending order of preference (a lower value is more preferred).

The electroconductive part 152 preferably has a film thickness of less than 300 nm from the viewpoint of thinning the electroconductive film. The maximum film thickness of the electroconductive part 152 is 145 nm or less, 140 nm or less, 120 nm or less, 110 nm or less, 80 nm or less, or 50 nm or less in ascending order of preference (a lower value is more preferred). Additionally, the minimum film thickness of the electroconductive part 152 is preferably 10 nm or more for the same reason as described for the electroconductive part 13. The film thickness of the electroconductive part 152 can be measured by the same method as for the film thickness of the electroconductive part 13.

The electroconductive part 152 preferably has a Martens hardness of 970 N/mm$^2$ or more and 1050 N/mm$^2$ or less at an indentation amount of 10 nm from the surface 152A for the same reason as described for the electroconductive part 13. In the electroconductive part 152, the minimum Martens hardness at the above-described indentation amount of 10 nm is 980 N/mm$^2$ or more, 1000 N/mm$^2$ or more, or 1015 N/mm$^2$ or more in ascending order of preference (a higher value is more preferred); the maximum Martens hardness at the above-described indentation amount of 10 nm is 1040 N/mm$^2$ or less, 1030 N/mm$^2$ or less, or 1020 N/mm$^2$ or less in ascending order of preference (a lower value is more preferred).

The electroconductive part 152 preferably has a Martens hardness of 130 N/mm$^2$ or more and 300 N/mm$^2$ or less at an indentation amount of 100 nm from the surface 152A for the same reason as described for the electroconductive part 13. In the electroconductive part 152, the minimum Martens hardness at the above-described indentation amount of 100 nm is 140 N/mm$^2$ or more, 150 N/mm$^2$ or more, or 170 N/mm$^2$ or more in ascending order of preference (a higher value is more preferred); the maximum Martens hardness at the above-described indentation amount of 100 nm is 280 N/mm$^2$ or less, 250 N/mm$^2$ or less, or 200 N/mm$^2$ or less in ascending order of preference (a lower value is more preferred).

In cases where the electroconductive film 150 is used as an electrode for a touch panel sensor, the ratio of the electrical resistance in the second direction to that in the first direction (the ratio is hereinafter referred to as "electrical resistance value ratio") is preferably 1 or more and less than 2 when the electrical resistance values are measured in a predetermined size in six different directions including an arbitrary direction for each an angle of 30 degrees to the arbitrary direction in the surface 152A of the electroconductive part 152, wherein a direction in which the electroconductive part shows the lowest electrical resistance value is designated as the first direction, and a direction which is orthogonal to the first direction is designated as the second direction. The electrical resistance value ratio can be determined by a method similar to the electric resistance measurement method described for the electroconductive part 13. The maximum electrical resistance value ratio is preferably 1.8 or less, more preferably 1.5 or less, and most preferably 1.3 or less.

On the other hand, in cases of obtaining an electroconductive film which provides a much lower electrical resistance value in a particular direction, the above-described electrical resistance value ratio is preferably 2 or more when the electrical resistance values are measured in a predetermined size in six different directions including an arbitrary direction for each an angle of 30 degrees to the arbitrary direction in the surface 31A of the electroconductive part 31. The arithmetic mean of three measurements is determined as the electrical resistance value ratio. The minimum electrical resistance value ratio is more preferably 3 or more. The maximum electrical resistance value ratio is 10 or less, or 8 or less in ascending order of preference (a lower value is more preferred) from the viewpoint of obtaining a uniform resistance value on the surface.

Such an electroconductive part having an electrical resistance value ratio of 1 or more and less than 2 or an electrical resistance value ratio of 2 or more can be obtained, for example, by appropriately modifying the fiber length of electroconductive fibers, the type or film thickness of a resin that constitutes the below-described organic protective layer, and/or the temperature for drying the electroconductive fiber-containing composition.

<Light-Transmitting Resin>

The light-transmitting resin 154 covers electroconductive fibers 155, similarly to the light-transmitting resin 15, to prevent removal of the electroconductive fibers 155 from the electroconductive part 152 and to improve the durability or scratch resistance of the electroconductive part 152, and, also in the present embodiment, covers electroconductive fibers 155 to such an extent that the electroconductive part 152 can conduct electricity from the surface 152A.

The light-transmitting resin 154 is the same as the light-transmitting resin 15. Thus, the film thickness and constituent materials of the light-transmitting resin 154 are also the same as those of the light-transmitting resin 15. The light-transmitting resin 154 is similar to the light-transmitting resin 15, and the description is thus omitted here. However, in cases where the electroconductive part 152 is provided directly on one surface 151A of the light-transmitting resin base material 151, and the light-transmitting resin 154 has a refractive index lower than that of the light-transmitting resin base material 151, and the light-transmitting resin 154 has a film thickness of 60 nm or more and 130 nm or less, the electroconductive part 152 can exhibit substantially the same effect as that of a low-refractive-index layer in an anti-reflection film to reduce the reflectance of the surface 152A of the electroconductive part 152. This enables reducing the light reflection Y-value as well as increasing the total light transmittance. In that case, the absolute difference in refractive index between the light-transmitting resin 154 and the light-transmitting resin base material 151 is preferably 0.05 or more.

<Reaction Inhibitor>

A reaction inhibitor is a substance that prevents reduction in electrical conductivity after application of the light-transmitting resin composition due to the reaction of the electroconductive fibers 15 with substances in the atmosphere. The reaction inhibitor and the content of the reaction inhibitor are the same as those described in the first embodiment, and the description of the reaction inhibitor and the content is thus omitted here.

<Electroconductive Fibers>

In cases where the electroconductive fibers 155 are unevenly distributed on the light-transmitting base material 151 side than the position HL, which is located at half the film thickness of the electroconductive part 152, the electroconductive fibers 155 contact with each other in the thickness direction of the electroconductive part 152, as indicated by the ability of the electroconductive part 152 to conduct electricity from the surface 152A.

The electroconductive fibers 155 preferably contact with each other to the surface direction (two-dimensional direction) of the electroconductive part 152 to form a network structure (meshwork) in the light-transmitting resin base material 151 side than the position HL, which is located at half the film thickness of the electroconductive part 152. Formation of a network structure by the electroconductive fibers 155 enables efficient creation of a conductive path with the electroconductive fibers 155 even in a small amount.

Some of the electroconductive fibers 155 are preferably exposed on the surface 152A of the electroconductive part 152. Once electrical conduction from the surface 152A of the electroconductive part 152 is identified by the above-described measurement method, some of the electroconductive fibers 155 can thus be determined to be exposed on the surface 152A of the electroconductive part 152.

The electroconductive fibers 155 preferably have a fiber diameter of 200 nm or less for the same reason as described for the electroconductive fibers 16. The minimum fiber diameter of the electroconductive fibers 155 is more preferably 10 nm or more from the viewpoint of the electroconductive of the electroconductive part 152, and a more preferred range of fiber diameter in the electroconductive fibers 155 is 15 nm or more to 180 nm or less. The fiber diameter of the electroconductive fibers 155 can be obtained by the same method as for the fiber diameter of the electroconductive fibers 16.

The electroconductive fibers 155 preferably have a fiber length of 1 μm or more for the same reason as described for the electroconductive fibers 16. The maximum fiber length of the electroconductive fibers 155 may be 500 μm or less, 300 μm or less, or 30 μm or less, while the minimum fiber length of the electroconductive fibers 155 may be 3 μm or more, or 10 μm or more. The fiber length of the electroconductive fibers 155 can be obtained by the same method as for the fiber length of the electroconductive fibers 16.

Similarly to the electroconductive fibers 16, the electroconductive fibers 155 preferably have a fiber length of, for example, 1 μm or more and less than 30 μm in cases of obtaining an electroconductive part having an electrical resistance value ratio of 1 or more and less than 2, while the electroconductive fibers 155 preferably have a fiber length of, for example, 30 μm or more in cases of obtaining an electroconductive part having an electrical resistance value ratio of 2 or more. In cases of obtaining an electroconductive part having an electrical resistance value ratio of 1 or more and less than 2, the electroconductive fibers 155 preferably have a minimum fiber length of 10 μm or more and a maximum fiber length of 20 μm or less from the viewpoint of obtaining a low surface resistance value.

The constituent fibers of the electroconductive fibers 155 are the same as those of the electroconductive fibers 16, and the description of the constituent fibers is thus omitted here.

<<Underlayer>>

The underlayer 153 is a layer for the purpose of improving adhesion to other layers, preventing the electroconductive film from sticking to itself when the electroconductive film is rolled, and/or inhibiting cissing of a coating liquid applied for forming another layer. The underlayer 153 contains, for example, an anchoring agent and/or a priming agent. As the anchoring agent and the priming agent, at least any of, for example, polyurethane resins, polyester resins, polyvinyl chloride resins, polyvinyl acetate resins, vinyl chloride-vinyl acetate copolymers, acrylic resins, polyvinyl alcohol resins, polyvinyl acetal resins, copolymers of ethylene and vinyl acetate or acrylic acid, copolymers of ethylene and styrene and/or butadiene, thermoplastic resins such as olefin resins and/or modified resins thereof, polymers of radiation-polymerizable compounds, polymers of thermopolymerizable compounds, and the like can be used.

The underlayer 153 may contain particles of a lubricant or the like for the purpose of preventing the electroconductive film from sticking to itself when the electroconductive film is rolled, as described above. Examples of the particles include silica particles.

The underlayer 153 preferably has a film thickness of 10 nm or more and 1 μm or less. In cases where the underlayer has a film thickness of less than 10 nm, the underlayer may function insufficiently; additionally, in cases where the underlayer has a film thickness of more than 1 μm, the underlayer may adversely affect the optical properties or may fail to provide excellent adhesion. The film thickness of the underlayer 153 is determined as the arithmetic mean of the thickness values measured at randomly selected 10 locations, wherein the thickness values are determined at the 10 locations in cross-sectional images of the underlayer photographed using a scanning electron microscope (SEM), a scanning transmission electron microscope (STEM), or a transmission electron microscope (TEM) at a magnification of 1,000 to 500,000 times (preferably, a magnification of 25,000 to 50,000 times). The underlayer 153 more preferably has a minimum film thickness of 30 nm or more and a maximum film thickness of 150 nm or less. The film thickness of the underlayer 153 can also be measured by the same method as for the film thickness of the electroconductive part 13.

<<Other Electroconductive Films>>

For the electroconductive film 150 shown in FIG. 21, the electroconductive part 152 is a film with no pattern, namely a so-called plain film, but the electroconductive part may be patterned depending on applications. Specifically, the electroconductive film may be an electroconductive film 160, as shown in FIG. 24, comprising an electroconductive layer 161 which is composed of plural electroconductive parts 162 and plural nonconductive parts 163 located between the electroconductive parts 162, or an electroconductive film comprising, as shown in FIG. 4, plural electroconductive parts and plural gaps existing between the electroconductive parts. The surface 160A of the electroconductive film 160 comprises the surfaces 162A of the electroconductive parts 162 and the surfaces 163A of the nonconductive parts 163, while the surface of the electroconductive film having gaps existing between electroconductive parts comprises the surfaces of the electroconductive parts and one surface of the light-transmitting resin base material. For example, the physical property values of the electroconductive film 160 and the electroconductive film having gaps existing between electroconductive parts are similar to those of the electroconductive film 150. In FIG. 24, the elements indicated by the same reference numbers as in FIG. 21 are the same as those indicated in FIG. 21, and further description is thus omitted.

<Electroconductive Part>

The electroconductive parts 162 are the same as the electroconductive part 152, except that the former electroconductive parts are patterned. That is, the electroconductive parts 162 are provided directly on one surface 151A of the light-transmitting resin base material 151. Additionally, the electroconductive parts 162 comprise a light-transmitting resin 154 and plural electroconductive fibers 155 incorporated in the light-transmitting resin 154, as shown in FIG. 25. The electroconductive parts 162 can conduct electricity from the surfaces 162A. In the electroconductive parts 162, the electroconductive fibers 165 are preferably unevenly distributed on the light-transmitting base material 151 side than the position HL, which is located at half the film thickness of the electroconductive parts 162, as shown in FIG. 25. Other configurations, materials, physical properties values, and the like of the electroconductive parts 162 are also the same as those of the electroconductive part 152, and further description is thus omitted here.

<Nonconductive Part>

The nonconductive parts 163 are parts located between electroconductive parts 162 and having no electrical conductivity. As shown in FIG. 25, the nonconductive parts 163 contain substantially no electroconductive fibers 155. The nonconductive parts 163 preferably contain none of the electroconductive fibers 155.

Because the nonconductive parts 163 are prepared together with the electroconductive parts 162 as an integrated body, the film thickness of the nonconductive parts is less than 300 nm. The maximum film thickness of the nonconductive parts 163 is 145 nm or less, 140 nm or less, 120 nm or less, 110 nm or less, 80 nm or less, or 50 nm or less in ascending order of preference (a lower value is more preferred). Additionally, the minimum film thickness of the nonconductive parts 163 is preferably 10 nm or more. The film thickness of the nonconductive parts 163 will be measured by the same method as for the film thickness of the electroconductive part 13.

As shown in FIG. 25, the nonconductive parts 163 comprise the light-transmitting resin 154. The nonconductive parts 163 may be prepared by removing electroconductive fibers 155 through sublimation and may have the resulting voids 163B which are not filled with electroconductive fibers. In that case, the sublimated electroconductive fibers 155 burst out through areas to be the nonconductive parts 163 during the preparation of the nonconductive parts 163 and the resulting nonconductive parts 163 have rough surfaces 163A. The light-transmitting resin 154 in the nonconductive parts 163 is the same as the light-transmitting resin 154 in the electroconductive parts 162, and the description is thus omitted here.

<<Production Methods of Electroconductive Films>>

Figure 26A:
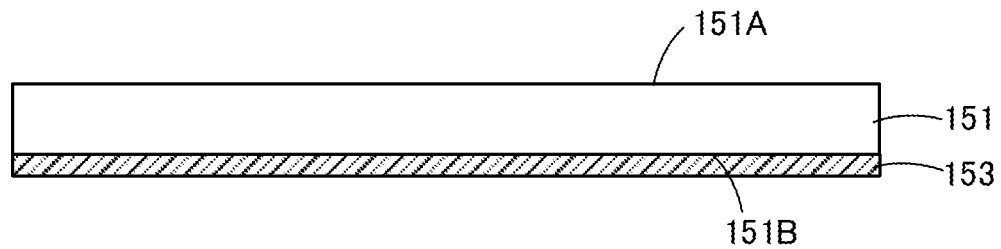
FIGS. 26(A), 26(B) and 26(C) schematically illustrate the process for producing the electroconductive film according to the third embodiment.

The electroconductive film 160 can be produced, for example, as follows. As shown in FIG. 26(A), a light-transmitting resin base material 151 carrying an underlayer 153 not on one surface 151A but on the other surface 151B is first formed. Incidentally, a light-transmitting resin base material having no underlayer on both surfaces may alternatively be prepared.

Figure 26B:
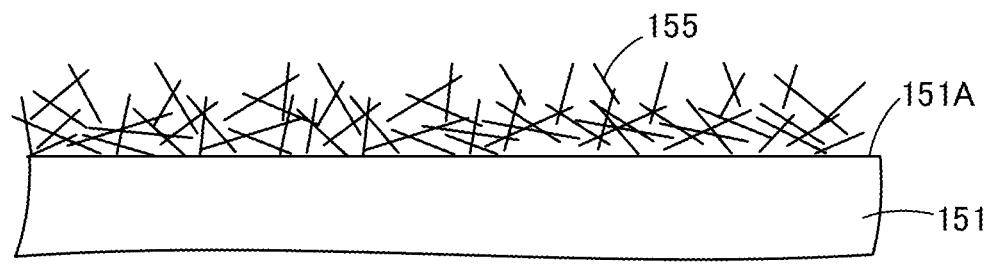

Next, an electroconductive fiber-containing composition containing electroconductive fibers 155 and an organic dispersion medium is applied directly on the one surface 151A of the light-transmitting resin base material 151, and dried to place a plurality of the electroconductive fibers 155 directly on the one surface 151A of the light-transmitting resin base material 151, as shown in FIG. 26(B). The electroconductive fiber-containing composition is the same as that used in the first embodiment, and the description of the electroconductive fiber-containing composition is thus omitted here.

Figure 26C:
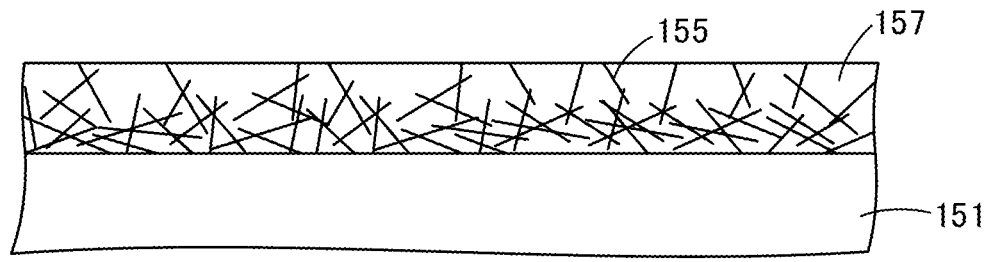

After a plurality of the electroconductive fibers 155 are placed directly on the one surface 151A of the light-transmitting resin base material 151, a light-transmitting resin composition containing a polymerizable compound and a solvent is applied on it and dried to form a coating film 157 of the light-transmitting resin composition, as shown in FIG. 26(C). The light-transmitting resin composition is the same as that used in the first embodiment, and the description of the light-transmitting resin composition is thus omitted here.

Figure 27A:
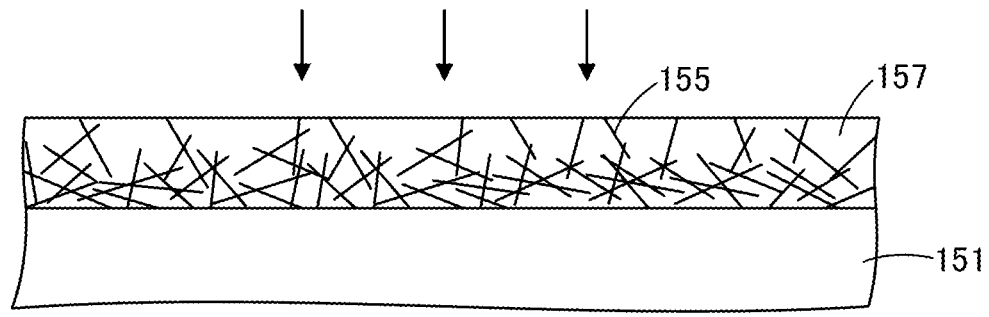
FIGS. 27(A) and 27(B) schematically illustrate the process for producing the electroconductive film according to the third embodiment.

Next, the coating film 157 is exposed to ionizing radiation such as ultraviolet light, as shown in FIG. 27(A), to polymerize (cross-link) the polymerizable compound and to cure the coating film 157, whereby the light-transmitting resin 154 is prepared.

Figure 27B:
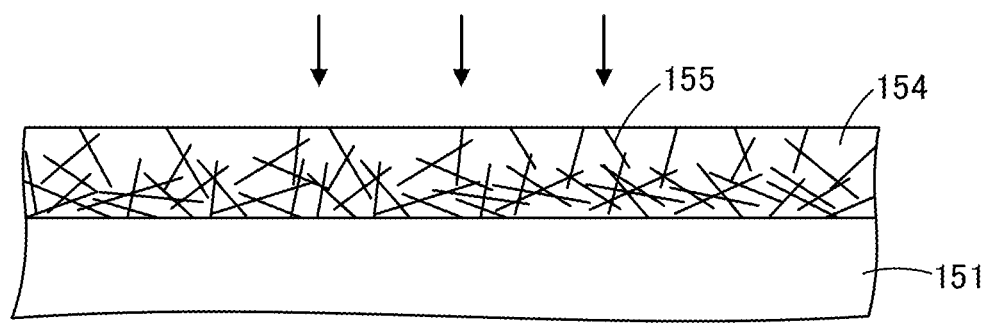

Because the electroconductive part 31 of the electroconductive film 150 shown in FIG. 21 is a plain film, the electroconductive film 150 is obtained in the above-described process. The electroconductive film 160 shown in FIG. 23 is patterned and can be obtained similarly to the first embodiment, for example, by irradiating laser light (for example, infrared laser) to areas to be the nonconductive parts 163 for the generation of patterns of the electroconductive parts 162, as shown in FIG. 27(B).

According to the present embodiment, the electroconductive part 152 or parts 162 are provided directly on the one surface 151A of the light-transmitting resin base material 151, that is, no underlayer is provided between the light-transmitting resin base material 151 and the electroconductive part 152 or parts 162, so that no electroconductive fibers 155 are incorporated in an underlayer. Thus, the electroconductive fibers 155 hardly spread in the thickness direction of the electroconductive film 150 or 160 and the contact points between the electroconductive fibers 155 are consequently increased. Accordingly, the electroconductive film can achieve a low surface resistance. Additionally, the content of electroconductive fibers 155 can be reduced and a low haze value of 5% or less can consequently be achieved because the contact points between the electroconductive fibers 155 can be increased.

In a thin electroconductive part, the amount of electroconductive fibers is accordingly reduced and the electroconductive part is thus prone to increase the surface resistance. According to the present embodiment, the contact points between the electroconductive fibers 155 are increased in cases where the electroconductive fibers 155 as a whole in the electroconductive part 152 or parts 162 are unevenly distributed on the light-transmitting base material 151 side than the position HL, which is located at half the film thickness of the electroconductive part 152 or parts 162, and a low haze value of 5% or less and a low surface resistance value of 200Ω/□ or less can consequently be achieved even if the electroconductive part 152 or parts 162 have a thin film thickness of less than 300 nm or a very thin film thickness of 145 nm or less.

According to the present embodiment, the electroconductive part 152 or parts 162 are provided directly on the one surface 151A of the light-transmitting resin base material 151, that is, no hard coat layer is provided between the light-transmitting resin base material 151 and the electroconductive part 152 or parts 162, so that excellent flexibility is achieved in the electroconductive film 150 or 160.

According to the present embodiment, the electroconductive fibers 155 as a whole in the electroconductive part 152 or parts 162 are unevenly distributed on the light-transmitting base material 151 side than the position HL, which is located at half the film thickness of the electroconductive part 152 or parts 162, and the contact points between the electroconductive fibers 155 can consequently be increased. This allows ensuring electrical conduction from the surface 152A of the electroconductive part 152 or the surfaces 162A of the electroconductive parts 162 and thus for achieving a lower surface resistance value, even if the content of electroconductive fibers 155 is low. Additionally, a lower haze value can be achieved because the content of electroconductive fibers 155 can be reduced. Furthermore, the electroconductive fibers 155 in the electroconductive part 152 or parts 162 are unevenly distributed on the light-transmitting base material 151 side than the position HL, which is located at half the film thickness of the electroconductive part 152 or parts 162, and a majority of the electroconductive fibers 155 are consequently covered with the light-transmitting resin 154. This allows preventing the electroconductive fibers 155 from reducing the electrical conductivity due to the reaction with sulfur, oxygen, and/or halogens in the air.

In the present embodiment, an organic dispersion medium is used as a dispersion medium for an electroconductive fiber-containing composition, and the electroconductive fiber-containing composition contains no resin material or, alternatively, a smaller amount of a resin material than the conventional amount of the resin material. Accordingly, in the electroconductive part 152 or parts 162, the electroconductive fibers 155 can be unevenly distributed on the light-transmitting base material 151 side than the position HL, which is located at half the film thickness of the electroconductive part 152 or parts 162, due to the same reason as described in the first embodiment.

According to the present embodiment, the electroconductive part 152 is provided directly on one surface 151A of the light-transmitting resin base material 151 by coating process; the difference in electrical resistance depending on the in-plain direction of the electroconductive part 152 can be reduced if the above-described electrical resistance value ratio is 1 or more and less than 2 in the electroconductive part 152, due to the same reason as described in the first embodiment. In cases where the electroconductive film is used for an electrode for a touch panel sensor, limitations on the pattern of the electrode, IC chips, and partitioning are reduced with the reduced difference in electrical resistance.

According to the present embodiment, the electroconductive part 152 has a high electrical resistance value in the second direction and a low electrical resistance value in the first direction in cases where the above-described electrical resistance value ratio is 2 or more. Thus, the electroconductive film 10 showing a further lower electrical resistance value in a particular direction (first direction) due to the same reason as described in the first embodiment can be provided.

According to the present embodiment, the light-transmitting resin 154 in the electroconductive part 152 or parts 162 contains a reaction inhibitor, and can consequently inhibit the electroconductive fibers 155 from reducing the electrical conductivity due to the reaction with sulfur, oxygen, and/or halogens in the atmospheric air, on the same basis as described in the first embodiment.

According to the present embodiment, a maximally excellent surface resistance value can be obtained with a minimum amount of electroconductive fibers because the electroconductive fibers 155 as a whole in the electroconductive part 152 or parts 162 are unevenly distributed on the light-transmitting base material 151 side than the position HL, which is located at half the film thickness of the electroconductive part 152 or parts 162. Additionally, the uneven distribution of the electroconductive fibers 155 as described above enables optical properties with a lower haze value. Furthermore, uneven distribution, rather than homogeneous dispersion, of electroconductive fibers 155 enables easier adjustment of the Martens hardness. Additionally, the dense presence of electroconductive fibers 155 in the light-transmitting resin 154 enables increasing the hardness of the light-transmitting resin and also enables obtaining a light-transmitting resin which is neither too hard nor too soft by devising the composition of the light-transmitting resin 154. In addition, the light-transmitting resin having an appropriate Martens hardness could achieve excellent flexibility for folding or rolling.

According to the present embodiment, a reaction inhibitor contained in the electroconductive part 152 can control the reaction of the electroconductive fibers 155 with components of a light-transmitting adhesive layer due to the same reason as described in the first embodiment, even if the electroconductive part 152 or parts 162 in contact with the light-transmitting adhesive layer are tested by the humidity/heat resistance test. Accordingly, the number of light-transmitting adhesive layer choices can be increased.

The electroconductive films 150 and 160 have been described above; the above-described electroconductive film comprising gaps existing between electroconductive parts can likewise obtain the same effects as those of the electroconductive films 150 and 160.

Figure 28:
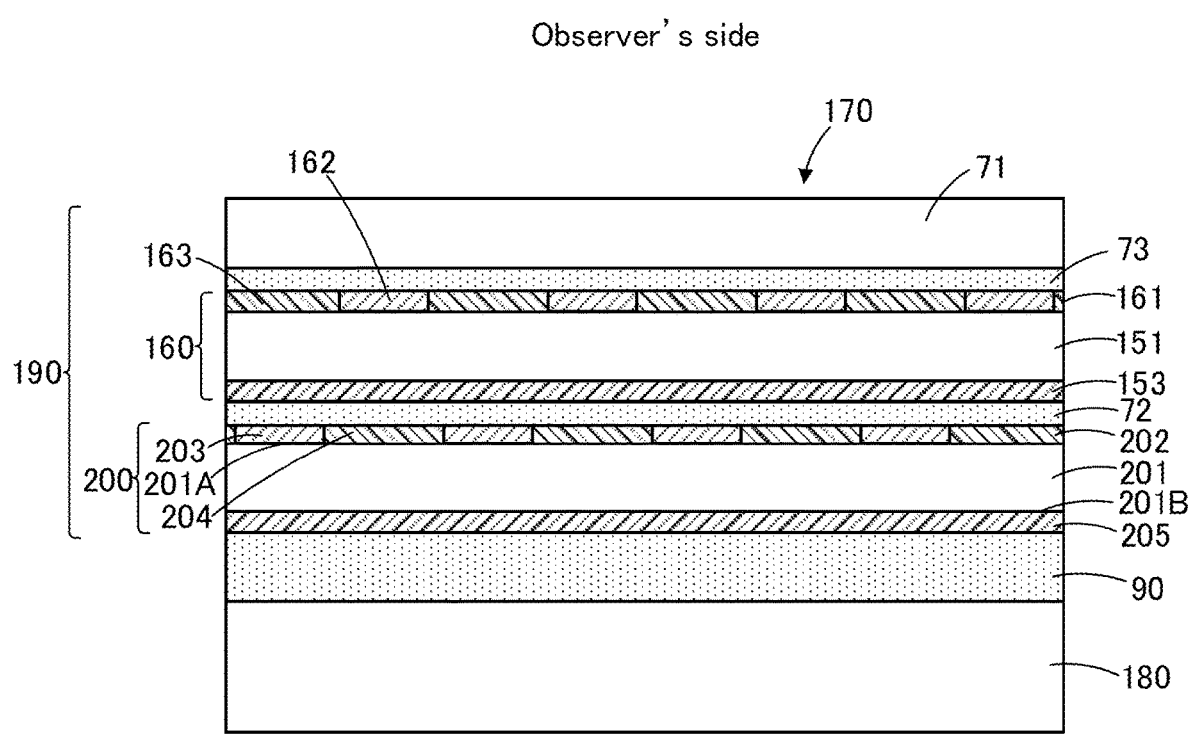
FIG. 28 depicts a schematic diagram of an image display device according to the third embodiment.

The application of an electroconductive film according to the present embodiment is not limited to a particular application and can be incorporated into an image display device comprising a touch panel and be used. Additionally, the electroconductive film can be used, for example, as an electromagnetic shield. FIG. 28 depicts a schematic diagram of an image display device according to the present embodiment. In FIG. 28, the elements indicated by the same reference numbers as in FIG. 13 are the same as those indicated in FIG. 13, and further description is thus omitted.

<<<Image Display Device>>>

As shown in FIG. 28, an image display device 170 mainly comprises a display panel 180 for displaying images, a touch panel 190 placed on the observer's side of the display panel 180, and a light-transmitting adhesion layer 90 intervening between the display panel 180 and the touch panel 190. In the present embodiment, the display panel 180 is an organic light-emitting diode (OLED) panel and the image display device 170 thus comprises no backlight unit but may comprise a backlight unit depending on the type of the display panel (display element).

<<Display Panel>>

The display panel 180 is an organic light-emitting diode (OLED) panel, as described above, and thus comprises an organic light-emitting diode as a display element. The display panel may be a liquid-crystal display panel, an inorganic light-emitting diode panel, or a quantum dot light-emitting diode (QLED) panel.

<<Touch Panel>>

The touch panel 190 comprises an electroconductive film 200, an electroconductive film 160 placed on the observer's side of the electroconductive film 200, a light-transmitting cover member 71, such as a cover glass, placed on the observer's side of the electroconductive film 160, a light-transmitting adhesive layer 72 intervening between the electroconductive film 200 and the electroconductive film 160, and a light-transmitting adhesive layer 73 intervening between the electroconductive film 160 and the light-transmitting cover member 71.

<Electroconductive Film>

The electroconductive film 200 has almost the same structure as that of the electroconductive film 160. That is, the electroconductive film 200 comprises a light-transmitting resin base material 201 and electroconductive parts 203 provided directly and patterned on one surface 201A of the light-transmitting resin base material 201, as shown in FIG. 28. The electroconductive part 203 shown in FIG. 28 is an integral part of an electroconductive layer 202. The electroconductive layer 202 is composed of plural electroconductive parts 203 and nonconductive parts 204 located between the electroconductive parts 203. Additionally, the electroconductive film 200 further comprises an underlayer 205 provided directly on the other surface 201B of the light-transmitting resin base material 201. The light-transmitting resin base material 201 and the underlayer 205 are similar to the light-transmitting resin base material 151 and the underlayer 153, and the description is thus omitted here.

(Electroconductive Part and Nonconductive Part)

The electroconductive parts 203 have the same structure as that of the electroconductive parts 162. That is, the electroconductive parts 203 comprise a light-transmitting resin and electroconductive fibers. The nonconductive parts 204 comprise a light-transmitting resin and contain substantially no electroconductive fibers. The electroconductive part 203 can conduct electricity from the surface of the electroconductive part 203. Additionally, the electroconductive fibers in the electroconductive parts 203 are preferably unevenly distributed on the light-transmitting base material 201 side than the position HL, which is located at half the film thickness of the electroconductive parts 203. The electroconductive parts 203 have the same structure as that of the electroconductive parts 162 but the electroconductive parts 203 may not need to have the same structure as that of the electroconductive parts 162.

The electroconductive parts 162 of the electroconductive film 160 function as electrode lines in the X direction in a projected capacitive touch panel, while the electroconductive parts 203 of the electroconductive film 200 function as electrode lines in the Y direction in a projected capacitive touch panel and have the same top view as shown in FIG. 14.

Fourth Embodiment

Figure 29:
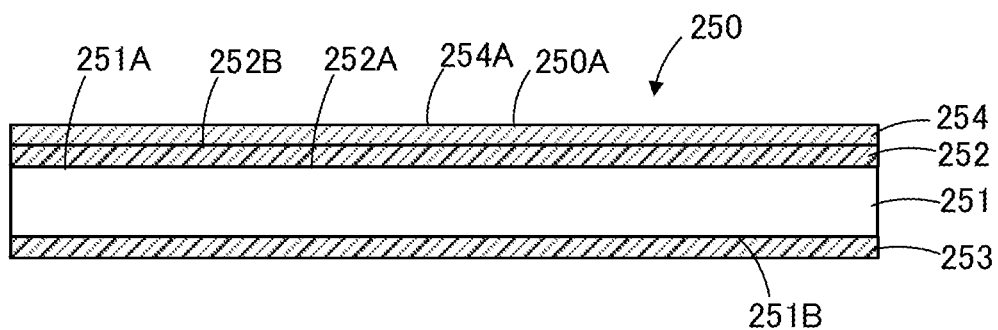
FIG. 29 depicts a schematic diagram of an electroconductive film according to the fourth embodiment.
Figure 30:
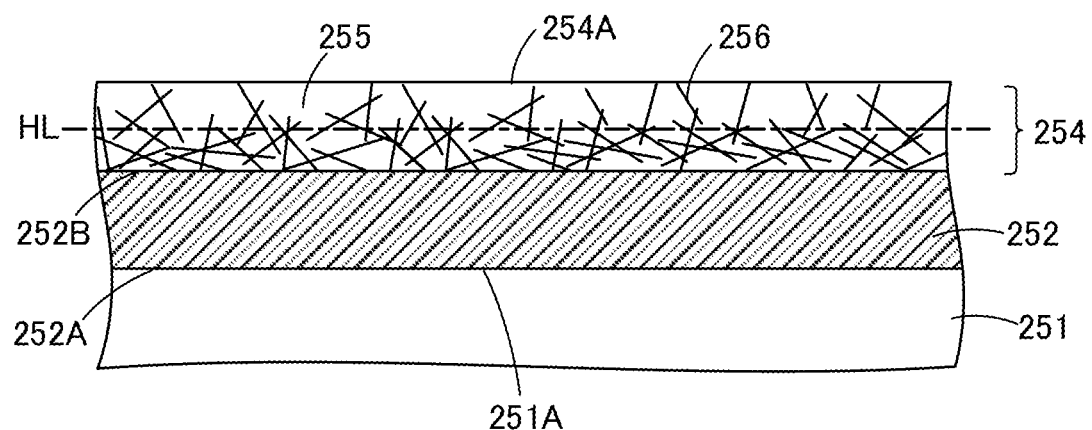
FIG. 30 depicts an enlarged view of a part of the electroconductive film shown in FIG. 29.
Figure 31:
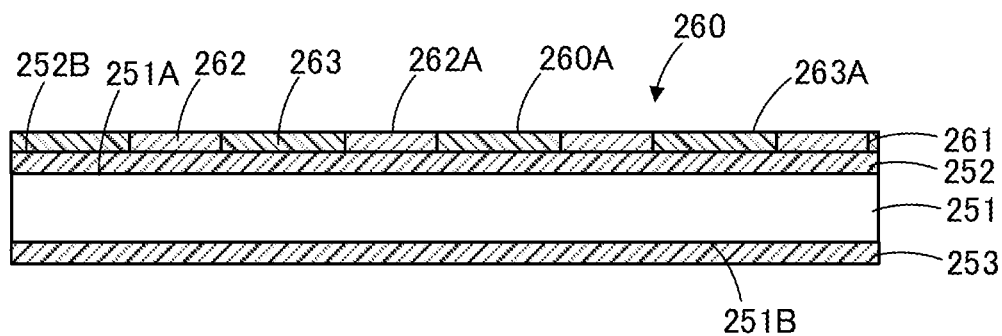
FIG. 31 depicts a schematic diagram of another electroconductive film according to the fourth embodiment.
Figure 32:
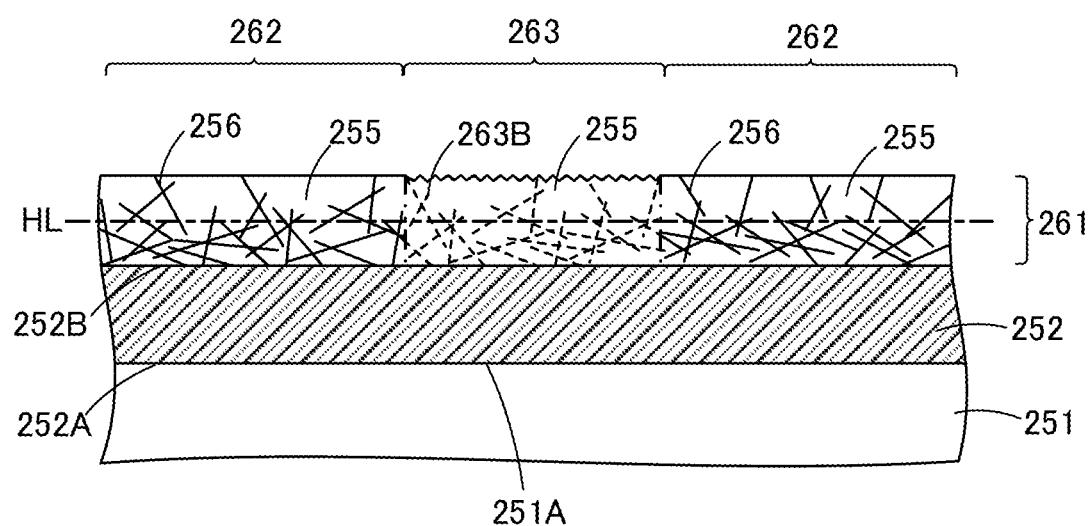
FIG. 32 depicts an enlarged view of a part of the electroconductive film shown in FIG. 31.

Now, the electroconductive film, touch panel, and image display device according to the fourth embodiment of the present invention will be described below with reference to the drawings. FIG. 29 depicts a schematic diagram of an electroconductive film according to the present embodiment; FIG. 30 depicts an enlarged view of a part of the electroconductive film shown in FIG. 29; FIG. 31 depicts a schematic diagram of another electroconductive film according to the present embodiment; FIG. 32 depicts an enlarged view of a part of the electroconductive film shown in FIG. 31. FIGS. 33 and 34 schematically illustrate the process for producing the electroconductive film according to the present embodiment.

<<<Electroconductive Film>>>

An electroconductive film 250 is light transmissive and comprises an underlayer 252 and an electroconductive part 254 in this order on one surface 251A of a light-transmitting resin base material 251 and further comprises an underlayer 253 on the other surface 251B, as shown in FIG. 29. Specifically, the electroconductive film 250 comprises a light-transmitting resin base material 251, an underlayer 252 provided directly on one surface 251A of the light-transmitting resin base material 251, an underlayer 253 provided directly on the other surface 251B of the light-transmitting resin base material 251, and an electroconductive part 254 provided directly on the surface 252B (hereinafter referred to as "the other surface of the underlayer"), of the underlayer 252 opposite to the light-transmitting resin base material 251 side surface 252A (hereinafter referred to as "the one surface of the underlayer"). The surface 250A of the electroconductive film 250 is constituted by the surface 254A of the electroconductive part 254. Incidentally, the electroconductive film 250 may not comprise the underlayer 253.

Additionally, although the electroconductive part 254 shown in FIG. 29 is provided only on the other surface 252B of the underlayer 252, an electroconductive part may additionally be provided on a surface of the underlayer 253 opposite to the light-transmitting resin base material 251 side surface. However, in cases where electroconductive parts are provided on both surfaces of the light-transmitting resin base material, an electroconductive part should be provided directly on a surface of one underlayer opposite to the light-transmitting resin base material side surface but electroconductive parts may not need to be provided directly on both surfaces of underlayers opposite to the light-transmitting resin base material side surface.

The electroconductive film 250 has a haze value (total haze value) of 5% or less for the same reason as described for the electroconductive film 10. The haze value of the electroconductive film 250 can be measured by the same method as for the haze value of the electroconductive film 10. The electroconductive film 250 has a haze value of 3% or less, 2% or less, 1.5% or less, 1.2% or less, or 1.1% or less in ascending order of preference (a lower value is more preferred).

The electroconductive film 250 preferably has a total light transmittance of 80% or more for the same reason as described for the electroconductive film 10. The total light transmittance of the electroconductive film 250 can be measured by the same method as for the total light transmittance of the electroconductive film 10. The electroconductive film 250 has a total light transmittance of 85% or more, 88% or more, or 89% or more in ascending order of preference (a higher value is more preferred).

The electroconductive film 250 has flexibility. For the same reason as that described for the electroconductive film 150, such as cracks of an electroconductive film, preferably, in cases where the electroconductive film 250 is folded at 180 degrees in a manner that leaves a gap of 3 mm between the opposite edges of the electroconductive film 10 and the process (foldability test) is repeated one hundred thousand times, the below-described ratio between the electrical resistance values measured before and after the foldability test on the surface 254A of the electroconductive part 254 of the electroconductive film 250 is 3 or less; more preferably, the ratio between the electrical resistance values measured before and after the foldability test on the surface 254A of the electroconductive part 254 of the electroconductive film 250 is 3 or less in cases where the foldability test is repeated two hundred thousand times; further preferably, the ratio between the electrical resistance values measured before and after the foldability test on the surface 254A of the electroconductive part 254 of the electroconductive film 250 is 3 or less in cases where the foldability test is repeated one million times. If a hard coat layer is provided between a light-transmitting resin base material and an electroconductive part, it is highly likely that the hard coat layer is cracked by the foldability test after repeating the foldability test the number of times as specified above and the ratio of the electrical resistance value measured after the foldability test on the surface of the electroconductive part of the electroconductive film exceeds 3. In cases where the foldability test is repeated the number of times as specified above, the ratio between the electrical resistance values measured before and after the foldability test on the surface 254A of the electroconductive part 254 of the electroconductive film 250 is more preferably 1.5 or less, regardless of whether a hard coat layer is provided or not. The foldability test may be carried out by folding the electroconductive film 250 with the electroconductive part 254 facing either inward or outward. In either case, the ratio between the electrical resistance values measured before and after the foldability test on the surface 254A of the electroconductive part 254 of the electroconductive film 250 is preferred to be 3 or less. The electrical resistance measurement and the foldability test will be performed in the same manner as described for the electroconductive film 150.

<<Light-Transmitting Resin Base Material>>

The light-transmitting resin base material 251 is not limited to a particular light-transmitting resin base material as long as it is a base material composed of a light-transmissive resin. Examples of the light-transmitting resin as a component of the light-transmitting resin base material 251 include the same light-transmitting resins as those described for the light-transmitting base material 11. The thickness of the light-transmitting base material 251 is the same as that of the light-transmitting base material 11. However, although some light-transmitting resin base materials have an underlayer for the purpose of improving adhesion to other layers, preventing the electroconductive film from sticking to itself when the electroconductive film is rolled, and/or inhibiting cissing of a coating liquid applied for forming another layer, the term "light-transmitting resin base material" in the present embodiment will be used to refer to a light-transmitting resin base material without an underlayer. The light-transmitting resin base material 251 may have a surface treated by a physical treatment such as corona discharge treatment or oxidation treatment to improve the adhesiveness.

<<Underlayer>>

The underlayers 252 and 253 are layers for the purpose of improving adhesion to other layers, preventing the electroconductive film from sticking to itself when the electroconductive film is rolled, and/or inhibiting cissing of a coating liquid applied for forming another layer. The underlayer 252 is provided directly on one surface 251A of the light-transmitting resin base material 251, while the underlayer 253 is provided directly on the other surface 251B of the light-transmitting resin base material 251. The phrase "provided directly on" in this context means that the underlayer is in direct contact with one surface or the other surface of the light-transmitting resin base material. That is, no other layers are provided between the light-transmitting resin base material 251 and the underlayer 252 or 253. The determination of whether or not an underlayer is provided directly on one surface or the other surface of a light-transmitting resin base material, or whether or not another layer is provided between a light-transmitting resin base material and an underlayer can be achieved by observing a cross-section near the interface between the light-transmitting resin base material and the electroconductive part using a scanning electron microscope (SEM), a scanning transmission electron microscope (STEM), or a transmission electron microscope (TEM) at a magnification of 1,000 to 500,000 times. The underlayer may contain particles as, for example, lubricant additives for the purpose of preventing an electroconductive film from sticking to itself when the electroconductive film is rolled; accordingly, the layer between the light-transmitting resin base material and the electroconductive part can be identified as an underlayer by the presence of the particles in the layer. As the electron microscopy conditions for the measurement in this case, the conditions for measuring the film thickness of, for example, the electroconductive part 13 can be used.

The underlayer 252 preferably contains substantially none of the below-described electroconductive fibers 256. The phrase "the underlayer contains substantially no electroconductive fiber" in this context means that the underlayer may contain a small amount of electroconductive fibers as long as the electroconductive part exhibits a surface resistance value of up to 1000Ω/□ or less. The underlayer 252 more preferably contains none of the electroconductive fibers 16. The determination of whether or not the underlayer 252 contains electroconductive fibers 256 can be achieved by observing a cross-section near the interface between the underlayer and the electroconductive part using a scanning electron microscope (SEM), a scanning transmission electron microscope (STEM), or a transmission electron microscope (TEM) at a magnification of 1,000 to 500,000 times. To achieve substantially no electroconductive fibers 256 in the underlayer 252, a dispersion medium that rarely infiltrates into the underlayer 252 can be used as a dispersion medium in the below-described electroconductive fiber-containing composition. As the electron microscopy conditions for the measurement in this case, the conditions for measuring the film thickness of, for example, the electroconductive part 13 can be used.

The underlayers 252 and 253 contain, for example, an anchoring agent and/or a priming agent. The anchoring agent and the priming agent are the same as those described for the underlayer, and further description is thus omitted here.

The underlayers 252 and 253 may contain particles of a lubricant or the like for the purpose of preventing the electroconductive film from sticking to itself when the electroconductive film is rolled, as described above. Examples of the particles include silica particles.

The underlayers 252 and 253 preferably have a film thickness of 10 nm or more and 1 μm or less for the same reason as described for the underlayer 153. Additionally, film thicknesses of the underlayers 252 and 253 will be measured by the same method as for the film thickness of the underlayer 153. The underlayers 252 and 253 each more preferably have a minimum film thickness of 30 nm or more and a maximum film thickness of 150 nm or less.

<<Electroconductive Part>>

The electroconductive part 254 is provided directly on the underlayer 252. The phrase "provided directly on" in this context means that the electroconductive part is in direct contact with the underlayer. That is, no other layer is provided between the underlayer 252 and the electroconductive part 254. The determination of whether or not an electroconductive part is provided directly on an underlayer, or whether or not any other layer is provided between an underlayer and an electroconductive part can be achieved by observing a cross-section near the interface between the underlayer and the electroconductive part using a scanning electron microscope (SEM), a scanning transmission electron microscope (STEM), or a transmission electron microscope (TEM) at a magnification of 1,000 to 500,000 times. As the electron microscopy conditions for the measurement in this case, the conditions for measuring the film thickness of, for example, the electroconductive part 13 can be used.

The electroconductive part 254 comprises a light-transmitting resin 255 and plural electroconductive fibers 256 incorporated in the light-transmitting resin 255, as shown in FIG. 30. The electroconductive part 254 preferably further comprises a reaction inhibitor which is contained in the light-transmitting resin 15.

The electroconductive part 254 can conduct electricity from the surface 254A. Measurement of the surface resistance of the electroconductive part 254 can determine, as in the case of the electroconductive part 13, whether or not the electroconductive part 254 can conduct electricity from the surface 254A of the electroconductive part 254. The method of measuring the surface resistance of the electroconductive part 254 and the criteria to evaluate whether or not the electroconductive part 254 can conduct electricity from the surface 254A of the electroconductive part 254 are the same as those described for the electroconductive part 13, and the description of the measurement method and the evaluation criteria is thus omitted here. Although a majority of the electroconductive fibers 256 are distributed on the light-transmitting resin base material 251 side than the position HL, which is located at half the film thickness of the electroconductive part 254, as described below, the remaining electroconductive fibers 256 are stacked on the electroconductive fibers 256 which are distributed on the light-transmitting resin base material 251 side, and consequently distributed on the surface 254 side than the position HL, which is located at half the film thickness of the electroconductive part 254, and also located on the surface 254A of the electroconductive part 254. Thus, the electroconductive part 254 can conduct electricity from the surface 254A.

In the electroconductive part 254, the electroconductive fibers 256 are preferably unevenly distributed on the light-transmitting base material 251 side than the position HL, which is located at half the film thickness of the electroconductive part 254, as shown in FIG. 30. The determination of whether or not the electroconductive fibers 256 are unevenly distributed on the light-transmitting base material 251 side than the position HL, which is located at half the film thickness of the electroconductive part 254, is achieved by the evaluation method described for the electroconductive part 13, and the description of the method is omitted here. The existence ratio of electroconductive fibers distributed from the position located at half the film thickness of the electroconductive part to the light-transmitting base material, which is determined from cross-sectional images acquired using a scanning transmission electron microscope (STEM) or a transmission electron microscope (TEM), is preferably 70% or more, more preferably 80% or more.

The surface resistance of the electroconductive part 254 is 200Ω/☐ or less for the same reason as described for the electroconductive part 13. The surface resistance of the electroconductive part 254 is a surface resistance value measured on the surface 254A of the electroconductive part 254. The surface resistance of the electroconductive part 254 can be measured by the same method as for the surface resistance of the electroconductive part 13. The minimum surface resistance value of the electroconductive part 254 is 1Ω/☐ or more, 5Ω/☐ or more, or 10Ω/☐ or more in ascending order of preference (a higher value is more preferred), while the maximum surface resistance value of the electroconductive part 254 is 100Ω/☐ or less, 70Ω/☐ or less, 60Ω/☐ or less, or 50Ω/☐ or less in ascending order of preference (a lower value is more preferred).

The electroconductive part 254 preferably has a film thickness of less than 300 nm from the viewpoint of thinning the electroconductive film. The maximum film thickness of the electroconductive part 254 is 145 nm or less, 140 nm or less, 120 nm or less, 110 nm or less, 80 nm or less, or 50 nm or less in ascending order of preference (a lower value is more preferred). Additionally, the minimum film thickness of the electroconductive part 254 is preferably 10 nm or more for the same reason as described for the electroconductive part 13. The film thickness of the electroconductive part 254 can be measured by the same method as for the film thickness of the electroconductive part 13.

The electroconductive part 254 preferably has a Martens hardness of 970 N/mm$^2$ or more and 1050 N/mm$^2$ or less at an indentation amount of 10 nm from the surface 254A for the same reason as described for the electroconductive part 13. In the electroconductive part 254, the minimum Martens hardness at the above-described indentation amount of 10 nm is 980 N/mm$^2$ or more, 1000 N/mm$^2$ or more, or 1015 N/mm$^2$ or more in ascending order of preference (a higher value is more preferred); the maximum Martens hardness at the above-described indentation amount of 10 nm is 1040 N/mm$^2$ or less, 1030 N/mm$^2$ or less, or 1020 N/mm$^2$ or less in ascending order of preference (a lower value is more preferred).

The electroconductive part 254 preferably has a Martens hardness of 130 N/mm$^2$ or more and 300 N/mm$^2$ or less at an indentation amount of 100 nm from the surface 254A for the same reason as described for the electroconductive part 13. In the electroconductive part 254, the minimum Martens hardness at the above-described indentation amount of 100 nm is 140 N/mm$^2$ or more, 150 N/mm$^2$ or more, or 170 N/mm$^2$ or more in ascending order of preference (a higher value is more preferred); the maximum Martens hardness at the above-described indentation amount of 100 nm is 280 N/mm$^2$ or less, 250 N/mm$^2$ or less, or 200 N/mm$^2$ or less in ascending order of preference (a lower value is more preferred).

In cases where the electroconductive film 250 is used as an electrode for a touch panel sensor, the ratio of the electrical resistance value in the second direction to that in the first direction (the ratio is hereinafter referred to as "electrical resistance value ratio") is preferably 1 or more and less than 2 when the electrical resistance values are measured in a predetermined size in six different directions including an arbitrary direction for each an angle of 30 degrees to the arbitrary direction in the surface 254A of the electroconductive part 254, wherein a direction in which the electroconductive part shows the lowest electrical resistance value is designated as the first direction, and a direction which is orthogonal to the first direction is designated as the second direction. The electrical resistance value ratio can be determined by a method similar to the electric resistance measurement method described for the electroconductive part 13. The maximum electrical resistance value ratio is 1.8 or less, 1.5 or less, 1.3 or less in ascending order of preference (a lower value is more preferred).

On the other hand, in cases of obtaining an electroconductive film which provides a much lower electrical resistance value in a particular direction, the above-described electrical resistance value ratio is preferably 2 or more when the electrical resistance values are measured in a predetermined size in six different including an arbitrary direction for each an angle of 30 degrees to the arbitrary direction in the surface 254A of the electroconductive part 254. The arithmetic mean of three measurements is determined as the electrical resistance value ratio. The minimum electrical resistance value ratio is more preferably 3 or more. The maximum electrical resistance value ratio is 10 or less, or 8 or less in ascending order of preference (a lower value is more preferred) from the viewpoint of obtaining a uniform resistance value on the surface.

Such an electroconductive part having an electrical resistance value ratio of 1 or more and less than 2 or an electrical resistance value ratio of 2 or more can be obtained, for example, by appropriately modifying the fiber length of electroconductive fibers, the type or film thickness of a resin that constitutes the below-described organic protective layer, and/or the temperature for drying the electroconductive fiber-containing composition.

<Light-Transmitting Resin>

The light-transmitting resin 255 covers electroconductive fibers 256, similarly to the light-transmitting resin 15, to prevent removal of the electroconductive fibers 256 from the electroconductive part 254 and to improve the durability or abrasion resistance of the electroconductive part 254, and, also in the present embodiment, covers electroconductive fibers 256 to such an extent that the electroconductive part 254 can conduct electricity from the surface 254A.

The light-transmitting resin 255 is the same as the light-transmitting resin 15. Thus, the film thickness and constituent materials of the light-transmitting resin 255 are also the same as those of the light-transmitting resin 15. The light-transmitting resin 255 is similar to the light-transmitting resin 15, and the description is thus omitted here.

<Reaction Inhibitor>

A reaction inhibitor is a substance that prevents reduction in electrical conductivity after application of the light-transmitting resin composition due to the reaction of the electroconductive fibers 256 with substances in the atmosphere. The reaction inhibitor and the content of the reaction inhibitor are the same as those described in the first embodiment, and the description of the reaction inhibitor and the content is thus omitted here.

<Electroconductive Fibers>

In cases where the electroconductive fibers 256 are unevenly distributed on the light-transmitting base material 251 side than the position HL, which is located at half the film thickness of the electroconductive part 254, the electroconductive fibers 256 contact with each other in the thickness direction of the electroconductive part 254, as indicated by the ability of the electroconductive part 254 to conduct electricity from the surface 254A.

The electroconductive fibers 256 preferably contact with each other in the surface direction (two-dimensional direction) of the electroconductive part 254 to form a network structure (meshwork) in the light-transmitting resin base material 251 side than the position HL, which is located at half the film thickness of the electroconductive part 254. Formation of a network structure by the electroconductive fibers 256 enables efficient creation of a conductive path with the electroconductive fibers 256 even in a small amount.

Some of the electroconductive fibers 256 are preferably exposed on the surface 254A of the electroconductive part 254. Once electrical conduction from the surface 254A of the electroconductive part 254 is identified by the above-described measurement method, some of the electroconductive fibers 256 can thus be determined to be exposed on the surface 254A of the electroconductive part 254.

The electroconductive fibers 256 preferably have a fiber diameter of 200 nm or less for the same reason as described for the electroconductive fibers 16. The minimum fiber diameter of the electroconductive fibers 256 is more preferably 10 nm or more from the viewpoint of the electroconductive of the electroconductive part 13, and a more preferred range of fiber diameter in the electroconductive fibers 256 is 15 nm or more and 180 nm or less. The fiber diameter of the electroconductive fibers 256 can be obtained by the same method as for the fiber diameter of the electroconductive fibers 16.

The electroconductive fibers 256 preferably have a fiber length of 1 μm or more for the same reason as described for the electroconductive fibers 16. The maximum fiber length of the electroconductive fibers 256 may be 500 μm or less, 300 μm or less, or 30 μm or less, while the minimum fiber length of the electroconductive fibers 256 may be 3 μm or more, or 10 μm or more. The fiber length of the electroconductive fibers 256 can be obtained by the same method as for the fiber length of the electroconductive fibers 16.

Similarly to the electroconductive fibers 16, the electroconductive fibers 256 preferably have a fiber length of, for example, 1 μm or more and less than 30 μm in cases of obtaining an electroconductive part having an electrical resistance value ratio of 1 or more and less than 2, while the electroconductive fibers 256 preferably have a fiber length of, for example, 30 μm or more in cases of obtaining an electroconductive part having an electrical resistance value ratio of 2 or more. In cases of obtaining an electroconductive part having an electrical resistance value ratio of 1 or more and less than 2, the electroconductive fibers 256 preferably have a minimum fiber length of 10 μm or more and a maximum fiber length of 20 μm or less from the viewpoint of obtaining a low surface resistance value.

The constituent fibers of the electroconductive fibers 256 are the same as those of the electroconductive fibers 16, and the description of the constituent fibers is thus omitted here.

<<Other Electroconductive Films>>

For the electroconductive film shown in FIG. 29, the electroconductive part 254 is a film with no pattern, namely a so-called plain film, but the electroconductive part may be patterned depending on applications. Specifically, the electroconductive film may be an electroconductive film 260, as shown in FIG. 31, comprising an electroconductive layer 261 which is composed of plural electroconductive parts 262 and plural nonconductive parts 263 located between the electroconductive parts 262, or an electroconductive film comprising, as shown in FIG. 4, plural electroconductive parts and plural gaps existing between the electroconductive parts. The surface 260A of the electroconductive film 260 comprises the surfaces 262A of the electroconductive parts 262 and the surfaces 263A of the nonconductive parts 263, while the surface of the electroconductive film having gaps existing between electroconductive parts comprises the surfaces of the electroconductive parts and one surface of the light-transmitting resin base material. For example, the physical property values of the electroconductive film 260 and the electroconductive film having gaps existing between electroconductive parts are similar to those of the electroconductive film 250. In FIG. 31, the elements indicated by the same reference numbers as in FIG. 29 are the same as those indicated in FIG. 29, and further description is thus omitted.

<Electroconductive Part>

The electroconductive parts 262 are the same as the electroconductive part 254, except that the former electroconductive parts are patterned. That is, the electroconductive parts 262 are provided directly on the other surface 252B of the underlayer 252. Additionally, the electroconductive parts 262 comprise a light-transmitting resin 255 and plural electroconductive fibers 256 incorporated in the light-transmitting resin 255, as shown in FIG. 32. The electroconductive parts 262 can conduct electricity from the surfaces 262A. In the electroconductive parts 262, the electroconductive fibers 256 are preferably unevenly distributed on the light-transmitting base material 251 side than the position HL, which is located at half the film thickness of the electroconductive parts 262, as shown in FIG. 32. Other configurations, materials, physical properties values, and the like of the electroconductive parts 262 are also the same as those of the electroconductive part 254, and further description is thus omitted here.

<Nonconductive Part>

The nonconductive parts 263 are parts located between electroconductive parts 262 and having no electrical conductivity. As shown in FIG. 32, the nonconductive parts 263 contain substantially no electroconductive fibers 256.

Because the nonconductive parts 263 are prepared together with the electroconductive parts 262 as an integrated body, the film thickness of the nonconductive parts is less than 300 nm. The maximum film thickness of the nonconductive parts 263 is 145 nm or less, 140 nm or less, 120 nm or less, 110 nm or less, 80 nm or less, or 50 nm or less in ascending order of preference (a lower value is more preferred). Additionally, the minimum film thickness of the nonconductive parts 263 is preferably 10 nm or more. The film thickness of the nonconductive parts 263 will be measured by the same method as for the film thickness of the electroconductive part 13.

As shown in FIG. 32, the nonconductive parts 263 comprise the light-transmitting resin 255. The nonconductive parts 263 may be formed by removing electroconductive fibers 256 through sublimation and may have the resulting voids 263B which are not filled with electroconductive fibers. In that case, the sublimated electroconductive fibers 256 burst out through areas to be the nonconductive parts 23 during the preparation of the nonconductive parts 263 and the resulting nonconductive parts 263 have rough surfaces 263A. The light-transmitting resin 255 in the nonconductive parts 263 is the same as the light-transmitting resin 255 in the electroconductive part 254, and the description is thus omitted here.

<<Production Methods of Electroconductive Films>>

Figure 33A:
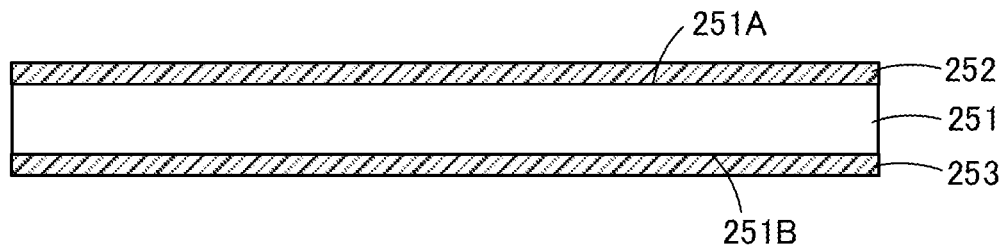
FIGS. 33(A), 33(B) and 33(C) schematically illustrate the process for producing the electroconductive film according to the fourth embodiment.

The electroconductive film 250 can be produced, for example, as follows. As shown in FIG. 33(A), a light-transmitting resin base material 251 carrying an underlayer 252 on one surface 251A and an underlayer 253 on the other surface 251B is first formed. Incidentally, a light-transmitting resin base material carrying an underlayer on one surface but not on the other surface may alternatively be prepared.

Figure 33B:
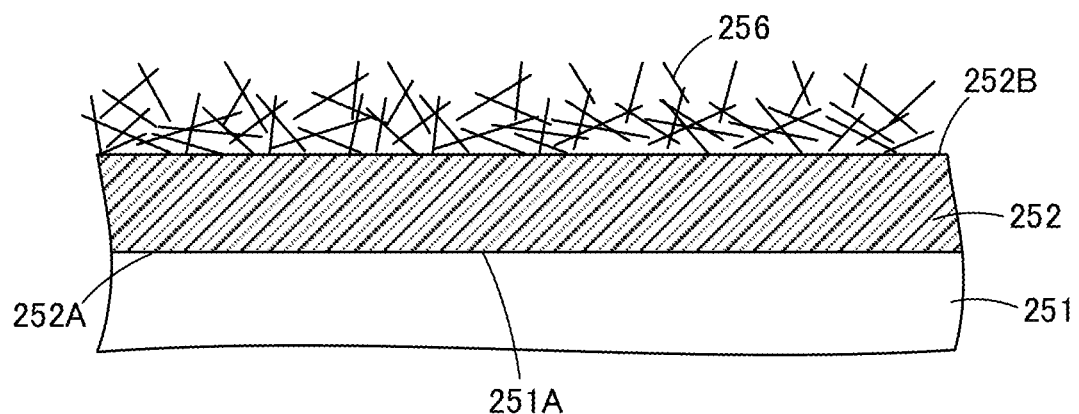

Next, an electroconductive fiber-containing composition containing electroconductive fibers 256 and a dispersion medium is applied directly on the other surface 252B of the underlayer 252, and dried to place a plurality of the electroconductive fibers 256 directly on the other surface 252B of the underlayer 252, as shown in FIG. 33(B). The electroconductive fiber-containing composition is the same as that used in the first embodiment, and the description of the electroconductive fiber-containing composition is thus omitted here.

Figure 33C:
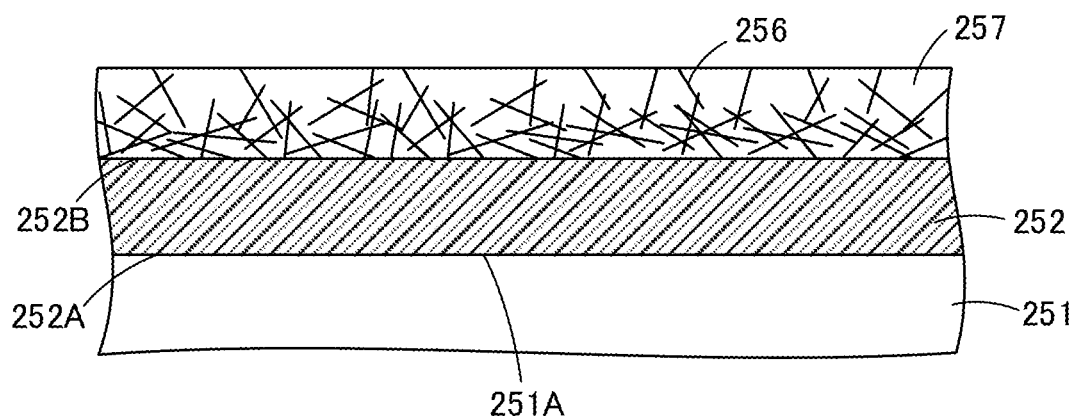

After a plurality of the electroconductive fibers 256 are placed directly on the other surface 252B of the underlayer 252, a light-transmitting resin composition containing a polymerizable compound and a solvent is applied on it and dried to prepare a coating film 257 of the light-transmitting resin composition, as shown in FIG. 33(C). The light-transmitting resin composition is the same as that used in the first embodiment, and the description of the light-transmitting resin composition is thus omitted here.

Figure 34A:
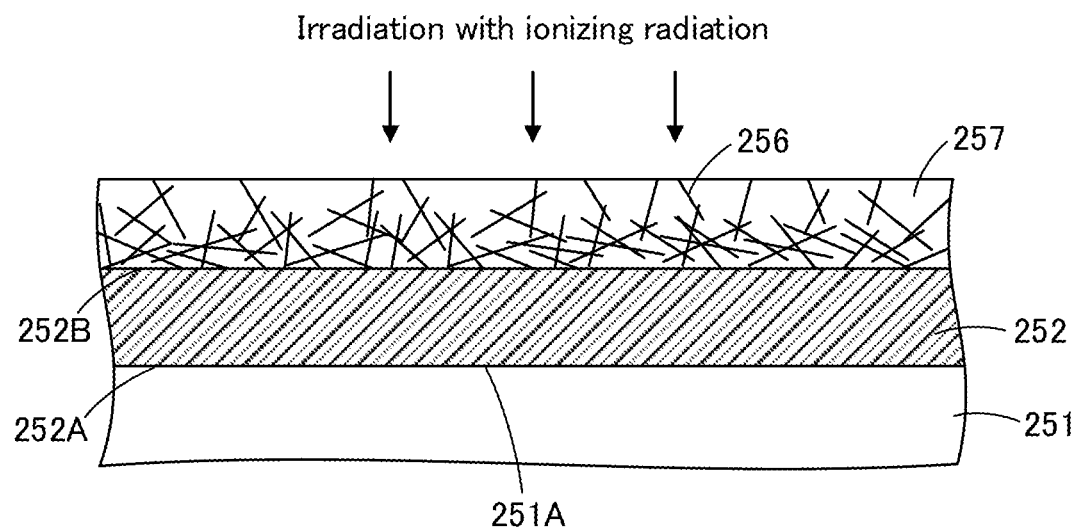
FIGS. 34(A) and 34(B) schematically illustrate the process for producing the electroconductive film according to the fourth embodiment.

Next, the coating film 257 is exposed to ionizing radiation such as ultraviolet light, as shown in FIG. 34(A), to polymerize (cross-link) the polymerizable compound and to cure the coating film 257, whereby the light-transmitting resin 255 is prepared.

Figure 34B:
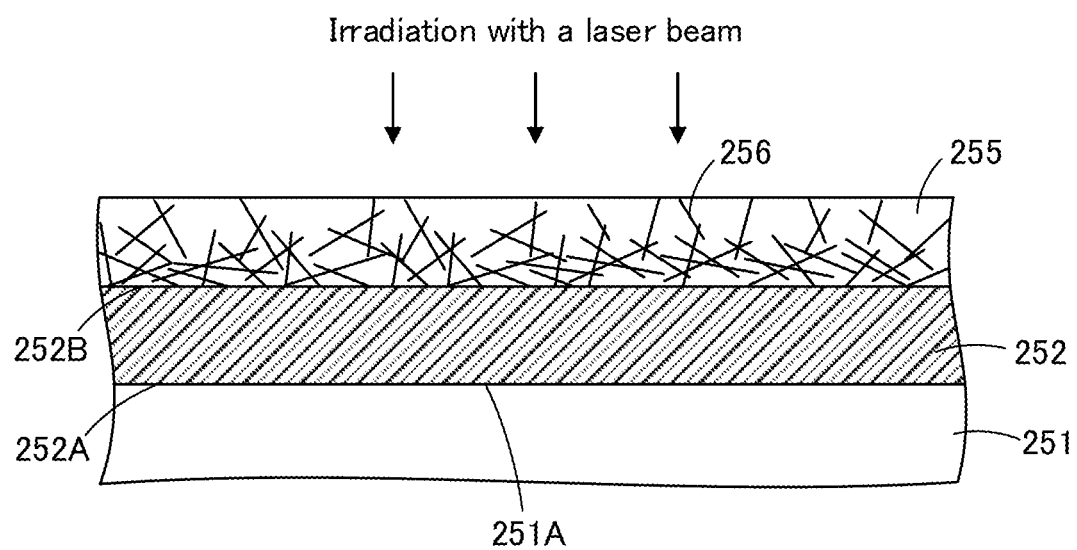

Because the electroconductive part 254 of the electroconductive film 250 shown in FIG. 29 is a plain film, the electroconductive film 250 is obtained in the above-described process. The electroconductive film 260 shown in FIG. 31 is patterned and can be obtained similarly to the first embodiment, for example, by irradiating laser light (for example, infrared laser) to areas to be the nonconductive parts 263 for the generation of patterns of the electroconductive parts 262, as shown in FIG. 34(B).

According to the present embodiment, the underlayer 252 is provided directly on one surface 251A of the light-transmitting resin base material 251 and the electroconductive part 254 or parts 262 are provided directly on the other surface 252B of the underlayer 252. That is, no hard coat layers are provided both between the light-transmitting resin base material 251 and the underlayer 252 and between the underlayer 252 and the electroconductive part 254 or parts 262. Consequently, excellent flexibility is achieved in the resulting electroconductive film. Additionally, the electroconductive part 254 or parts 262 are provided directly on the other surface 252B of the underlayer 252 and the resulting laminate demonstrates stronger interlayer adhesion and is less prone to delamination, as compared to an electroconductive part provided directly on a light-transmitting base material. Thus, even if electric wirings are formed on the surface 254A of the electroconductive part 254 or the surfaces 262A of the electroconductive parts 262 by using various electroconductive pastes (for example, silver paste), the electric wirings would be less prone to be peeled off from the surface 254A of the electroconductive part 254 or the surfaces 262A of the electroconductive parts 262. Accordingly, the number of electroconductive paste choices can be increased. Examples of the silver paste include DW-520H-14, DW-520H-18, and DW-520H-19 manufactured by Toyobo Co., Ltd.; and PA-LTP-AW03 manufactured by Phoenix Materials Co., Ltd.

According to the present embodiment, the contact points between the electroconductive fibers 256 can be increased in cases where the electroconductive fibers 256 as a whole in the electroconductive part 254 or parts 262 are unevenly distributed on the light-transmitting base material 251 side than the position HL, which is located at half the film thickness of the electroconductive part 254 or parts 262. This allows ensuring electrical conduction from the surface 254A of the electroconductive part 254 or the surfaces 262A of the electroconductive parts 262 and thus for achieving a low haze value of 5% or less, even if the content of electroconductive fibers 256 is low. Additionally, formation of the electroconductive part or parts on the surface of the underlayer results in incorporation of the electroconductive fibers 256 into the underlayer and consequently tends to induce the increase of surface resistance value but can reduce the content of the electroconductive fibers and consequently achieve a lower surface resistance value.

In a thin electroconductive part, the amount of electroconductive fibers is accordingly reduced and the electroconductive part is thus prone to increase the surface resistance value. According to the present embodiment, the contact points between the electroconductive fibers 256 are increased in cases where the electroconductive fibers 256 as a whole in the electroconductive part 254 or parts 262 are unevenly distributed on the light-transmitting base material 251 side than the position HL, which is located at half the film thickness of the electroconductive part 254 or parts 262, and a low haze value of 5% or less and a low surface resistance value of 200Ω/□ or less can consequently be achieved even if the electroconductive part 254 or parts 262 have a thin film thickness of less than 300 nm or a very thin film thickness of 145 nm or less.

According to the present embodiment, the electroconductive fibers 256 in the electroconductive part 254 or parts 262 are unevenly distributed on the light-transmitting base material 251 side than the position HL, which is located at half the film thickness of the electroconductive part 254 or parts 262, and a majority of the electroconductive fibers 256 are consequently covered with the light-transmitting resin 255. This allows preventing the electroconductive fibers 256 from reducing the electrical conductivity due to the reaction with sulfur, oxygen, and/or halogens in the air.

According to the present embodiment, the electroconductive fibers 256 in the electroconductive part 254 or parts 262 are unevenly distributed on the light-transmitting base material 251 side than the position HL, which is located at half the film thickness of the electroconductive part 254 or parts 262, and a maximally excellent surface resistance value can consequently be obtained with a minimum amount of electroconductive fibers. Additionally, the uneven distribution of the electroconductive fibers 256 as described above enables optical properties with a lower haze value. Furthermore, uneven distribution, rather than homogeneous dispersion, of electroconductive fibers 256 enables easier adjustment of the Martens hardness. Additionally, the dense presence of electroconductive fibers 256 in the light-transmitting resin 254 enables increasing the hardness of the light-transmitting resin and also enables obtaining a light-transmitting resin which is neither too hard nor too soft by devising the composition of the light-transmitting resin 254. In addition, the light-transmitting resin having an appropriate Martens hardness could achieve excellent flexibility for folding or rolling.

In the present embodiment, an organic dispersion medium is used as a dispersion medium for an electroconductive fiber-containing composition, and the electroconductive fiber-containing composition contains no resin material or, alternatively, a smaller amount of a resin material than the conventional amount of the resin material. Accordingly, in the electroconductive part 254 or parts 262, the electroconductive fibers 256 can be unevenly distributed on the light-transmitting base material 251 side than the position HL, which is located at half the film thickness of the electroconductive part 254 or parts 262, due to the same reason as described in the first embodiment.

According to the present embodiment, the electroconductive part 254 is provided directly on the other surface 252B of the underlayer 252 by coating process; the difference in electrical resistance value depending on the in-plain direction of the electroconductive part 254 can be reduced if the above-described electrical resistance value ratio is 1 or more and less than 2 in the electroconductive part 254, due to the same reason as described in the first embodiment. In cases where the electroconductive film is used for an electrode for a touch panel sensor, limitations on the pattern of the electrode, IC chips, and partitioning are reduced with the reduced difference in electrical resistance.

According to the present embodiment, the electroconductive part 254 has a high electrical resistance value in the second direction and a low electrical resistance value in the first direction in cases where the above-described electrical resistance value ratio is 2 or more. Thus, the electroconductive film 250 showing a further lower electrical resistance value in a particular direction (first direction) due to the same reason as described in the first embodiment can be provided.

According to the present embodiment, the light-transmitting resin 255 in the electroconductive part 254 or parts 262 contains a reaction inhibitor, and can consequently prevent the electroconductive fibers 256 from reducing the electrical conductivity due to the reaction with sulfur, oxygen, and/or halogens in the atmospheric air, on the same basis as described in the first embodiment.

According to the present embodiment, a reaction inhibitor contained in the electroconductive part 254 can control the reaction of the electroconductive fibers 256 with components of a light-transmitting adhesive layer due to the same reason as described in the first embodiment, even if the electroconductive part 254 or parts 262 in contact with the light-transmitting adhesive layer are tested by the humidity/heat resistance test. Accordingly, the number of light-transmitting adhesive layer choices can be increased.

The electroconductive films 250 and 260 have been described above; the above-described electroconductive film comprising gaps existing between electroconductive parts can likewise obtain the same effects as those of the electroconductive films 250 and 260.

Figure 35:
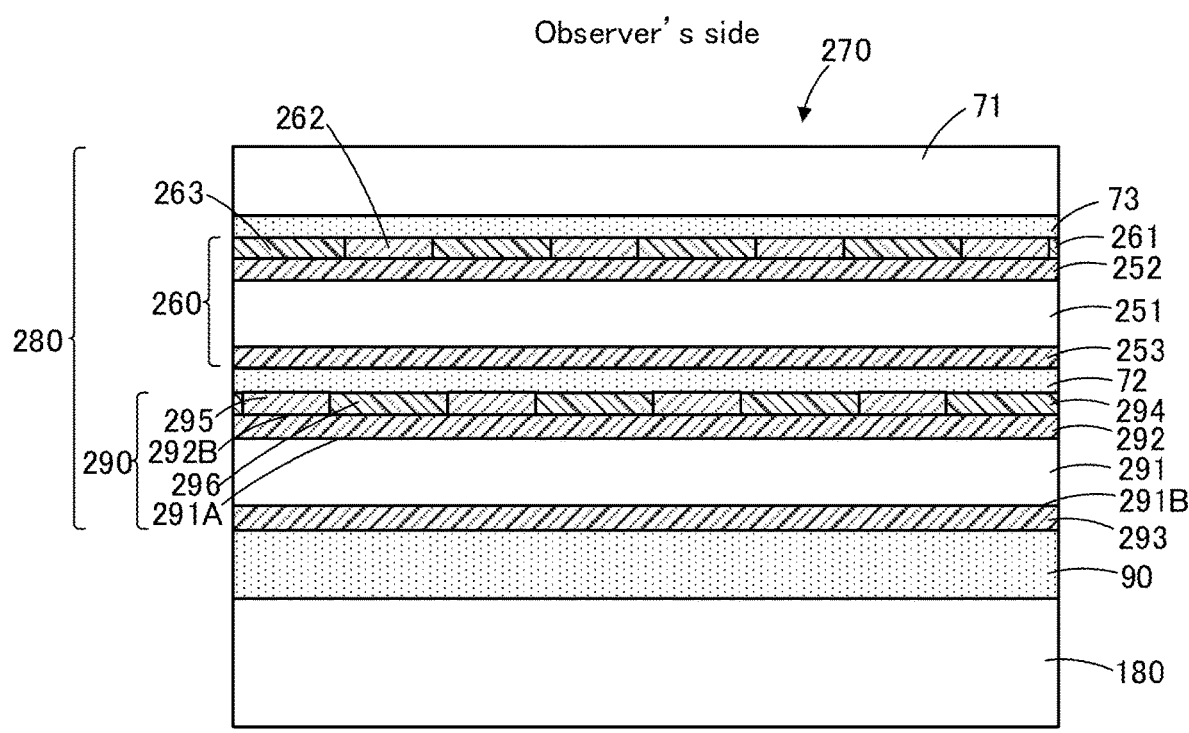
FIG. 35 depicts a schematic diagram of an image display device according to the fourth embodiment.

The application of an electroconductive film according to the present embodiment is not limited to a particular application and can be incorporated into an image display device comprising a touch panel and be used. Additionally, the electroconductive film can be used, for example, as an electromagnetic shield. FIG. 35 depicts a schematic diagram of an image display device according to the present embodiment. In FIG. 35, the elements indicated by the same reference numbers as in FIG. 28 are the same as those indicated in FIG. 28, and further description is thus omitted.

<<<Image Display Device>>>

As shown in FIG. 35, an image display device 270 mainly comprises a display panel 180 for displaying images, a touch panel 280 placed on the observer's side of the display panel 180, and a light-transmitting adhesion layer 90 intervening between the display panel 180 and the touch panel 280.

<<Touch Panel>>

The touch panel 280 comprises an electroconductive film 290, an electroconductive film 260 placed on the observer's side of the electroconductive film 290, a light-transmitting cover member 71, such as a cover glass, placed on the observer's side of the electroconductive film 260, a light-transmitting adhesive layer 72 intervening between the electroconductive film 290 and the electroconductive film 260, and a light-transmitting adhesive layer 73 intervening between the electroconductive film 260 and the light-transmitting cover member 71.

<Electroconductive Film>

The electroconductive film 290 has almost the same structure as that of the electroconductive film 260. That is, the electroconductive film 290 comprises a light-transmitting resin base material 291, an underlayer 292 provided directly on one surface 291A of the light-transmitting resin base material 291, an underlayer 293 provided directly on the other surface 291B of the light-transmitting resin base material 291, and electroconductive parts 295 provided directly and patterned on the surface 292B of the underlayer 292 opposite to the light-transmitting resin base material 291 side surface 292A, as shown in FIG. 35. The electroconductive parts 295 shown in FIG. 35 are an integral part of an electroconductive layer 294. The electroconductive layer 294 is composed of plural electroconductive parts 295 and nonconductive parts 296 located between the electroconductive parts 295. The light-transmitting resin base material 291 and the underlayers 292 and 293 are similar to the light-transmitting resin base material 251 and the underlayers 252 and 253, and the description is omitted here.

(Electroconductive Part and Nonconductive Part)

The electroconductive parts 295 have the same structure as that of the electroconductive parts 262. That is, the electroconductive parts 295 comprise a light-transmitting resin and electroconductive fibers. The nonconductive parts 296 comprise a light-transmitting resin and contain substantially no electroconductive fibers. The electroconductive parts 295 can conduct electricity from the surfaces 295A of the electroconductive parts 295. Additionally, the electroconductive fibers in the electroconductive parts 295 are preferably unevenly distributed on the light-transmitting base material 291 side than the position HL, which is located at half the film thickness of the electroconductive parts 295. The electroconductive parts 295 have the same structure as that of the electroconductive parts 262 but the electroconductive parts 295 may not need to have the same structure as that of the electroconductive parts 262.

The electroconductive parts 262 of the electroconductive film 260 function as electrode lines in the X direction in a projected capacitive touch panel, while the electroconductive parts 295 of the electroconductive film 290 function as electrode lines in the Y direction in a projected capacitive touch panel and have the same top view as shown in FIG. 13.

EXAMPLES

Now, the present invention will be described in more detail by way of examples. However, the present invention is not limited to those examples.

<Preparation of a Hard Coat Layer Composition>

First, the following components were combined to meet the composition requirements indicated below and thereby obtain a hard coat layer composition 1.

(Hard Coat Layer Composition 1)

A mixture of pentaerythritol triacrylate and pentaerythritol tetraacrylate (product name "KAYARAD PET-30"; manufactured by Nippon Kayaku Co., Ltd.): 30 parts by mass;

A polymerization initiator (product name "Irgacure 184"; manufactured by BASF Japan Ltd.): 1.5 parts by mass;
Methyl ethyl ketone (MEK): 50 parts by mass;
Cyclohexanone: 18.5 parts by mass.

<Preparation of Silver Nanowire-Containing Compositions>

(Silver Nanowire-Containing Composition 1)

Ethylene glycol (EG) as a reducing agent and polyvinylpyrrolidone (PVP; having an average molecular weight of 1,300,000; manufactured by Aldrich) as a shape controlling and protecting colloid agent were used to perform the following individual steps of core formation and particle growth to prepare a silver nanowire-containing composition.

1. Core Formation Step

To 100 mL of EG maintained at a temperature of 160° C. in a reaction vessel, 2.0 mL of a silver nitrate solution in EG (having a silver nitrate concentration of 1.0 mol/L) was added at a constant rate with stirring over one minute. Then, silver core particles were prepared by reducing silver ions while the temperature was maintained at 160° C. for 10 minutes. The reaction liquid was yellow in color due to the surface plasmon absorption in nano-sized silver particles, confirming the reduction of silver ions and the subsequent formation of silver microparticles (core particles). Then, 10.0 mL of a PVP solution in EG (having a PVP concentration of $3.0 \times 10^{-1}$ mol/L) was added to the reaction liquid at a constant rate over 10 minutes.

2. Particle Growth Step

After the above-described core formation step was completed, the reaction liquid containing the core particles was maintained at a temperature of 160° C. with stirring, to which 100 mL of a silver nitrate solution in EG (having a silver nitrate concentration of $1.0 \times 10^{-1}$ mol/L) and 100 mL of a PVP solution in EG (having a PVP concentration of $3.0 \times 10^{-1}$ mol/L) were added at a constant rate over 120 minutes by using the double-jet technique. In the course of the particle growth step, an aliquot was withdrawn every 30 minutes from the reaction liquid to perform electron microscopic observation. The observation indicated that the core particles formed in the core formation step grew into the shape of wires with the passage of time but no microparticles were generated during the particle growth step. Measurement of fiber diameter and fiber length in finally obtained silver nanowires indicated that the silver nanowires had a fiber diameter of 30 nm and a fiber length of 15 μm.

3. Desalting/Washing Step

After completion of the particle growth step, the reaction liquid was cooled down to room temperature and then applied to an ultrafiltration membrane with a molecular weight cut-off of 0.2 μm for desalting/washing and for solvent exchange to ethanol. Subsequently, the reaction liquid was concentrated to a volume of 100 mL to obtain a dispersion of silver nanowires. Finally, the concentrated reaction liquid was diluted with ethanol to achieve a silver nanowire concentration of 0.1% by mass, whereby the silver nanowire-containing composition 1 was obtained.

Measurement of fiber diameter and fiber length in silver nanowires in the silver nanowire-containing composition 1 indicated that the silver nanowires had a fiber diameter of 30 nm and a fiber length of 15 μm. The fiber diameter of the silver nanowires was obtained as the arithmetic mean of the fiber diameters of 100 electroconductive fibers in 50 images photographed at a magnification of 100,000 to 200,000 times using a transmission electron microscope (TEM) (product name "H-7650"; manufactured by Hitachi High-Technologies Corporation), which were measured on the photographed images by a software program accessory to the TEM. The above-described fiber diameters were measured by setting the accelerating voltage to "100 kV," the emission current to "10 μA," the condenser lens aperture to "1," the objective lens aperture to "0," the observation mode to "HC," and the Spot to "2." Additionally, the fiber length of the silver nanowires was obtained as the arithmetic mean of the fiber lengths of 100 silver nanowires measured using a scanning electron microscope (SEM) (product name "S-4800 (Type 2)"; manufactured by Hitachi High-Technologies Corporation) at a magnification of 500 to 20,000,000 times. The above-described fiber lengths were measured by setting the signal selection to "SE," the accelerating voltage to "3 kV," the emission current to "10 μA," and the SE detector to "Mixed." The fiber length of the silver nanowires was obtained as the arithmetic mean of the fiber lengths of 100 silver nanowires in 10 images acquired at a magnification of 500 to 20,000,000 times using a scanning electron microscope (SEM) (product name "S-4800 (Type 2)"; manufactured by Hitachi High-Technologies Corporation) on the SEM mode, which were measured on the acquired images by an accessory software program. The above-described fiber length were measured using a 45° pre-tilted sample table by setting the signal selection to "SE," the accelerating voltage to "3 kV," the emission current to "10 μA to 20 μA," the SE detector to "Mixed," the probe current to "Norm," the focus mode to "UHR," the condenser lens 1 to "5.0," the WD to "8 mm," and the Tilt to "30°." The TE detector was removed from the microscope system prior to the observation. When the fiber diameter of the silver nanowires was determined, a measurement sample prepared by the following method was used. First, the silver nanowire-containing composition 1 was diluted with ethanol depending on the type of the dispersion medium in the composition to reduce the concentration of silver nanowires to 0.05% by mass or less. Furthermore, a drop of the diluted silver nanowire-containing composition 1 was applied on a carbon-coated grid mesh for TEM or STEM observation (a Cu grid with the model "#10-1012, Elastic Carbon Film ELS-C10 in the STEM Cu100P grid specification"), dried at room temperature, and then observed under the above-described conditions, and the resulting observation image data was used to calculate the arithmetic mean. When the fiber length of the silver nanowire was determined, a measurement sample prepared by the following method was used. First, the silver nanowire-containing composition 1 was applied on an untreated surface of a polyethylene terephthalate (PET) film in B5 size having a thickness of 50 μm at an application dose of 10 mg/m², and dried to evaporate the dispersion medium and to place electroconductive fibers on the surface of the PET film, and an electroconductive film was thereby prepared. A piece having a size of 10 mm×10 mm was cut from the central part of the electroconductive film. Then, the excised electroconductive film was attached flat against the tilted surface of a 45° pre-tilted SEM sample table (model number "728-45"; manufactured by Nissin EM Co., Ltd.; 45° pre-tilted sample table; 15 mm diameter×10 mm; made of M4 aluminum) using a silver paste. Furthermore, the cut electroconductive film was sputtered with Pt—Pd for 20 to 30 seconds to obtain electrical conductivity. The fiber diameters and fiber lengths of the below-described silver nanowires were determined in the same manner.

(Silver Nanowire-Containing Composition 2)

The silver nanowire-containing composition 2 was obtained in the same manner as the silver nanowire-containing composition 1, except that the silver nanowire dispersion liquid was supplemented with 0.1 parts by mass of the mixture of pentaerythritol triacrylate and pentaerythritol tetraacrylate (product name "KAYARAD PET-30"; manufactured by Nippon Kayaku Co., Ltd.) and 0.005 parts by mass of polymerization initiator (product name "Irgacure 184"; manufactured by BASF SE) and diluted with ethanol to achieve a silver nanowire concentration of 0.1% by mass.
(Silver Nanowire-Containing Composition 3)

The silver nanowire-containing composition 3 was obtained in the same manner as the silver nanowire-containing composition 1, except that the silver nanowire dispersion liquid was diluted with ethanol to achieve a silver nanowire concentration of 0.2% by mass.
(Silver Nanowire-Containing Composition 4)

The silver nanowire-containing composition 4 was obtained in the same manner as the silver nanowire-containing composition 2, except that the silver nanowire dispersion liquid was diluted with ethanol to achieve a silver nanowire concentration of 0.2% by mass.
(Silver Nanowire-Containing Composition 5)

The silver nanowire-containing composition 5 was obtained in the same manner as the silver nanowire-containing composition 1, except that the reaction time in the particle growth step was prolonged to obtain silver nanowires having a fiber length of 40 μm.
(Silver Nanowire-Containing Composition 6)

The silver nanowire-containing composition 6 having a silver nanowire concentration of 0.1% by mass was obtained in the same manner as the silver nanowire-containing composition 1, except that the silver nanowire dispersion liquid was supplemented with 1 part by mass of the mixture of pentaerythritol triacrylate and pentaerythritol tetraacrylate (product name "KAYARAD PET-30"; manufactured by Nippon Kayaku Co., Ltd.) and 0.05 parts by mass of polymerization initiator (product name "Irgacure 184"; manufactured by BASF SE).
(Silver Nanowire-Containing Composition 7)

The silver nanowire-containing composition 7 was obtained in the same manner as the silver nanowire-containing composition 1, except that the silver nanowire dispersion liquid was supplemented with 1 part by mass of the mixture of pentaerythritol triacrylate and pentaerythritol tetraacrylate (product name "KAYARAD PET-30"; manufactured by Nippon Kayaku Co., Ltd.) and 0.05 parts by mass of polymerization initiator (product name "Irgacure 184"; manufactured by BASF SE) and diluted with ethanol to achieve a silver nanowire concentration of 0.2% by mass.
(Silver Nanowire-Containing Composition 8)

The silver nanowire-containing composition 8 was obtained in the same manner as the silver nanowire-containing composition 1, except that the silver nanowire dispersion liquid was supplemented with 1 part by mass of the mixture of pentaerythritol triacrylate and pentaerythritol tetraacrylate (product name "KAYARAD PET-30"; manufactured by Nippon Kayaku Co., Ltd.) and 0.05 parts by mass of polymerization initiator (product name "Irgacure 184"; manufactured by BASF SE) and diluted with ethanol to achieve a silver nanowire concentration of 1% by mass.
(Silver Nanowire-Containing Composition 9)

The silver nanowire-containing composition 9 was obtained in the same manner as the silver nanowire-containing composition 1, except that the silver nanowire dispersion liquid was diluted with a mixture of ethanol and isopropyl alcohol (IPA) instead of ethanol to achieve a silver nanowire concentration of 0.1% by mass. The ratio of IPA relative to the whole composition was 30% by mass.

(Silver Nanowire-Containing Composition 10)

The silver nanowire-containing composition 10 was obtained in the same manner as the silver nanowire-containing composition 9, except that the reaction time in the particle growth step was prolonged to obtain silver nanowires having a fiber length of 25 μm.
(Silver Nanowire-Containing Composition 11)

The silver nanowire-containing composition 11 was obtained in the same manner as the silver nanowire-containing composition 9, except that the reaction time in the particle growth step was shortened to obtain silver nanowires having a fiber length of 10 μm.
(Silver Nanowire-Containing Composition 12)

The silver nanowire-containing composition 12 was obtained in the same manner as the silver nanowire-containing composition 9, except that the concentration of polyvinylpyrrolidone was reduced by increasing the number of iterations of the desalting/washing step, as compared to that in the silver nanowire-containing composition 1.
(Silver Nanowire-Containing Composition 13)

The silver nanowire-containing composition 13 was obtained in the same manner as the silver nanowire-containing composition 9, except that anone was used instead of isopropyl alcohol (IPA) and the reaction time in the particle growth step was prolonged to obtain silver nanowires having a fiber length of 25 μm. The ratio of anone relative to the whole composition was 30% by mass.
(Silver Nanowire-Containing Composition 14)

The silver nanowire-containing composition 14 was obtained in the same manner as the silver nanowire-containing composition 9, except that the reaction time in the particle growth step was shortened to obtain silver nanowires having a fiber length of 5 μm.
(Silver Nanowire-Containing Composition 15)

The silver nanowire-containing composition 15 was obtained in the same manner as the silver nanowire-containing composition 9, except that the reaction time in the particle growth step was prolonged to obtain silver nanowires having a fiber length of 40 μm.
(Silver Nanowire-Containing Composition 16)

The silver nanowire-containing composition 16 was obtained in the same manner as the silver nanowire-containing composition 9, except that the concentration of polyvinylpyrrolidone was increased by reducing the number of iterations of the desalting/washing step, as compared to that in the silver nanowire-containing composition 1.
(Silver Nanowire-Containing Composition 17)

The silver nanowire-containing composition 17 was obtained in the same manner as the silver nanowire-containing composition 9, except that the silver nanowire dispersion liquid was diluted with a mixture of ethanol and isopropyl alcohol to achieve a silver nanowire concentration of 0.2% by mass.
(Silver Nanowire-Containing Composition 18)

The silver nanowire-containing composition 18 was obtained in the same manner as the silver nanowire-containing composition 9, except that ethanol was used instead of a mixture of ethanol and isopropyl alcohol.
(Silver Nanowire-Containing Composition 19)

The silver nanowire-containing composition 19 was obtained in the same manner as the silver nanowire-containing composition 1, except that the silver nanowire dispersion liquid was diluted with a mixture of ethanol and anone instead of ethanol to achieve a silver nanowire concentration of 0.1% by mass and an anone ratio of 30% by mass in the solvent after the dilution.

(Silver Nanowire-Containing Composition 20)

The silver nanowire-containing composition 20 was obtained in the same manner as the silver nanowire-containing composition 19, except that the silver nanowire dispersion liquid was supplemented with 0.1 parts by mass of the mixture of pentaerythritol triacrylate and pentaerythritol tetraacrylate (product name "KAYARAD PET-30"; manufactured by Nippon Kayaku Co., Ltd.) and 0.005 parts by mass of polymerization initiator (product name "Irgacure 184"; manufactured by BASF SE) and diluted with a mixture of ethanol and anone to achieve a silver nanowire concentration of 0.1% by mass and an anone ratio of 30% by mass in the solvent after the dilution.

(Silver Nanowire-Containing Composition 21)

The silver nanowire-containing composition 21 was obtained in the same manner as the silver nanowire-containing composition 19, except that the silver nanowire dispersion liquid was diluted with a mixture of ethanol and anone to achieve a silver nanowire concentration of 0.2% by mass and an anone ratio of 30% by mass in the solvent after the dilution.

(Silver Nanowire-Containing Composition 22)

The silver nanowire-containing composition 22 was obtained in the same manner as the silver nanowire-containing composition 20, except that the silver nanowire dispersion liquid was diluted with a mixture of ethanol and anone to achieve a silver nanowire concentration of 0.2% by mass and an anone ratio of 30% by mass in the solvent after the dilution.

(Silver Nanowire-Containing Composition 23)

The silver nanowire-containing composition 23 was obtained in the same manner as the silver nanowire-containing composition 19, except that the reaction time in the particle growth step was prolonged to obtain silver nanowires having a fiber length of 40 µm.

<Light-Transmitting Resin Composition>

The following components were combined to meet the composition requirements indicated below and thereby obtain a light-transmitting resin layer composition 1.

(Light-Transmitting Resin Composition 1)

A mixture of pentaerythritol triacrylate and pentaerythritol tetraacrylate (product name "KAYARAD PET-30"; manufactured by Nippon Kayaku Co., Ltd.): 5 parts by mass;

A polymerization initiator (product name "Irgacure 184"; manufactured by BASF Japan Ltd.): 0.25 parts by mass;

Methyl ethyl ketone (MEK): 70 parts by mass;

Cyclohexanone: 24.75 parts by mass.

(Light-Transmitting Resin Composition 2)

A mixture of pentaerythritol triacrylate and pentaerythritol tetraacrylate (product name "KAYARAD PET-30"; manufactured by Nippon Kayaku Co., Ltd.): 5 parts by mass;

2-Methylthio-benzothiazole (manufactured by Tokyo Chemical Industry Co., Ltd.): 0.1 parts by mass;

A polymerization initiator (product name "Irgacure 184"; manufactured by BASF Japan Ltd.): 0.25 parts by mass;

Methyl ethyl ketone (MEK): 70 parts by mass;

Cyclohexanone: 24.75 parts by mass.

Examples A and Comparative Examples A

Example A1

First, a polyethylene terephthalate film (product name "Cosmoshine A4100"; manufactured by Toyobo Co., Ltd.) having a thickness of 50 µm and having an underlayer on one surface was prepared as a light-transmitting base material, and the hard coat layer composition 1 was applied on the underlayer of the polyethylene terephthalate film to form a coating film. Subsequently, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to cure the coating film, whereby a hard coat layer having a film thickness of 2 µm was formed as a light-transmitting functional layer.

After the hard coat layer was formed, the silver nanowire-containing composition 1 was applied at an application dose of 10 mg/m$^2$ on an untreated surface of the polyethylene terephthalate film opposite to the surface facing the hard coat layer. Then, the dispersion medium in the silver nanowire-containing composition 1 was evaporated by dry air blowing at 50° C. at a flow rate of 0.5 m/s for 15 seconds and subsequent dry air blowing at 70° C. at a flow rate of 10 m/s for 30 seconds over the applied silver nanowire-containing composition 1 to place silver nanowires on the surface of the hard coat layer.

Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to form a light-transmitting resin having a film thickness of 100 nm by curing the coating film, whereby an electroconductive film that comprised an electroconductive part having a film thickness of 100 nm and comprising the light-transmitting resin and the silver nanowires incorporated in the light-transmitting resin was obtained. The electroconductive part according to Example A1 was a plain film with no pattern.

The film thickness of the electroconductive part according to Example A1 was determined as the arithmetic mean of the thickness values measured at randomly selected 10 locations, wherein the thickness values were determined at the 10 locations in cross-sectional images of the electroconductive part photographed using a scanning transmission electron microscope (STEM) or a transmission electron microscope (TEM). Specifically, the cross-sectional images were photographed by the following method. First, samples for observing a cross-section were prepared from the electroconductive film. More specifically, a cut piece of the electroconductive film having a size of 2 mm×5 mm was placed in an embedding plate made of silicone, into which an epoxy resin was later poured to embed the whole electroconductive film in the resin. Then, the embedding resin was left to stand at 65° C. for 12 hours or longer and cured. Subsequently, ultra-thin sections were prepared using an ultramicrotome (product name "Ultramicrotome EM UC7"; manufactured by Leica Microsystems GmbH) at a feeding rate of 100 nm. The prepared ultra-thin sections were collected on collodion-coated meshes (150 meshes) to obtain STEM samples. Then, a cross-sectional image of a STEM sample was photographed using a scanning transmission electron microscope (STEM) (product name "S-4800 (Type 2)"; manufactured by Hitachi High-Technologies Corporation). The cross-sectional image was photographed by setting the detector switch (signal selection) to "TE," the accelerating voltage to 30 kV, and the emission current to "10 µA." The focus, contrast, and brightness were appropriately adjusted at a magnification of 5,000 to 200,000 times so that each layer could be identified. The magnification is preferably in the range from 10,000 to 50,000 times, further preferably in the range from 25,000 to 40,000 times. An interface between layers photographed at an extremely high magnification is represented by pixels in a coarse resolution image and appears obscure. Thus, the magnification should not be increased excessively during the measurement of film thickness. The cross-section was imaged by additionally setting the beam monitor aperture to 3 and the objective lens aperture to 3, and also setting the WD to 8 mm. The film thickness of an electroconductive part was measured by the above method not only in Example A1 but also in the following Examples and Comparative Examples.

Example A2

In Example A2, an electroconductive film was obtained in the same manner as in Example A1, except that the light-transmitting resin composition 2 was used instead of the light-transmitting resin composition 1.

Example A3

In Example A3, an electroconductive film was obtained in the same manner as in Example A1, except that the silver nanowire-containing composition 2 was used instead of the silver nanowire-containing composition 1 and the application dose of the light-transmitting resin composition was modified to achieve a film thickness of 100 nm across the whole electroconductive part. During the production process, the silver nanowire-containing composition 2 was applied and dried to form a coating film containing silver nanowires and a resin material.

Example A4

In Example A4, an electroconductive film was obtained in the same manner as in Example A1, except that the silver nanowire-containing composition 3 was used instead of the silver nanowire-containing composition 1.

Example A5

In Example A5, an electroconductive film was obtained in the same manner as in Example A1, except that the silver nanowire-containing composition 4 was used instead of the silver nanowire-containing composition 1 and the application dose of the light-transmitting resin composition was modified to achieve a film thickness of 100 nm across the whole electroconductive part. During the production process, the silver nanowire-containing composition 4 was applied and dried to form a coating film containing silver nanowires and a resin material.

Example A6

In Example A6, a polyethylene terephthalate film (product name "Cosmoshine A4300"; manufactured by Toyobo Co., Ltd.) having a thickness of 50 μm and having underlayers on both surfaces was prepared as a light-transmitting base material, and the hard coat layer composition 1 was applied on one of the underlayers of the polyethylene terephthalate film to form a coating film. Subsequently, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to cure the coating film, whereby a hard coat layer having a film thickness of 2 μm was formed as a light-transmitting functional layer. Then, a hard coat layer was also formed on the other underlayer of the polyethylene terephthalate film in the same manner as described above to prepare a film comprising hard coat layers on both surfaces. Subsequently, the silver nanowire-containing composition 1 was applied on the hard coat layer formed on the above-described other underlayer to form an electroconductive part having a film thickness of 100 nm in the same manner as in Example A1, whereby an electroconductive film was obtained. The electroconductive part according to Example A6 was a plain film with no pattern.

Example A7

In Example A7, an electroconductive film was obtained in the same manner as in Example A6, except that the silver nanowire-containing composition 2 was used instead of the silver nanowire-containing composition 1 and the application dose of the light-transmitting resin composition was modified to achieve a film thickness of 100 nm across the whole electroconductive part. During the production process, the silver nanowire-containing composition 2 was applied and dried to form a coating film containing silver nanowires and a resin material.

Example A8

In Example A8, an electroconductive film was obtained in the same manner as in Example A6, except that the silver nanowire-containing composition 3 was used instead of the silver nanowire-containing composition 1.

Example A9

In Example A9, an electroconductive film was obtained in the same manner as in Example A6, except that the silver nanowire-containing composition 4 was used instead of the silver nanowire-containing composition 1 and the application dose of the light-transmitting resin composition was modified to achieve a film thickness of 100 nm across the whole electroconductive part. During the production process, the silver nanowire-containing composition 4 was applied and dried to form a coating film containing silver nanowires and a resin material.

Example A10

In Example A10, an electroconductive film was obtained in the same manner as in Example A1, except that the silver nanowire-containing composition 5 was used instead of the silver nanowire-containing composition 1.

Comparative Example A1

In Comparative Example A1, an electroconductive film was obtained in the same manner as in Example A1, except that the silver nanowire-containing composition 6 was used instead of the silver nanowire-containing composition 1.

Comparative Example A2

In Comparative Example A2, an electroconductive film was obtained in the same manner as in Example A1, except that the silver nanowire-containing composition 7 was used instead of the silver nanowire-containing composition 1.

Comparative Example A3

In Comparative Example A3, an electroconductive film was obtained in the same manner as in Example A1, except that the silver nanowire-containing composition 8 was used instead of the silver nanowire-containing composition 1.

Comparative Example A4

In Comparative Example A4, an electroconductive film was obtained in the same manner as in Example A6, except that the silver nanowire-containing composition 6 was used instead of the silver nanowire-containing composition 1.

Comparative Example A5

In Comparative Example A5, an electroconductive film was obtained in the same manner as in Example A1, except that no light-transmitting resin was formed.

Comparative Example A6

In Comparative Example A6, an electroconductive film was obtained in the same manner as in Example A1, except that the film thickness of the light-transmitting resin was changed from 100 nm to 50 nm.

Comparative Example A7

In Comparative Example A7, an electroconductive film was obtained in the same manner as in Example A1, except that the film thickness of the light-transmitting resin was changed from 100 nm to 400 nm.

<Evaluation of Uneven Silver Nanowire Distribution>

For the electroconductive films according to Examples A1 to A10 and Comparative Examples A1 to A4, and A6 and A7, it was examined whether or not the silver nanowires as a whole in each electroconductive part were unevenly distributed on the polyethylene terephthalate film side than the position located at half the film thickness of the electroconductive part. Specifically, first of all, samples for observing a cross-section were prepared from each electroconductive film. More specifically, a cut piece of the electroconductive film having a size of 2 mm×5 mm was placed in an embedding plate made of silicone, into which an epoxy resin was later poured to embed the whole electroconductive film in the resin. Then, the embedding resin was left to stand at 65° C. for 12 hours or longer and cured. Subsequently, ultra-thin sections were prepared using an ultramicrotome (product name "Ultramicrotome EM UC7"; manufactured by Leica Microsystems GmbH) at a feeding rate of 100 nm. The prepared ultra-thin sections were collected on collodion-coated meshes (150 meshes) to obtain STEM samples. Then, a cross-sectional image of a STEM sample was acquired using a scanning transmission electron microscope (STEM) (product name "S-4800 (Type 2)"; manufactured by Hitachi High-Technologies Corporation). The cross-section was observed and imaged under STEM at a magnification of 5,000 to 200,000 times by setting the detector switch (signal selection) to "TE," the accelerating voltage to "30 kV," and the emission current to "10 µA," and appropriately adjusting the focus, contrast, and brightness so that each layer could be identified. The magnification is preferably in the range from 10,000 to 100,000 times, more preferably in the range from 10,000 to 50,000 times, and most preferably in the range from 25,000 to 50,000 times. Additionally, the cross-section was imaged by additionally setting the beam monitor aperture to "3" and the objective lens aperture to "3," and also setting the WD to "8 mm." Then, the cross-sectional images at 10 locations photographed as described above were prepared. Next, each image of the cross-section was enlarged to the pixel resolution, and the numbers of pixels covering the silver nanowires distributed from the position located at half the film thickness of the electroconductive part to the polyethylene terephthalate film and covering the silver nanowires distributed from the position located at half the film thickness of the electroconductive part to the surface of the electroconductive part were counted in each cross-sectional image to determine the ratio of the number of pixels covering the silver nanowires distributed from the above-described half-length position to the polyethylene terephthalate film relative to the total number of pixels covering all the silver nanowires. For the pixels covering a silver nanowire, each pixel on the line running through the above-described half-length position would be divided into a portion located from the above-described half-length position to the polyethylene terephthalate film and the remaining portion located from the above-described position to the surface of the electroconductive part, to divide one pixel based on the area ratio between the divided portions. Then, the above-described ratio determined from each cross-sectional image was determined as the existence ratio of electroconductive fibers distributed on the polyethylene terephthalate film side than the position located at half the film thickness of the electroconductive part, and the arithmetic mean of the existence ratio determined from the cross-sectional images was calculated. In cases where the arithmetic mean was 55% or more, the electroconductive fibers were determined to be unevenly distributed on the polyethylene terephthalate film side. The electroconductive film according to Comparative Example A5 comprised no light-transmitting resin and was thus not subjected to the evaluation.

<Measurement of Total Light Transmittance>

For the electroconductive films according to the above-described Examples A1 to A10 and Comparative Examples A1 to A7, the total light transmittance was measured using a haze meter (product name "HM-150"; manufactured by Murakami Color Research Laboratory Co., Ltd.) according to JIS K7361-1: 1997. The total light transmittance was a value measured on the whole electroconductive film and is also determined as the arithmetic mean of three measurement values obtained from one electroconductive film, wherein a sample having a size of 50 mm×100 mm is cut from the electroconductive film and the sample without curl or wrinkle and without any dirt such as fingerprints or dust is then placed in the haze meter in such a manner that the electroconductive part faces in the direction opposite to the light source.

<Measurement of Haze Value>

For the electroconductive films according to the above-described Examples A1 to A10 and Comparative Examples A1 to A7, the haze value (total haze value) of each electroconductive film was measured using a haze meter (product name "HM-150"; manufactured by Murakami Color Research Laboratory Co., Ltd.) according to JIS K7136: 2000. The haze value was a value measured on the whole electroconductive film and is also determined as the arithmetic mean of three measurement values obtained from one electroconductive film, wherein a sample having a size of 50 mm×100 mm was cut from the electroconductive film and the sample without curl or wrinkle and without any dirt such as fingerprints or dust was then placed in the haze meter in such a manner that the electroconductive part faced in the direction opposite to the light source.

<Measurement of Surface Resistance Value>

For the electroconductive films according to the above-described Examples A1 to A10 and Comparative Examples A1 to A7, the surface resistance of an electroconductive part was measured using a contact-type resistivity meter (product name "Loresta-AX MCP-T370"; Manufactured by Mitsubishi Chemical Analytech Co., Ltd., Type of sensor: ASP-probe) according to JIS K7194: 1994 (Testing method for resistivity of conductive plastics with a four-point probe array). The surface resistance was measured with the contact-type resistivity meter by placing a cut piece of the electroconductive film having a size of 80 mm×50 mm on a flat glass plate to create an uniformly flat surface, and then placing an ASP-probe on the center of the electroconductive part facing upward and evenly pressing all the electrode pins on the electroconductive part. For the measurement with the contact-type resistivity meter, the mode "Ω/□" as a sheet resistance measurement mode was selected. Subsequently, the start button was pushed and the instrument was held to obtain the result of the measurement. Additionally, a very high resistance value may be obtained when the surface resistance of a light-transmitting resin having a large film thickness is measured with the above-described resistivity meter. In that case, a high resistance value resulting from reduction of electrical conduction through silver nanowires due to the light-transmitting resin is indistinguishable from a high resistance value resulting from lack of electrical conduction from the surface of the electroconductive part. Thus, the surface resistance of an electroconductive part was also measured with a non-destructive resistivity meter (product name "EC-80P"; manufactured by Napson Corporation) based on the eddy current method. The surface resistance was measured with the non-destructive resistivity meter by placing a cut piece of the electroconductive film having a size of 80 mm×50 mm on a flat glass plate to create an uniform flat surface and bringing a probe into contact with the electroconductive part facing upward. For the measurement with the non-destructive resistivity meter, the type SW2 was selected for the measurement in the mode M-H sheet resistance (Ω/□) measurement, and a probe for the measurement range from 10 to 1000Ω/□ or from 0.5 to 10Ω/□ was used. Three locations for the measurement of surface resistance were in the central part of the electroconductive film and the arithmetic mean of the surface resistance values at the three locations was determined as the surface resistance value. The measurement of surface resistance value was performed in an environment at a temperature of 23° C. and a relative humidity of 55% independently of the type of a resistivity meter. The measurement of resistance value was performed using electroconductive films which had not been subjected to the below-described shelf test.

<Shelf Test>

For the electroconductive films according to the above-described Examples A1 to A10 and Comparative Examples A1 to A7, a shelf test was performed by leaving each electroconductive film in the air at room temperature. Specifically, for the purpose of speeding up the evaluation, pieces of adhesive tape (product number "7210F"; manufactured by Nitto Denko Corporation; 24 mm width) containing a high sulfur content were attached to polyethylene terephthalate films (product name "A4300"; manufactured by Toyobo Co., Ltd.) having a thickness of 50 μm and the resulting laminates were placed on each electroconductive film in such a manner that the surface of the adhesive tape was brought into contact with the electroconductive part, and were then left to stand for one week. Each adhesive tape piece was positioned at the center of an area having a size of 80 mm×50 mm on the electroconductive film, which was later cut. In the electroconductive films according to Examples A1 to A10 and Comparative Examples A1 to A6, the pieces of each electroconductive film having a size of 80 mm×50 mm were cut either before or after the shelf test in an environment at a temperature of 23° C. and a relative humidity of 55% and measured for surface resistance value (unit: Ω/□) on the electroconductive part using a contact-type resistivity meter (product name "Loresta-AX MCP-T370"; Manufactured by Mitsubishi Chemical Analytech Co., Ltd., Type of sensor: ASP-probe) according to JIS K7194: 1994 (Testing method for resistivity of conductive plastics with a four-point probe array) to evaluate the increase of the surface resistance value after the shelf test to the surface resistance value before the shelf test. Additionally, the electroconductive films according to Comparative Example A7 had a light-transmitting resin with a large film thickness and the surface resistance value of the electroconductive part measured with the contact-type resistivity meter was consequently too high, which was likely to compromise accurate determination of increase rate of the surface resistance value after the shelf test to the surface resistance value before the shelf test. Thus, a non-destructive resistivity meter (product name "EC-80P"; manufactured by Napson Corporation) based on the eddy current method was used instead of a contact-type resistivity meter to measure and evaluate the surface resistance value of the electroconductive part before and after the shelf test as described above. In the Loresta-AX MCP-T370, probe "Low" should be selected for the measurement of a surface resistance value of 0.01Ω/□ or more and less than 0.5Ω/□, probe "Middle" should be selected for the measurement of a surface resistance value of 0.5Ω/□ or more and less than 10Ω/□, probe "High" should be selected for the measurement of a surface resistance value of 10Ω/□ or more and less than 1000Ω/□, and probe "Super High" should be selected for the measurement of a surface resistance value of 1000Ω/□ or more and 3000Ω/□ or less. Additionally, in the EC-80P, probes for the measurement ranges from 10 to 1000Ω/□ and from 0.5 to 10Ω/□ should be used. The evaluation criteria were as described below. The increase rate of surface resistance value was calculated based on the following formula, where A represents the increase rate of surface resistance value, B represents the surface resistance value of the electroconductive part before the shelf test, and C represents the surface resistance value of the electroconductive part after the shelf test. Additionally, the surface resistance value B before the shelf test and the surface resistance value C after the shelf test were each measured at three locations in the central part of the electroconductive part in the cut pieces of the electroconductive film, and each of the surface resistance values was determined as the arithmetic mean of the surface resistance values determined at those three locations. The arithmetic mean of the surface resistance values measured at randomly selected 10 locations on the surface of the electroconductive part before the shelf test was used as the surface resistance value B before the shelf test, while the arithmetic mean of the surface resistance values measured at randomly selected 10 locations on the surface of the electroconductive part after the shelf test was used as the surface resistance value C after the shelf test.

$$A=(C-B)/B \times 100$$

o: the increase rate of the surface resistance value after the shelf test to the surface resistance value before the shelf test in the electroconductive part was 10% or less;
Δ: the increase rate of the surface resistance value after the shelf test to the surface resistance value before the shelf test in the electroconductive part was more than 10% and 50% or less;
x: the increase rate of the surface resistance value after the shelf test to the surface resistance value before the shelf test in the electroconductive part was more than 50%.

<Measurement of Martens hardness>

For the electroconductive films according to the above-described Examples A1 to A7 and Comparative Examples A1 to A7, the Martens hardness of each electroconductive part was measured individually at indentation amounts of 10 nm and 100 nm from the surface of the electroconductive part. Specifically, first of all, a cut piece of each electroconductive film having a size of 20 mm×20 mm was fixed with an adhesive resin (product name "Aron Alpha® General type"; manufactured by Toagosei Co., Ltd.) on a commercially available slide glass with the electroconductive part facing upward. Specifically, a drop of the above-described adhesive resin was placed at the center of a slide glass 1 (product name "Slide glass (Strainer), 1-9645-11"; manufactured by AS One Corporation). In this step, the adhesive resin was not spread over the slide glass, and a drop of the adhesive resin was applied so that the adhesive resin did not extend beyond the electroconductive film when pressed as described below. Subsequently, the slide glass was contacted with the cut piece of the electroconductive film having the above-described size with the electroconductive part facing upward and with the center of the electroconductive film located on the adhesive resin, and the adhesive resin was spread between the slide glass 1 and the electroconductive film for temporary adhesion. Then, another new slide glass 2 was placed on the electroconductive film to obtain a laminate composed of the slide glass 1, the adhesive resin, the electroconductive film, and the slide glass 2. Subsequently, a weight of 30 to 50 g was left to stand on the slide glass 2 for 12 hours at room temperature. Then, the weight and the slide glass 2 were removed from the laminate to prepare a measurement sample. The measurement sample was fixed on the measurement stage of a microhardness tester (product name "PICODENTOR HM500", manufactured by Fischer Instruments K.K.; following ISO14577-1 and ASTM E2546) placed horizontally on an vibration isolation table. The slide glass 1 was fixed by putting tape (product name "Cello Tape®"; manufactured by Nichiban Co., Ltd.) on the four edges. After the measurement sample was fixed on the measurement stage of the microhardness tester, the Martens hardness was measured under the following measurement conditions at indentation amounts of 10 nm and 100 nm on the surface of the electroconductive part. The Martens hardness was measured at five arbitrary locations near the center on the surface of the electroconductive part in the measurement sample to determine the arithmetic mean of the obtained five hardness values as the Martens hardness. However, the measured five arbitrary locations were selected on the area having a surface as flat as possible in the electroconductive part by observing the electroconductive part at a magnification of 50 to 500 times using a microscope accessory to the PICODENTOR HM500, avoiding areas with extreme projections due to overlapped electroconductive fibers and, on the contrary, areas with extreme depressions. Additionally, when the Martens hardness was calculated, Martens hardness "HM" was selected as a type of hardness to be measured on the PICODENTOR HM500.

(Measurement Conditions)
   Type of an indenter: Vickers (quadrangular pyramid diamond indenter, having an apex part with an angle of 136 degrees between opposite faces);
   Load control mode: up to 40 mN;
   Loading time: 20 seconds;
   Creep time: 5 seconds;
   Unloading time: 20 seconds;
   Indentation: 10 nm (for measuring the Martens hardness at an indentation amount of 10 nm) and 100 nm (for measuring the Martens hardness at an indentation amount of 100 nm);
   Measurement temperature: 25° C.;
   Measurement humidity: 50%.

In the measurement profile, the applied load increased from 0 mN to 40 mN over 20 seconds, kept at 40 mN for 5 seconds, and then decreased from 40 mN to 0 mN over 20 seconds.

<Determination of Electrical Resistance value Ratio>

An arbitrary direction was determined in the surface of each of the electroconductive films according to Examples A1 to A10, and rectangular samples having a size of 110 mm length×5 mm width and extending in six different directions including the arbitrary direction, which were each an angle of 30 degrees to the arbitrary direction, were cut from the electroconductive film. After the samples were cut from the electroconductive film, a silver paste (product name "DW-520H-14"; manufactured by Toyobo Co., Ltd.) was applied on the surfaces of both longitudinal ends of each sample, having a size of 5 mm length×5 mm width, in a manner that enabled a post-curing film thickness of 5 μm or more and 10 μm or less, and heated at 130° C. for 30 minutes to obtain the sample retaining the cured silver pastes on both the terminal regions. The distance between points for measuring the electrical resistance was constantly kept at 100 mm in each sample retaining the cured silver pastes on both the terminal regions. Then, the electrical resistance value of each sample retaining the cured silver pastes on both the terminal regions was measured using a tester (product name "Digital MΩ Hitester 3454-11"; manufactured by Hioki E.E. Corporation). Specifically, because the Digital MΩ Hitester 3454-11 comprised two probe terminals (a red probe terminal and a black probe terminal; both are pin-type terminals), the red probe terminal and the black probe terminal were respectively contacted with the cured silver paste provided on one terminal region and that provided on the other terminal region to measure the electrical resistance value. Then, a sample showing the lowest electrical resistance value was identified among the samples cut in the six directions. The direction of excising the sample from the electroconductive film was designated as a first direction, and a sample excised in a second direction perpendicular to the first direction was identified, and the ratio of the electrical resistance of the sample in the second direction to that of the sample in the first direction was obtained. The measurement of electrical resistance was performed in an environment at a temperature of 23° C. and a relative humidity of 55%. The arithmetic mean of three measurements was determined as the electrical resistance value ratio.

The results are shown in Tables 1 and 2 below.

Additionally, a large increase rate of the surface resistance value after the shelf test to the surface resistance value before the shelf test was observed. This is considered to be due to a thin film thickness of each light-transmitting resin and the resulting reduction in electrical conductivity resulting from the reaction of the silver nanowires with sulfur, oxygen, and/or halogens in the air.

In the electroconductive film according to Comparative Example A3, the silver nanowires were unevenly distributed on the polyethylene terephthalate film side than the position located at half the film thickness of the electroconductive

TABLE 1

| | Silver nanowire | | | | Surface resistance value ($\Omega/\square$) | | | Martens hardness (N/nm$^2$) | |
|---|---|---|---|---|---|---|---|---|---|
| | Existence ratio on the PET side (%) | Uneven distribution on the PET side | Total light transmittance (%) | Haze value (%) | Contact-type | Non-destructive type | Shelf test | Indentation of 10 nm | Indentation of 100 nm |
| Example A1 | 82 | ○ | 91.0 | 1.0 | 50 | 49 | ○ | 1018 | 180 |
| Example A2 | 82 | ○ | 91.0 | 1.0 | 50 | 49 | ○ | 1018 | 180 |
| Example A3 | 78 | ○ | 91.0 | 1.0 | 60 | 61 | ○ | 1018 | 180 |
| Example A4 | 92 | ○ | 90.5 | 1.8 | 30 | 32 | ○ | 1018 | 180 |
| Example A5 | 85 | ○ | 90.5 | 1.8 | 36 | 37 | ○ | 1018 | 180 |
| Example A6 | 79 | ○ | 90.5 | 1.0 | 51 | 50 | ○ | 1018 | 190 |
| Example A7 | 75 | ○ | 90.5 | 1.0 | 59 | 58 | ○ | 1018 | 190 |
| Example A8 | 90 | ○ | 90.0 | 1.8 | 29 | 30 | ○ | 1018 | 190 |
| Example A9 | 88 | ○ | 90.0 | 1.8 | 32 | 32 | ○ | 1018 | 190 |
| Example A10 | 78 | ○ | 91.0 | 1.1 | 38 | 39 | ○ | 1018 | 190 |
| Comparative Example A1 | 32 | x | 91.0 | 1.0 | 132 | 138 | Δ | 1018 | 180 |
| Comparative Example A2 | 48 | x | 90.5 | 1.8 | 72 | 75 | Δ | 1018 | 180 |
| Comparative Example A3 | 78 | ○ | 84.8 | 5.2 | 15 | 14 | Δ | 1018 | 180 |
| Comparative Example A4 | 42 | x | 91.0 | 1.0 | 142 | 140 | Δ | 1018 | 190 |
| Comparative Example A5 | — | — | 90.5 | 1.3 | 55 | 54 | x | 968 | 123 |
| Comparative Example A6 | 53 | x | 90.5 | 1.2 | 53 | 51 | Δ | 988 | 150 |
| Comparative Example A7 | 95 | ○ | 90.5 | 1.0 | 10$^6$ or more | 50 | ○ | 2000 | 260 |

TABLE 2

| | Electrical resistance value ($\Omega$) | | Electrical resistance value ratio |
|---|---|---|---|
| | First direction | Second direction | |
| Example A1 | 98 | 135 | 1.38 |
| Example A2 | 99 | 137 | 1.38 |
| Example A3 | 119 | 156 | 1.31 |
| Example A4 | 59 | 75 | 1.27 |
| Example A5 | 72 | 92 | 1.28 |
| Example A6 | 97 | 134 | 1.38 |
| Example A7 | 115 | 156 | 1.36 |
| Example A8 | 58 | 73 | 1.26 |
| Example A9 | 57 | 71 | 1.24 |
| Example A10 | 40 | 147 | 3.68 |

In each of the electroconductive films according to Comparative Examples A1, A2, and A4, the silver nanowires were not unevenly distributed on the polyethylene terephthalate film side than the position located at half the film thickness of the electroconductive part, and a lower haze value and a higher surface resistance value were consequently achieved. This is considered to be due to a high content of a resin material in each electroconductive fiber-containing composition and the resulting insertion of the resin material into the space between silver nanowires.

part and a low surface resistance value was consequently achieved because the content of a resin material was high but the content of silver nanowires was increased in the electroconductive fiber-containing composition. However, the content of silver nanowires was high, and a high haze value was consequently achieved. Additionally, a large increase rate of the surface resistance value after the shelf test to the surface resistance value before the shelf test was observed.

In each of the electroconductive films according to Comparative Examples A5 and A6, the silver nanowires were not unevenly distributed on the the polyethylene terephthalate film side than the position located at half the film thickness of the electroconductive part and a quite large increase rate of the surface resistance value after the shelf test to the surface resistance value before the shelf test was consequently observed because no light-transmitting resin was formed or the film thickness of the light-transmitting resin was small.

In the electroconductive film according to Comparative Example 7, the silver nanowires were unevenly distributed on the polyethylene terephthalate film side than the position located at half the film thickness of the electroconductive part, but the film thickness of the light-transmitting resin was large and the surface of the electroconductive part consequently failed to ensure electrical conduction from the surface. Thus, a low haze value and a very high surface resistance value were achieved.

In each of the electroconductive films according to Examples A1 to A10, on the other hand, the silver nanowires were unevenly distributed on the polyethylene terephthalate film side than the position located at half the film thickness of the electroconductive part and the electroconductive part successfully ensured electrical conductivity from the surface, and a low haze value and a low surface resistance value were consequently achieved. Additionally, in each of the electroconductive films according to Example A1 to A8, the reaction of the metallic nanowires with, for example, sulfur, oxygen, and/or halogens in the air and the reduction in electrical conductivity in the electroconductive part were successfully controlled because the increase rate of the surface resistance value after the shelf test to the surface resistance value before the shelf test was small.

For the electroconductive films according to Example A1 and A2, a humidity/heat resistance test was performed by leaving each electroconductive film in an environment at a temperature of 85° C. and a relative humidity of 85% for 240 hours, wherein a light-transmitting adhesive sheet (product name "OCA8146-2"; manufactured by 3M Japan Ltd.) was attached to the surface of the electroconductive part. The increase rate of the surface resistance value after the humidity/heat resistance test to the surface resistance value before the humidity/heat resistance test in the electroconductive part was 10% in the electroconductive film according to Example A1, while the increase rate of the surface resistance value after the humidity/heat resistance test to the surface resistance value before the humidity/heat resistance test in the electroconductive part was 5% in the electroconductive films according to Example A2. The surface resistance value and the increase rate of the surface resistance value were determined by the same methods as for the surface resistance value and the increase rate of the surface resistance determined in the above-described shelf test.

When 5.5-inch rectangular samples (length:width=16:9) were prepared from each of the patterned electroconductive parts of the electroconductive films according to Examples A1 to A10 and the surface resistance value was measured on the bezel by the procedure described in the above embodiment, the surface resistance value ranged from 40Ω/□ to 60Ω/□. Additionally, when the line resistance was measured at six locations on the electroconductive part by the procedure described in the above embodiment, the electrical resistance value ratio ranged from 1.21 to 1.35.

Examples B and Comparative Examples B

Example B1

First, a polyethylene terephthalate film (product name "Cosmoshine A4100"; manufactured by Toyobo Co., Ltd.) having a thickness of 50 µm and having an underlayer on one surface was prepared as a light-transmitting base material, and the hard coat layer composition 1 was applied on the underlayer of the polyethylene terephthalate film to form a coating film. Subsequently, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to cure the coating film, whereby a hard coat layer having a film thickness of 2 µm was formed as a light-transmitting functional layer.

After the hard coat layer was formed, the silver nanowire-containing composition 9 was applied at an application dose of 10 mg/m$^2$ on an untreated surface of the polyethylene terephthalate film opposite to the surface facing the formed hard coat layer. Then, the dispersion medium in the silver nanowire-containing composition 9 was evaporated by dry air blowing at 50° C. at a flow rate of 0.5 m/s for 15 seconds and subsequent dry air blowing at 70° C. at a flow rate of 10 m/s for 30 seconds over the applied silver nanowire-containing composition 9 to place silver nanowires on the surface of the hard coat layer.

Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to form a light-transmitting resin having a film thickness of 100 nm by curing the coating film, whereby an electroconductive film that comprised an electroconductive part having a film thickness of 100 nm and comprising the light-transmitting resin and the silver nanowires incorporated in the light-transmitting resin was obtained. The electroconductive part according to Example B1 was a plain film with no pattern.

Example B2

In Example B2, an electroconductive film was obtained in the same manner as in Example B1, except that the light-transmitting resin composition 2 was used instead of the light-transmitting resin composition 1.

Example B3

In Example B3, an electroconductive film was obtained in the same manner as in Example B1, except that the silver nanowire-containing composition 10 was used instead of the silver nanowire-containing composition 9.

Example B4

In Example B4, an electroconductive film was obtained in the same manner as in Example B1, except that the silver nanowire-containing composition 11 was used instead of the silver nanowire-containing composition 9.

Example B5

In Example B5, an electroconductive film was obtained in the same manner as in Example B1, except that the silver nanowire-containing composition 12 was used instead of the silver nanowire-containing composition 9.

Example B6

In Example B6, an electroconductive film was obtained in the same manner as in Example B1, except that both the temperatures for drying the applied silver nanowire-containing composition 9 were 40° C.

Example B7

In Example B7, an electroconductive film was obtained in the same manner as in Example B1, except that the silver nanowire-containing composition 13 was used instead of the silver nanowire-containing composition 9.

Example B8

In Example 8, an electroconductive film was obtained in the same manner as in Example B1, except that the silver nanowire-containing composition 14 was used instead of the silver nanowire-containing composition 9.

Comparative Example B1

In Comparative Example B1, an electroconductive film was obtained in the same manner as in Example B1, except that the silver nanowire-containing composition 15 was used instead of the silver nanowire-containing composition 9.

Comparative Example B2

In Comparative Example B2, an electroconductive film was obtained in the same manner as in Example B1, except that the silver nanowire-containing composition 16 was used instead of the silver nanowire-containing composition 9.

Comparative Example B3

In Comparative Example B3, an electroconductive film was obtained in the same manner as in Example B1, except that the silver nanowire-containing composition 17 was used instead of the silver nanowire-containing composition 9 and the application dose of the silver nanowire-containing composition 17 was changed to 5 mg/m².

Comparative Example B4

In Comparative Example B4, an electroconductive film was obtained in the same manner as in Example B1, except that the silver nanowire-containing composition 18 was used instead of the silver nanowire-containing composition 9.

Comparative Example B5

In Comparative Example B5, an electroconductive film was obtained in the same manner as in Example B1, except that both the temperatures for drying the applied silver nanowire-containing composition 9 were 100° C.

<Determination of Electrical Resistance Value Ratio>

In the surface of each of the electroconductive films according to Examples B1 to B8 and Comparative Examples B1 to B5, the electrical resistance value ratio was measured under the same measurement conditions as those in Example A to determine the ratio of the electrical resistance value of a sample cut in the second direction to that of a sample cut in the first direction.

<Evaluation of Uneven Silver Nanowire Distribution>

For the electroconductive films according to Examples B1 to B8 and Comparative Examples B1 to B5, it was examined, under the same conditions as those in Example A, whether or not the silver nanowires as a whole in each electroconductive part were unevenly distributed on the polyethylene terephthalate film side than the position located at half the film thickness of the electroconductive part.

<Measurement of Total Light Transmittance>

For the electroconductive films according to the above-described Examples B1 to B8 and Comparative Examples B1 to B5, the total light transmittance was measured under the same measurement conditions as those in Example A.

<Measurement of Haze Value>

For the electroconductive films according to the above-described Examples B1 to B8 and Comparative Examples B1 to B5, the haze value (total haze value) of each electroconductive film was measured under the same measurement conditions as those in Example A.

<Measurement of Surface Resistance Value>

In each of the electroconductive films according to the above-described Examples B1 to B8 and Comparative Examples B1 to B5, the resistance on the surface of the electroconductive part was measured under the same measurement conditions as those in Example A.

<Shelf Test>

For the electroconductive films according to the above-described Examples B1 to B8 and Comparative Examples B1 to B5, the shelf test was performed under the same conditions as those in Example A to evaluate the increase rate of the surface resistance value after the shelf test to the surface resistance value before the shelf test in the same manner as in Example A1. The evaluation criteria were as described below.

○: the increase rate of the surface resistance value after the shelf test to the surface resistance value before the shelf test in the electroconductive part was 10% or less;

Δ: the increase rate of the surface resistance value after the shelf test to the surface resistance value before the shelf test in the electroconductive part was more than 10% and 50% or less;

x: the increase rate of the surface resistance value after the shelf test to the surface resistance value before the shelf test in the electroconductive part was more than 50%.

<Measurement of Martens Hardness>

For the electroconductive films according to the above-described Examples B1 to B8 and Comparative Examples B1 to B5, the Martens hardness of each electroconductive part was measured individually at indentation amounts of 10 nm and 100 nm from the surface of the electroconductive part under the same conditions as those in Example A.

The results are shown in Tables 3 and 4 below.

TABLE 3

| | Electrical resistance value (Ω) | | Electrical resistance value ratio | Silver nanowire | | Total light transmittance (%) | Haze value (%) |
|---|---|---|---|---|---|---|---|
| | First direction | Second direction | | Existence ratio on the PET side (%) | Uneven distribution on the PET side | | |
| Example B1 | 98 | 135 | 1.38 | 82 | ○ | 91.1 | 1.0 |
| Example B2 | 99 | 136 | 1.37 | 83 | ○ | 91.1 | 1.0 |
| Example B3 | 85 | 135 | 1.59 | 80 | ○ | 91.1 | 1.1 |
| Example B4 | 113 | 126 | 1.12 | 79 | ○ | 91.0 | 0.9 |

TABLE 3-continued

|  | Electrical resistance value (Ω) | | Electrical resistance value ratio | Silver nanowire | | Total light transmittance (%) | Haze value (%) |
| --- | --- | --- | --- | --- | --- | --- | --- |
|  | First direction | Second direction |  | Existence ratio on the PET side (%) | Uneven distribution on the PET side |  |  |
| Example B5 | 88 | 107 | 1.22 | 75 | ◯ | 91.1 | 1.0 |
| Example B6 | 101 | 123 | 1.22 | 82 | ◯ | 90.9 | 1.0 |
| Example B7 | 110 | 126 | 1.15 | 81 | ◯ | 90.9 | 1.1 |
| Example B8 | 2650 | 2782 | 1.05 | 80 | ◯ | 90.8 | 0.9 |
| Comparative Example B1 | 40 | 147 | 3.68 | 78 | ◯ | 91.0 | 1.1 |
| Comparative Example B2 | 75 | 169 | 2.25 | 77 | ◯ | 91.0 | 1.1 |
| Comparative Example B3 | 70 | 141 | 2.01 | 80 | ◯ | 91.2 | 1.1 |
| Comparative Example B4 | 68 | 145 | 2.13 | 83 | ◯ | 91.1 | 1.1 |
| Comparative Example B5 | 72 | 161 | 2.24 | 82 | ◯ | 91.0 | 1.1 |

TABLE 4

|  | Surface resistance value (Ω/□) | | Shelf test | Martens hardness (N/nm$^2$) | |
| --- | --- | --- | --- | --- | --- |
|  | Contact-type | Non-destructive type |  | Indentation of 10 nm | Indentation of 100 nm |
| Example B1 | 50 | 52 | ◯ | 1080 | 180 |
| Example B2 | 50 | 52 | ◯ | 1080 | 180 |
| Example B3 | 43 | 41 | ◯ | 1080 | 180 |
| Example B4 | 58 | 57 | ◯ | 1080 | 180 |
| Example B5 | 45 | 45 | ◯ | 1080 | 180 |
| Example B6 | 51 | 50 | ◯ | 1080 | 180 |
| Example B7 | 56 | 55 | ◯ | 1080 | 180 |
| Example B8 | 1352 | 1395 | ◯ | 1080 | 180 |
| Comparative Example B1 | 38 | 39 | ◯ | 1080 | 180 |
| Comparative Example B2 | 68 | 65 | ◯ | 1080 | 180 |
| Comparative Example B3 | 51 | 50 | ◯ | 1080 | 180 |
| Comparative Example B4 | 53 | 51 | ◯ | 1080 | 180 |
| Comparative Example B5 | 51 | 52 | ◯ | 1080 | 180 |

As shown in Table 3, the electroconductive film according to Comparative Example B1 had an electrical resistance value ratio of 2 or more, and the difference in electrical resistance depending on the in-plain direction of the electroconductive part was consequently not reduced. This is considered to be due to the tendency of the silver nanowires to align in a particular direction immediately after the application of the silver nanowire-containing composition, the very long fiber length of the silver nanowires, and the resulting failure to eliminate the alignment of the silver nanowires during drying though the alignment is usually relaxed during drying.

The electroconductive film according to Comparative Example B2 had an electrical resistance value ratio of 2 or more, and the difference in electrical resistance depending on the in-plain direction of the electroconductive part was consequently not reduced. This is considered to be due to an increased viscosity in early drying stage resulting from an excessively high content of polyvinylpyrrolidone and the resulting failure to eliminate the alignment of the silver nanowires during drying.

The electroconductive film according to Comparative Example B3 had an electrical resistance value ratio of 2 or more, and the difference in electrical resistance depending on the in-plain direction of the electroconductive part was consequently not reduced. This is considered to be due to a high concentration of silver nanowires in the silver nanowire-containing composition and a quick drying of the silver nanowire-containing composition resulting from a small application dose, and the resulting failure to eliminate the alignment of the silver nanowires during drying.

The electroconductive film according to Comparative Example B4 had an electrical resistance value ratio of 2 or more, and the difference in electrical resistance depending on the in-plain direction of the electroconductive part was consequently not reduced. This is considered to be due to a quick drying of ethanol as compared to isopropyl alcohol and the resulting failure to eliminate the alignment of the silver nanowires during drying.

The electroconductive film according to Comparative Example B5 had an electrical resistance value ratio of 2 or more, and the difference in electrical resistance depending on the in-plain direction of the electroconductive part was consequently not reduced. This is considered to be due to a quick drying of the silver nanowire-containing composition for high drying temperature and the resulting failure to eliminate the alignment of the silver nanowires during drying.

On the other hand, as shown in Table 3, each of the electroconductive films according to Examples B1 to B8 had an electrical resistance value ratio of 1 or more and less than 2, and the difference in electrical resistance depending on the in-plain direction of the electroconductive part was consequently reduced and a low surface resistance value was consequently achieved. The high surface resistance value observed in the electroconductive film according to Example B8 is considered to be due to the very short fiber length of the silver nanowires.

For the electroconductive films according to Example B1 and B2, a humidity/heat resistance test was performed by leaving each electroconductive film in an environment at a temperature of 85° C. and a relative humidity of 85% for 240 hours, wherein a light-transmitting adhesive sheet (product name "OCA8146-2"; manufactured by 3M Japan Ltd.) was attached to the surface of the electroconductive part. The increase rate of the surface resistance value after the humidity/heat resistance test to the surface resistance value before the humidity/heat resistance test in the electroconductive part was 10% in the electroconductive films according to Example B1, while the increase rate of the surface resistance value after the humidity/heat resistance test to the surface resistance value before the humidity/heat resistance test in the electroconductive part was 5% in the electroconductive films according to Example B2. The surface resistance value and the increase rate of the surface resistance value were determined by the same methods as for the surface resistance value and the increase rate of the surface resistance determined in the above-described shelf test.

When 5.5-inch rectangular samples (length:width=16:9) were prepared from each of the patterned electroconductive parts of the electroconductive films according to Examples B1 to B8 and the surface resistance was measured on the bezel by the procedure described in the above embodiment, the surface resistance ranged from 40Ω/□ to 60Ω/□. Additionally, when the line resistance was measured at six locations on the electroconductive part by the procedure described in the above embodiment, the electrical resistance value ratio ranged from 1.21 to 1.35.

Examples C and Comparative Examples C

Example C1

First, a polyethylene terephthalate film (product name "Cosmoshine A4100"; manufactured by Toyobo Co., Ltd.) having a thickness of 50 µm and having an underlayer on one surface was prepared as a light-transmitting resin base material, and the silver nanowire-containing composition 19 was applied at an application dose of 10 mg/m² directly on the surface having no underlayer of the polyethylene terephthalate film. Subsequently, the dispersion medium in the silver nanowire-containing composition 19 was evaporated by dry air blowing at 50° C. at a flow rate of 0.5 m/s for 15 seconds and subsequent dry air blowing at 70° C. at a flow rate of 10 m/s for 30 seconds over the applied silver nanowire-containing composition 1 to place silver nanowires directly on the surface having no underlayer of the polyethylene terephthalate film.

Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm² to prepare a light-transmitting resin having a film thickness of 100 nm by curing the coating film, whereby an electroconductive film that comprised an electroconductive part having a film thickness of 100 nm and comprising the light-transmitting resin and the silver nanowires incorporated in the light-transmitting resin and provided directly on the surface having no underlayer of the polyethylene terephthalate film was obtained. The electroconductive part according to Example 1 was a plain film with no pattern.

Example C2

In Example C2, an electroconductive film was obtained in the same manner as in Example C1, except that the light-transmitting resin composition 2 was used instead of the light-transmitting resin composition 1.

Example C3

In Example C3, an electroconductive film was obtained in the same manner as in Example 1, except that the silver nanowire-containing composition 20 was used instead of the silver nanowire-containing composition 19 and the application dose of the light-transmitting resin composition 1 was modified to achieve a thickness of 100 nm across the whole electroconductive part. During the production process, the silver nanowire-containing composition 20 was applied and dried to form a coating film containing silver nanowires and a resin material.

Example C4

In Example C4, an electroconductive film was obtained in the same manner as in Example C1, except that the silver nanowire-containing composition 21 was used instead of the silver nanowire-containing composition 19.

Example C5

In Example C5, an electroconductive film was obtained in the same manner as in Example C1, except that the silver nanowire-containing composition 22 was used instead of the silver nanowire-containing composition 19 and the application dose of the light-transmitting resin composition was modified to achieve a film thickness of 100 nm across the whole electroconductive part. During the production process, the silver nanowire-containing composition 22 was applied and dried to form a coating film containing silver nanowires and a resin material.

Example C6

In Example C6, an electroconductive film was obtained in the same manner as in Example C1, except that the silver nanowire-containing composition 23 was used instead of the silver nanowire-containing composition 19.

Example C7

In Example C7, an electroconductive film was obtained in the same manner as in Example C1, except that a cycloolefin polymer base material (product name "ZF-16"; manufactured by Zeon Corporation) having a thickness of 47 µm and having no underlayers on both surfaces was used instead of the polyethylene terephthalate film.

Example C8

In Example C8, an electroconductive film was obtained in the same manner as in Example C1, except that a polycarbonate base material (product name "C110-100"; manufactured by Teijin Ltd.) having a thickness of 100 µm and having no underlayers on both surfaces was used instead of the polyethylene terephthalate film.

Comparative Example C1

In Comparative Example C1, an electroconductive film was obtained in the same manner as in Example C1, except that a polyethylene terephthalate film (product name "Cosmoshine A4300"; manufactured by Toyobo Co., Ltd.) having a thickness of 50 µm and having underlayers on both surfaces as a light-transmitting resin base material was used instead of the polyethylene terephthalate film (product name "Cosmoshine A4100"; manufactured by Toyobo Co., Ltd.) having a thickness of 50 µm and having an underlayer on one surface and the silver nanowire-containing composition 19 was applied on the surface of one of the underlayers of the polyethylene terephthalate film.

Comparative Example C2

In Comparative Example C2, an electroconductive film was obtained in the same manner as in Comparative Example C1, except that the silver nanowire-containing composition 20 was used instead of the silver nanowire-containing composition 19.

Comparative Example C3

In Comparative Example C3, an electroconductive film was obtained in the same manner as in Comparative Example 1, except that the silver nanowire-containing composition 21 was used instead of the silver nanowire-containing composition 19.

Comparative Example C4

In Comparative Example C4, an electroconductive film was obtained in the same manner as in Comparative Example 1, except that the silver nanowire-containing composition 22 was used instead of the silver nanowire-containing composition 19.

Comparative Example C5

In Comparative Example C5, an electroconductive film was obtained in the same manner as Comparative Example C1, except that no light-transmitting resin was formed.

Comparative Example C6

In Comparative Example C6, an electroconductive film was obtained in the same manner as in Comparative Example C1, except that the film thickness of the light-transmitting resin was changed from 100 nm to 400 nm.

Comparative Example C7

First, a polyethylene terephthalate film (product name "Cosmoshine A4300"; manufactured by Toyobo Co., Ltd.) having a thickness of 50 µm and having underlayers on both surfaces was prepared as a light-transmitting resin base material, and the hard coat layer composition 1 was applied on the surface of one of the underlayers of the polyethylene terephthalate film to form a coating film. Subsequently, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm² to cure the coating film, whereby a hard coat layer having a film thickness of 2 µm was formed.

After the hard coat layer was formed, the silver nanowire-containing composition 19 was applied at an application dose of 10 mg/m² directly on the surface of the hard coat layer. Then, the dispersion medium in the silver nanowire-containing composition 1 was evaporated by dry air blowing at 50° C. at a flow rate of 0.5 m/s for 15 seconds and subsequent dry air blowing at 70° C. at a flow rate of 10 m/s for 30 seconds over the applied silver nanowire-containing composition 19 to place silver nanowires on the surface of the hard coat layer.

Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm² to form a light-transmitting resin having a film thickness of 100 nm by curing the coating film, whereby an electroconductive film that comprised an electroconductive part having a film thickness of 100 nm and comprising the light-transmitting resin and the silver nanowires incorporated in the light-transmitting resin and provided on the hard coat layer was obtained. The electroconductive part according to Comparative Example C7 was a plain film with no pattern.

<Measurement of Surface Resistance Value>

In each of the electroconductive films according to the above-described Examples C1 to C8 and Comparative Examples C1 to C7, the resistance on the surface of the electroconductive part was measured under the same measurement conditions as those in Example A.

<Measurement of Total Light Transmittance>

For the electroconductive films according to the above-described Examples C1 to C8 and Comparative Examples C1 to C7, the total light transmittance was measured under the same measurement conditions as those in Example A.

<Measurement of Haze Value>

For the electroconductive films according to the above-described Examples C1 to C8 and Comparative Examples C1 to C7, the haze value (total haze value) of each electroconductive film was measured under the same measurement conditions as those in Example A.

<Evaluation of Uneven Silver Nanowire Distribution>

For the electroconductive films according to Examples C1 to C8 and Comparative Examples C1 to C4, and C6 and C7, it was examined, under the same conditions as those in Example A, whether or not the silver nanowires as a whole in each electroconductive part were unevenly distributed on the base material such as polyethylene terephthalate film side than the position located at half the film thickness of the electroconductive part. The electroconductive film according to Comparative Example C5 comprised no light-transmitting resin and was thus not subjected to the evaluation.

<Evaluation of Flexibility>

For the electroconductive films according to Examples C1 to C8 and Comparative Examples C1 to C7, a foldability test was performed to evaluate the flexibility. Specifically, first of all, an arbitrary direction was determined in the surface of the electroconductive part in each electroconductive film, and six rectangular samples having a size of 125 mm length×50 mm width and extending in six different directions including the arbitrary direction, which were each an angle of 30 degrees to the arbitrary direction, were cut from the electroconductive film. After the samples were cut from the electroconductive film, a silver paste (product name "DW-520H-14"; manufactured by Toyobo Co., Ltd.) was applied on the surfaces of both longitudinal ends of each sample, having a size of 10 mm length×50 mm width, and heated at 130° C. for 30 minutes to obtain the sample retaining the cured silver pastes on both the terminal regions. The distance between points for measuring the electrical resistance was constantly kept at 105 mm in each sample retaining the cured silver pastes on both the terminal regions. Then, the electrical resistance of each sample retaining the cured silver pastes on both the terminal regions was measured using a tester (product name "Digital MΩ Hitester 3454-11"; manufactured by Hioki E.E. Corporation). Specifically, because the Digital MΩ Hitester 3454-11 comprised two probe terminals (a red probe terminal and a black probe terminal; both are pin-type terminals), the red probe terminal was contacted with the cured silver paste provided on one terminal region and the black probe terminal was contacted with the cured silver paste provided on the other terminal region to measure the electrical resistance. Then, a sample showing the lowest electrical resistance value was selected among the samples cut in the six directions. Subsequently, the selected sample having the short edges (50 mm) fixed with fixing members was mounted to an endurance testing machine (product name "DLDMLH-FS"; manufactured by Yuasa System Co., Ltd.) in such a manner that the minimum distance between the two opposing edges was 3 mm (the outer width of the bent part: 3.0 mm), as shown in FIG. 5(C), and the sample with the electroconductive part facing inward was folded at 180 degrees and then unfolded (a foldability test performed on the sample with the electroconductive part facing inward and the base material facing outward), and the process was repeated one hundred thousand times. After the foldability test was performed, the sample after the foldability test was measured for electrical resistance on the surface of the electroconductive part, similarly to the sample before the foldability test. Then, the electrical resistance value ratio, namely the ratio of the electrical resistance value measured after the foldability test on the selected sample to that measured before the foldability test on the same sample (the electrical resistance of the selected sample before the foldability test/the electrical resistance of the same sample after the foldability test), was calculated. Additionally, a sample cut from each of the electroconductive films according to Examples and Comparative Examples and selected based on the measured electrical resistance value in the same manner as described above was mounted to the above-described endurance testing machine in the same manner as described above, and the sample with the base material facing inward was folded at 180 degrees and then unfolded (a foldability test performed on the sample with the electroconductive part facing outward and the base material facing inward), and the process was repeated one hundred thousand times, and the sample after the foldability test was similarly measured for electrical resistance on the surface of the electroconductive part to calculate the electrical resistance value ratio. Then, the results of the foldability tests were evaluated as the flexibility based on the following evaluation criteria. The arithmetic mean of three measurements was determined as the electrical resistance value ratio.

⊙: the electrical resistance value ratio was 1.5 or less in both of the foldability tests;

○: the electrical resistance value ratio was more than 1.5 and 3 or less in both of the foldability tests;

Δ: the electrical resistance value ratio was more than 3 in either of the foldability tests.

<Determination of Electrical Resistance Value Ratio>

In the surface of each of the electroconductive films according to the Examples, the electrical resistance value ratio was measured under the same measurement conditions as those in Example A to determine the ratio of the electrical resistance of a sample cut in the first direction to that of a sample cut in the second direction.

<Shelf Test>

For the electroconductive films according to the above-described Examples C1 to C8 and Comparative Examples C1 to C7, the shelf test was performed under the same conditions as those in Example A to evaluate the increase rate of the surface resistance value after the shelf test to the surface resistance value before the shelf test in the same manner as in Example A. The evaluation criteria were as described below.

○: the increase rate of the surface resistance value after the shelf test to the surface resistance value before the shelf test in the electroconductive part was less than 10% or less;

Δ: the increase rate of the surface resistance value after the shelf test to the surface resistance value before the shelf test in the electroconductive part was more than 10% and 50% or less;

x: the increase rate of the surface resistance value after the shelf test to the surface resistance value before the shelf test in the electroconductive part was more than 50%.

<Measurement of Martens Hardness>

For the electroconductive films according to the above-described Examples C1 to C8 and Comparative Examples C1 to C7, the Martens hardness of each electroconductive part was measured individually at indentation amounts of 10 nm and 100 nm from the surface of the electroconductive part under the same conditions as those in Example A.

The results are shown in Tables 5 and 6 below.

TABLE 5

| | Surface resistance value (Ω/□) | | | | Silver nanowire | | | | Martens hardness (N/nm$^2$) | |
|---|---|---|---|---|---|---|---|---|---|---|
| | Contact-type | Non-destructive type | Total light transmittance (%) | Haze value (%) | Existence ratio on the base material side (%) | Uneven distribution on the base material side | Flexibility | Shelf test | Indentation of 10 nm | Indentation of 100 nm |
| Example C1 | 51 | 50 | 90.3 | 1.2 | 83 | ○ | ⊙ | ○ | 1018 | 180 |
| Example C2 | 50 | 50 | 90.4 | 1.2 | 85 | ○ | ⊙ | ○ | 1018 | 180 |
| Example C3 | 61 | 60 | 90.3 | 1.2 | 78 | ○ | ⊙ | ○ | 1018 | 180 |
| Example C4 | 31 | 30 | 89.5 | 2.0 | 91 | ○ | ⊙ | ○ | 1018 | 180 |
| Example C5 | 37 | 38 | 89.6 | 2.0 | 85 | ○ | ⊙ | ○ | 1018 | 180 |
| Example C6 | 39 | 40 | 90.0 | 1.3 | 76 | ○ | ⊙ | ○ | 1018 | 180 |
| Example C7 | 52 | 52 | 91.0 | 1.0 | 75 | ○ | ○ | ○ | 1018 | 160 |
| Example C8 | 54 | 53 | 90.5 | 1.0 | 73 | ○ | ○ | ○ | 1018 | 150 |
| Comparative Example C1 | 143 | 162 | 89.5 | 1.2 | 79 | ○ | ⊙ | ○ | 1018 | 160 |

TABLE 5-continued

| | Surface resistance value (Ω/□) | | Total light transmittance (%) | Haze value (%) | Silver nanowire Existence ratio on the base material side (%) | Uneven distribution on the base material side | Flexibility | Shelf test | Martens hardness (N/nm²) | |
|---|---|---|---|---|---|---|---|---|---|---|
| | Contact-type | Non-destructive type | | | | | | | Indentation of 10 nm | Indentation of 100 nm |
| Comparative Example C2 | 189 | 185 | 89.5 | 1.2 | 75 | ○ | ⊙ | ○ | 1018 | 160 |
| Comparative Example C3 | 93 | 95 | 88.8 | 1.2 | 85 | ○ | ⊙ | ○ | 1018 | 160 |
| Comparative Example C4 | 112 | 110 | 88.7 | 1.9 | 83 | ○ | ⊙ | ○ | 1018 | 160 |
| Comparative Example C5 | 142 | 152 | 89.5 | 1.5 | — | — | ⊙ | x | 968 | 123 |
| Comparative Example C6 | 10⁶ or more | 163 | 89.5 | 1.2 | 95 | ○ | ⊙ | ○ | 2000 | 260 |
| Comparative Example C7 | 52 | 52 | 89.6 | 1.2 | 82 | ○ | x | ○ | 1018 | 190 |

TABLE 6

| | Electrical resistance value (Ω) | | Electrical resistance value ratio |
|---|---|---|---|
| | First direction | Second direction | |
| Example C1 | 97 | 115 | 1.19 |
| Example C2 | 95 | 115 | 1.22 |
| Example C3 | 106 | 127 | 1.20 |
| Example C4 | 58 | 65 | 1.12 |
| Example C5 | 73 | 83 | 1.14 |
| Example C6 | 42 | 127 | 3.02 |
| Example C7 | 98 | 120 | 1.22 |
| Example C8 | 100 | 121 | 1.21 |

As shown in Table 5, each of the electroconductive films according to Comparative Examples C1 to C6 had an underlayer provided between the base material, such as the polyethylene terephthalate base material, and the electroconductive part, and a high surface resistance value was consequently achieved. This is considered to be due to incorporation of silver nanowires into the underlayer.

The electroconductive film according to Comparative Example C7 had a hard coat layer provided between the base material, such as the polyethylene terephthalate base material, and the electroconductive part, and poor flexibility and a high electrical resistance value ratio between before and after the foldability test were consequently achieved. This is considered to be due to a crack or fracture formed by the foldability test in the electroconductive film and the resulting reduction in electrical conductivity.

On the other hand, as shown in Table 5, each of the electroconductive films according to Examples C1 to C8 had an electroconductive part provided directly on the surface of a base material, such as a polyethylene terephthalate base material, and a low surface resistance value was consequently achieved. Additionally, excellent flexibility was achieved in each of the electroconductive films because no hard coat layer was provided between the base material and the electroconductive part.

For the electroconductive films according to Example C1 and C2, a humidity/heat resistance test was performed by leaving each electroconductive film in an environment at a temperature of 85° C. and a relative humidity of 85% for 240 hours, wherein a light-transmitting adhesive sheet (product name "OCA8146-2"; manufactured by 3M Japan Ltd.) was attached to the surface of the electroconductive part. The increase rate of the surface resistance value after the humidity/heat resistance test to the surface resistance value before the humidity/heat resistance test in the electroconductive part was 10% in the electroconductive films according to Example C1, while the increase rate of the surface resistance value after the humidity/heat resistance test to the surface resistance value before the humidity/heat resistance test in the electroconductive part was 5% in the electroconductive films according to Example C2. The surface resistance value and the increase rate of surface resistance value were determined by the same methods as for the surface resistance value and the increase rate of surface resistance determined in the above-described shelf test.

When 5.5-inch rectangular samples (length:width=16:9) were prepared from each of the patterned electroconductive parts of the electroconductive films according to Examples C1 to C8 and the surface resistance value was measured on the bezel by the procedure described in the above embodiment, the surface resistance value ranged from 40Ω/□ to 60Ω/□. Additionally, when the line resistance was measured at six locations on the electroconductive part by the procedure described in the above embodiment, the electrical resistance value ratio ranged from 1.21 to 1.35.

Examples D and Comparative Examples D

Example D1

First, a polyethylene terephthalate film (product name "Cosmoshine A4300"; manufactured by Toyobo Co., Ltd.) having a thickness of 50 μm and having underlayers on both surfaces was prepared as a light-transmitting resin base material, and the silver nanowire-containing composition 1 was applied at an application dose of 10 mg/m² directly on the surface of one of the underlayers of the polyethylene terephthalate film. Then, the dispersion medium in the silver nanowire-containing composition 1 was evaporated by dry air blowing at 50° C. at a flow rate of 0.5 m/s for 15 seconds and subsequent dry air blowing at 70° C. at a flow rate of 10 m/s for 30 seconds over the applied silver nanowire-containing composition 1 to place silver nanowires directly on the surface of the one underlayer of the polyethylene terephthalate film.

Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to form a light-transmitting resin having a film thickness of 100 nm by curing the coating film, whereby an electroconductive film that comprised an electroconductive part having a film thickness of 100 nm and comprising the light-transmitting resin and the silver nanowires incorporated in the light-transmitting resin and provided directly on the surface of the one underlayer of the polyethylene terephthalate film was obtained. The electroconductive part according to Example D1 was a plain film with no pattern.

Example D2

In Example D2, an electroconductive film was obtained in the same manner as in Example D1, except that the light-transmitting resin composition 2 was used instead of the light-transmitting resin composition 1.

Example D3

In Example D3, an electroconductive film was obtained in the same manner as in Example D1, except that the silver nanowire-containing composition 2 was used instead of the silver nanowire-containing composition 1 and the application dose of the light-transmitting resin composition 1 was modified to achieve a thickness of 100 nm across the whole electroconductive part. During the production process, the silver nanowire-containing composition 2 was applied and dried to prepare a coating film containing silver nanowires and a resin material.

Example D4

In Example D4, an electroconductive film was obtained in the same manner as in Example D1, except that the silver nanowire-containing composition D3 was used instead of the silver nanowire-containing composition 1.

Example D5

In Example D5, an electroconductive film was obtained in the same manner as in Example D1, except that the silver nanowire-containing composition 4 was used instead of the silver nanowire-containing composition 1 and the application dose of the light-transmitting resin composition was modified to achieve a film thickness of 100 nm across the whole electroconductive part. During the production process, the silver nanowire-containing composition 4 was applied and dried to form a coating film containing silver nanowires and a resin material.

Example D6

In Example D6, an electroconductive film was obtained in the same manner as in Example D1, except that the silver nanowire-containing composition 5 was used instead of the silver nanowire-containing composition 1.

Example D7

In Example D7, an electroconductive film was obtained in the same manner as in Example D1, except that the silver nanowire-containing composition 19 was used instead of the silver nanowire-containing composition 1.

Comparative Example D1

First, a polyethylene terephthalate film (product name "Cosmoshine A4300"; manufactured by Toyobo Co., Ltd.) having a thickness of 50 μm and having underlayers on both surfaces was prepared as a light-transmitting resin base material, and the hard coat layer composition 1 was applied on the surface of one of the underlayers of the polyethylene terephthalate film to form a coating film. Subsequently, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to cure the coating film, whereby a hard coat layer having a film thickness of 2 μm was formed.

After the hard coat layer was formed, the silver nanowire-containing composition 1 was applied at an application dose of 10 mg/m$^2$ directly on the surface of the hard coat layer. Then, the dispersion medium in the silver nanowire-containing composition 1 was evaporated by dry air blowing at 50° C. at a flow rate of 0.5 m/s for 15 seconds and subsequent dry air blowing at 70° C. at a flow rate of 10 m/s for 30 seconds over the applied silver nanowire-containing composition 1 to place silver nanowires on the surface of the hard coat layer.

Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm$^2$ to form a light-transmitting resin having a film thickness of 100 nm by curing the coating film, whereby an electroconductive film that comprised an electroconductive part having a film thickness of 100 nm and comprising the light-transmitting resin and the silver nanowires incorporated in the light-transmitting resin and provided on the hard coat layer was obtained. The electroconductive part according to Comparative Example D1 was a plain film with no pattern.

Comparative Example D2

In Comparative Example D2, an electroconductive film was obtained in the same manner as in Comparative Example D1, except that the silver nanowire-containing composition 2 was used instead of the silver nanowire-containing composition 1.

Comparative Example D3

In Comparative Example D3, an electroconductive film was obtained in the same manner as in Comparative Example D1, except that the silver nanowire-containing composition 3 was used instead of the silver nanowire-containing composition 1.

Comparative Example D4

In Comparative Example D4, an electroconductive film was obtained in the same manner as in Comparative Example D1, except that the silver nanowire-containing composition 4 was used instead of the silver nanowire-containing composition 1.

Comparative Example D5

In Comparative Example D5, an electroconductive film was obtained in the same manner as Comparative Example D1, except that no light-transmitting resin was formed.

Comparative Example D6

In Comparative Example D6, an electroconductive film was obtained in the same manner as in Comparative Example D1, except that the film thickness of the light-transmitting resin was changed from 100 nm to 400 nm.

Comparative Example D7

First, a polyethylene terephthalate film (product name "Cosmoshine A4100"; manufactured by Toyobo Co., Ltd.) having a thickness of 50 µm and having a underlayer on one surface was prepared as a light-transmitting resin base material, and the silver nanowire-containing composition 1 was applied at an application dose of 10 mg/m² directly on the surface having no underlayer of the polyethylene terephthalate film. Then, the dispersion medium in the silver nanowire-containing composition 1 was evaporated by dry air blowing at 50° C. at a flow rate of 0.5 m/s for 15 seconds and subsequent dry air blowing at 70° C. at a flow rate of 10 m/s for 30 seconds over the applied silver nanowire-containing composition 1 to place silver nanowires directly on the surface having no underlayer of the polyethylene terephthalate film Subsequently, the above-described light-transmitting resin composition 1 was applied to cover the silver nanowires and to form a coating film. Then, the formed coating film was dried by dry air blowing at 50° C. at a flow rate of 0.5 m/s for 15 seconds and subsequent dry air blowing at 70° C. at a flow rate of 10 m/s for 30 seconds over the coating film to evaporate the solvent in the coating film, and then exposed to ultraviolet light to a cumulative light dose of 100 mJ/cm² to prepare a light-transmitting resin having a film thickness of 100 nm by curing the coating film, whereby an electroconductive film that comprised an electroconductive part comprising the light-transmitting resin and the silver nanowires incorporated in the light-transmitting resin and provided directly on the surface having no underlayer of the polyethylene terephthalate film was obtained. The electroconductive part according to Comparative Example D7 was a plain film with no pattern.

<Evaluation of Flexibility>

For the electroconductive films according to Examples D1 to D7 and Comparative Examples D1 to D7, the foldability test was performed to measure the electrical resistance value under the same measurement conditions as those in Example C and to evaluate the flexibility in the same manner as in Example C. The evaluation criteria were as described below.

⊙: the electrical resistance value ratio was 1.5 or less in both of the foldability tests;
○: the electrical resistance value ratio was more than 1.5 and 3 or less in both of the foldability tests;
x: the electrical resistance value ratio was more than 3 in either of the foldability tests.

<Adhesion Test>

For the electroconductive films according to Examples D1 to D7 and Comparative Examples D1 to D7, adhesion to a cured silver paste was evaluated. Specifically, first of all, three pieces of electroconductive film having a size of 150 mm×150 mm were cut from each of the electroconductive films according to Examples D1 to D7 and Comparative Examples D1 to D7, and a silver paste 1 (product name "DW-520H-14"; manufactured by Toyobo Co., Ltd.) was applied by screen printing technique on the first piece of electroconductive film, and a silver paste 2 (product name "DW-520H-19"; manufactured by Toyobo Co., Ltd.) was applied by screen printing technique on the surfaces of the electroconductive parts of the second piece of electroconductive film, and a silver paste 3 (product name "DW-520H-18"; manufactured by Toyobo Co., Ltd.) was applied by screen printing technique on the surfaces of the electroconductive parts of the third piece of electroconductive film. After each silver paste was applied on the surface of each electroconductive part, each electroconductive film retaining the applied silver paste was heated at 130° C. for 30 minutes to form a cured silver paste having a film thickness of 7 µm on the surface of the electroconductive part of the electroconductive film. Then, a cross-cut test was performed on each electroconductive film retaining the cured silver paste in an environment at a temperature of 23° C. and a relative humidity of 55% to evaluate the adhesion between the electroconductive film and the cured silver paste. Specifically, the cured silver paste formed on each electroconductive part was inscribed using a cutter knife to create a grid of 10×10, wherein the vertical and horizontal grid lines were spaced 1 mm apart and were orthogonal to each other. The incisions were deep enough to penetrate the cured silver paste and to reach the polyethylene terephthalate film. A piece of adhesive tape (model number "405"; manufactured by Nichiban Co., Ltd.; 24 mm width) was attached to the surface of the cured silver paste with the inscribed grid lines to cover the entire area of the grid, and the attached adhesive tape was quickly removed the surface of the cured silver paste by holding a part of the adhesive tape and pulling it vertically. The process of attaching and removing the adhesive tape was consecutively repeated five times and the number of square coating films left in the grid was counted after the five trials to evaluate the adhesion. The evaluation results were based on the following evaluation criteria. In cases where the number of remaining square coating films was 100, that is, no square coating film was peeled off and removed, it was expressed as 100/100; in cases where all the square coating films were removed, it was expressed as 0/100.

○: 100/100;
Δ: 80/100 to 99/100;
x: 0/100 to 79/100.

<Measurement of Surface Resistance Value>

In each of the electroconductive films according to the above-described Examples D1 to D7 and Comparative Examples D1 to D7, the resistance value on the surface of the electroconductive part was measured under the same measurement conditions as those in Example A.

<Measurement of Total Light Transmittance>

For the electroconductive films according to the above-described Examples D1 to D7 and Comparative Examples D7 to D7, the total light transmittance was measured under the same measurement conditions as those in Example A.

<Measurement of Haze Value>

For the electroconductive films according to the above-described Examples D1 to D7 and Comparative Examples D1 to D7, the haze value (total haze value) of each electroconductive film was measured under the same measurement conditions as those in Example A.

<Evaluation of Uneven Silver Nanowire Distribution>

For the electroconductive films according to Examples D1 to D7 and Comparative Examples D1 to D4, and D6 and D7, it was examined, under the same conditions as those in Example A, whether or not the silver nanowires as a whole in each electroconductive part were unevenly distributed on the base material such as the polyethylene terephthalate film side than the position located at half the film thickness of the electroconductive part. The electroconductive film according to Comparative Example D5 comprised no light-transmitting resin and was thus not subjected to the evaluation.

<Determination of Electrical Resistance Value Ratio>

In the surface of each of the electroconductive films according to Examples D1 to D7, the electrical resistance value ratio was measured under the same measurement conditions as those in Example A to determine the ratio of the electrical resistance value of a sample cut in the second direction to that of a sample cut in the first direction.

<Shelf Test>

For the electroconductive films according to the above-described Examples D1 to D7 and Comparative Examples D1 to D7, the shelf test was performed under the same conditions as those in Example A to evaluate the increase in surface resistance value after the shelf test to the surface resistance value before the shelf test in the same manner as in Example A. The evaluation criteria were as described below.

○: the increase rate of the surface resistance value after the shelf test to the surface resistance value before the shelf test in the electroconductive part was less than 10% or less;

Δ: the increase rate of the surface resistance value after the shelf test to the surface resistance value before the shelf test in the electroconductive part was more than 10% and 50% or less;

×: the increase rate of the surface resistance value after the shelf test to the surface resistance value before the shelf test in the electroconductive part was more than 50%.

<Measurement of Martens Hardness>

For the electroconductive films according to the above-described Examples D1 to D7 and Comparative Examples D1 to D7, the Martens hardness of each electroconductive part was measured individually at indentation amounts of 10 nm and 100 nm from the surface of the electroconductive part under the same conditions as those in Example A.

The results are shown in Tables 7 to 9 below.

TABLE 7

| | | Adhesion | | | Surface resistance value (Ω/□) | |
| | | | | | Non- | |
| | | | | | | destruc- |
| | | Silver | Silver | Silver | Contact- | tive |
| | Flexibilty | paste 1 | paste 2 | paste 3 | type | type |
|---|---|---|---|---|---|---|
| Example D1 | ⊙ | ○ | ○ | ○ | 52 | 51 |
| Example D2 | ⊙ | ○ | ○ | ○ | 51 | 53 |
| Example D3 | ⊙ | ○ | ○ | ○ | 63 | 65 |
| Example D4 | ⊙ | ○ | ○ | ○ | 30 | 32 |
| Example D5 | ⊙ | ○ | ○ | ○ | 37 | 38 |
| Example D6 | ⊙ | ○ | ○ | ○ | 41 | 43 |
| Example D7 | ⊙ | ○ | ○ | ○ | 143 | 162 |
| Comparative Example D1 | × | ○ | ○ | ○ | 53 | 54 |
| Comparative Example D2 | × | ○ | ○ | ○ | 63 | 62 |
| Comparative Example D3 | × | ○ | ○ | ○ | 33 | 32 |
| Comparative Example D4 | × | ○ | ○ | ○ | 38 | 39 |
| Comparative Example D5 | × | ○ | ○ | ○ | 53 | 55 |
| Comparative Example D6 | × | ○ | ○ | ○ | $10^6$ or more | 53 |
| Comparative Example D7 | ⊙ | ○ | ○ | Δ | 51 | 50 |

TABLE 8

| | | | Silver nanowire | | | Martens hardness (N/nm²) | |
| | Total light transmittance (%) | Haze value (%) | Existence ratio on the PET side (%) | Uneven distribution on the PET side | Shelf test | Indentation of 10 nm | Indentation of 100 nm |
|---|---|---|---|---|---|---|---|
| Example D1 | 89.6 | 1.2 | 82 | ○ | ○ | 1018 | 160 |
| Example D2 | 89.5 | 1.3 | 80 | ○ | ○ | 1018 | 160 |
| Example D3 | 89.5 | 1.2 | 78 | ○ | ○ | 1018 | 160 |
| Example D4 | 88.8 | 2.0 | 89 | ○ | ○ | 1018 | 160 |
| Example D5 | 88.7 | 1.9 | 88 | ○ | ○ | 1018 | 160 |
| Example D6 | 88.9 | 1.3 | 77 | ○ | ○ | 1018 | 160 |
| Example D7 | 89.5 | 1.2 | 79 | ○ | ○ | 1018 | 160 |
| Comparative Example D1 | 89.5 | 1.2 | 79 | ○ | ○ | 1018 | 190 |
| Comparative Example D2 | 89.5 | 1.2 | 75 | ○ | ○ | 1018 | 190 |
| Comparative Example D3 | 88.9 | 1.2 | 88 | ○ | ○ | 1018 | 190 |
| Comparative Example D4 | 88.8 | 1.9 | 86 | ○ | ○ | 1018 | 190 |
| Comparative Example D5 | 89.5 | 1.5 | — | — | × | 1018 | 190 |

TABLE 8-continued

| | Silver nanowire | | | | | |
|---|---|---|---|---|---|---|
| | Total light transmittance (%) | Haze value (%) | Existence ratio on the PET side (%) | Uneven distribution on the PET side | Shelf test | Martens hardness (N/nm$^2$) |
| | | | | | | Indentation of 10 nm / Indentation of 100 nm |
| Comparative Example D6 | 89.5 | 1.2 | 95 | ○ | ○ | 2000 / 260 |
| Comparative Example D7 | 90.3 | 1.2 | 83 | ○ | ○ | 1018 / 180 |

TABLE 9

| | Electrical resistance value (Ω) | | Electrical resistance value ratio |
|---|---|---|---|
| | First direction | Second direction | |
| Example D1 | 98 | 136 | 1.39 |
| Example D2 | 97 | 136 | 1.40 |
| Example D3 | 104 | 142 | 1.37 |
| Example D4 | 53 | 67 | 1.26 |
| Example D5 | 72 | 90 | 1.25 |
| Example D6 | 40 | 151 | 3.78 |
| Example D7 | 270 | 324 | 1.20 |

As shown in Table 7, each of the electroconductive films according to Comparative Examples D1 to D6 had a hard coat layer provided between the underlayer and the electroconductive part, and poor flexibility was consequently achieved. On the other hand, as shown in Table 7, each of the electroconductive films according to Examples D1 to D7 had an electroconductive part provided directly on the surface of an underlayer, and excellent flexibility was consequently achieved.

Additionally, as shown in Table 7, the electroconductive film according to Comparative Example D7 had an electroconductive part provided directly on a polyethylene terephthalate film, and excellent adhesion to the cured silver pastes 1 and 2 and poor adhesion to the cured silver paste 3 were consequently achieved. On the other hand, each of the electroconductive films according to Examples D1 to D7 had an electroconductive part provided directly on the surface of an underlayer, and excellent adhesion to all the cured silver pastes 1 to 3 was consequently achieved.

The high surface resistance value observed by a contact-type resistivity meter in Comparative Example D6 is considered to be due to the presence of a light-transmitting resin with an extremely large film thickness, while the relatively high surface resistance observed in Example D7 is considered to be due to the influence of anone as a dispersion medium that permeates into the underlayer and the resulting incorporation of silver nanowires into the underlayer.

For the electroconductive films according to Example D1 and D2, a humidity/heat resistance test was performed by leaving each electroconductive film in an environment at a temperature of 85° C. and a relative humidity of 85% for 240 hours, wherein a light-transmitting adhesive sheet (product name "OCA8146-2"; manufactured by 3M Japan Ltd.) was attached to the surface of the electroconductive part. The increase rate of the surface resistance value after the humidity/heat resistance test to the surface resistance value before the humidity/heat resistance test in the electroconductive part was 10% in the electroconductive films according to Example D1, while the increase rate of the surface resistance value after the humidity/heat resistance test to the surface resistance value before the humidity/heat resistance test in the electroconductive part was 5% in the electroconductive films according to Example D2. The surface resistance value and the increase rate of the surface resistance were determined by the same methods as for the surface resistance value and the increase rate of the surface resistance determined in the above-described shelf test.

When 5.5-inch rectangular samples (length:width=16:9) were prepared from each of the patterned electroconductive parts of the electroconductive films according to Examples D1 to D7 and the surface resistance was measured on the bezel by the procedure described in the above embodiment, the surface resistance value from 40Ω/□ to 60Ω/□. Additionally, when the line resistance was measured at six locations on the electroconductive part by the procedure described in the above embodiment, the electrical resistance value ratio ranged from 1.21 to 1.35.

LIST OF REFERENCE NUMERALS 10, 20, 30, 80, 100, 110, 140, 150, 160, 200, 250, 260, 290. Electroconductive film
10A, 20A, 30A, 100A, 110A, 140A, 150A, 160A, 250A, 260A. Surface
11, 81, 101, 141. Light-transmitting base material
12, 82, 102, 142. Light-transmitting functional layer
13, 22, 31, 84, 103, 112, 144, 152, 162, 203, 254, 262, 295. Electroconductive part
15, 86, 104, 154, 255. Light-transmitting resin
16, 87, 105, 155, 256. Electroconductive fiber
21, 83, 111, 143, 161, 202, 261, 294. Electroconductive layer
40, 120, 170, 270. Image display device
50, 180. Display panel
55. Display element
70, 130, 190, 280. Touch panel
151, 201, 251, 291. Light-transmitting resin base material

The invention claimed is:

1. A light-transmitting electroconductive film comprising a light-transmitting base material and an electroconductive part provided on at least one surface of the light-transmitting base material,
wherein the electroconductive part comprises a light-transmitting resin and plural electroconductive fibers incorporated in the light-transmitting resin;
the electroconductive part can conduct electricity from the surface of the electroconductive part;
the electroconductive fibers as a whole are unevenly distributed on the light-transmitting base material side than the position located at half the film thickness of the electroconductive part in the electroconductive part;
the electroconductive part has a surface resistance value of 200Ω/□ or less; and
the electroconductive film has a haze value of 5% or less.

2. The electroconductive film according to claim 1, wherein the electroconductive part is a single layer structure.

3. The electroconductive film according to claim 1, wherein the light-transmitting resin has a thickness of less than 300 nm.

4. The electroconductive film according to claim 1, wherein the electroconductive film has a total light transmittance of 80% or more.

5. A touch panel comprising the electroconductive film according to claim 1.

6. An image display device comprising the touch panel according to claim 5.

7. A light-transmitting electroconductive film comprising a light-transmitting resin base material and an electroconductive part provided on one surface of the light-transmitting resin base material,
- wherein the electroconductive part comprises a light-transmitting resin and plural electroconductive fibers incorporated in the light-transmitting resin;
- the electroconductive part can conduct electricity from the surface of the electroconductive part;
- the electroconductive part is provided directly on the one surface of the light-transmitting resin base material;
- the electroconductive part has a surface resistance value of 70Ω/□ or less;
- the electroconductive film has a haze value of 5% or less;
- the light-transmitting electroconductive film further comprises an underlayer provided directly on the other surface of the light-transmitting resin base material opposite to the one surface;
- the underlayer has a thickness of 10 nm or more and 1 μm or less; and
- the electroconductive part has a Martens hardness of 970 N/mm$^2$ or more and 1050 N/mm$^2$ or less at an indentation amount of 10 nm from the surface of the electroconductive part.

8. The electroconductive film according to claim 7, wherein the electroconductive fibers as a whole are unevenly distributed on the light-transmitting base material side than the position located at half the film thickness of the electroconductive part in the electroconductive part.

9. The electroconductive film according to claim 7, wherein the electroconductive film has a total light transmittance of 80% or more.

10. A touch panel comprising the electroconductive film according to claim 7.

11. An image display device comprising the touch panel according to claim 10.

12. A light-transmitting electroconductive film comprising an underlayer and an electroconductive part in this order on at least one surface of a light-transmitting resin base material,
- wherein the electroconductive part comprises a light-transmitting resin and plural electroconductive fibers incorporated in the light-transmitting resin;
- the underlayer is provided directly on at least one surface of the light-transmitting resin base material;
- the electroconductive part is provided directly on the underlayer;
- the electroconductive part has a surface resistance value of 70Ω/□ or less;
- the electroconductive film has a haze value of 5% or less;
- the underlayer has a thickness of 10 nm or more and 1 μm or less; and
- the electroconductive part has a Martens hardness of 970 N/mm$^2$ or more and 1050 N/mm$^2$ or less at an indentation amount of 10 nm from the surface of the electroconductive part.

13. The electroconductive film according to claim 12, wherein the electroconductive fibers as a whole are unevenly distributed on the light-transmitting base material side than the position located at half the film thickness of the electroconductive part in the electroconductive part.

14. The electroconductive film according to claim 12, wherein the electroconductive film has a total light transmittance of 80% or more.

15. A touch panel comprising the electroconductive film according to claim 12.

16. An image display device comprising the touch panel according to claim 15.

* * * * *